(12) United States Patent
Helander et al.

(10) Patent No.: US 12,492,313 B2
(45) Date of Patent: *Dec. 9, 2025

(54) MATERIALS FOR FORMING A NUCLEATION-INHIBITING COATING AND DEVICES INCORPORATING SAME

(71) Applicant: OTI LUMIONICS INC., Mississauga (CA)

(72) Inventors: Michael Helander, Mississauga (CA); Scott Nicholas Genin, Mississauga (CA); Zhibin Wang, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 52 days.

This patent is subject to a terminal disclaimer.

(21) Appl. No.: 18/349,834

(22) Filed: Jul. 10, 2023

(65) Prior Publication Data

US 2024/0074230 A1  Feb. 29, 2024

Related U.S. Application Data

(63) Continuation of application No. 17/436,562, filed as application No. PCT/IB2020/051991 on Mar. 7, 2020, now Pat. No. 11,730,012.

(Continued)

(51) Int. Cl.
*C09D 5/24* (2006.01)
*C09D 7/63* (2018.01)
(Continued)

(52) U.S. Cl.
CPC .......... *C09D 5/24* (2013.01); *C09D 7/63* (2018.01); *H10K 59/80522* (2023.02); *H10K 71/621* (2023.02); *H10K 85/111* (2023.02)

(58) Field of Classification Search
CPC ... C08K 5/01; C09D 5/00; C09D 5/24; C09D 7/63; H10K 50/824; H10K 50/8445;
(Continued)

(56) References Cited

U.S. PATENT DOCUMENTS 3,928,480 A   12/1975   Tabushi et al.
4,022,928 A    5/1977   Piwcyzk
(Continued)

FOREIGN PATENT DOCUMENTS

CA   2890253 A1   5/2014
CN   1284508 A    2/2001
(Continued)

OTHER PUBLICATIONS

Forrest, James A. "Reductions of the glass transition temperature in thin polymer films: Probing the length scale of cooperative dynamics." "Physical Review E 61.1 (2000): R53-6.".
(Continued)

*Primary Examiner* — Mark Kopec
*Assistant Examiner* — Jaison P Thomas
(74) *Attorney, Agent, or Firm* — Foley & Lardner LLP

(57) ABSTRACT

An opto-electronic device comprising a nucleation inhibiting coating (NIC) disposed on a surface of the device in a first portion of a lateral aspect thereof; and a conductive coating disposed on a surface of the device in a second portion of the lateral aspect thereof; wherein an initial sticking probability of the conductive coating is substantially less for the NIC than for the surface in the first portion, such that the first portion is substantially devoid of the conductive coating; and wherein the NIC comprises a com-
(Continued)

pound having a formula such as that illustrated by the following formula:

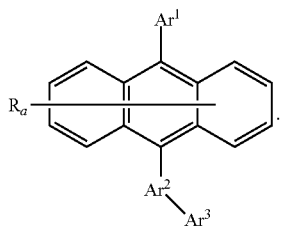

30 Claims, 58 Drawing Sheets

Related U.S. Application Data

(60) Provisional application No. 62/830,338, filed on Apr. 5, 2019, provisional application No. 62/822,715, filed on Mar. 22, 2019, provisional application No. 62/815,267, filed on Mar. 7, 2019.

(51) Int. Cl.
*H10K 59/80* (2023.01)
*H10K 71/00* (2023.01)
*H10K 85/10* (2023.01)

(58) Field of Classification Search
CPC .... H10K 71/00; H10K 71/621; H10K 85/111; H10K 59/80522; H10K 59/12; H10K 71/60; Y02E 10/549
See application file for complete search history.

(56) References Cited

U.S. PATENT DOCUMENTS

| | | | |
|---|---|---|---|
| 4,119,635 A | 10/1978 | Omodei-Sale et al. |
| 4,188,486 A | 2/1980 | Tsukamoto et al. |
| 4,379,155 A | 4/1983 | Omodei-Sale et al. |
| 4,512,997 A | 4/1985 | Meier et al. |
| 4,832,983 A | 5/1989 | Nagatomi et al. |
| 5,015,758 A | 5/1991 | Pilgrim et al. |
| 5,232,635 A | 8/1993 | Van Moer et al. |
| 5,399,936 A | 3/1995 | Namiki et al. |
| 5,550,290 A | 8/1996 | Mizuta et al. |
| 5,652,285 A | 7/1997 | Coggio et al. |
| 5,795,798 A | 8/1998 | Mishra et al. |
| 5,834,130 A | 11/1998 | Kido |
| 5,935,721 A | 8/1999 | Shi et al. |
| 6,016,033 A | 1/2000 | Jones et al. |
| 6,171,715 B1 | 1/2001 | Sato et al. |
| 6,285,039 B1 | 9/2001 | Kobori et al. |
| 6,361,886 B2 | 3/2002 | Shi et al. |
| 6,407,408 B1 | 6/2002 | Zhou et al. |
| 6,465,115 B2 | 10/2002 | Shi et al. |
| 6,472,468 B1 | 10/2002 | Omura |
| 6,538,374 B2 | 3/2003 | Hosokawa |
| 6,635,364 B1 | 10/2003 | Igarashi |
| 6,638,644 B2 | 10/2003 | Zheng |
| 6,682,785 B2 | 1/2004 | Wingen et al. |
| 6,787,468 B2 | 9/2004 | Kim et al. |
| 6,835,950 B2 | 12/2004 | Brown et al. |
| 6,852,429 B1 | 2/2005 | Li et al. |
| 6,878,469 B2 | 4/2005 | Yoon et al. |
| 6,899,963 B1 | 5/2005 | Zheng et al. |
| 6,900,470 B2 | 5/2005 | Kobayashi et al. |
| 6,927,270 B2 | 8/2005 | Lichtenhan et al. |
| 6,995,035 B2 | 2/2006 | Cok et al. |
| 7,018,713 B2 | 3/2006 | Padiyath |
| 7,053,255 B2 | 5/2006 | Ikeda et al. |
| 7,056,601 B2 | 6/2006 | Cosimbescu et al. |
| 7,099,299 B2 | 8/2006 | Liang et al. |
| 7,105,298 B2 | 9/2006 | Liu et al. |
| 7,166,240 B2 | 1/2007 | Ishida et al. |
| 7,169,482 B2 | 1/2007 | Aziz |
| 7,173,276 B2 | 2/2007 | Choi et al. |
| 7,175,815 B2 | 2/2007 | Yamasaki et al. |
| 7,192,659 B2 | 3/2007 | Ricks et al. |
| 7,193,015 B1 | 3/2007 | Mabry et al. |
| 7,217,683 B1 | 5/2007 | Blanski et al. |
| 7,252,893 B2 | 8/2007 | Ricks et al. |
| 7,319,129 B2 | 1/2008 | Yoshida et al. |
| 7,326,371 B2 | 2/2008 | Conley et al. |
| 7,361,796 B2 | 4/2008 | Ikeda et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,449,539 B2 | 11/2008 | Morimoto et al. |
| 7,491,975 B2 | 2/2009 | Kubota |
| 7,495,389 B2 | 2/2009 | Noguchi et al. |
| 7,504,526 B2 | 3/2009 | Kubota et al. |
| 7,651,787 B2 | 1/2010 | Seo et al. |
| 7,674,914 B2 | 3/2010 | Egawa et al. |
| 7,701,132 B2 | 4/2010 | Oh |
| 7,728,510 B2 | 6/2010 | Oh |
| 7,733,009 B2 | 6/2010 | Kondakov et al. |
| 7,776,457 B2 | 8/2010 | Lee et al. |
| 7,790,892 B2 | 9/2010 | Ikeda et al. |
| 7,816,861 B2 | 10/2010 | Choi et al. |
| 7,820,864 B2 | 10/2010 | Umemoto |
| 7,833,632 B2 | 11/2010 | Kawamura et al. |
| 7,839,074 B2 | 11/2010 | Ikeda et al. |
| 7,839,083 B2 | 11/2010 | Kubota |
| 7,851,071 B2 | 12/2010 | Yamamoto et al. |
| 7,867,629 B2 | 1/2011 | Yamamoto et al. |
| 7,887,931 B2 | 2/2011 | Cosimbescu |
| 7,897,667 B2 | 3/2011 | Mabry et al. |
| 7,910,687 B2 | 3/2011 | Busing et al. |
| 7,947,519 B2 | 5/2011 | Lee et al. |
| 7,956,351 B2 | 6/2011 | Choi |
| 7,973,306 B2 | 7/2011 | Kim et al. |
| 7,986,672 B2 | 7/2011 | Tiedemann et al. |
| 7,998,540 B2 | 8/2011 | Goulding et al. |
| 7,999,459 B2 | 8/2011 | Chun et al. |
| 8,004,180 B2 | 8/2011 | Seo |
| 8,025,815 B2 | 9/2011 | Kawamura et al. |
| 8,030,838 B2 | 10/2011 | Kwak et al. |
| 8,044,580 B2 | 10/2011 | Yamazaki et al. |
| 8,071,226 B2 | 12/2011 | Je et al. |
| 8,076,839 B2 | 12/2011 | Kuma et al. |
| 8,089,066 B2 | 1/2012 | Yamazaki et al. |
| 8,097,349 B2 | 1/2012 | Yamamoto et al. |
| 8,101,771 B2 | 1/2012 | Nomura et al. |
| 8,115,376 B2 | 2/2012 | Fujioka et al. |
| 8,174,185 B2 | 5/2012 | Park et al. |
| 8,217,570 B2 | 7/2012 | Kawamura et al. |
| 8,222,634 B2 | 7/2012 | Lee |
| 8,232,350 B2 | 7/2012 | Fujita et al. |
| 8,237,351 B2 | 8/2012 | Sung et al. |
| 8,257,620 B2 | 9/2012 | Cranor et al. |
| 8,310,149 B2 | 11/2012 | Lifka et al. |
| 8,318,878 B2 | 11/2012 | Sudo et al. |
| 8,318,995 B2 | 11/2012 | Kubota et al. |
| 8,343,637 B2 | 1/2013 | Parham et al. |
| 8,362,469 B2 | 1/2013 | Suh |
| 8,383,932 B2 | 2/2013 | Jung et al. |
| 8,399,720 B2 | 3/2013 | Umemoto |
| 8,541,113 B2 | 9/2013 | Je et al. |
| 8,568,902 B2 | 10/2013 | Kubota et al. |
| 8,586,202 B2 | 11/2013 | Imai et al. |
| 8,592,053 B2 | 11/2013 | Kawakami |
| 8,679,647 B2 | 3/2014 | Pflumm et al. |
| 8,703,303 B2 | 4/2014 | Yamamoto et al. |
| 8,729,530 B2 | 5/2014 | Nagao et al. |
| 8,759,818 B2 | 6/2014 | Lecloux |
| 8,766,306 B2 | 7/2014 | Lifka et al. |
| 8,779,655 B2 | 7/2014 | Nishimura |

(56) References Cited

U.S. PATENT DOCUMENTS

| | | |
|---|---|---|
| 8,795,847 B2 | 8/2014 | Heil et al. |
| 8,795,855 B2 | 8/2014 | Klubek et al. |
| 8,809,838 B2 | 8/2014 | Jeong et al. |
| 8,852,756 B2 | 10/2014 | Vestweber et al. |
| 8,853,675 B2 | 10/2014 | Kubota et al. |
| 8,859,111 B2 | 10/2014 | Parham et al. |
| 8,872,206 B2 | 10/2014 | Chung et al. |
| 8,877,356 B2 | 11/2014 | Spindler et al. |
| 8,883,324 B2 | 11/2014 | Yabunouchi et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,987,516 B2 | 3/2015 | Umemoto |
| 8,993,123 B2 | 3/2015 | Buesing et al. |
| 8,994,010 B2 | 3/2015 | Choi et al. |
| 9,018,621 B2 | 4/2015 | Park et al. |
| 9,024,301 B2 | 5/2015 | Kawamura et al. |
| 9,024,307 B2 | 5/2015 | Lee |
| 9,040,962 B2 | 5/2015 | Adamovich et al. |
| 9,051,344 B2 | 6/2015 | Lin et al. |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,113,536 B2 | 8/2015 | Oka et al. |
| 9,126,970 B2 | 9/2015 | Pflumm |
| 9,169,274 B2 | 10/2015 | Mizuki et al. |
| 9,214,636 B2 | 12/2015 | Takashima et al. |
| 9,219,234 B2 | 12/2015 | Kubota et al. |
| 9,231,030 B2 | 1/2016 | Choi et al. |
| 9,245,934 B2 | 1/2016 | Chung et al. |
| 9,246,105 B2 | 1/2016 | Sun |
| 9,246,123 B2 | 1/2016 | Kim et al. |
| 9,257,654 B2 | 2/2016 | Kawakami |
| 9,276,220 B2 | 3/2016 | Kim et al. |
| 9,287,339 B2 | 3/2016 | Lee et al. |
| 9,293,515 B2 | 3/2016 | Choi |
| 9,331,308 B2 | 5/2016 | Choi et al. |
| 9,353,027 B2 | 5/2016 | Kawamura et al. |
| 9,444,064 B2 | 9/2016 | Kaiser et al. |
| 9,450,027 B2 | 9/2016 | Pang et al. |
| 9,478,591 B2 | 10/2016 | Nam et al. |
| 9,515,280 B2 | 12/2016 | Yun |
| 9,548,456 B2 | 1/2017 | Lee et al. |
| 9,570,471 B2 | 2/2017 | Heo et al. |
| 9,583,716 B2 | 2/2017 | Ikeda |
| 9,595,681 B2 | 3/2017 | Mujica-Fernaud |
| 9,608,207 B2 | 3/2017 | Takaku et al. |
| 9,624,193 B2 | 4/2017 | Aihara |
| 9,660,195 B2 | 5/2017 | Kawamura et al. |
| 9,666,812 B2 | 5/2017 | Lee et al. |
| 9,680,108 B2 | 6/2017 | Ito et al. |
| 9,711,734 B2 | 7/2017 | Kim |
| 9,711,751 B2 | 7/2017 | Prushinskiy et al. |
| 9,728,726 B2 | 8/2017 | Takaku |
| 9,748,318 B2 | 8/2017 | Shim et al. |
| 9,776,983 B2 | 10/2017 | Marchionni et al. |
| 9,786,846 B2 | 10/2017 | Kubota |
| 9,793,491 B2 | 10/2017 | Hwang et al. |
| 9,812,657 B2 | 11/2017 | Kravchuk et al. |
| 9,831,457 B2 | 11/2017 | Kang et al. |
| 9,859,520 B2 | 1/2018 | Kim |
| 9,882,140 B2 | 1/2018 | Han et al. |
| 9,896,621 B2 | 2/2018 | Kim et al. |
| 9,954,039 B2 | 4/2018 | Im et al. |
| 9,960,216 B2 | 5/2018 | Lee et al. |
| 9,966,554 B2 | 5/2018 | Lee et al. |
| 10,026,906 B2 | 7/2018 | Jung et al. |
| 10,032,843 B2 | 7/2018 | Lee et al. |
| 10,062,850 B2 | 8/2018 | Jung et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,153,450 B2 | 12/2018 | Kawamura |
| 10,177,206 B2 | 1/2019 | Jung et al. |
| 10,181,573 B2 | 1/2019 | Im |
| 10,186,568 B2 | 1/2019 | Kim et al. |
| 10,205,101 B2 | 2/2019 | Kubota et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,297,762 B2 | 5/2019 | Zeng et al. |
| 10,361,375 B2 | 7/2019 | Zeng et al. |
| 10,501,583 B2 | 12/2019 | Song et al. |
| 10,700,304 B2 | 6/2020 | Helander et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2003/0219625 A1 | 11/2003 | Wolk et al. |
| 2004/0018383 A1 | 1/2004 | Aziz et al. |
| 2004/0058193 A1 | 3/2004 | Hatwar |
| 2004/0152910 A1 | 8/2004 | Fukuoka et al. |
| 2004/0249027 A1 | 12/2004 | Lim et al. |
| 2004/0249070 A1 | 12/2004 | Lim et al. |
| 2005/0181232 A1 | 8/2005 | Ricks et al. |
| 2005/0211958 A1 | 9/2005 | Conley et al. |
| 2005/0245648 A1 | 11/2005 | Lim et al. |
| 2005/0271899 A1 | 12/2005 | Brown et al. |
| 2006/0019116 A1 | 1/2006 | Conley et al. |
| 2006/0043858 A1 | 3/2006 | Ikeda et al. |
| 2006/0078757 A1 | 4/2006 | Boerner |
| 2006/0125390 A1 | 6/2006 | Oh |
| 2006/0147747 A1 | 7/2006 | Yamamoto et al. |
| 2006/0154105 A1 | 7/2006 | Yamamoto et al. |
| 2006/0182993 A1 | 8/2006 | Ogata et al. |
| 2006/0210830 A1 | 9/2006 | Funahashi et al. |
| 2006/0246315 A1 | 11/2006 | Begley et al. |
| 2007/0003785 A1 | 1/2007 | Slusarek et al. |
| 2007/0077349 A1 | 4/2007 | Newman et al. |
| 2007/0178405 A1 | 8/2007 | Kanda et al. |
| 2007/0252517 A1 | 11/2007 | Owczarczyk et al. |
| 2007/0252521 A1 | 11/2007 | Kondakov et al. |
| 2008/0001123 A1 | 1/2008 | Inoue et al. |
| 2008/0012475 A1 | 1/2008 | Oyamada et al. |
| 2008/0093986 A1 | 4/2008 | Inoue et al. |
| 2008/0103315 A1 | 5/2008 | Egawa et al. |
| 2008/0105865 A1 | 5/2008 | Oyamada et al. |
| 2008/0166593 A1 | 7/2008 | Stoessel et al. |
| 2008/0203905 A1 | 8/2008 | Je et al. |
| 2008/0286607 A1 | 11/2008 | Nomura et al. |
| 2008/0286610 A1 | 11/2008 | Deaton et al. |
| 2008/0303422 A1 | 12/2008 | Vestweber et al. |
| 2009/0033208 A1 | 2/2009 | Nagayama et al. |
| 2009/0066239 A1 | 3/2009 | Yabunouchi |
| 2009/0093641 A1 | 4/2009 | Dolbier et al. |
| 2009/0145483 A1 | 6/2009 | Kim et al. |
| 2009/0153037 A1 | 6/2009 | Kim et al. |
| 2009/0153039 A1 | 6/2009 | Kim et al. |
| 2009/0153040 A1 | 6/2009 | Kim et al. |
| 2009/0159130 A1 | 6/2009 | Eum et al. |
| 2009/0165860 A1 | 7/2009 | Kim et al. |
| 2009/0174316 A1 | 7/2009 | Kim et al. |
| 2009/0179196 A1 | 7/2009 | Adachi et al. |
| 2009/0179555 A1 | 7/2009 | Kim et al. |
| 2009/0184631 A1 | 7/2009 | Kim et al. |
| 2009/0199903 A1 | 8/2009 | Oyamada et al. |
| 2009/0200926 A1 | 8/2009 | Lee et al. |
| 2009/0233125 A1 | 9/2009 | Choi et al. |
| 2009/0236973 A1 | 9/2009 | Yabe et al. |
| 2009/0239986 A1 | 9/2009 | Kim et al. |
| 2009/0252990 A1 | 10/2009 | Kim et al. |
| 2010/0019657 A1 | 1/2010 | Eum et al. |
| 2010/0052526 A1 | 3/2010 | Je et al. |
| 2010/0078628 A1 | 4/2010 | Chi et al. |
| 2010/0108997 A1 | 5/2010 | Kim et al. |

(56) References Cited

U.S. PATENT DOCUMENTS

| | | |
|---|---|---|
| 2010/0117028 A1 | 5/2010 | Takeshima et al. |
| 2010/0193768 A1 | 8/2010 | Habib |
| 2010/0244197 A1 | 9/2010 | Arena et al. |
| 2010/0314615 A1 | 12/2010 | Mizuki et al. |
| 2010/0327240 A1 | 12/2010 | Cranor et al. |
| 2011/0006289 A1 | 1/2011 | Mizuki et al. |
| 2011/0094889 A1 | 4/2011 | Shin et al. |
| 2011/0156016 A1 | 6/2011 | Kawamura et al. |
| 2011/0175031 A1 | 7/2011 | Matsunami et al. |
| 2011/0186820 A1 | 8/2011 | Kim et al. |
| 2011/0198582 A1 | 8/2011 | Horiuchi et al. |
| 2011/0203517 A1 | 8/2011 | Freudenberg et al. |
| 2011/0204772 A1 | 8/2011 | Egawa |
| 2011/0220886 A1 | 9/2011 | Takeshima et al. |
| 2011/0285276 A1 | 11/2011 | Kadoma et al. |
| 2011/0297923 A1 | 12/2011 | Mizuki et al. |
| 2011/0306798 A1 | 12/2011 | Umemoto |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0023556 A1 | 1/2012 | Schultz et al. |
| 2012/0043533 A1 | 2/2012 | Mizuki et al. |
| 2012/0056165 A1 | 3/2012 | Kawamura et al. |
| 2012/0091885 A1 | 4/2012 | Kim et al. |
| 2012/0104422 A1 | 5/2012 | Lee et al. |
| 2012/0112169 A1 | 5/2012 | Mizuki et al. |
| 2012/0146030 A1 | 6/2012 | You et al. |
| 2012/0181520 A1 | 7/2012 | Kim et al. |
| 2012/0181922 A1 | 7/2012 | Kawamura et al. |
| 2012/0187541 A1 | 7/2012 | Arena et al. |
| 2013/0020561 A1 | 1/2013 | Suzuki et al. |
| 2013/0049024 A1 | 2/2013 | Choi et al. |
| 2013/0056784 A1 | 3/2013 | Lee et al. |
| 2013/0075509 A1 | 3/2013 | Beaudet et al. |
| 2013/0112952 A1 | 5/2013 | Adamovich et al. |
| 2013/0153878 A1 | 6/2013 | Mizuki et al. |
| 2013/0175509 A1 | 7/2013 | Kim et al. |
| 2013/0187143 A1 | 7/2013 | Nishimura et al. |
| 2013/0221338 A1 | 8/2013 | Kawamura et al. |
| 2014/0014925 A1 | 1/2014 | Jung et al. |
| 2014/0070236 A1 | 3/2014 | Chen et al. |
| 2014/0103306 A1 | 4/2014 | Moon et al. |
| 2014/0110680 A1 | 4/2014 | Choe |
| 2014/0148877 A1 | 5/2014 | Pan et al. |
| 2014/0159011 A1 | 6/2014 | Suzuki et al. |
| 2014/0183500 A1 | 7/2014 | Ikeda et al. |
| 2014/0186983 A1 | 7/2014 | Kim et al. |
| 2014/0225085 A1 | 8/2014 | Hayashi et al. |
| 2014/0231761 A1 | 8/2014 | Kim et al. |
| 2014/0239273 A1 | 8/2014 | Mizutani et al. |
| 2014/0246657 A1 | 9/2014 | Kim et al. |
| 2014/0291653 A1 | 10/2014 | Ikeda et al. |
| 2014/0299866 A1 | 10/2014 | Ruske et al. |
| 2014/0319511 A1 | 10/2014 | Mizuki et al. |
| 2014/0326958 A1* | 11/2014 | Chung .................. H10K 50/84 438/34 |
| 2014/0326985 A1 | 11/2014 | Mizuki et al. |
| 2014/0332772 A1 | 11/2014 | Han et al. |
| 2014/0333266 A1 | 11/2014 | Kain |
| 2014/0346406 A1 | 11/2014 | Lee et al. |
| 2014/0346482 A1 | 11/2014 | Mizuki et al. |
| 2014/0353601 A1 | 12/2014 | Cho et al. |
| 2014/0367654 A1 | 12/2014 | Kim et al. |
| 2015/0076456 A1 | 3/2015 | Choi et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0171337 A1 | 6/2015 | Jung et al. |
| 2015/0184104 A1 | 7/2015 | Xu et al. |
| 2015/0194614 A1 | 7/2015 | Kravchuk et al. |
| 2015/0284580 A1 | 10/2015 | Kawakami et al. |
| 2015/0287846 A1 | 10/2015 | Helander et al. |
| 2015/0333266 A1 | 11/2015 | Ito et al. |
| 2015/0376768 A1 | 12/2015 | Veres et al. |
| 2016/0005976 A1 | 1/2016 | Mizuki et al. |
| 2016/0013438 A1 | 1/2016 | Im et al. |
| 2016/0043325 A1 | 2/2016 | Gorohmaru et al. |
| 2016/0079543 A1 | 3/2016 | Park et al. |
| 2016/0099411 A1 | 4/2016 | Kim et al. |
| 2016/0104859 A1 | 4/2016 | Kim et al. |
| 2016/0133846 A1 | 5/2016 | Ishii et al. |
| 2016/0149156 A1 | 5/2016 | Kim et al. |
| 2016/0155952 A1 | 6/2016 | Hwang et al. |
| 2016/0180763 A1 | 6/2016 | Park et al. |
| 2016/0181527 A1 | 6/2016 | Mizuki et al. |
| 2016/0181543 A1 | 6/2016 | Ito et al. |
| 2016/0211454 A1 | 7/2016 | Kim et al. |
| 2016/0211458 A1 | 7/2016 | Ito et al. |
| 2016/0211459 A1 | 7/2016 | Ito et al. |
| 2016/0225992 A1 | 8/2016 | Ito et al. |
| 2016/0233437 A1 | 8/2016 | Suzuki et al. |
| 2016/0260901 A1 | 9/2016 | Kim et al. |
| 2016/0268520 A1 | 9/2016 | Mizuki et al. |
| 2016/0284998 A1 | 9/2016 | Kawamura et al. |
| 2016/0293888 A1 | 10/2016 | Shim et al. |
| 2016/0308137 A1 | 10/2016 | Park et al. |
| 2016/0333137 A1 | 11/2016 | Pan |
| 2016/0351638 A1 | 12/2016 | Im et al. |
| 2016/0351818 A1 | 12/2016 | Kim et al. |
| 2016/0372524 A1 | 12/2016 | Yun et al. |
| 2016/0380198 A1 | 12/2016 | Mizuki et al. |
| 2017/0012221 A1 | 1/2017 | Buesing et al. |
| 2017/0018733 A1 | 1/2017 | Jin et al. |
| 2017/0033166 A1 | 2/2017 | Shim et al. |
| 2017/0062755 A1 | 3/2017 | Im et al. |
| 2017/0100607 A1 | 4/2017 | Pan et al. |
| 2017/0104166 A1 | 4/2017 | Jeong et al. |
| 2017/0117469 A1 | 4/2017 | Ito et al. |
| 2017/0125495 A1 | 5/2017 | Lee et al. |
| 2017/0125506 A1 | 5/2017 | Kim |
| 2017/0125687 A1 | 5/2017 | Ikeda et al. |
| 2017/0125703 A1 | 5/2017 | Suzuki et al. |
| 2017/0155078 A1 | 6/2017 | Lee |
| 2017/0170246 A1 | 6/2017 | Im et al. |
| 2017/0179397 A1 | 6/2017 | Kim et al. |
| 2017/0179402 A1 | 6/2017 | Kim et al. |
| 2017/0183291 A1 | 6/2017 | Ito et al. |
| 2017/0186831 A1 | 6/2017 | Nam et al. |
| 2017/0197998 A1 | 7/2017 | Pan |
| 2017/0237023 A1 | 8/2017 | Kim et al. |
| 2017/0256722 A1 | 9/2017 | Shim et al. |
| 2017/0309822 A1 | 10/2017 | Mizuki et al. |
| 2017/0313650 A1 | 11/2017 | Stoessel et al. |
| 2017/0317154 A1 | 11/2017 | Heo |
| 2017/0317284 A1 | 11/2017 | Mizuki et al. |
| 2017/0324045 A1 | 11/2017 | Takahashi et al. |
| 2017/0338438 A1 | 11/2017 | Kwon et al. |
| 2017/0342318 A1 | 11/2017 | Kim et al. |
| 2018/0006239 A1 | 1/2018 | Yokoyama et al. |
| 2018/0006264 A1 | 1/2018 | Lee et al. |
| 2018/0012499 A1 | 1/2018 | Madhusudan et al. |
| 2018/0019398 A1 | 1/2018 | Mizuki et al. |
| 2018/0019408 A1 | 1/2018 | Ko |
| 2018/0040685 A1 | 2/2018 | Yeo et al. |
| 2018/0061323 A1 | 3/2018 | Kwon et al. |
| 2018/0062088 A1 | 3/2018 | Cho et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123054 A1 | 5/2018 | Gorohmaru et al. |
| 2018/0123055 A1 | 5/2018 | Park et al. |
| 2018/0123078 A1 | 5/2018 | Byun et al. |
| 2018/0127385 A1 | 5/2018 | Jung et al. |
| 2018/0130949 A1 | 5/2018 | Kim et al. |
| 2018/0145262 A1 | 5/2018 | Zeng et al. |
| 2018/0158881 A1 | 6/2018 | Lim et al. |
| 2018/0166518 A1 | 6/2018 | Kim |
| 2018/0198076 A1 | 7/2018 | Takahashi et al. |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0226581 A1 | 8/2018 | Chang et al. |
| 2018/0240990 A1 | 8/2018 | Choi et al. |

(56) References Cited

U.S. PATENT DOCUMENTS

| | | |
|---|---|---|
| 2018/0261797 A1 | 9/2018 | Lee |
| 2018/0265777 A1 | 9/2018 | Ambrosek et al. |
| 2018/0273563 A1 | 9/2018 | Choi et al. |
| 2018/0294436 A1 | 10/2018 | Choi et al. |
| 2018/0309058 A1 | 10/2018 | Mizuki et al. |
| 2018/0309064 A1 | 10/2018 | Aldred et al. |
| 2018/0309071 A1 | 10/2018 | Jeon et al. |
| 2018/0309085 A1 | 10/2018 | Park et al. |
| 2018/0323377 A1 | 11/2018 | Mizuki et al. |
| 2018/0337219 A1 | 11/2018 | Rhee et al. |
| 2018/0340032 A1 | 11/2018 | Campbell et al. |
| 2018/0342682 A1 | 11/2018 | Park et al. |
| 2018/0366678 A1 | 12/2018 | Chi et al. |
| 2019/0013342 A1 | 1/2019 | Kato et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0136077 A1 | 4/2020 | Lee et al. |
| 2020/0159284 A1 | 5/2020 | Mathew et al. |
| 2020/0194676 A1 | 6/2020 | Chang et al. |
| 2020/0194730 A1 | 6/2020 | Park et al. |
| 2020/0212130 A1 | 7/2020 | Kim et al. |
| 2020/0357871 A1 | 11/2020 | Chung et al. |
| 2020/0409412 A1 | 12/2020 | Kim et al. |
| 2021/0134901 A1 | 5/2021 | Sung et al. |
| 2022/0025134 A1 | 1/2022 | Wehrmann et al. |
| 2022/0398759 A1 | 12/2022 | Schindler et al. |

FOREIGN PATENT DOCUMENTS

| | | |
|---|---|---|
| CN | 1460682 A | 12/2003 |
| CN | 101299419 A | 11/2008 |
| CN | 100526288 C | 8/2009 |
| CN | 101617064 A | 12/2009 |
| CN | 101730938 A | 6/2010 |
| CN | 1625552 B | 9/2011 |
| CN | 1784388 B | 2/2012 |
| CN | 101812021 B | 12/2012 |
| CN | 103467396 A | 12/2013 |
| CN | 101267022 B | 8/2014 |
| CN | 103992481 A | 8/2014 |
| CN | 104037359 A | 9/2014 |
| CN | 104769149 A | 7/2015 |
| CN | 101503393 B | 8/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106317025 A | 1/2017 |
| CN | 103788087 B | 5/2017 |
| CN | 106992267 A | 7/2017 |
| CN | 107021986 A | 8/2017 |
| CN | 107522744 A | 12/2017 |
| CN | 107564945 A | 1/2018 |
| CN | 107573485 A | 1/2018 |
| CN | 107573582 A | 1/2018 |
| CN | 107808895 A | 3/2018 |
| CN | 105849930 B | 6/2018 |
| CN | 108376019 A | 8/2018 |
| CN | 108389878 A | 8/2018 |
| CN | 108418928 A | 8/2018 |
| CN | 105359289 B | 9/2018 |
| CN | 108630830 A | 10/2018 |
| CN | 108767136 A | 11/2018 |
| CN | 108881531 A | 11/2018 |
| CN | 108900659 A | 11/2018 |
| CN | 106189093 B | 12/2018 |
| CN | 109299631 A | 2/2019 |
| CN | 106046688 B | 3/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 106432200 B | 7/2019 |
| CN | 110112182 A | 8/2019 |
| CN | 110144551 A | 8/2019 |
| CN | 110265474 A | 9/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |
| CN | 111029381 A | 4/2020 |
| CN | 111029382 A | 4/2020 |
| CN | 111046599 A | 4/2020 |
| CN | 111048564 A | 4/2020 |
| CN | 111142180 A | 5/2020 |
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 210668382 U | 6/2020 |

(56) References Cited

FOREIGN PATENT DOCUMENTS

| | | |
|---|---|---|
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| CN | 109970981 B | 4/2022 |
| CN | 110265702 B | 6/2022 |
| DE | 19748109 A1 | 5/1999 |
| EP | 0 444 822 B1 | 9/1994 |
| EP | 1 465 874 A2 | 10/2004 |
| EP | 1 551 206 A1 | 7/2005 |
| EP | 1 213 337 B1 | 11/2005 |
| EP | 1 816 114 A1 | 8/2007 |
| EP | 1 850 368 A1 | 10/2007 |
| EP | 1 873 162 A1 | 1/2008 |
| EP | 2 055 709 A2 | 5/2009 |
| EP | 2 055 710 A1 | 5/2009 |
| EP | 2 067 766 A1 | 6/2009 |
| EP | 2 067 767 A1 | 6/2009 |
| EP | 2 075 309 A2 | 7/2009 |
| EP | 2 080 795 A1 | 7/2009 |
| EP | 2 175 005 A1 | 4/2010 |
| EP | 2 066 150 B1 | 5/2010 |
| EP | 2 182 040 A2 | 5/2010 |
| EP | 2 202 283 A1 | 6/2010 |
| EP | 2 062 958 B1 | 7/2010 |
| EP | 1 602 648 B1 | 4/2013 |
| EP | 2 028 249 B1 | 5/2013 |
| EP | 1 621 597 B1 | 9/2013 |
| EP | 2 270 897 B1 | 12/2014 |
| EP | 1 009 044 B1 | 7/2015 |
| EP | 2 462 203 B1 | 3/2016 |
| EP | 2 998 997 A1 | 3/2016 |
| EP | 3 089 232 A1 | 11/2016 |
| EP | 2 197 979 B1 | 12/2016 |
| EP | 3 182 477 A1 | 6/2017 |
| EP | 3 185 325 A1 | 6/2017 |
| EP | 2 248 849 B1 | 7/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 2 434 558 B1 | 7/2018 |
| EP | 3 406 752 A1 | 11/2018 |
| EP | 3 499 576 A1 | 6/2019 |
| GB | 1 096 600 A | 12/1967 |
| IN | 229083 B | 8/2007 |
| JP | 2002-212163 A | 7/2002 |
| JP | 3588978 B2 | 11/2004 |
| JP | 2004-352815 A | 12/2004 |
| JP | 2005-041843 A | 2/2005 |
| JP | 2007-188854 A | 7/2007 |
| JP | 4025111 B2 | 12/2007 |
| JP | 4025136 B2 | 12/2007 |
| JP | 2008-133263 A | 6/2008 |
| JP | 4185097 B2 | 11/2008 |
| JP | 2008-291006 A | 12/2008 |
| JP | 4308663 B2 | 8/2009 |
| JP | 2009-535813 A | 10/2009 |
| JP | 2010-258410 A | 11/2010 |
| JP | 2011-173972 A | 9/2011 |
| JP | 4846982 B2 | 12/2011 |
| JP | 2012-044125 A | 3/2012 |
| JP | 4970934 B2 | 7/2012 |
| JP | 4972844 B2 | 7/2012 |
| JP | 2012-531426 A | 12/2012 |
| JP | 5093879 B2 | 12/2012 |
| JP | 5166961 B2 | 3/2013 |
| JP | 5198657 B2 | 5/2013 |
| JP | 5233074 B2 | 7/2013 |
| JP | 2013-173771 A | 9/2013 |
| JP | 2013-219278 A | 10/2013 |
| JP | 5572134 B2 | 8/2014 |
| JP | 5645849 B2 | 12/2014 |
| JP | 2017-503317 A | 1/2017 |
| KR | 100691543 B1 | 3/2007 |
| KR | 100826364 B1 | 5/2008 |
| KR | 100858816 B1 | 9/2008 |
| KR | 1020090128427 A | 12/2009 |
| KR | 1020100041043 A | 4/2010 |
| KR | 1020100054630 A | 5/2010 |
| KR | 1020100066424 A | 6/2010 |
| KR | 1020100123735 A | 11/2010 |
| KR | 100998838 B1 | 12/2010 |
| KR | 101020350 B1 | 3/2011 |
| KR | 101036391 B1 | 5/2011 |
| KR | 1020110123701 A | 11/2011 |
| KR | 1020130077276 A | 7/2013 |
| KR | 101317511 B1 | 10/2013 |
| KR | 1020140062258 A | 5/2014 |
| KR | 1020140126108 A | 10/2014 |
| KR | 101530266 B1 | 6/2015 |
| KR | 10201503510 A | 9/2015 |
| KR | 101561479 B1 | 10/2015 |
| KR | 1020150120906 A | 10/2015 |
| KR | 1020150127368 A | 11/2015 |
| KR | 101640772 B1 | 7/2016 |
| KR | 101661925 B1 | 10/2016 |
| KR | 1020170030168 A | 3/2017 |
| KR | 1020170075865 A | 7/2017 |
| KR | 1020180115655 A | 10/2018 |
| KR | 1020180121304 A | 11/2018 |
| KR | 1020190020930 A | 3/2019 |
| TW | 227655 B | 2/2005 |
| TW | 201105775 A | 2/2011 |
| TW | 363054 B | 5/2012 |
| TW | 485137 B | 5/2015 |
| TW | 499653 B | 9/2015 |
| TW | 201929219 A | 7/2019 |
| WO | WO-95/33732 A1 | 12/1995 |
| WO | WO-98/18804 A1 | 5/1998 |
| WO | WO-2006/070711 A1 | 7/2006 |
| WO | WO-2006/070712 A1 | 7/2006 |
| WO | WO-2006/074781 A1 | 7/2006 |
| WO | WO-2008/010377 A1 | 1/2008 |
| WO | WO-2008/069586 A1 | 6/2008 |
| WO | WO-2008/105294 A1 | 9/2008 |
| WO | WO-2009/099133 A1 | 8/2009 |
| WO | WO-2009/102054 A1 | 8/2009 |
| WO | WO-2010/050778 A1 | 5/2010 |
| WO | WO-2010/064871 A1 | 6/2010 |
| WO | WO-2010/094378 A1 | 8/2010 |
| WO | WO-2010/114256 A2 | 10/2010 |
| WO | WO-2010/114263 A2 | 10/2010 |
| WO | WO-2010/122810 A1 | 10/2010 |
| WO | WO-2010/134350 A1 | 11/2010 |
| WO | WO-2010/151006 A1 | 12/2010 |
| WO | WO-2011/012212 A1 | 2/2011 |
| WO | WO-2011/049284 A1 | 4/2011 |
| WO | WO-2011/074252 A1 | 6/2011 |
| WO | WO-2011/074253 A1 | 6/2011 |
| WO | WO-2011/115378 A1 | 9/2011 |
| WO | WO-2011/129096 A1 | 10/2011 |
| WO | WO-2012/070535 A1 | 5/2012 |
| WO | WO-2013/109030 A1 | 7/2013 |
| WO | WO-2013/100724 A4 | 10/2013 |
| WO | WO-2013/180456 A1 | 12/2013 |
| WO | WO-2013/183851 A1 | 12/2013 |
| WO | WO-2013/187007 A1 | 12/2013 |
| WO | WO-2014/024880 A1 | 2/2014 |
| WO | WO-2014/025317 A1 | 2/2014 |

(56) References Cited

FOREIGN PATENT DOCUMENTS

| | | | |
|---|---|---|---|
| WO | WO-2014/104144 A1 | 7/2014 | |
| WO | WO-2014/163228 A1 | 10/2014 | |
| WO | WO-2015/005440 A1 | 1/2015 | |
| WO | WO-2015/033559 A1 | 3/2015 | |
| WO | WO-2015/041352 A1 | 3/2015 | |
| WO | WO-2016/042781 A1 | 3/2016 | |
| WO | WO-2016/056364 A1 | 4/2016 | |
| WO | WO-2017072678 A1 * | 5/2017 | ............... C09D 5/24 |
| WO | WO-2017/100944 A1 | 6/2017 | |
| WO | WO-2018/100559 A1 | 6/2018 | |
| WO | WO-2018/103747 A1 | 6/2018 | |
| WO | WO-2018/206575 A1 | 11/2018 | |
| WO | WO-2019/002198 A1 | 1/2019 | |
| WO | WO-2019/006749 A1 | 1/2019 | |
| WO | WO-2019/047126 A1 | 3/2019 | |
| WO | WO-2019/062221 A1 | 4/2019 | |
| WO | WO-2019/062236 A1 | 4/2019 | |
| WO | WO-2019/088594 A2 | 5/2019 | |
| WO | WO-2019/141198 A1 | 7/2019 | |
| WO | WO-2019/147012 A1 | 8/2019 | |
| WO | WO-2019/178782 A1 | 9/2019 | |
| WO | WO-2019/199131 A1 | 10/2019 | |
| WO | WO-2019/199139 A1 | 10/2019 | |
| WO | WO-2019/199693 A1 | 10/2019 | |
| WO | WO-2019/200862 A1 | 10/2019 | |
| WO | WO-2019/233298 A1 | 12/2019 | |
| WO | WO-2019/242510 A1 | 12/2019 | |
| WO | WO-2020/029559 A1 | 2/2020 | |
| WO | WO-2020/029612 A1 | 2/2020 | |
| WO | WO-2020/029621 A1 | 2/2020 | |
| WO | WO-2020/045262 A1 | 3/2020 | |
| WO | WO-2020/052232 A1 | 3/2020 | |
| WO | WO-2020/057208 A1 | 3/2020 | |
| WO | WO-2020/079456 A1 | 4/2020 | |
| WO | WO-2020/105015 A1 | 5/2020 | |
| WO | WO-2020/134914 A1 | 7/2020 | |
| WO | WO-2020/191889 A1 | 10/2020 | |
| WO | WO-2020/192051 A1 | 10/2020 | |
| WO | WO-2020/195917 A1 | 10/2020 | |
| WO | WO-2020/199445 A1 | 10/2020 | |
| WO | WO-2020/226383 A1 | 11/2020 | |
| WO | WO-2020/261191 A1 | 12/2020 | |

OTHER PUBLICATIONS

Abraham, Michael H., et al. "Determination of molar refractions and Abraham descriptors for tris(acetylacetonato)chromium(III), tris(acetylacetonato)iron(III) and tris(acetylacetonato)cobalt(III)." New Journal of Chemistry 41.23 (2017): 14259-14265.
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Amat, Miguel A., et al. "Liquid-vapor equilibria and interfacial properties of -alkanes and perfluoroalkanes by molecular simulation." The Journal of chemical physics 132.11 (2010): 114704.
Aqra, Fathi, and Ahmed Ayyad. "Surface free energy of alkali and transition metal nanoparticles." Applied surface science 314 (2014): 308-313.
Baek, Jang-Yeol, et al. "New asymmetrical limb structured blue emitting material for OLED." Optical Materials Express 4.6 (2014): 1151-1158.
Baek, Seungin, et al. "74-2: Diffracted Image Retrieving with Deep Learning." SID Symposium Digest of Technical Papers. vol. 51. No. 1. 2020.
Balague, J., et al. "Synthesis of fluorinated telomers. Part 1. Telomerization of vinylidene fluoride with perfluoroalkyl iodides." Journal of Fluorine Chemistry 70.2 (1995): 215-223.
Bechtolsheim, C. V., V. Zaporojtchenko, and F. Faupel. "Interface structure and formation between gold and trimethylcyclohexane polycarbonate." Journal of materials research 14.9 (1999): 3538-3543.

Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.
Ben'kovskii, V.G., et al. "Density, surface tension and refractive index of aromatic hydrocarbons at low temperatures." Chemistry and Technology of Fuels and Oils 2.1 (1966): 23-26.
Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.
Casas-Solvas, Juan M., et al. "Synthesis of substituted pyrenes by indirect methods." Organic & Biomolecular Chemistry 12.2 (2014): 212-232.
Chambrier, Isabelle, et al. "Synthesis of Porphyrin-CdSe Quantum Dot Assemblies: Controlling Ligand Binding by Substituent Effects." Inorganic chemistry 54.15 (2015): 7368-7380.
Chang, Li, et al. "A smart surface with switchable wettability by an ionic liquid." Nanoscale?9.18 (2017): 5822-5827.
Chen, Hsiao-Fan, et al. "1,3,5-Triazine derivatives as new electron transport-type host materials for highly efficient green phosphorescent OLEDs." Journal of Materials Chemistry 19.43 (2009): 8112-8118.
Chen, Yu-Hung, et al. "58.2: High-Performance Large-Size OLED Tv with Ultra Hd Resolution." SID Symposium Digest of Technical Papers. vol. 46. No. 1. 2015.
Ching, Suet Ying. "Plasmonic properties of silver-based alloy thin films." (2015). Open Access Theses and Dissertations. 194.
Condorelli, Guglielmo G., et al. "Engineering of molecular architectures of β-diketonate precursors toward new advanced materials." Coordination chemistry reviews 251.13-14 (2007): 1931-1950.
Crowder, Gene A., et al. "Vapor pressures and triple point temperatures for several pure fluorocarbons." Journal of Chemical and Engineering Data 12.4 (1967): 481-485.
Cuny, Philippe, et al. "Phenanthrene degradation, emulsification and surface tension activities of a pseudomonas putida strain isolated from a coastal oil contaminated microbial mat." Ophelia, 58.3 (2004), 283-287.
Dalvi, Vishwanath H., Rossky, Peter J. "Molecular origins of fluorocarbon hydrophobicity." Proceedings of the National Academy of Sciences of the United States of America 107.31 (2010): 13603-13607.
Das, Prajwalita, et al. "Recent advancements in the synthesis of pentafluorosulfanyl (SF5)-containing heteroaromatic compounds." Tetrahedron Letters 58.52 (2017): 4803-4815.
David, Robert, Neumann, A. Wilhelm. "A Theory for the Surface Tensions and Contact Angles of HydrogenBonding Liquids." Langmuir 30.39 (2014): 11634-11639.
Dawood, Kamal M., et al. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. vol. 9270. SPIE, 2014.
Dikarev, Evgeny V., et al. "Heterometallic Bismuth-Transition Metal Homoleptic β-Diketonates." Journal of the American Chemical Society 127.17 (2005): 6156-6157.
Dolbier, William R. Jr., and Kanishchev, Oleksandr S. "Chapter One—SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.
Drake, Simon R., et al. "Lanthanide β-diketonate glyme complexes exhibiting unusual co-ordination modes." Journal of the Chemical Society, Dalton Transactions 15 (1993): 2379-2386.
Drelich, Jaroslaw, et al. "Hydrophilic and Superhydrophilic Surfaces and Materials." Soft Matter, 7.21 (2011): 9804-9828.
Dubrovskii, Vladimir. "Fundamentals of Nucleation Theory." Nucleation Theory and Growth of Nanostructures. Springer, Berlin, Heidelberg, 2014. 1-73.

(56) References Cited

OTHER PUBLICATIONS

Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols: A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Emerton, Neil, David Ren, and Tim Large. "28-1: Image Capture Through TFT Arrays." SID Symposium Digest of Technical Papers. vol. 51. No. 1. 2020.
Evers, Robert C. "Low glass transition temperature fluorocarbon ether bibenzoxazole polymers." Journal of Polymer Science: Polymer Chemistry Edition 16.11 (1978): 2833-2848.
Faupel, F., et al. "Nucleation, growth, interdiffusion, and adhesion of metal films on polymers." AIP Conference Proceedings. vol. 491. No. 1. American Institute of Physics, 1999.
Feng, Zhengyu, et al. "28-3: Pixel Design for Transparent MicroLED Display with Low Blurring." SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Foreign Search Report on PCT PCT/IB2020/051991 Dtd May 22, 2020.
Formica, Nadia, et al. "Ultrastable and Atomically Smooth Ultrathin Silver Films Grown on a Copper Seed Layer." ACS Applied Materials & Interfaces 5.8 (2013): 3048-3053.
Fowkes, Frederick M. "Attractive Forces at Interfaces." Industrial and Engineering Chemistry 56.12 (1964): 40-52.
Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness." Macromolecules 34.16 (2001): 5627-5634.
Fusella, Michael A., et al. "Plasmonic enhancement of stability and brightness in organic light-emitting devices." Nature 585.7825 (2020): 379-382.
Gao, Lichao, et al. "Teflon is Hydrophilic. Comments on Definitions of Hydrophobic, Shear versus Tensile Hydrophobicity, and Wettability Characterization." Langmuir 24.17 (2008): 9183-9188.
Garrick, Lloyd M. "Novel, New Aromatic SF 5 Derivatives: Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Golovin, Kevin, et al. "Low-interfacial toughness materials for effective large-scale deicing." Science 364.6438 (2019): 371-375.
Gray, Victor, et al. "Photophysical characterization of the 9,10-disubstituted anthracene chromophore and its applications in triplet-triplet annihilation photon upconversion." Journal of Materials Chemistry C 3.42 (2015): 11111-11121.
Green, Mark. "The nature of quantum dot capping ligands." Journal of Materials Chemistry 20.28 (2010): 5797-5809.
Grzyll, Lawrence R., et al. "Density, Viscosity, and Surface Tension of Liquid Quinoline, Naphthalene, Biphenyl, Decafluorobiphenyl, and 1,2-Diphenylbenzene from 300 to 400 C." Journal of Chemical & Engineering Data 41.3 (1996): 446-450.
Hammer, Nathan I., et al. "Quantum dots coordinated with conjugated organic ligands: new nanomaterials with novel photophysics." Nanoscale Research Letters 2.6 (2007): 282-290.
Han, Yoon Deok, et al. "Quantum dot and p-conjugated molecule hybrids: nanoscale luminescence and application to photoresponsive molecular electronics." NPG Asia Materials 6.6 (2014): e103-e103.
Heaney, James B. "Evaluation of commercially supplied silver coated Teflon for spacecraft temperature control usage." (1974).
Heinrich, Darina, et al. "Synthesis of Cyclopentadiene Ligands with Fluorinated Substituents by Reaction of Cobaltocene with Fluoroalkenes." European Journal of Inorganic Chemistry 2014.30 (2014): 5103-5106.
Herzog, Axel, et al. "A Perfluorinated Nanosphere: Synthesis and Structure of Perfluoro-deca-B-methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hoene, Joan Von, et al. "Thermal Decomposition of Metal Acetylacetonates: Mass Spectrometer Studies." The Journal of Physical Chemistry 62.9 (1958): 1098-1101.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hughes, Russell P., Trujillo, Hernando A. "Selective Solubility of Organometallic Complexes in Saturated Fluorocarbons. Synthesis of Cyclopentadienyl Ligands with Fluorinated Ponytails." Organometallics 15.1 (1996): 286-294.
Hyre, Ariel S., Doerrer, Linda H. "A structural and spectroscopic overview of molecular lanthanide complexes with fluorinated O-donor ligands." Coordination Chemistry Reviews 404 (2020): 213098.
Jain, Akash, et al. "Estimation of Melting Points of Organic Compounds." Industrial & engineering chemistry research 43.23 (2004): 7618-7621.
Jarvis N.L., Zisman W.A. "Surface Chemistry of Fluorochemicals." U.S. Naval Research Laboratory (NRL); Washington, DC, USA, 1965.
Jean G. Riess. "Understanding the Fundamentals of Perfluorocarbons and Perfluorocarbon Emulsions Relevant to In Vivo Oxygen Delivery." Artificial Cells, Blood Substitutes, and Biotechnology 33.1 (2005): 47-63.
Jiao, Zhiqiang, et al. "61-2: Weakening Micro-Cavity Effects in White Top-Emitting WOLEDs with Semitransparent Metal Top Electrode." SID Symposium Digest of Technical Papers. vol. 49. No. 1. 2018.
Joliton, Adrien, and Carreira, Erick M. "Ir-Catalyzed Preparation of SF5-Substituted Potassium Aryl Trifluoroborates via C—H Borylation and Their Application in the Suzuki-Miyaura Reaction." Organic Letters 15.20 (2013): 5147-5149.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.

(56) References Cited

OTHER PUBLICATIONS

Kim, Beomjin et al. "Synthesis and electroluminescence properties of highly efficient blue fluorescence emitters using dual core chromophores." Journal of Materials Chemistry C 1.3 (2013): 432-440.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays." SID Symposium Digest of Technical Papers. vol. 51. No. 1. 2020.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, Srdjan. Adhesion changes at metal-polymer interfaces: Study of the copper-(acrylonitrile-butadiene-styrene) system. Diss. Dissertation, Technische Universiteit Eindhoven, 2007.
Knight Jr., L. B., et al. "Unusual behavior of vaporized magnesium under low pressure conditions." The Journal of Physical Chemistry? 79.12 (1975): 1183-1190.
Koma, N. et al. "44.2: Novel Front-light System Using Fine-pitch Patterned OLED." SID Symposium Digest of Technical Papers, 39: 655-658. 2008.
Korich, Andrew L., and Iovine, Peter M. "Boroxine chemistry and applications: A perspective." Dalton Transactions 39.6 (2010): 1423-1431.
Kota, Arun K. et al. "The design and applications of superomniphobic surfaces." NPG Asia Materials 6.7 (2014): e109-e109.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance" Advances in Colloid and Interface Science 210 (2014): 65-71.
Kwak, Sang Woo, et al. "Synthesis and Electroluminescence Properties of 3-(Trifluoromethyl)phenyl-Substituted 9,10-Diarylanthracene Derivatives for Blue Organic Light-Emitting Diodes." Applied Sciences 7.11 (2017): 1109-1120.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."SID Symposium Digest of Technical Papers. vol. 46. No. 1. 2015.
Lee, Donggu, et al. "The influence of sequential ligand exchange and elimination on the performance of P3HT: CdSe quantum dot hybrid solar cells." Nanotechnology 26.46 (2015): 465401.
Li, Chong, et al. "Photocontrolled Intramolecular Charge/Energy Transfer and Fluorescence Switching of Tetraphenylethene-Dithienylethene-Perylenemonoimide Triad with Donor-Bridge-Acceptor Structure." Chem. Asian J., 9.1 (2014): 104-109.
Li, Lu, et al. "Fluorinated anthracene derivatives as deep-blue emitters and host materials for highly efficient organic light-emitting devices." RSC Advances 5.73 (2015): 59027-59036.
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, Yang, et al. "P-168: Top Emission WOLED for High Resolution OLED TV." SID Symposium Digest of Technical Papers. vol. 49. No. 1. 2018.
Lund, L. G., et al. "514. Phosphonitrilic derivatives. Part I. The preparation of cyclic and linear phosphonitrilic chlorides." Journal of the Chemical Society (Resumed) (1960): 2542-2547.
Maderna, A., et al. "The Syntheses of Amphiphilic Camouflaged Carboranes as Modules for Supramolecular Construction." J. Am. Chem. Soc. 123. 42 (2001): 10423-10424.
Maissel, Leon I., and Maurice H. Francombe. An introduction to thin films. CRC Press, 1973. pp. 61-83, 198, 199.
Malandrino, Graziella, et al. "New Thermally Stable and Highly Volatile Precursors for Lanthanum MOCVD: Synthesis and Characterization of Lanthanum β-Diketonate Glyme Complexes." Inorganic Chemistry 34.25 (1995): 6233-6234.
McDowell, Matthew, et al. "Semiconductor Nanocrystals Hybridized with Functional Ligands: New Composite Materials with Tunable Properties." Materials 3.1 (2010): 614-637.
McIntosh, Thomas J., et al. "Structure and Interactive Properties of Highly Fluorinated Phospholipid Bilayers." Biophysical Journal 71.4 (1996): 1853-1868.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by Ink Jet Printing. OLEDs World Summit, Sep. 2020.
Mishra, Shashank, Daniele, Stephane. "Metal-Organic Derivatives with Fluorinated Ligands as Precursors for Inorganic Nanomaterials." Chemical Reviews 115.16 (2015): 8379-8448.
Mittal, Kashmiri Lal, ed. "Metallized plastics 3: fundamental and applied aspects." Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Mucur, S.P., et al. "Conventional and inverted organic light emitting diodes based on bright green emmisive polyfluorene derivatives." Polymer 151.12 (2018): 101-107.
Murano, Sven, et al. "30.3: Invited Paper: AMOLED Manufacturing-Challenges and Solutions from a Material Makers Perspective." SID Symposium Digest of Technical Papers. vol. 45. No. 1. 2014.
Nakamura, Daiki, et al. "68-4: Top-emission OLED Kawara-type Multidisplay with Auxiliary Electrode." SID Symposium Digest of Technical Papers. vol. 49. No. 1. 2018.
Nittler, Laurent, et al. "Morphology study of small amounts of evaporated gold on polymers." Surface and interface analysis 44.8 (2012): 1072-1075.
Office Action for Chinese Application No. 202080032836.3 dated Jul. 11, 2022.
Official Action on JP 2021-552884 DTD Mar. 1, 2022.
Ohring, Milton. Materials science of thin films. Elsevier, 2001.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Pandharkar, Riddhish, et al. "A Computational Study of AlF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Peters, Richard D., et al. "Using Self-Assembled Monolayers Exposed to X-rays To Control the Wetting Behavior of Thin Films of Diblock Copolymers." Langmuir 16.10 (2000): 4625-4631.
Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.

(56) References Cited

OTHER PUBLICATIONS

Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.

Rokni-Fard, Mahroo, and Quanmin Guo. "Biased Ostwald ripening in site-selective growth of two-dimensional gold clusters." The Journal of Physical Chemistry C 122.14 (2018): 7801-7805.

Rumyantev, R.V., Fukin, G.K. "Intramolecular C—F Ln dative interactions in lanthanide complexes with fluorinated ligands." Russian Chemical Bulletin 66.9 (2017): 1557-1562.

Safonov, Alexey I., et al. "Deposition of thin composite films consisting of fluoropolymer and silver nanoparticles having surface plasmon resonance." Thin Solid Films 603 (2016): 313-316.

Sakka, Tetsuo, et al. "Surface tension of fluoroalkanes in a liquid phase." Journal of Fluorine Chemistry 126.3 (2005): 371-375.

Satulu, Veronica, et al. "Combining fluorinated polymers with Ag nanoparticles as a route to enhance optical properties of composite materials." Polymers 12.8 (2020): 1640.

Scharnberg, M., et al. "Radiotracer measurements as a sensitive tool for the detection of metal penetration in molecular-based organic electronics." Applied Physics Letters 86.2 (2005): 024104.

Schissel, Paul, and Alvin Warren Czanderna. "Reactions at the silver/polymer interface: a review." Solar Energy Materials 3.1-2 (1980): 225-245.

Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.

Senaweera, Sameera M., and Weaver, Jimmie D., "Selective Perfluoro- and Polyfluoroarylation of Meldrum's Acid". The Journal of Organic Chemistry 79.21 (2014): 10466-10476.

Shen, Mingmin, et al. "Destabilization of Ag nanoislands on Ag (100) by adsorbed sulfur." The Journal of chemical physics 135.15 (2011): 154701.

Shi, Shiming, et al. "56-1: Invited Paper: Research on Commercial Foldable AMOLED and Relevant Technologies." SID Symposium Digest of Technical Papers. vol. 51. No. 1. 2020.

Shin, Dong-Youn, and Inyoung Kim. "Self-patterning of fine metal electrodes by means of the formation of isolated silver nanoclusters embedded in polyaniline." Nanotechnology 20.41 (2009): 415301.

Shirasaki, Yasuhiro. Efficiency loss mechanisms in colloidal quantum-dot light-emitting diodes. Diss. Massachusetts Institute of Technology, 2013.

Smithson, Robert LW, Donald J. McClure, and D. Fennell Evans. "Effects of polymer substrate surface energy on nucleation and growth of evaporated gold films." Thin Solid Films 307.1-2 (1997): 110-112.

Snyder Jr., Carl E. "Structural Modifications of Fluoro-alkyl S-Triazines and Their Lubricant Properties." ASLE Transactions 14.3 (1971): 237-242.

Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.

Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.

Sonoda, Tohru, et al. "84-1: Invited Paper: 30-inch 4K Rollable OLED Display." SID Symposium Digest of Technical Papers. vol. 51. No. 1. 2020.

Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.

Spelt, J. K., Neumann, A. W. "Solid Surface Tension: The Equation of State Approach and the Theory of Surface Tension Components. Theoretical and Conceptual Considerations." Langmuir 3 (1987): 588-591.

Syafiq, A., et al. "Superhydrophilic Smart Coating for Self-Cleaning Application on Glass Substrate." Journal of Nanomaterials 2018 (2018).

Szab, Dnes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.

Tang, Quan, et al. "28-2: Study of the Image Blur through FFS LCD Panel Caused by Diffraction for Camera under Panel." SID Symposium Digest of Technical Papers. vol. 51. No. 1. 2020.

Tarasevich, Y. I. "Surface energy of oxides and silicates." Theoretical and Experimental Chemistry 42 (2006): 145-161.

Thran, A., et al. "Condensation coefficients of Ag on polymers." Physical review letters 82.9 (1999): 1903.

Thurston, John H., et al. "Toward a General Strategy for the Synthesis of Heterobimetallic Coordination Complexes for Use as Precursors to Metal Oxide Materials: Synthesis, Characterization, and Thermal Decomposition of Bi2(Hsal)6 M(Acac)3 (M = Al, Co, V, Fe, Cr)." Inorganic chemistry 43.10 (2004): 3299-3305.

Tsai, Yu-Hsiang, et al. "P-202: A Flexible Transparent OLED Display with FlexUPTM Technology." SID Symposium Digest of Technical Papers. vol. 48. No. 1. 2017.

Tsujioka, Tsuyoshi, and Kosuke Tsuji. "Metal-vapor deposition modulation on soft polymer surfaces." Applied Physics Express 5.2 (2012): 021601.

Tsujioka, Tsuyoshi, et al. "Selective metal deposition on photoswitchable molecular surfaces." Journal of the American Chemical Society 130.32 (2008): 10740-10747.

Tsujioka, Tsuyoshi, Rie Takagi, and Takahiro Shiozawa. "Light-controlled metal deposition on photochromic polymer films." Journal of Materials Chemistry?20.43 (2010): 9623-9627.

Umemoto, Teruo, et al. "Discovery of practical production processes for arylsulfur pentafluorides and their higher homologues, bis- and tris(sulfur pentafluorides): Beginning of a new era of 'super- trifluoromethyl' arene chemistry and its industry." Beilstein Journal of Organic Chemistry 8 (2012): 461-471.

Varagnolo, Silvia, et al. "Embedded-grid silver transparent electrodes fabricated by selective metal condensation." Journal of Materials Chemistry C?8.38 (2020): 13453-13457.

Varagnolo, Silvia, et al. "Selective deposition of silver and copper films by condensation coefficient modulation." Electronic Supplementary Material (ESI) for Materials Horizons. (2020).

Varagnolo, Silvia, et al. "Selective deposition of silver and copper films by condensation coefficient modulation." Materials Horizons 7.1 (2020): 143-148.

Vitos, Levente, et al. "The surface energy of metals." Surface science 411.1-2 (1998): 186-202.

Walker, Amy V., et al. "Dynamics of interaction of magnesium atoms on methoxy-terminated self- assembled monolayers: an example of a reactive metal with a low sticking probability." The Journal of Physical Chemistry C 111.2 (2007): 765-772.

Wang, Hailiang, et al. "P-132: An Under-Display Camera Optical Structure for Full-Screen LCD." SID Symposium Digest of Technical Papers. vol. 51. No. 1. 2020.

Wang, Zhibin, et al. "55-1: Invited Paper: Self-Assembled Cathode Patterning in AMOLED for Under-Display Camera." SID Symposium Digest of Technical Papers. vol. 51. No. 1. 2020.

Wang, Zhibin, et al. "60-5: Late-News Paper: 17-inch Transparent AMOLED Display with Self-Assembled Auxiliary Electrode." SID Symposium Digest of Technical Papers. vol. 50. No. 1. 2019.

Weimer, P. K. "Physics of Thin Films, vol. 2.". Academic Press, (1964).

Wolf, Florian F., et al. "Hydrogen-bonding cyclodiphosphazanes: superior effects of 3,5-(CF3)2-substitution in anion-recognition and counter-ion catalysis." New J. Chem., 42.7 (2018): 4854-4870.

Wolfgang Decker, Vast Films, Ltd. "Pattern Metallization: Selective Deposition of Metals on Polymer Films for Functional Applications" AIMCAL Fall Conference 2005.

Wu, Zhongyuan, et al. "34-2: Distinguished Paper: Development of 55inch 8K AMOLED TV by Inkjet Printing Process." SID Symposium Digest of Technical Papers. Vol. 51. No. 1. 2020.

Xia, Z. Y., et al. "High performance organic light-emitting diodes based on tetra(methoxy)-containing anthracene derivatives as a hole transport and electron-blocking layer." Journal of Materials Chemistry 20.38 (2010): 8382-8388.

(56) References Cited

OTHER PUBLICATIONS

Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, Pengyun, et al. "Superhydrophobic ceramic coating: Fabrication by solution precursor plasma spray and investigation of wetting behavior." Journal of Colloid and Interface Science 523 (2018): 35-44.
Yamada, Toshikazu, et al. "Nanoparticle chemisorption printing technique for conductive silver patterning with submicron resolution." Nature communications 7.1 (2016): 1-9.
Yang, Jun-Yu, et al. "32-3: AMOLED IR Drop Compensation for Channel Length Modulation." SID Symposium Digest of Technical Papers. vol. 51. No. 1. 2020.
Yeung, Leo W.Y., et al. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science?532 (2003): 300-305.
Zaporojtchenko, V., et al. "Determination of condensation coefficients of metals on polymer surfaces." Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianzhan, et al. "Bio-inspired superhydrophilic coatings with high anti-adhesion against mineral scales." NPG Asia Materials 10.3 (2018): e471-e471.
Zhang, Xuan, et al. "Synthesis of extended polycyclic aromatic hydrocarbons by oxidative tandem spirocyclization and 1, 2-aryl migration." Nature communications 8.1 (2017): 1-8.
Zhang, Zhenhua. "74-3: Image Deblurring of Camera Under Display by Deep Learning." SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Zheng, Dongxiao, et al. "Non-conjugated and p-conjugated functional ligands on semiconductor quantum dots." Composites Communications 11 (2019): 21-26.
Abroshan, H. et al. "66-3: Active Learning for the Design of Novel OLED Materials." SID Symposium Digest of Technical Papers. 53.1 (2022).
Bae, J. et al. "Optically recoverable, deep ultraviolet (UV) stable and transparent sol-gel fluoro siloxane hybrid material for a UV LEDencapsulant." RSC advances 6.32 (2016): 26826-26834.
Baradie, B. et al. "Synthesis and characterization of novel polysiloxane-grafted fluoropolymers." Canadian journal of chemistry 83.6-7 (2005): 553-558.
Bertolucci, M. et al. "Wetting Behavior of Films of New Fluorinated Styrene-Siloxane Block Copolymers." Macromolecules 37.10 (2004): 3666-3672.
Cai, J. et al. "P-13.10: A New Color Space Model for AMOLED Display Based on IR Drop" SID Symposium Digest of Technical Papers 54 (2023).
Chaiprasert, T. et al. "Vinyl-functionalized Janus ring siloxane: potential precursors to hybrid functional materials." Materials 14.8 (2021): 2014.
Chen, G. K. J., and J. Chen. "Flexible displays: Flexible AMOLED manufacturing." Handbook of Visual Display Technology; Chen, J., Cranton, W., Fihn, M., Eds (2016).
Cho, H.U. et al. "17-1: Invited Paper: Enhancement of Current Efficiency for OLED Devices Using Meta-Heuristic Algorithm." SID Symposium Digest of Technical Papers. 52.1 (2021).
Choi, B. K. et al. "48-1: Invited Paper: Next Generation Highly Efficient and Stable Phosphorescent Emitting Materials For OLEDs." SID Symposium Digest of Technical Papers 51.1 (2020).
Dash, P. and Y. C.H. "How much battery does dark mode save? An accurate OLED display power profiler for modern smartphones." Proceedings of the 19th Annual International Conference on Mobile Systems, Applications, and Services (2021).
Ito, Hitoshi, et al. "Synthesis and Thermal Properties of Fully Aromatic Polysilarylenesiloxanes." Polymer Journal 38.2 (2006): 109-116.
Jang, Sang Eok, et al. "Thermally stable fluorescent blue organic light-emitting diodes using spirobifluorene based anthracene host materials with different substitution position." Synthetic metals 160.11-12 (2010): 1184-1188.
Jin, Y. et al. "Two-Tier Ensemble Deep Learning Model for Anomaly Detection in OLED Encapsulation Process" The 21st International Meeting on Information Display, Seoul, Korea (2021).
Jung, W. et al. "High-precision laser glass cutting for future display" Journal of the Society for Information Display 30.5 (2022): 462-470.
Kaesler, K., "The hidden defenders : Silane and siloxane impregnation protects construction materials", European coatings journal, 3 (2006):36-41.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, J. et al. "Design of Stable Blue Phosphorescent OLEDs Using State Interaction between Exciplex and Component Host" The 21st International Meeting on Information Display, Seoul, Korea (2021).
Kim, Kyu-Sung, et al. "Blue light-emitting OLED using new spiro [fluorene-7, 9'-benzofluorene] host and dopant materials." Organic Electronics 9.5 (2008): 797-804.
Kim, S et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).

(56) References Cited

OTHER PUBLICATIONS

Kim, S. et al. "Autonomous Materials Design for More Efficient OLED Devices using Machine Learning" The 21st International Meeting on Information Display, Seoul, Korea (2021).
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, S. et al. "20-2: High Efficiency and Long Device Lifetime Green Organic Light Emitting Diodes using a Pt Complex." SID Symposium Digest of Technical Papers 51.1 (2020).
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Liu, F. et al. "Syntheses and structure of the first eight-membered fluoro and chloro hafnium siloxane complexes" Zeitschrift für anorganische und allgemeine Chemie 622.5 (1996): 819-822.
Lysien, M. et al. "55-1: Deposition of Conductive and Insulating Materials at Micrometer Scale for Display-Component Prototyping." SID Symposium Digest of Technical Papers 53.1 (2022).
Mackus, A.J.M. et al. "From the bottom-up: toward area-selective atomic layer deposition with high selectivity" Chemistry of Materials 31.1 (2018): 2-12.
Marzari, N. et al. "Electronic-structure methods for materials design." Nature materials 20.6 (2021): 736-749.
Oka, M. and Satoshi, H. "Synthesis of photoresponsive cyclic poly (dimethyl siloxane) s from monodisperse linear precursors" Reactive and functional polymers 158 (2021): 104800.
Owen, M. J. "A review of significant directions in fluorosiloxane coatings" Surface Coatings International Part B: Coatings Transactions 87:B2 (2004).
Sanju, K. S. "Synthesis of Organic Systems and Study of their Light Emitting Properties in Solution and Polymer Matrix." Chapter 1. https://shodhganga.inflibnet.ac.in/bitstream/10603/106813/8/08_chapter%201.pdf.
Shen, Wen-Jian, et al. "Spirobifluorene-linked bisanthracene: An efficient blue emitter with pronounced thermal stability." Chemistry of materials 16.5 (2004): 930-934.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Tokuchi. S et al. "8-4: Oxide Semiconductor In—Zn—O—X system with High Electron Mobility." SID Symposium Digest of Technical Papers 54.1 (2023).
Töpper, T. et al. "Siloxane-based thin films for biomimetic low-voltage dielectric actuators." Sensors and Actuators A: Physical 233 (2015): 32-41.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Wang, J. et al. "A new fluorinated polysiloxane with good optical properties and low dielectric constant at high frequency based on easily available tetraethoxysilane (TEOS)." Macromolecules 50.23 (2017): 9394-9402.
Winget, P. et al. "57-1: Accelerating Next-Generation Display Materials Development with a Smart Digital Chemistry Platform." SID Symposium Digest of Technical Papers 54.1 (2023).
Wu, Y. et al. "P-13.5: Investigation on Chromatic Dispersion of Reflection for CFOT Display" SID Symposium Digest of Technical Papers 54 (2023).
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yang, J. et al. "25-4: Methodology and Correlation of AI-Based Design for OLED Materials." SID Symposium Digest of Technical Papers 52.1 (2021).
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yoo, D. et al. "Retrosynthesis Planning for Thermally Activated Delayed Fluorescence Molecules" The 21st International Meeting on Information Display, Seoul, Korea (2021).
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zhu, C. et al. "A novel synthetic UV-curable fluorinated siloxane resin for low surface energy coating." Polymers 10.9 (2018): 979.

\* cited by examiner

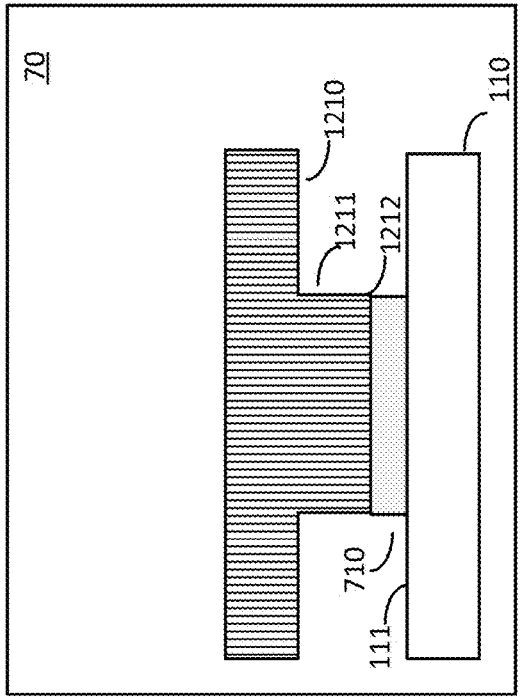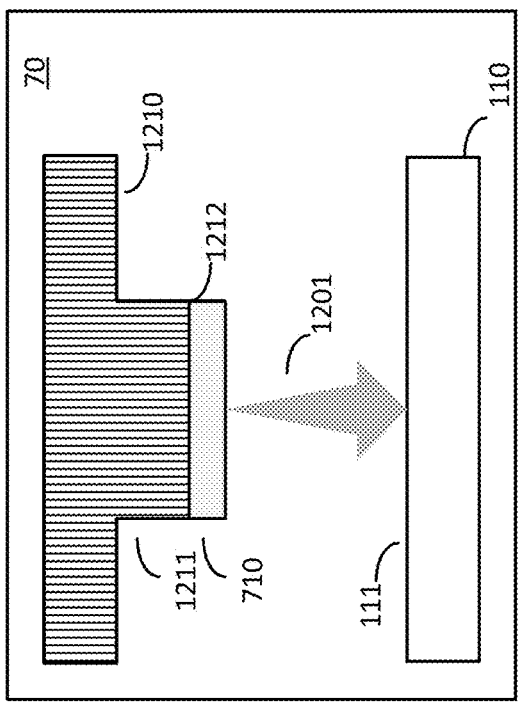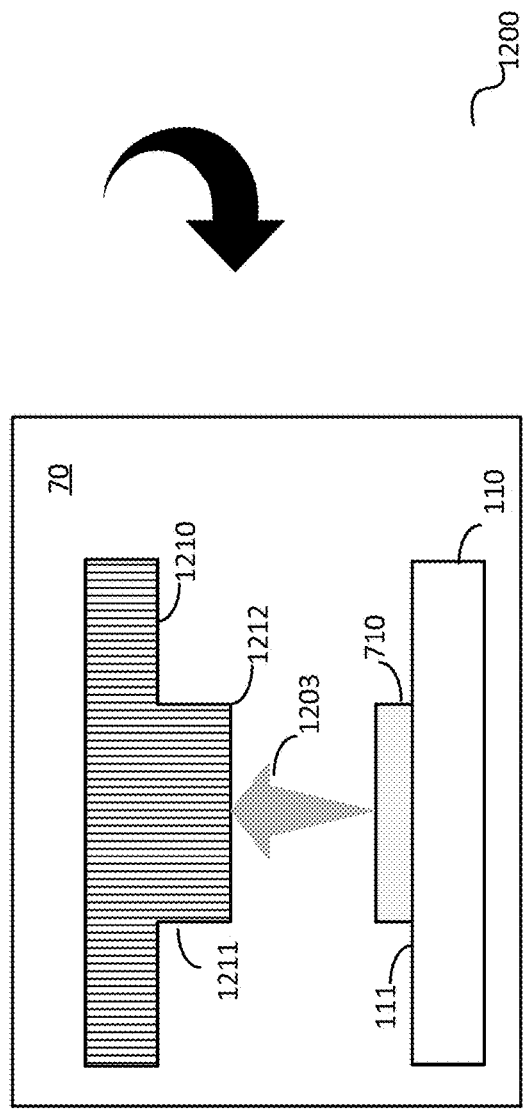
FIG. 12A
FIG. 12B
FIG. 12C

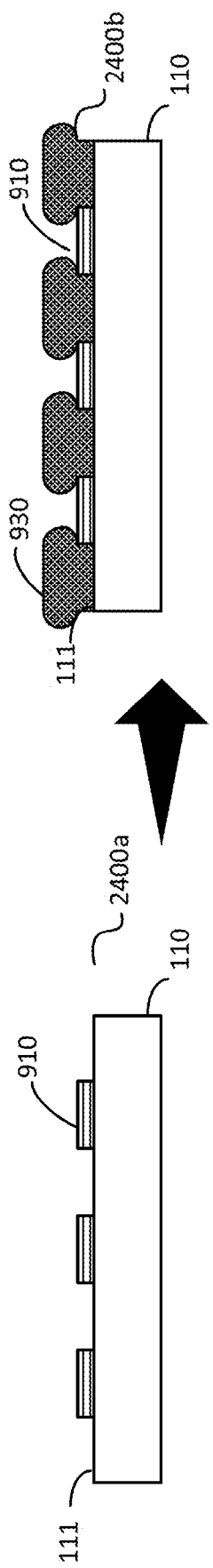
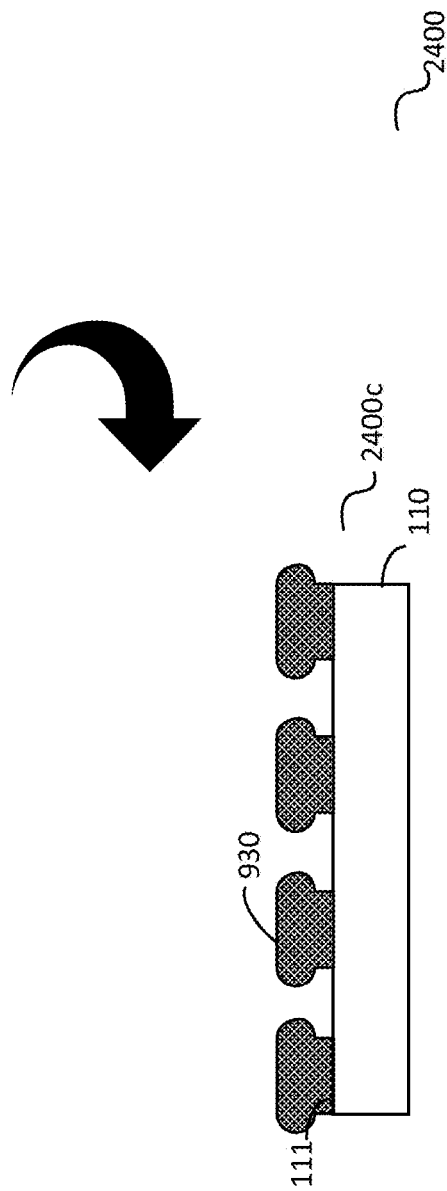
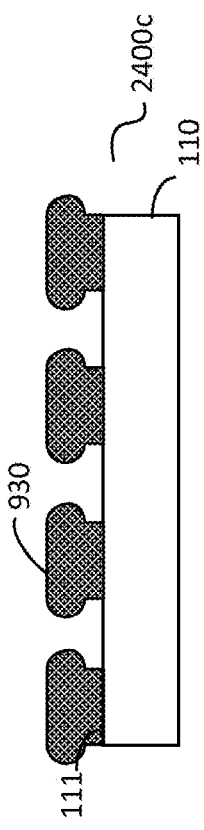
FIG. 24A
FIG. 24B
FIG. 24C

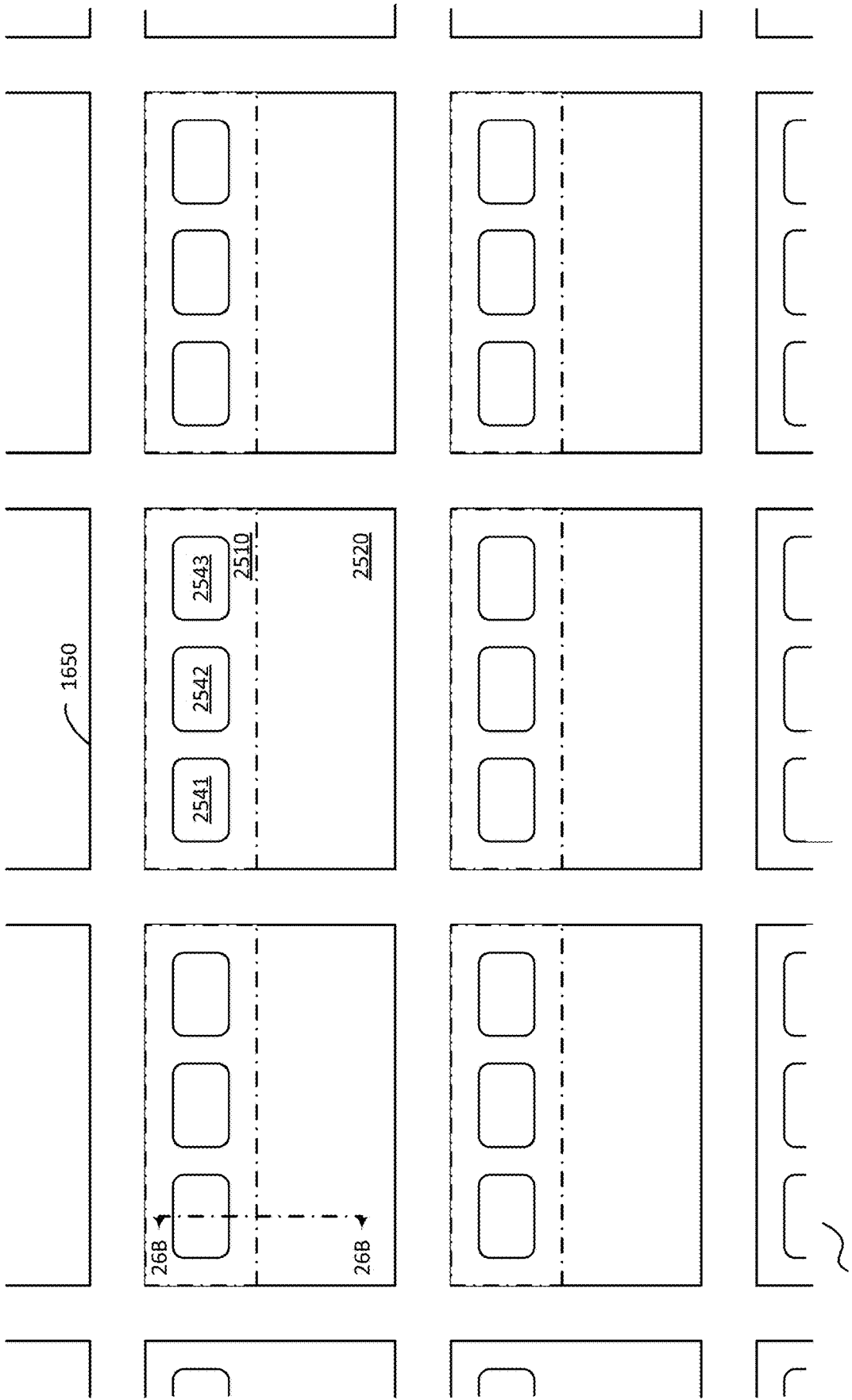

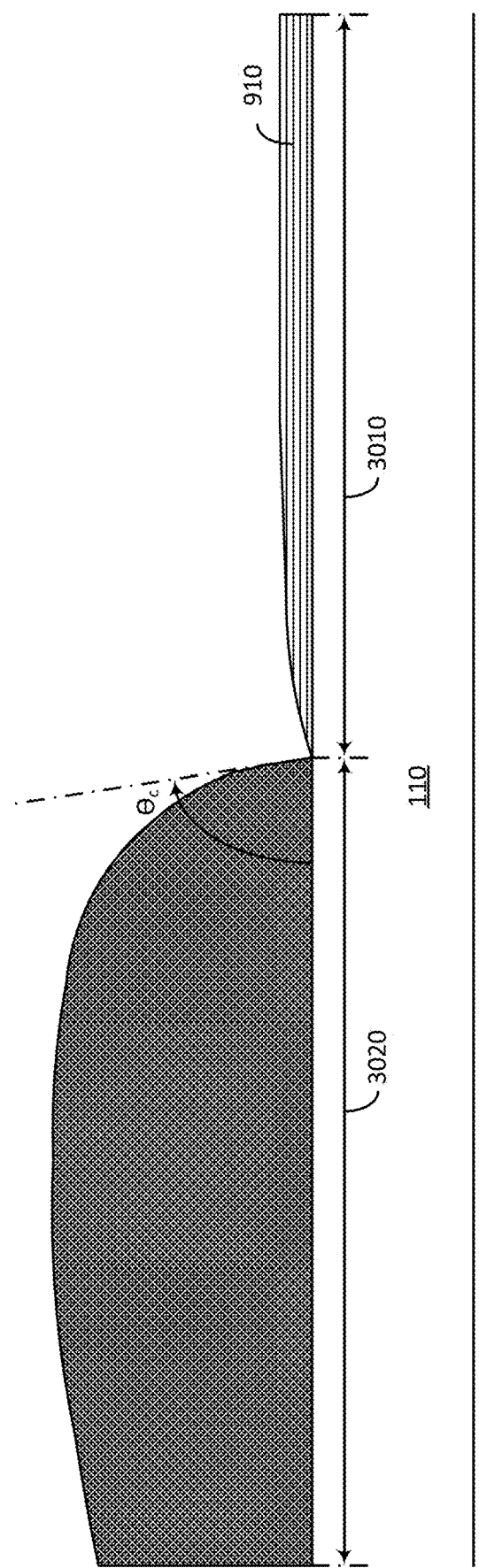

MATERIALS FOR FORMING A NUCLEATION-INHIBITING COATING AND DEVICES INCORPORATING SAME

RELATED APPLICATIONS

This application is a continuation application of U.S. application Ser. No. 17/436,562, filed Sep. 3, 2021, which is a U.S. National Stage Application under 35 U.S.C. § 371 of International Application No. PCT/IB2020/051991, filed Mar. 7, 2020, which claims the benefit of priority to U.S. Provisional Application No. 62/815,267 filed Mar. 7, 2019, U.S. Provisional Application No. 62/822,715 filed Mar. 22, 2019, and U.S. Provisional Application No. 62/830,338 filed Apr. 5, 2019, the contents of each of which are incorporated herein by reference in their entirety.

TECHNICAL FIELD

The present disclosure relates to opto-electronic devices and in particular a nucleation-inhibiting coating and devices incorporating same for use on such devices.

BACKGROUND

In an opto-electronic device such as an organic light emitting diode (OLED), at least one semiconducting layer is disposed between a pair of electrodes, such as an anode and a cathode. The anode and cathode are electrically coupled to a power source and respectively generate holes and electrons that migrate toward each other through the at least one semiconducting layer. When a pair of holes and electrons combine, a photon may be emitted.

OLED display panels may comprise a plurality of pixels (and/or sub-pixel(s) 2541-2543 thereof), each of which has an associated pair of electrodes, which are typically formed by deposition of a conductive coating on an exposed surface of an underlying material under vacuum conditions. In some applications, it may be desirable to provide a patterned electrode for each pixel and/or sub-pixel in the OLED manufacturing process.

One method for doing so involves the interposition of a fine metal mask (FMM) during deposition of the conductive coating. However, the conductive coating deposition process occurs at high temperature, which impacts the ability to re-use the FMM and/or the accuracy of the pattern that may be achieved, with attendant increases in cost, effort and complexity.

One method for doing so involves depositing the conductive coating and thereafter removing, including by a laser drilling process, unwanted regions thereof to form the pattern. However, the removal process often involves the creation and/or presence of debris, which may affect the yield of the manufacturing process.

It would be beneficial to provide an improved mechanism for providing a patterned deposition of a conductive coating.

BRIEF DESCRIPTION OF THE DRAWINGS

Examples of the present disclosure will now be described by reference to the following figures, in which identical reference numerals in different figures indicate identical elements and in which:

FIGS. 12A-12C are schematic diagrams that show example stages of an example process for depositing a selective coating in a pattern on an exposed surface in a printing process, according to an example in the present disclosure;

FIGS. 24A-24C are schematic diagrams that show example stages of an example process for depositing a conductive coating in a pattern on an exposed surface by selective deposition and subsequent removal process, according to an example in the present disclosure;

FIG. 26A is a schematic diagram illustrating, in plan view, an example of a transparent electro-luminescent device comprising at least one example pixel region and at least one example light-transmissive region according to an example in the present disclosure;

FIGS. 30A-30I are schematic diagrams that show various potential behaviours of an NIC at a deposition interface with a conductive coating according to an example in the present disclosure;

Figure 1:
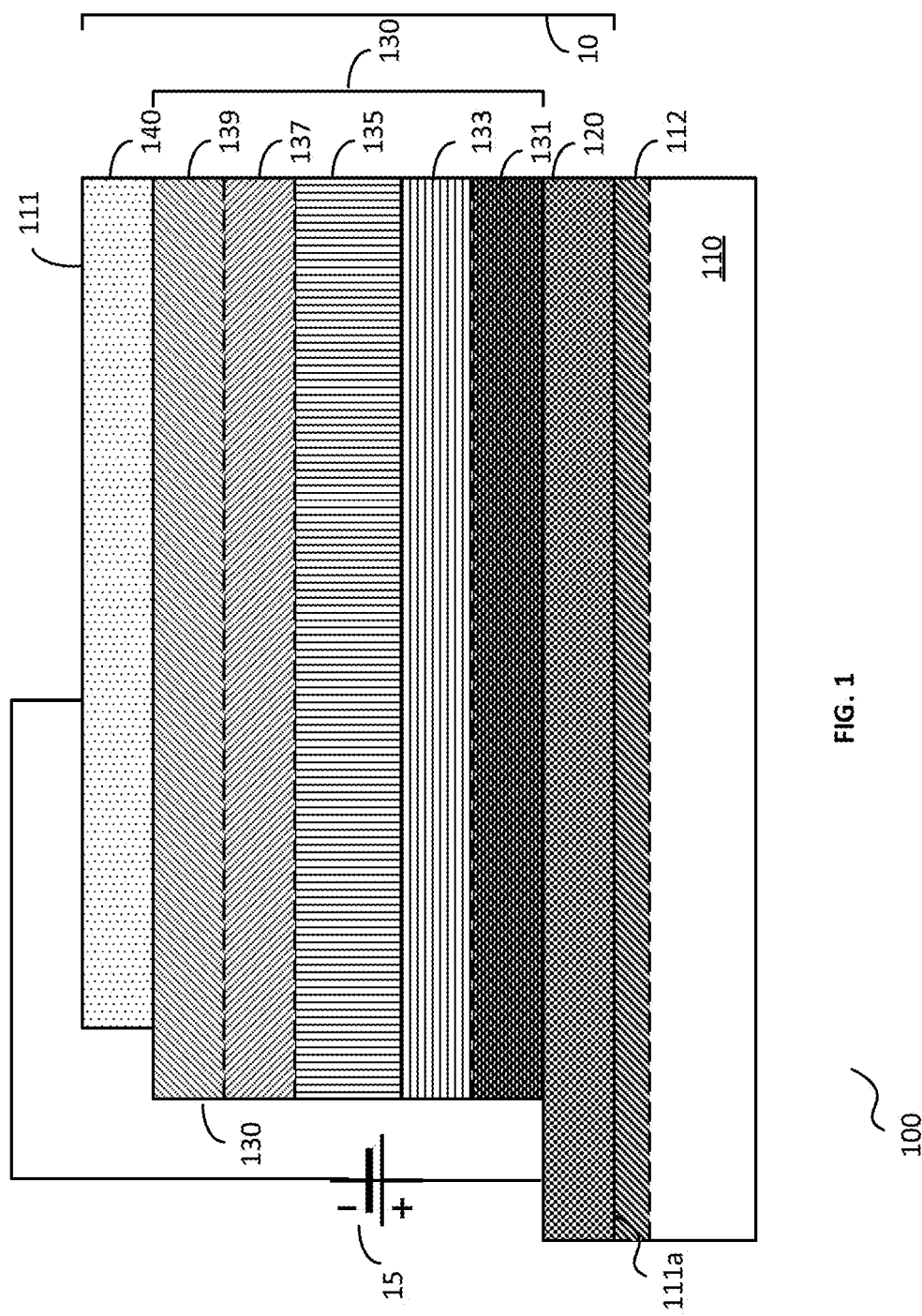
FIG. 1 is a block diagram from a cross-sectional aspect, of an example electro-luminescent device according to an example in the present disclosure.

In the present disclosure, for purposes of explanation and not limitation, specific details are set forth in order to provide a thorough understanding of the present disclosure, including, without limitation, particular architectures, interfaces and/or techniques. In some instances, detailed descriptions of well-known systems, technologies, components, devices, circuits, methods and applications are omitted so as not to obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, so as not to obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses a nucleation inhibiting coating (NIC) that may be selectively disposed, in a manufacturing process for manufacturing an opto-electronic device, on a surface thereof in a first portion of a lateral aspect thereof, that, relative to a given material for forming a conductive coating, has a surface having an initial sticking probability $S_0$ that is substantially less than the initial sticking probability $S_0$ of the surface. Accordingly, when the conductive coating is deposited on the surface of the device, including in an open-mask and/or mask-free deposition process, the conductive coating tends not to remain within the first portion, while the conductive coating tends to remain within a second portion of the lateral aspect of the surface. In some non-limiting examples, the NIC may be selectively deposited within the first portion by using a fine metal mask (FMM). Because the NIC may be deposited at a temperature that is substantially lower than that at which the conductive coating may be deposited, the FMM may be re-used and/or an accurate pattern of deposited conductive coating may be achieved, with attendant reduction of cost and effort.

In some non-limiting examples, the NIC may comprise a compound having a formula selected from a group consisting of Formulae (I), (II)<(III), (IV), (V), (VI), (VII), and (VIII):

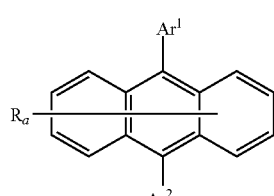

Formula (I)

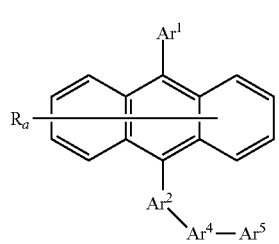

Formula (II)

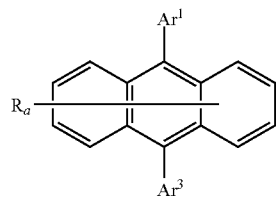

Formula (III)

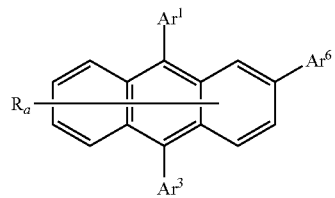

Formula (IV)

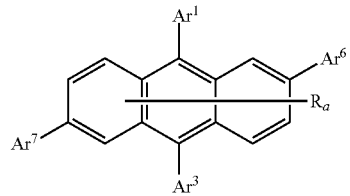

Formula (V)

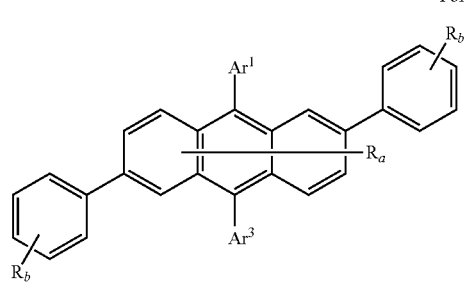

Formula (VI)

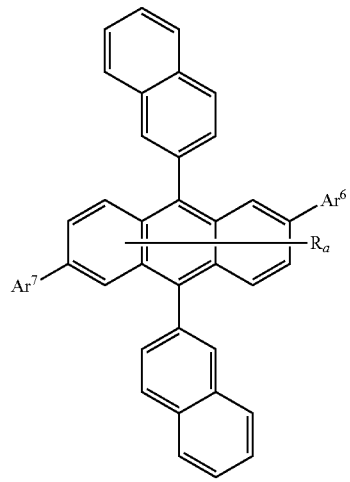

Formula (VII)

Formula (VIII)

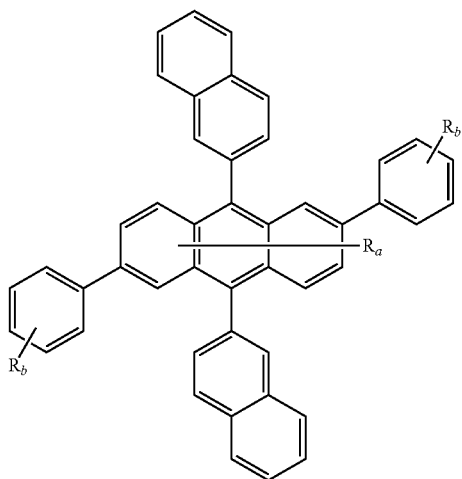

According to a broad aspect of the present disclosure, there is disclosed an opto-electronic device comprising a nucleation inhibiting coating (NIC) disposed on a surface of the device in a first portion of a lateral aspect thereof; a conductive coating disposed on a surface of the device in a second portion of the lateral aspect thereof; wherein an initial sticking probability of the conductive coating is substantially less for the NIC than for the surface in the first portion, such that the first portion is substantially devoid of the conductive coating; and wherein the NIC comprises a compound having a formula selected from a group consisting of Formulae (I), (II) (III) (IV), (V), (VI), (VII) and (VIII):

Formula (I)

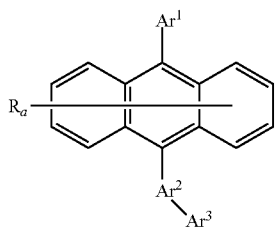

Formula (II)

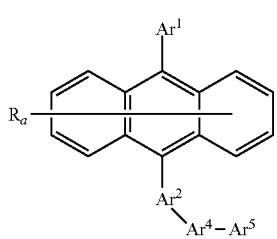

Formula (III)

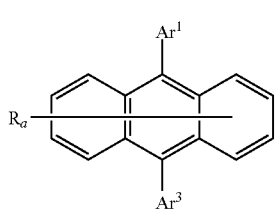

Formula (IV)

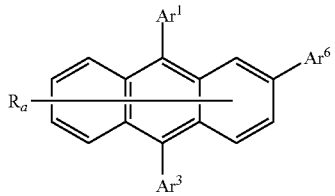

Formula (V)

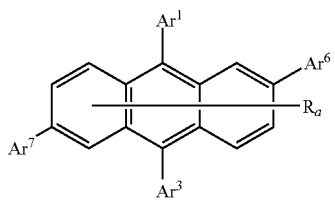

Formula (VI)

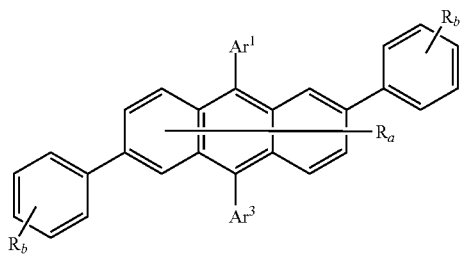

Formula (VII)

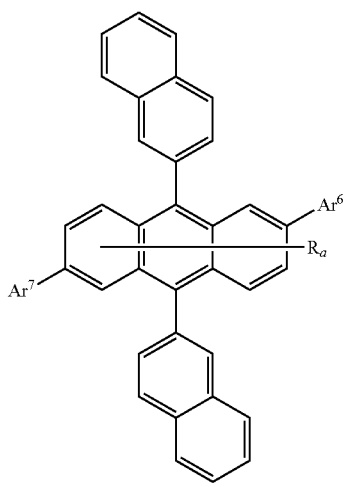

-continued

Formula (VIII)

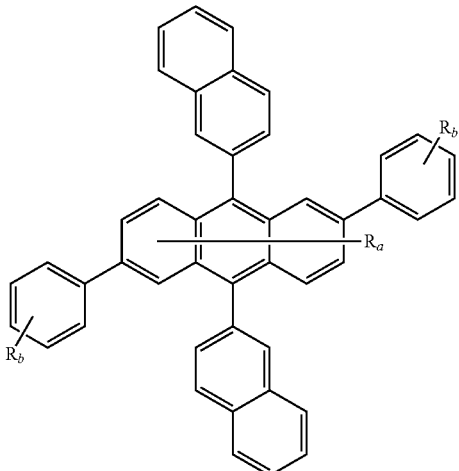

Examples have been described above in conjunctions with aspects of the present disclosure upon which they can be implemented. Those skilled in the art will appreciate that examples may be implemented in conjunction with the aspect with which they are described, but may also be implemented with other examples of that or another aspect. When examples are mutually exclusive, or are otherwise incompatible with each other, it will be apparent to those having ordinary skill in the relevant art. Some examples may be described in relation to one aspect, but may also be applicable to other aspects, as will be apparent to those having ordinary skill in the relevant art.

Some aspects or examples of the present disclosure may provide an NIC and an opto-electronic device having such NIC selectively deposited therewithin.

DESCRIPTION

Electro-Luminescent Device

The present disclosure relates generally to electronic devices, and more specifically, to opto-electronic devices. An opto-electronic device generally encompasses any device that converts electrical signals into photons and vice versa.

In the present disclosure, the terms "photon" and "light" may be used interchangeably to refer to similar concepts.

In the present disclosure, photons may have a wavelength that lies in the visible light spectrum, in the infrared (IR) and/or ultraviolet (UV) region thereof.

An organic opto-electronic device can encompass any opto-electronic device where one or more active layers thereof are formed primarily of an organic material, and more specifically, an organic semiconductor material.

In the present disclosure, it will be appreciated by those having ordinary skill in the relevant art that an organic material, may comprise, without limitation, a wide variety of organic (carbon-containing) molecules, and/or organic polymers, including without limitation, those described in PCT Publication No. WO 2012/017074. Further, it will be appreciated by those having ordinary skill in the relevant art that organic materials that are doped with various inorganic substances, including without limitation, elements and/or inorganic compounds, may still be considered to be organic materials. Still further, it will be appreciated by those having ordinary skill in the relevant art that various organic materials may be used, and that the processes described herein are generally applicable to an entire range of such organic materials.

In the present disclosure, an inorganic substance may refer to a substance that primarily includes an inorganic material. In the present disclosure, an inorganic material may comprise any material that is not considered to be an organic material, including without limitation, metals, glasses and/or minerals.

Where the opto-electronic device emits photons through a luminescent process, the device may be considered an electro-luminescent device. In some non-limiting examples, the electro-luminescent device may be an organic light-emitting diode (LED) (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor and/or a television set.

In some non-limiting examples, the electro-luminescent device may be an organic photo-voltaic (OPV) device that converts solar energy into photons. In some non-limiting examples, the electro-luminescent device may be an electro-luminescent quantum dot device. In the present disclosure, unless specifically indicated to the contrary, reference will be made to OLED electro-luminescent devices, with the understanding that such disclosure could, in some examples, equally be made applicable to other electro-luminescent devices, including without limitation, an OPV and/or quantum dot device in a manner apparent to those having ordinary skill in the relevant art.

The structure of such electro-luminescent devices will be described from each of two aspects, namely from a cross-sectional aspect and/or from a lateral (plan view) aspect.

In the context of introducing the cross-sectional aspect below, the components of such electro-luminescent devices are shown in substantially planar lateral strata. Those having ordinary skill in the relevant art will appreciate that such substantially planar representation is for purposes of illustration only, and that across a lateral extent of such a device, there may be localized substantially planar strata of different thicknesses and dimension, including, in some non-limiting examples, the substantially complete absence of a layer or stratum, and/or layer(s) and/or strata separated by non-planar transition regions (including lateral gaps and even discontinuities). Thus, while for illustrative purposes, the electro-luminescent device is shown below in its cross-sectional aspect as a substantially stratified structure, in the plan view aspect discussed below, such device may illustrate a diverse topography to define features, each of which may substantially exhibit the stratified profile discussed in the cross-sectional aspect.

Cross-Sectional Aspect

FIG. 1 is a simplified block diagram from a cross-sectional aspect, of an example electro-luminescent device according to the present disclosure. The electro-luminescent device, shown generally at 100 comprises, a substrate 110, upon which a frontplane 10, comprising a plurality of layers, respectively, a first electrode 120, an organic layer 130, and a second electrode 140, are disposed. In some non-limiting examples, a barrier coating 1550 (FIG. 15C) may be provided to surround and/or encapsulate the layers 120, 130, 140 and/or the substrate 110 disposed thereon.

For purposes of illustration, an exposed layer of underlying material is referred to as 111. In FIG. 1, the exposed layer 111 is shown as being of the second electrode 140. Those having ordinary skill in the relevant art will appreciate that, at the time of deposition of, by way of non-limiting example, the first electrode 120, the exposed layer would have been shown as 111a, of the substrate 110.

In the present disclosure, a directional convention is followed, extending substantially normally relative to the lateral aspect described above, in which the substrate 110 is considered to be the "bottom" of the electro-luminescent device 100, and the layers 120, 130, 140 are disposed on "top" of the substrate 11. Following such convention, the second electrode 140 is at the top of the electro-luminescent device 100 shown, even if (as may be the case in some examples, including without limitation, during a manufacturing process, in which one or more layers 120, 130, 140 may be introduced by means of a vapor deposition process), the substrate 110 is physically inverted such that the top surface, on which one of the layers 120, 130, 140, such as, without limitation, the first electrode 120, is to be disposed, is physically below the substrate 110, so as to allow the deposition material (not shown) to move upward and be deposited upon the top surface thereof as a thin film.

In some non-limiting examples, the device 100 may be electrically coupled to a power source 15. When so coupled, the device 100 may emit photons as described herein.

In some non-limiting examples, the device 100 may be classified according to a direction of emission of photons therefrom. In some non-limiting examples, the device 100 may be considered to be a bottom-emission device if the photons generated are emitted in a direction toward and through the substrate 100 at the bottom of the device 100 and away from the layers 120, 130, 140 disposed on top of the substrate 110. In some non-limiting examples, the device 100 may be considered to be a top-emission device if the photons are emitted in a direction away from the substrate 110 at the bottom of the device 100 and toward and/or through the top layer 140 disposed, with intermediate layers 120, 130, on top of the substrate 110. In some non-limiting examples, the device 100 may be considered to be a double-sided emission device if it is configured to emit photons in both the bottom (toward and through the substrate 110) and top (toward and through the top layer 140).

Thin Film Formation

The frontplane 10 layers 120, 130, 140 may be disposed in turn on top of a target exposed surface 111 (and/or, in some non-limiting examples, including without limitation, in the case of selective deposition disclosed herein, at least one target region of such surface) of an underlying material, which in some non-limiting examples, may be, from time to time, the substrate 110 and intervening lower layers 120, 130, 140, as a thin film. In some non-limiting examples, an electrode 120, 140 may be formed of at least one thin film conductive coating 930 (FIG. 9) layer.

The thickness of each layer 120, 130, 140, and of the substrate 110, shown in FIG. 1 is illustrative only and not necessarily representative of a thickness relative to another layer 120, 130, 140 (and/or of the substrate 110).

The formation of thin films during vapor deposition on an exposed surface 111 of an underlying material involves processes of nucleation and growth. During initial stages of film formation, a sufficient number of vapor monomers (e.g. atoms and/or molecules) typically condense from a vapor phase to form initial nuclei on the surface 111 presented, whether of the substrate 110 (or of an intervening lower layer 120, 130, 140). As vapor monomers continue to impinge on such surface, a size and density of these initial nuclei increase to form small clusters or islands. After reaching a saturation island density, adjacent islands typically will start to coalesce, increasing an average island size, while decreasing an island density. Coalescence of adjacent islands may continue until a substantially closed film is formed.

There may be at least three basic growth modes for the formation of thin films: 1) island (Volmer-Weber), 2) layer-by-layer (Frank-van der Merwe), and 3) Stranski-Krastanov. Island growth typically occurs when stale clusters of monomers nucleate on a surface and grow to form discrete islands. This growth mode occurs when the interactions between the monomers is stringer than that between the monomers and the surface.

The nucleation rate describes how many nuclei of a given size (where the free energy does not push a cluster of such nuclei to either grow or shrink) ("critical nuclei") form on a surface per unit time. During initial stages of film formation, it is unlikely that nuclei will grow from direct impingement of monomers on the surface, since the density of nuclei is low, and thus the nuclei cover a relatively small fraction of the surface (e.g. there are large gaps/spaces between neighboring nuclei). Therefore, the rate at which critical nuclei grow typically depends on the rate at which adsorbed monomers (e.g. adatoms) on the surface migrate and attach to nearby nuclei.

After adsorption of an adatom on a surface, the adatom may either desorb from the surface, or may migrate some distance on the surface before either desorbing, interacting with other adatoms to form a small cluster, or attach to a growing nucleus. An average amount of time that an adatom remains on the surface after initial adsorption is given by:

$$\tau_s = \frac{1}{\nu}\exp\left(\frac{E_{des}}{kT}\right)$$

In the above equation, v is a vibrational frequency of the adatom on the surface, k is the Botzmann constant, T is temperature, and $E_{des}$ 631 (FIG. 6) is an energy involved to desorb the adatom from the surface. From this equation it is noted that the lower the value of $E_{des}$ 631 the easier it is for the adatom to desorb from the surface, and hence the shorter the time the adatom will remain on the surface. A mean distance an adatom can diffuse is given by, $$X = a_0 \exp\left(\frac{E_{des} - E_s}{2kT}\right)$$

where $a_0$ is a lattice constant and $E_s$ 621 (FIG. 6) is an activation energy for surface diffusion. For low values of and/or high values of the adatom will diffuse a shorter distance before desorbing, and hence is less likely to attach to growing nuclei or interact with another adatom or cluster of adatoms.

During initial stages of film formation, adsorbed adatoms may interact to form clusters, with a critical concentration of clusters per unit area being given by, $$\frac{N_i}{n_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{N}R\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = a_0^2 \exp\left(\frac{E_{des} - E_s}{kT}\right)$$

The critical nucleation rate is thus given by the combination of the above equations:

$$\dot{N}_i = \dot{R}a_0^2 n_0 \left(\frac{\dot{R}}{vn_0}\right) \exp\left(\frac{(i+1)E_{des} - E_s + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, or are subjected to vapor impingement rates.

Sites of substrate heterogeneities, such as defects, ledges or step edges, may increase $E_{des}$ 631, to a higher density of nuclei observed at such sites. Also, impurities or contamination on a surface may also increase $E_{des}$ 631, leading to a higher density of nuclei. For vapor deposition processes, conducted under high vacuum conditions, the type and density of contaminates on a surface is affected by a vacuum pressure and a composition of residual gases that make up that pressure.

Under high vacuum conditions, a flux of molecules that impinge on a surface (per $cm^2$-sec) is given by:

$$\phi = 3.513 \times 10^{22} \frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ 631 and hence a higher density of nuclei.

While the present disclosure discusses thin film formation, in reference to at least one layer or coating, in terms of vapor deposition, those having ordinary skill in the relevant art will appreciate that, in some non-limiting examples, various components of the electro-luminescent device 100 may be selectively deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), physical vapor deposition (PVD) (including without limitation, sputtering), chemical vapor deposition (CVD (including without limitation, plasma-enhanced CVD (PECVD), organic vapor phase deposition (OVPD), laser annealing, laser-induced thermal imaging (LITI) patterning, atomic-layer deposition (ALD), coating (including without limitation, spin coating, dip coating, line coating and/or spray coating) and/or combinations thereof. Such processes may be used in combination with a shadow mask, which may, in some non-limiting examples, be an open mask and/or fine metal mask (FMM), during deposition of any of various layers and/or coatings to achieve various patterns by masking and/or precluding deposition of a deposited material on certain portions of a surface of an underlying material exposed thereto.

In the present disclosure, the terms "evaporation" and/or "sublimation" may be used interchangeably to refer generally to deposition processes in which a source material is converted into a vapor, including without limitation by heating, to be deposited onto a target surface (and/or target region(s) and/or portion(s) thereof) in, without limitation, a solid state. As will be understood, an evaporation process is a type of PVD process where one or more source materials are evaporated or sublimed under a low pressure (including without limitation, a vacuum) environment and deposited on a target surface (and/or target region(s) and/or portion(s) thereof) through de-sublimation of the one or more evaporated source materials. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source) and/or any other type of evaporation source.

In some non-limiting examples, a deposition source material may be a mixture and/or a compound. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness of a material, irrespective of the mechanism of deposition thereof, refers to an amount of the material deposited on a target exposed surface 111 (and/or target region(s) and/or portion(s) thereof), which corresponds to an amount of the material to cover the target surface (and/or target region(s) and/or portion(s) thereof) with a uniformly thick layer of the material having the referenced layer thickness. By way of non-limiting example, depositing a layer thickness of 10 nm of material indicates that an amount of the material deposited on the surface corresponds to an amount of the material to form a uniformly thick layer of the material that is 10 nm thick. It will be appreciated that, having regard to the mechanism by which thin films are formed discussed above, by way of non-limiting example, due to possible stacking or clustering of monomers (including without limitation, atoms and/or molecules), an actual thickness of the deposited material may be non-uniform. By way of non-limiting example, depositing a layer thickness of 10 nm may yield some portions of the deposited material having an actual thickness greater than 10 nm, or other portions of the deposited material having an actual thickness less than 10 nm. A certain layer thickness of a material deposited on a surface may thus correspond, in some non-limiting examples, to an average thickness of the deposited material across the target surface (and/or target region(s) thereof.

In the present disclosure, a reference to depositing a number X of monolayers of material refers to depositing an amount of the material to cover a desired area of an exposed surface 111 with X single layer of constituent molecules and/or atoms of the material. In the present disclosure, a reference to depositing a fraction 0.X monolayer of a material refers to depositing an amount of the material to cover a fraction 0.X of a desired area of a surface with a single layer of constituent molecules and/or atoms of the material. Those having ordinary skill in the relevant art will appreciate that due to, by way of non-limiting example, possible stacking and/or clustering of molecules and/or atoms, an actual local thickness of a deposited material across a desired area of a surface may be non-uniform. By way of non-limiting example, depositing 1 monolayer of a material may result in some local regions of the desired area of the surface being uncovered by the material, while other local regions of the desired area of the surface may have multiple atomic and/or molecular layers deposited thereon.

In the present disclosure, a target surface (and/or target region(s) thereof) may be considered to be "substantially devoid of", "substantially free of" or "substantially uncovered by" a material if there is a substantial absence of the material on the target surface (and/or target region(s) thereof) as determined by any suitable determination mechanism.

In some non-limiting examples, one measure of an amount of a material on a surface is a percentage coverage of the surface by such material, where, in some non-limiting examples, the surface may be considered to be substantially of the material if the percentage of the surface by such material does not exceed 10%, does not exceed 8%, does not exceed 5% does not exceed 3%, and/or does not exceed 1%. In some non-limiting examples surface coverage may be assessed using a variety of imaging techniques, including without limitation, transmission electron microscopy, atomic force microscopy and/or scanning electron microscopy.

Thus, in some non-limiting examples, a surface of a material may be considered to be substantially free of an electrically conductive material if the light transmittance therethrough is greater than 90%, greater than 92%, greater than 95%, and/or greater than 98% of the light transmittance of a reference material of similar composition and dimension of such material, in some non-limiting examples, in the visible portion of the electromagnetic spectrum.

In the present disclosure, for purposes of simplicity of illustration, details of deposited materials, including without limitation, thickness profiles and/or edge profiles of layer(s) have been omitted. Various possible edge profiles at an interface between nucleation inhibiting compound and/or coatings (NICs) 910 (FIG. 9) and conductive coatings 930 are discussed herein.

Substrate 110

In some examples, the substrate 110 may comprise a base substrate 112. In some examples, the base substrate 112 may be formed of material suitable for use as the base substrate 112, including without limitation, an inorganic material, including without limitation, silicon (Si), glass, metal (including without limitation, a metal foil), sapphire, lithium fluoride (LiF) and/or other inorganic material suitable for use as the base substrate 112, and/or an organic material, including without limitation, a polymer, including without limitation, a silicon-based polymer. In some examples, the base substrate 112 may be rigid or flexible. In some examples, the substrate 112 may be defined by at least one planar surface. The substrate 110 has at least one surface that supports the remaining front plane 10 components of the electro-luminescent device 100, including without limitation, the first electrode 120, the at least one organic layer 130 and/or the second electrode 140.

In some non-limiting examples, such surface may be an organic surface and/or an inorganic surface.

In some examples, the substrate 110 may comprise, in addition to the base substrate 112, one or more additional organic and/or inorganic layers (not shown nor specifically described herein) supported on an exposed surface 111 of the base substrate 112.

In some non-limiting examples, such additional layers may comprise and/or form one or more organic layers, which may comprise, replace and/or supplement one or more of the at least one organic layers 130.

In some non-limiting examples, such additional layers may comprise one or more inorganic layers, which may comprise and/or form one or more electrodes, which in some non-limiting examples, may comprise, replace and/or supplement the first electrode 120 and/or the second electrode 140.

In some non-limiting examples, such additional layers may comprise and/or be formed of and/or as a backplane layer 20 (FIG. 2) of a semiconductor material. In some non-limiting examples, the backplane layer 20 is differentiated from the frontplane 10 of the device 100, in that the backplane layer 20, including electronic components 200 (FIG. 2) thereof may be formed by a photolithography process, which may not be provided under, and/or may precede the introduction of low pressure (including without limitation, a vacuum) environment, such as is the case with the deposition of one or more of the frontplane 10 layers 120, 130, 140.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is less than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

Backplane and TFT Structure(s) Embodied Therein

Figure 2:
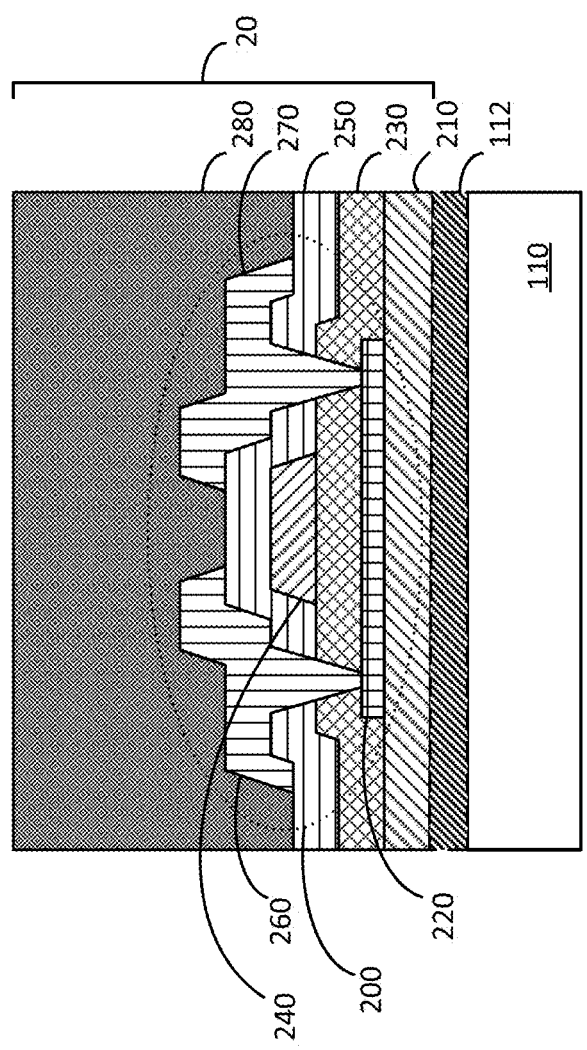
FIG. 2 is a cross-sectional view of an example backplane layer of the substrate 100 of the electro-luminescent device of FIG. 1, showing a thin film transistor (TFT) embodied therein.

FIG. 2 is a simplified cross-sectional view of an example of the substrate 110 of the electro-luminescent device 100, including a backplane layer 20 thereof. In some non-limiting examples, the backplane 20 of the substrate 110 may comprise one or more electronic and/or opto-electronic components, including without limitation, transistors, resistors and/or capacitors, such as which may support the device 100 acting as an active-matrix and/or a passive matrix device. In some non-limiting examples, such structures may be a thin-film transistor (TFT) structure, such as is shown at 200. In some non-limiting examples, the TFT structure 200 may be fabricated using organic and/or inorganic materials to form various layers 210, 220, 230, 240, 250, 270, 270, 280 and/or portions of the backplane layer 20 of the substrate 110 above the base substrate 112. In FIG. 2, the TFT structure 200 shown is a top-gate TFT. In some non-limiting examples, TFT technology and/or structures, including without limitation, one or more of the layers 210, 220, 230, 240, 250, 270, 270, 280, may be employed to implement non-transistor components, including without limitation, resistors and/or capacitors.

In some non-limiting examples, the backplane 20 may comprise a buffer layer 210 deposited on an exposed surface 111 of the base substrate 112 to support the components of the TFT structure 200. In some non-limiting examples, the TFT structure 200 may comprise a semiconductor active area 220, a gate insulating layer 230, a TFT gate electrode 240, an interlayer insulating layer 250, a TFT source electrode 270, a TFT drain electrode 270 and/or a TFT insulating layer 280. In some non-limiting examples, the semiconductor active area 220 is formed over a portion of the buffer layer 210, and the gate insulating layer 230 is deposited to substantially cover the semiconductor active area 220. In some non-limiting examples, the gate electrode 240 is formed on top of the gate insulating layer 230 and the interlayer insulating layer 250 is deposited thereon. The TFT source electrode 270 and the TFT drain electrode 270 are formed such that they extend through openings formed through both the interlayer insulating layer 250 and the gate insulating layer 230 such that they are electrically coupled to the semiconductor active area 220. The TFT insulating layer 280 is then formed over the TFT structure 200.

In some non-limiting examples, one or more of the layers 210, 220, 230, 240, 250, 270, 270, 280 of the backplane 20 may be patterned using photolithography, which uses a photomask to expose selective portions of a photoresist covering an underlying device layer to UV light. Depending upon a type of photoresist used, exposed or unexposed portions of the photomask may then be removed to reveal desired portions of the underlying device layer. In some examples, the photoresist is a positive photoresist, in which the selective portions thereof exposed to UV light are not substantially removeable thereafter, while the remaining portions not so exposed are substantially removeable thereafter. In some non-limiting examples, the photoresist is a negative photoresist, in which the selective portions thereof exposed to UV light are substantially removeable thereafter, while the remaining portions not so exposed are not substantially removeable thereafter. A patterned surface may thus be etched, including without limitation, chemically and/or physically, and/or washed off and/or away, to effectively remove an exposed portion of such layer 210, 220, 230, 240, 250, 270, 270, 280.

Further, while a top-gate TFT structure 200 is shown in FIG. 2, those having ordinary skill in the relevant art will appreciate that other TFT structures, including without limitation a bottom-gate TFT structure, may be formed in the backplane 20 without departing from the scope of the present disclosure.

In some non-limiting examples, the TFT structure 200 may be an n-type TFT and/or a p-type TFT. In some non-limiting examples, the TFT structure 200 may incorporate any one or more of amorphous Si (a-Si), indium gallium zinc oxide (IGZO) and/or low-temperature polycrystalline Si (LTPS).

First Electrode 120

The first electrode 120 is deposited over the substrate 110 and electrically coupled to a terminal of the power source 15. In some non-limiting examples, the first electrode 120 is directly coupled to the terminal of the power source 15. In some non-limiting examples, the first electrode 120 is coupled to the terminal of the power source 15 through at least one driving circuit 300 (FIG. 3), which in some non-limiting examples, may incorporate at least one TFT structure 200 in the backplane 20 of the substrate 110.

Figure 3:
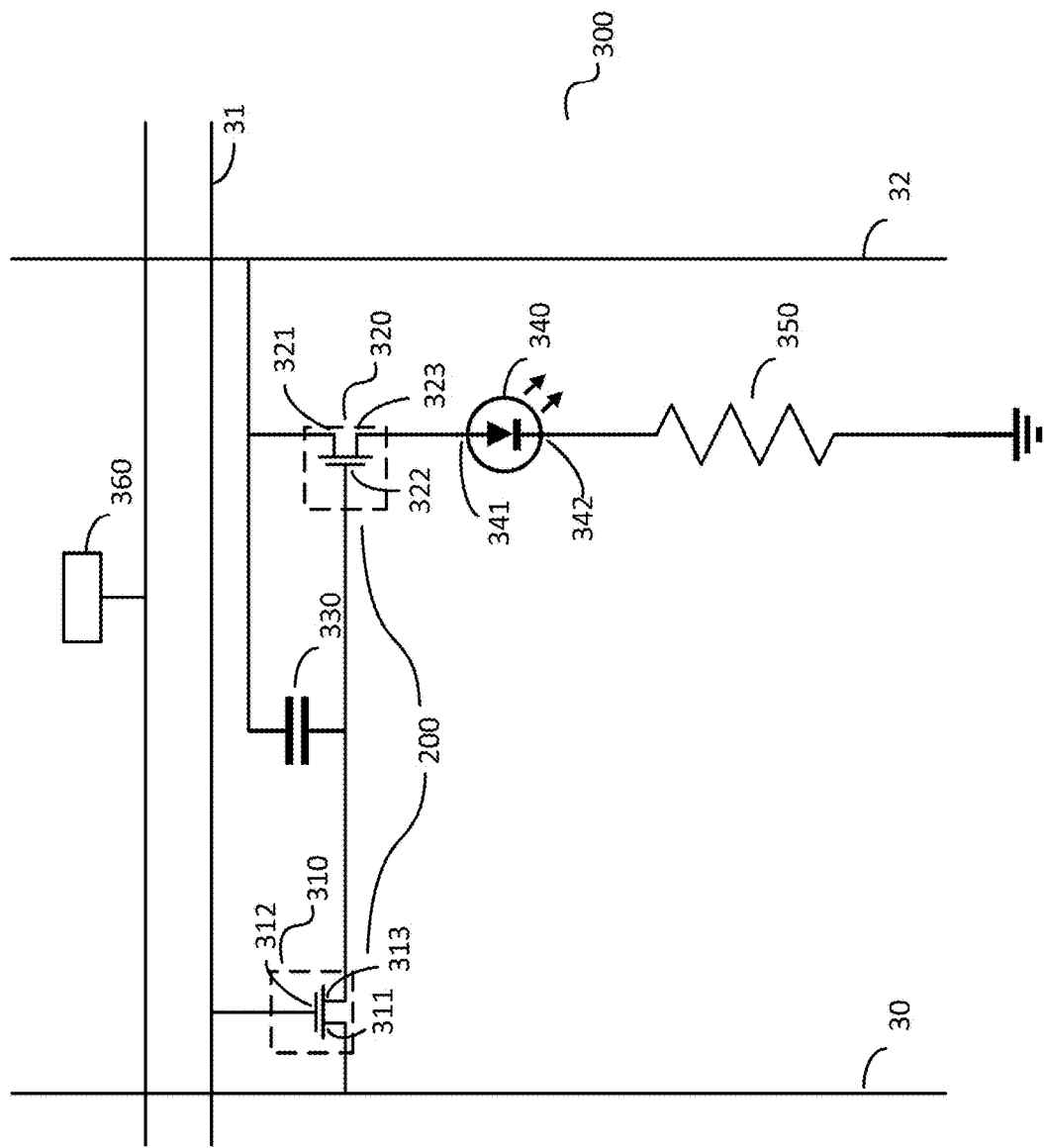
FIG. 3 is a circuit diagram for an example circuit such as may be provided by one or more of the TFTs shown in the backplane layer of FIG. 2.

In some non-limiting examples, the first electrode 120 may comprise an anode 341 (FIG. 3) and/or a cathode 342 (FIG. 3). In some non-limiting examples, the first electrode 120 is an anode 341 and is electrically coupled to a positive terminal of the power source 15.

In some non-limiting examples, the first electrode 120 may be formed by depositing at least one thin film, over (a portion of) the substrate 110. In some non-limiting examples, there may be a plurality of first electrodes 120, disposed in a spatial arrangement over a lateral aspect of the substrate 110. In some non-limiting examples, one or more of such at least one first electrodes 120 may be deposited over (a portion of) the TFT insulating layer 280 disposed in a lateral aspect in a spatial arrangement. If so, in some non-limiting examples, at least one of such at least one first electrodes 120 may extend through an opening of the corresponding TFT insulating layer 280, as shown in FIG. 2, to be electrically coupled to an electrode 240, 270, 270 of the TFT structure 200 in the backplane 20. In FIG. 2, a portion of the at least one first electrode 120 is shown coupled to the TFT drain electrode 270.

In some non-limiting examples, the at least one first electrode 120 and/or at least one thin film thereof, may comprise various materials, including without limitation, one or more metallic materials, including without limitation, magnesium (Mg), aluminum (Al), calcium (Ca), zinc (Zn), silver (Ag), cadmium (Cd), barium (Ba) and/or ytterbium (Yb), and/or combinations thereof, including without limitation, alloys containing any of such materials, one or more metal oxides, including without limitation, a transparent conducting oxide (TCO), including without limitation, ternary compositions such as, without limitation, fluorine tin oxide (FTO), indium zinc oxide (IZO), and/or indium tin oxide (ITO) and/or combinations thereof and/or in varying proportions, and/or combinations thereof in at least one layer, any one or more of which may be, without limitation, a thin film.

In some non-limiting examples, a thin film comprising the first electrode 120 may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof.

Second Electrode 140

The second electrode 140 is deposited over the organic layer 130 and electrically coupled to a terminal of the power source 15. In some non-limiting examples, the second electrode 140 is directly coupled to a terminal of the power source 15. In some non-limiting examples, the second electrode 140 is coupled to the terminal of the power source 15 through at least one driving circuit 300, which in some non-limiting examples, may incorporate at least one TFT structure 200 in the backplane 20 of the substrate 110.

In some non-limiting examples, the second electrode 140 may comprise an anode 341 and/or a cathode 342. In some non-limiting examples, the second electrode 130 is a cathode 342 and is electrically coupled to a negative terminal of the power source 15.

In some non-limiting examples, the second electrode 140 may be formed by depositing a conductive coating 930, in some non-limiting examples, as at least one thin film, over (a portion of) the organic layer 130. In some non-limiting examples, there may be a plurality of second electrodes 140, disposed in a spatial arrangement over a lateral aspect of the organic layer 130.

In some non-limiting examples, the at least one second electrode 140 may comprise various materials, including without limitation, one or more metallic materials, including without limitation, Mg, aluminum (Al), calcium (Ca), zinc (Zn), silver (Ag), cadmium (Cd), barium (Ba) and/or ytterbium (Yb), and/or combinations thereof, including without limitation, alloys containing any of such materials, one or more metal oxides, including without limitation, a transparent conducting oxide (TCO), including without limitation, ternary compositions such as, without limitation, fluorine tin oxide (FTO), indium zinc oxide (IZO), and/or indium tin oxide (ITO) and/or combinations thereof and/or in varying proportions, and/or combinations thereof in at least one layer, any one or more of which may be, without limitation, a thin film.

In some non-limiting examples, a thin film comprising the second electrode 140 may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof.

Driving Circuit

FIG. 3 is a circuit diagram for an example driving circuit such as may be provided by one or more of the TFT structures 200 shown in the backplane 20. In the example shown, the circuit, shown generally at 300 is for an example driving circuit for an active-matrix OLED (AMOLED) device 100 (and/or a pixel 340 (and/or sub-pixel(s) 2541-2543 (FIG. 25A) thereof) for supplying current to the first electrode 120 and the second electrode 140, and that controls emission of photons from the device 100 (and/or a pixel 340 (and/or sub-pixel(s) 2541-2543 thereof). The circuit 300 shown incorporates a plurality of p-type top-gate thin film TFT structures 200, although the circuit 300 could equally incorporate one or more p-type bottom-gate TFT structures 200, one or more n-type top-gate TFT structures 200, one or more n-type bottom-gate TFT structures 200, one or more other TFT structure(s) 200, and/or any combination thereof, whether or not formed as one or a plurality of thin film layers. The circuit 300 comprises, in some non-limiting examples, a switching TFT 310, a driving TFT 320 and a storage capacitor 330.

A pixel 340 (and/or sub-pixel) thereof) of the OLED display 100 is represented by a diode 340. The source 311 of the switching TFT 310 is coupled to a data (or, in some non-limiting examples, a column selection) line 30. The gate 312 of the switching TFT 310 is coupled to a gate (or, in some non-limiting examples, a row selection) line 31. The drain 313 of the switching TFT 310 is coupled to the gate 322 of the driving TFT 320.

The source 321 of the driving TFT 320 is coupled to a positive (or negative) terminal of the power source 15. The (positive) terminal of the power source 15 is represented by a power supply line (VDD) 32.

The drain 323 of the driving TFT 320 is coupled to the anode 341 (which may be, in some non-limiting examples, the first electrode 120) of the diode 340 (representing a pixel 340 (and/or sub-pixel(s) 2541-2543 thereof) of the OLED display 100) so that the driving TFT 320 and the diode 340 (a pixel 340 (and/or sub-pixel(s) 2541-2543 thereof) of the OLED display 100) are coupled in series between the power supply line (VDD) 32 and ground.

The cathode 342 (which may be, in some non-limiting examples, the second electrode 140) of the diode 340 (representing a pixel 340 (and/or sub-pixel(s) 2541-2543 thereof) of the OLED display 100) is represented as a resistor 350 in the circuit 300.

The storage capacitor 330 is coupled at its respective ends to the source 321 and gate 322 of the driving TFT 320. The driving TFT 320 regulates a current passed through the diode 340 (representing a pixel 340 (and/or sub-pixel(s) 2541-2543 thereof) of the OLED display 100) in accordance with a voltage of a charge stored in the storage capacitor 330, such that the diode 340 (representing a pixel 340 (and/or sub-pixel(s) 2541-2543 thereof) of the OLED display 100) outputs a desired luminance. The voltage of the storage capacitor 330 is set by the switching TFT 310, coupling it to the data line 30.

In some non-limiting examples, a compensation circuit 370 is provided to compensate for any deviation in transistor properties from variances during the manufacturing process and/or degradation of the switch TFT 310 and/or driving TFT 320 over time.

Organic Layer 130

In some non-limiting examples, the organic layer 130 may comprise a plurality of semiconducting layers 131, 133, 135, 137, 139, any of which may be disposed, in some non-limiting examples, in a thin film, in a stacked configuration, which may include, without limitation, any one or more of a hole injection layer (HIL) 131, a hole transport layer (HTL) 133, an EL 135, an electron transport layer (ETL) 137 and/or an electron injection layer (EIL) 139. In the present disclosure, the term "semiconducting layer(s)" may be used interchangeably with "organic layer(s)" since the semiconducting layers 131, 133, 135, 137, 139 in an OLED device 100 may in some non-limiting examples, may comprise organic semiconducting materials.

In some non-limiting examples, a thin film comprising a semiconducting layer 131, 133, 135, 137, 139 in the stack making up the organic layer 130, may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof.

Those having ordinary skill in the relevant art will readily appreciate that the structure of the device 100 may be varied by omitting and/or combining one or more of the semiconductor layers 131, 133, 135, 137, 139.

Further, any of the semiconductor layers 131, 133, 135, 137, 139 of the organic layer 130 may comprise any number of sub-layers. Still further, any of such layers 131, 133, 135, 137, 139 and/or sub-layer(s) thereof may comprise various mixture(s) and/or composition gradient(s). In addition, those having ordinary skill in the relevant art will appreciate that the device 100 may comprise one or more layers containing inorganic and/or organometallic materials and is not necessarily limited to devices composed solely of organic materials. By way of non-limiting example, the device 100 may comprise one or more quantum dots.

In some non-limiting examples, the HIL 131 may be formed using a hole injection material, which may facilitate injection of holes by the anode 341, which may be, in some non-limiting examples, the first electrode 120.

In some non-limiting examples, the HTL 133 may be formed using a hole transport material, which may, in some non-limiting examples, exhibit high hole mobility.

In some non-limiting examples, the ETL 137 may be formed using an electron transport material, which may, in some non-limiting examples, exhibit high electron mobility.

In some non-limiting examples, the EIL 139 may be formed using an electron injection material, which may facilitate injection of electrons by the cathode 342, which may be, in some non-limiting examples, the second electrode 140.

In some non-limiting examples, the EL 135 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter and/or a plurality of any combination of these.

In some non-limiting examples, the device 100 may be an OLED in which the organic layer comprises at least an EL 135 and typically, several layers of organic material, interposed between conductive thin film electrodes 120, 140. When a voltage is applied to the first electrode 120 and second electrode 140, by the power source 15, holes are injected into the organic layer 130 through the anode 341, which may be, in some non-limiting examples, the first electrode 120, and electrons are injected into the organic layer 130 through the cathode 342, which may be, in some non-limiting examples, the second electrode 140.

The injected holes and electrons tend to migrate through the various semiconductor layers 131, 133, 135, 137, 139 until they reach and meet each other. When a hole and an electron are in close proximity, they tend to be attracted to one another due to a Coulomb force and in some examples, may combine to form a bound state electron-hole pair referred to as an exciton. Especially if the exciton is formed in the EL 135, the exciton may decay through a radiative recombination process, in which a photon is emitted. The type of radiative recombination process may depend upon a spin state of an exciton. In some examples, the exciton may be characterized as having a singlet or a triplet spin state. In some non-limiting examples, radiative decay of a singlet exciton may result in fluorescence. In some non-limiting examples, radiative decay of a triplet exciton may result in phosphorescence.

More recently, other light emission mechanisms for OLEDs have been proposed and investigated, including without limitation, TADF. In some non-limiting examples, TADF emission occurs through a conversion of triplet excitons into single excitons via a reverse inter-system crossing process with the aid of thermal energy, followed by radiative decay of the singlet excitons.

In some non-limiting examples, an exciton may decay through a non-radiative process, in which no photon is released, especially if the exciton is not formed in the EL 135.

In the present disclosure, the term "internal quantum efficiency" (IQE) of an OLED device 100 refers to a proportion of all electron-hole pairs generated in the device 100 that decay through a radiative recombination process and emit a photon.

In the present disclosure, the term "external quantum efficiency" (EQE) of an OLED device 100 refers to a proportion of charge carriers delivered to the device 100 relative to a number of photons emitted by the device 100. In some non-limiting examples, an EQE of 100% indicates that one photon is emitted for each electron that is injected into the device 100.

Those having ordinary skill in the relevant art will appreciate that the EQE of a device 100 may, in some non-limiting examples, be substantially lower than the IQE of the same device 100. A difference between the EQE and the IQE of a given device 100 may in some non-limiting examples be attributable to a number of factors, including without limitation, adsorption and reflection of photons caused by various components of the device 100.

In some non-limiting examples, the device 100 may be an electro-luminescent quantum dot device in which the organic layer 130 comprises an active layer comprising at least one quantum dot. When current is provided by the power source 15 to the first electrode 120 and second electrode 140, photons are emitted from the active layer comprising the organic layer 130 between them.

Those having ordinary skill in the relevant art will readily appreciate that the structure of the device 100 may be varied by the introduction of one or more additional layers (not shown) at appropriate position(s) within the organic layer 130 stack, including without limitation, a hole blocking layer (not shown), an electron blocking layer (not shown), an additional charge transport layer (not shown) and/or an additional charge injection layer (not shown).

Barrier Coating 1550

In some non-limiting examples, a barrier coating 1550 (FIG. 15C) may be provided to surround and/or encapsulate the first electrode 120, second electrode 140, and the various semiconductor layers of the organic layer 130 and/or the substrate 110 disposed thereon of the device 100.

In some non-limiting examples, the barrier coating 1550 may be provided to inhibit the various layers 120, 130, 140 of the device 100, including the organic layer 130 and/or the cathode 342 (which may, in some non-limiting examples may be the second electrode 140) from being exposed to moisture and/or ambient air, since these layers 120, 130, 140 may be prone to oxidation.

In some non-limiting examples, application of the barrier coating 1550 to a highly non-uniform surface may increase a likelihood of poor adhesion of the barrier coating 1550 to such surface.

In some non-limiting examples, the absence of a barrier coating 1550 and/or a poorly-applied barrier coating 1550 may cause and/or contribute to defects in and/or partial and/or total failure of the device 100. In some non-limiting examples, a poorly-applied barrier coating 1550 may reduce adhesion of the barrier coating 1550 to the device 100. In some non-limiting examples, poor adhesion of the barrier coating 1550 may increase a likelihood of the barrier coating 1550 peeling off the device 100 in whole or in part, especially if the device 100 is bent and/or flexed. In some non-limiting examples, a poorly-applied barrier coating 1550 may allow air pockets to be trapped between the barrier coating 1550 and an underlying surface of the device 100 to which the barrier coating 1550 was applied during application of the barrier coating 1550.

In some non-limiting examples, the barrier coating 1550 may be a thin film encapsulation and may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof.

In some non-limiting examples, the barrier coating 1550 may be provided by laminating a pre-formed barrier film onto the device 100. In some non-limiting examples, the barrier coating 1550 may comprise a multi-layer coating comprising at least one of an organic material, an inorganic material and/or any combination thereof. In some non-limiting examples, the barrier coating 1550 may further comprise a getter material and/or a desiccant.

Lateral Aspect

In some non-limiting examples, including where the OLED device 100 comprises a lighting panel, the entire lateral aspect of the device 100 may correspond to a single lighting element. As such, the substantially planar cross-sectional profile shown in FIG. 1 may extend substantially along the entire lateral aspect of the device 100, such that photons are emitted from the device 100 substantially along the entirety of the lateral extent thereof. In some non-limiting examples, such single lighting element may be driven by a single driving circuit 300 of the device 100.

In some non-limiting examples, including where the OLED device 100 comprises a display module, the lateral aspect of the device 100 may be sub-divided into a plurality of emissive regions of the device 100, in which the cross-sectional aspect of the device structure 100, within each of the emissive region(s) shown, without limitation, in FIG. 1 causes photons to be emitted therefrom when energized.

Emissive Regions

In some non-limiting examples, individual emissive regions of the device 100 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by one or more features thereof, including without limitation, a wavelength of light emitted by the emissive region thereof, a shape of such emissive region, a dimension (along either or both of the first and/or second lateral direction(s)), an orientation (relative to either and/or both of the first and/or second lateral direction(s)) and/or a spacing (relative to either or both of the first and/or second lateral direction(s)) from a previous element in the pattern. In some non-limiting examples, the pattern may repeat in either or both of the first and/or second lateral direction(s).

In some non-limiting examples, each individual emissive region of the device 100 is associated with, and driven by, a corresponding driving circuit 300 within the backplane 20 of the device 100, in which the diode 340 corresponds to the OLED structure for the associated emissive region. In some non-limiting examples, including without limitation, where the emissive regions are laid out in a regular pattern extending in both the first (row) lateral direction and the second (column) lateral direction, there may be a signal line 30, 31 in the backplane 20, which may be the gate line (or row selection) line 31, corresponding to each row of emissive regions extending in the first lateral direction and a signal line 30, 31, which may in some non-limiting examples be the data (or column selection) line 30, corresponding to each column of emissive regions extending in the second lateral direction. In such a non-limiting configuration, a signal on the row selection line 31 may energize the respective gates 312 of the switching TFT(s) 310 electrically coupled thereto and a signal on the data line 30 may energize the respective sources of the switching TFT(s) 310 electrically coupled thereto, such that a signal on a row selection line 31/data line 30 pair will electrically couple and energise, by the positive terminal (represented by the power supply line VDD 32) of the power source 15, the anode 341, which may be, in some non-limiting examples, the first electrode 120, of the OLED structure of the emissive region associated with such pair, causing the emission of a photon therefrom, the cathode 342, which may be, in some non-limiting examples, the second electrode 140, thereof being electrically coupled to the negative terminal of the power source 15.

In some non-limiting examples, each emissive region of the device 100 corresponds to a single display pixel 340. In some non-limiting examples, each pixel 340 emits light at a given wavelength. In some non-limiting examples, the wavelength corresponds to a colour in, without limitation, the visible light spectrum, the ultraviolet spectrum and/or the infrared spectrum.

In some non-limiting examples, each emissive region of the device 100 corresponds to a sub-pixel 2541-2543 of a display pixel 340. In some non-limiting examples, a plurality of sub-pixels 2541-2543 may combine to form, or to represent, a single display pixel 340.

In some non-limiting examples, a single display pixel 340 may be represented by three sub-pixels 2541-2543. In some non-limiting examples, the three sub-pixels 2541-2543 may be denoted as, respectively, R(ed) sub-pixels 2541, G(reen) sub-pixels 2542 and/or B(lue) sub-pixels 2543. In some non-limiting examples, a single display pixel 340 may be represented by four sub-pixels 2541-2543, in which three of such sub-pixels 2541-2543 may be denoted as R, G and B sub-pixels 2541-2543 and the fourth sub-pixel 2541-2543 may be denoted as a W(hite) sub-pixel 2541-2543. In some non-limiting examples, the emission spectrum of the light emitted by a given sub-pixel 2541-2543 corresponds to the colour by which the sub-pixel 2541-2543 is denoted. In some non-limiting examples, the wavelength of the light does not correspond to such colour but further processing is performed, in a manner apparent to those having ordinary skill in the relevant art, to transform the wavelength to one that does so correspond.

Since the wavelength of sub-pixels 2541-2543 of different colours may be different, the optical characteristics of such sub-pixels 2541-2543 may differ, especially if a common electrode 120, 140 having a substantially uniform thickness profile is employed for sub-pixels 2541-2543 of different colours.

As a result, the presence of optical interfaces created by numerous thin-film layers and coatings with different refractive indices, such as may in some non-limiting examples be used to construct opto-electronic devices including without limitation OLED devices 100, may create different optical microcavity effects for sub-pixels 2541-2543 of different colours.

Some factors that may impact an observed microcavity effect in a device 100 includes, without limitation, the total path length (which in some non-limiting examples may correspond to the total thickness of the device 100 through which photons emitted therefrom will travel before being out-coupled), and the refractive indices of various layers and coatings.

In some non-limiting examples, modulating the thickness of an electrode 120, 140 in and across a lateral aspect 410 of emissive region(s) of a pixel 340 (and/or a sub-pixel thereof) may impact the microcavity effect observable. In some non-limiting examples, such impact may be attributable to a change in the total optical path length.

In some non-limiting examples, a change in a thickness of the electrode 120, 140 may also change the refractive index of light passing therethrough, in some non-limiting examples, in addition to a change in the total optical path length. In some non-limiting examples, this may be particularly the case where the electrode 120, 140 is formed of at least one thin film conductive coating 930.

In some non-limiting examples, the optical properties of the device 100, and/or in some non-limiting examples, across the lateral aspect 410 of emissive region(s) of a pixel 340 (and/or a sub-pixel thereof) that may be varied by modulating at least one optical microcavity effect, include, without limitation, the emission spectrum, the intensity (including without limitation, luminous intensity) and/or angular distribution of emitted light, including without limitation, an angular dependence of a brightness and/or color shift of the emitted light.

In some non-limiting examples, a sub-pixel is associated with a first set of other sub-pixels 2541-2543 to represent a first display pixel 340 and also with a second set of other sub-pixels 2541-2543 to represent a second display pixel 340, so that the first and second display pixels 340 may have associated therewith, the same sub-pixel(s) 2541-2543.

The pattern and/or organization of sub-pixels 2541-2543 into display pixels 340 continues to develop. All present and future patterns and/or organizations are considered to fall within the scope of the present disclosure.

Non-Emissive Regions

In some non-limiting examples, the various emissive regions of the device 100 are substantially surrounded and separated by, in at least one lateral direction, one or more non-emissive regions, in which the structure and/or configuration along the cross-sectional aspect, of the device structure 100 shown, without limitation, in FIG. 1, is varied, so as to substantially inhibit photons to be emitted therefrom. In some non-limiting examples, the non-emissive regions comprise those regions in the lateral aspect, that are substantially devoid of an emissive region.

Figure 4:
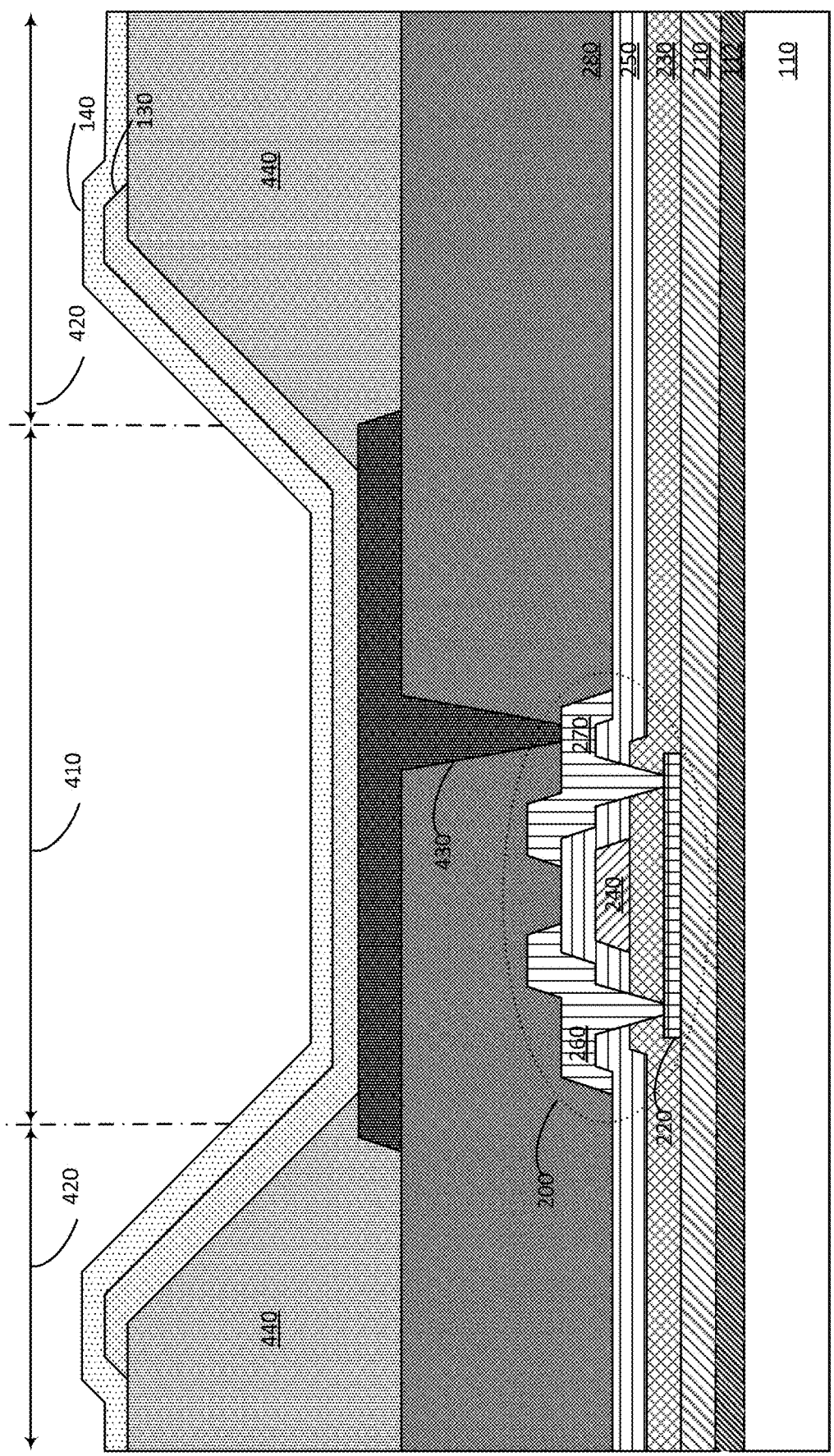
FIG. 4 is a cross-sectional view of the example electro-luminescent device of FIG. 1.

Thus, as shown in the cross-sectional view of FIG. 4, the lateral topology of the various semiconductor layers of the organic layer 130 may be varied to define at least one emissive region, surrounded (at least in one lateral direction) by at least one non-emissive region.

In some non-limiting examples, the emissive region corresponding to a single display pixel 340 (and/or a sub-pixel thereof) may be understood to have a lateral aspect 410, surrounded in at least one lateral direction by at least one non-emissive region having a lateral aspect 420.

A non-limiting example of an implementation of the cross-sectional aspect of the electro-luminescent device 100 as applied to an emissive region corresponding to a single display pixel 340 (and/or a sub-pixel thereof) of an OLED display will now be described. While features of such implementation are shown to be specific to the emissive region, those having ordinary skill in the relevant art will appreciate that in some non-limiting examples, more than one emissive region may encompass common features.

In some non-limiting examples, the first electrode 120, which may be, in some non-limiting examples, the anode 341, may be disposed over an exposed top layer of the device 100, in some non-limiting examples, within at least a portion of the lateral aspect 410 of the emissive region. In some non-limiting examples, at least within the lateral aspect 410 of the emissive region of the pixel(s) 340 (and/or sub-pixel(s) 2541-2543 thereof), the exposed top layer, may, at the time of deposition of the first electrode, comprise the TFT insulating layer 280 of the various TFT structures that make up the driving circuit 300 for the emissive region corresponding to a single display pixel 340 (and/or a sub-pixel thereof).

In some non-limiting examples, the TFT insulating layer 280 may be formed with an opening 430 extending therethrough to permit the first electrode 120 to be electrically coupled to one of the TFT electrodes 240, 270, 270, including, without limitation, by way of the non-limiting example shown in FIG. 4, the TFT drain electrode 270.

In FIG. 4, those having ordinary skill in the relevant art will appreciate that the driving circuit 300 comprises a plurality of TFT structures, including without limitation, the switching TFT 310, the driving TFT 320 and/or the storage capacitor 330. In FIG. 4, for purposes of simplicity of illustration, only one TFT structure 200 is shown, but it will be appreciated by those having ordinary skill in the relevant art, that such TFT structure 200 is representative of such plurality of TFT structures that comprise the driving circuit 300

In a cross-sectional aspect, the configuration of each emissive region may, in some non-limiting examples, be defined by the introduction of at least one pixel definition layer (PDL) 440 substantially throughout the lateral aspects 420 of the surrounding non-emissive region(s). In some non-limiting examples, the PDLs 440 may comprise an insulating organic and/or inorganic material.

In some non-limiting examples, the PDLs 440 are deposited substantially over the TFT insulating layer 280, although, as shown, in some non-limiting examples, the PDLs 440 may also and/or instead over at least a portion of the deposited first electrode 120 and/or its outer edges.

In some non-limiting examples, as shown in FIG. 4, the cross-sectional thickness and/or profile of the PDLs 440 may impart a substantially valley-shaped configuration to each (sub-)pixel's emissive region by a region of increased thickness along a boundary of the lateral aspect 420 of the surrounding non-emissive region with the lateral aspect 410 of the surrounded emissive region, corresponding to a pixel 340 (and/or a sub-pixel thereof).

In some non-limiting examples, the profile of the PDLs 440 may have a reduced thickness beyond such valley-shaped configuration, including without limitation, away from the boundary between the lateral aspect 420 of the surrounding non-emissive region and the lateral aspect 410 of the surrounded emissive region, in some non-limiting examples, substantially well within the lateral aspect 420 of such non-emissive region.

In some non-limiting examples, the organic layer 130 (and/or one or more semiconducting layers 131, 133, 135, 137, 139 thereof) may be deposited over the exposed surface 111 of the device 100, including at least a portion of the lateral aspects 410 of such emissive region of the pixel(s) 340 (and/or sub-pixel(s) 2541-2543 thereof). In some non-limiting examples, at least within the lateral aspects 410 of the emissive region of the pixel(s) 340 (and/or sub-pixel(s) 2541-2543 thereof), such exposed surface 111, may, at the time of deposition of the organic layer 130 (and/or semi-conducting layers 131, 133, 135, 137, 139 thereof), comprise the first electrode 120.

In some non-limiting examples, the organic layer 130 (and/or semiconducting layers 131, 133, 135, 137, 139 thereof) may also extend beyond the lateral aspects 410 of the emissive region of the pixel(s) 340 (and/or sub-pixel(s) 2541-2543 thereof) and at least partially within the lateral aspects 420 of the surrounding non-emissive region(s). In some non-limiting examples, such exposed top layer of such surrounding non-emissive region(s) may, at the time of deposition of the organic layer 130 (and/or semiconducting layers 131, 133, 135, 137, 139 thereof) comprise the PDL(s) 440.

In some non-limiting examples, the second electrode 140, which in some non-limiting examples, may be the cathode 342, may be disposed over an exposed surface 111 of the device 100, including at least a portion of the lateral aspects 410 of the emissive region of the pixel(s) 340 (and/or sub-pixel(s) 2541-2543 thereof). In some non-limiting examples, at least within the lateral aspects 410 of the emissive region of the pixel(s) 340 (and/or sub-pixel(s) 2541-2543 thereof), such exposed top layer, may, at the time of deposition of the second electrode 130, comprise the organic layer 130 (and/or semiconducting layers 131, 133, 135, 137, 139 thereof).

In some non-limiting examples, the second electrode 140 may also extend beyond the lateral aspects 410 of the emissive region of the pixel(s) 340 (and/or sub-pixel(s) 2541-2543 thereof) and at least partially within the lateral aspects 420 of the surrounding non-emissive region(s). In some non-limiting examples, such exposed top layer of such surrounding non-emissive region(s) may, at the time of deposition of the second electrode 140, comprise the PDL(s) 440.

In some non-limiting examples, the second electrode 140 may extend throughout substantially all or a substantial portion of the lateral aspects 420 of the surrounding non-emissive region(s).

Transmissivity

Because the OLED device 100 emits photons through either or both of the first electrode 120 (in the case of a bottom-emission and/or a double-sided emission device), which may be, in some non-limiting examples, the anode 341, as well as the substrate 110 and/or the second electrode 140 (in the case of a top-emission and/or double-sided emission device), which may be, in some non-limiting examples, the cathode 342, it may be desirable to make either or both of the first electrode 120 and/or the second electrode 140 substantially photon- (or light)-transmissive ("transmissive"), in some non-limiting examples, at least across a substantial portion of the lateral aspect 410 of the emissive region(s) of the device 100. In the present disclosure, such a transmissive element, including without limitation, an electrode 120, 140, a material from which such element is formed, and/or property of thereof may comprise an element, material and/or property thereof that is substantially transmissive ("transparent"), and/or, in some non-limiting examples, partially transmissive ("semi-transparent"), in some non-limiting examples, in at least one wavelength range.

A variety of mechanisms have been adopted to impart transmissive properties to the device 100, at least across a substantial portion of the lateral aspect 410 of the emissive region(s) thereof.

In some non-limiting examples, including without limitation, where the device 100 is a bottom-emission device and/or a double-sided emission device, the TFT(s) 200 of the driving circuit 300 associated with an emissive region of a pixel 340 (and/or sub-pixel(s) 2541-2543 thereof), which may at least partially reduce the transmissivity of the surrounding substrate 110, may be located within the lateral aspect 420 of the surrounding non-emissive region(s) to avoid impacting the transmissive properties of the substrate 110 within the lateral aspect 410 of the emissive region.

In some non-limiting examples, where the device 100 is a double-sided emission device, in respect of the lateral aspect 410 of an emissive region of a pixel 340 (and/or sub-pixel(s) 2541-2543 thereof), a first one of the electrode 120, 140 may be made substantially transmissive, including without limitation, by at least one of the mechanisms disclosed herein, in respect of the lateral aspect 410 of an neighbouring and/or adjacent pixel(s) 340 (and/or sub-pixel(s) 2541-2543 thereof), a second one of the electrodes 120, 140 may be made substantially transmissive, including without limitation, by at least one of the mechanisms disclosed herein. Thus, the lateral aspect 410 of a first emissive region of a pixel 340 (and/or sub-pixel(s) 2541-2543 thereof) may be made substantially top-emitting while the lateral aspect 410 of a second emissive region of a neighbouring pixel 340 (and/or sub-pixel(s) 2541-2543 thereof) may be made substantially bottom-emitting, such that substantially half of the pixels 340 (and/or sub-pixel(s) 2541-2543 thereof) are substantially top-emitting and substantially half of the pixels 340 (and/or sub-pixel(s) 2541-2543 thereof) are substantially bottom-emitting, in an alternating pixel 340 (and/or sub-pixel 2541-2543) sequence, while only a single electrode 120, 140 of each pixel 340 (and/or sub-pixel 2541-2543 thereof) is made substantially transmissive.

In some non-limiting examples, a mechanism to make an electrode 120, 140, in the case of a bottom-emission device and/or a double-sided emission device, the first electrode 120, and/or in the case of a top-emission device and/or a double-sided emission device, the second electrode 140, transmissive is to form such electrode 120, 140 of a transmissive material.

In some non-limiting examples, especially in the case of such conductive coatings 930, a relatively thin layer thickness of up to substantially a few tens of nanometers (nm) may contribute to enhanced transmissive qualities and favorable optical properties, including without limitation, reduced microcavity effects) for use in an OLED device 100.

In some non-limiting examples, a reduction in the thickness of an electrode 120, 140 to promote transmissive qualities may be accompanied by an increase in the sheet resistance of the electrode 120, 140.

In some non-limiting examples, one measure of an amount of an electrically conductive material on a surface is a transmittance, since in some non-limiting examples, electrically conductive materials, including without limitation, metals, including without limitation, Mg, attenuate and/or absorb photons.

Thus, in some non-limiting examples, a surface of a material may be considered to be substantially devoid of an electrically conductive material if the transmittance therethrough is greater than 90%, greater than 92%, greater than 95%, and/or greater than 98% than the transmittance of a reference material of similar composition and dimension of such material, in some non-limiting examples, in the visible portion of the electromagnetic spectrum.

In some non-limiting examples, a device 100 having at least one electrode 120, 140 with a high sheet resistance creates a large current-resistance (IR) drop when coupled to the power source 15, in operation. In some non-limiting examples, such an IR drop may be compensated for, to some extent, by increasing a level (VDD) of the power source 15. However, in some non-limiting examples, increasing the level of the power source 15 to compensate for the IR drop due to high sheet resistance, for at least one pixel 340 (and/or sub-pixel(s) 2541-2543 thereof) may call for increasing the level of a voltage to be supplied to other components to maintain effective operation of the device 100.

In some non-limiting examples, to reduce power supply demands for a device 100 without significantly impacting an ability to make an electrode 120, 140 substantially transmissive (by employing at least one thin film layer of any combination of TCOs, thin metal films and/or thin metallic alloy films), an auxiliary electrode 1650 (FIG. 16) and/or busbar structure may be formed on the device 100 to allow current to be carried more effectively to various emissive region(s) of the device 100, while at the same time, reducing the sheet resistance and its associated IR drop of the transmissive electrode 120, 140.

In some non-limiting examples, a sheet resistance specification, for a common electrode of an AMOLED display device, may vary according to a number of parameters, including without limitation, a (panel) size of the display device and/or a tolerance for voltage variation across the device (panel). In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 1650 to comply with such specification for various panel sizes. In one non-limiting example, an aperture ratio of 0.64 was assumed for all display panel sizes and a thickness of the auxiliary electrode 1650 for various example panel sizes were calculated for example voltage tolerances of 0.1 V and 0.2 V in Table 1 below.

TABLE 1

Example Auxiliary Electrode Thickness for Various Panel Size and Voltage Tolerances

| Panel Size (in.) | | 9.7 | 12.9 | 15.4 | 27 | 65 |
|---|---|---|---|---|---|---|
| Specified Thickness (nm) | @0.1 V | 132 | 239 | 335 | 1200 | 6500 |
| | @0.2 V | 67 | 117 | 175 | 516 | 21000 |

By way of non-limiting example, for a top-emission device, the second electrode 140, which may be, in some non-limiting examples, the cathode 342, may be made transmissive. On the other hand, in some non-limiting examples, such auxiliary electrode 1650 may not be substantially transmissive but may be electrically coupled to the second electrode 140 to reduce an effective sheet resistance of the second electrode 140.

In some non-limiting examples, such auxiliary electrode 1650 may be positioned and/or shaped in either or both of a lateral aspect and/or cross-sectional aspect so as not to interfere with the emission of photons from the lateral aspect 410 of emissive region(s) of a pixel 340 (and/or a sub-pixel thereof).

In some non-limiting examples, a mechanism to make an electrode 120, 140, in the case of a bottom-emission device and/or a double-sided emission device, the first electrode 120, and/or in the case of a top-emission device and/or a double-sided emission device, the second electrode 140, is to form such electrode 120, 140 in a pattern across at least a portion of the lateral aspect 410 of the emissive region(s) thereof and/or in some non-limiting examples, across at least a portion of the lateral aspect 420 of the non-emissive region(s) surrounding them. In some non-limiting examples, such mechanism may be employed to form the auxiliary electrode 1650 in a position and/or shape in either or both of a lateral aspect and/or cross-sectional aspect so as not to interfere with the emission of photons from the lateral aspect 410 of emissive region(s) of a pixel 340 (and/or a sub-pixel thereof), as discussed above.

In some non-limiting examples, a combination of these and/or other mechanisms may be employed.

Additionally, in some non-limiting examples, in addition to rendering one or more of the electrodes, including without limitation, the first electrode 120, the second electrode 140 and/or the auxiliary electrode 1650, substantially transmissive across at least across a substantial portion of the lateral aspect 410 of the emissive region(s) corresponding to the pixel(s) 340 (and/or sub-pixel(s) 2541-2543 thereof) of the device 100, in order to allow photons to be emitted substantially across the lateral aspect(s) 410 thereof, it may be desired to make at least one of the lateral aspect(s) 420 of the non-emissive region(s) of the device 100 substantially transmissive in both the bottom and top directions, so as to render the device 100 substantially transmissive relative to photons incident on an external surface thereof, such that a substantial portion such externally-incident light may be transmitted through the device 100, in addition to the emission (in a top-emission, bottom-emission and/or double-sided emission) of photons generated internally within the device 100 as disclosed herein.

Conductive Coating 930

In some non-limiting examples, a conductive coating material 931 (FIG. 9) used to deposit a conductive coating 930 onto an exposed surface 111 of underlying material may be a mixture and/or a compound.

In some non-limiting examples, at least one component of such mixture and/or compound is not deposited on such surface, may not be deposited on such exposed surface 111 during deposition and/or may be deposited in a small amount relative to an amount of remaining component(s) of such mixture and/or compound that are deposited on such exposed surface 111.

In some non-limiting examples, such at least one component of such mixture and/or compound may have a property relative to the remaining component(s) to selectively deposit substantially only the remaining component(s). In some non-limiting examples, the property may be a vapor pressure.

In some non-limiting examples, such at least one component of such mixture and/or compound may have a lower vapor pressure relative to the remaining components.

In some non-limiting examples, the conductive coating material 931 may be a copper-magnesium (Cu—Mg) mixture and/or compound, in which Cu has a lower vapor pressure than Mg.

In some non-limiting examples, the conductive coating material 931 used to deposit a conductive coating 930 onto an exposed surface 111 may be substantially pure.

In some non-limiting examples, the conductive coating material 931 used to deposit Mg is and in some non-limiting examples, comprises substantially pure Mg. In some non-limiting examples, substantially pure Mg may exhibit substantially similar properties relative to pure Mg. In some non-limiting examples, purity of Mg may be about 95% or higher, about 98% or higher, about 99% or higher, about 99.9% or higher and/or about 99.99% and higher.

In some non-limiting examples, a conductive coating material 931 used to deposit a conductive coating 930 onto an exposed surface 111 may comprise other metals in place of and/or in combination of Mg. In some non-limiting examples, a conductive coating material 931 comprising such other metals may include high vapor pressure materials, including without limitation, Yb, Cd, Zn and/or any combination of any of these.

In some non-limiting examples, materials that are typically used to form a transmissive electrode 120, 140, include TCOs, including without limitation, ternary compositions, such as, without limitation, FTO, IZO and/or ITO. In some non-limiting examples, an electrically conductive coating 930, in a thin film, including without limitation, those formed by a depositing a thin layer of a metal, including without limitation, Ag, Al and/or by depositing a thin layer of a metallic alloy, including without limitation, a magnesium silver (Mg:Ag) alloy and/or a ytterbium silver (Yb:Ag) alloy, may exhibit light-transmissive characteristics. In some non-limiting examples, the alloy may comprise a composition ranging from between about 1:9 to about 9:1 by volume. In some non-limiting examples, the electrode 120, 140 may be formed of a plurality of layers of any combination of conductive coatings 930, any one or more of which may be comprised of TCOs, thin metal films, thin metallic alloy films and/or any combination of any of these.

Patterning

As a result of the foregoing, it may be desirable to selectively deposit, across the lateral aspect 410 of the emissive region(s) of a pixel 340 (and/or a sub-pixel thereof) and/or the lateral aspect 420 of the non-emissive region(s) surrounding the emissive region(s), in a pattern, on an exposed surface 111 of a frontplane 10 layer of the device 100, including without limitation, at least one of the first electrode 120, the second electrode 140 and/or the organic layer 130 (and/or a semiconducting layer thereof) and/or of the auxiliary electrode 1650, if any. In some non-limiting examples, the first electrode 120, the second electrode 140 and/or the auxiliary electrode 1650 may be deposited in at least one of a plurality of conductive coatings 930.

In some non-limiting examples, such patterning may be achieved by employing a shadow mask for each at least one layer that has a pattern of apertures therein across region(s) across which the at least one layer is to be selectively deposited, using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing, PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof.

In some non-limiting examples, patterned electrodes, including without limitation, the first electrode 120, the second electrode 140 and/or the auxiliary electrode 1650, may be achieved by employing such masks to create features across the lateral aspect(s) 410 of emissive region(s) corresponding to pixel(s) 340 (and/or sub-pixel(s) 2541-2543 thereof) and/or of the lateral aspect(s) 420 of non-emissive region(s) surrounding them to impart a diverse topography that creates discontinuities in the deposition of a conductive coating 930 thereon.

Figure 5:
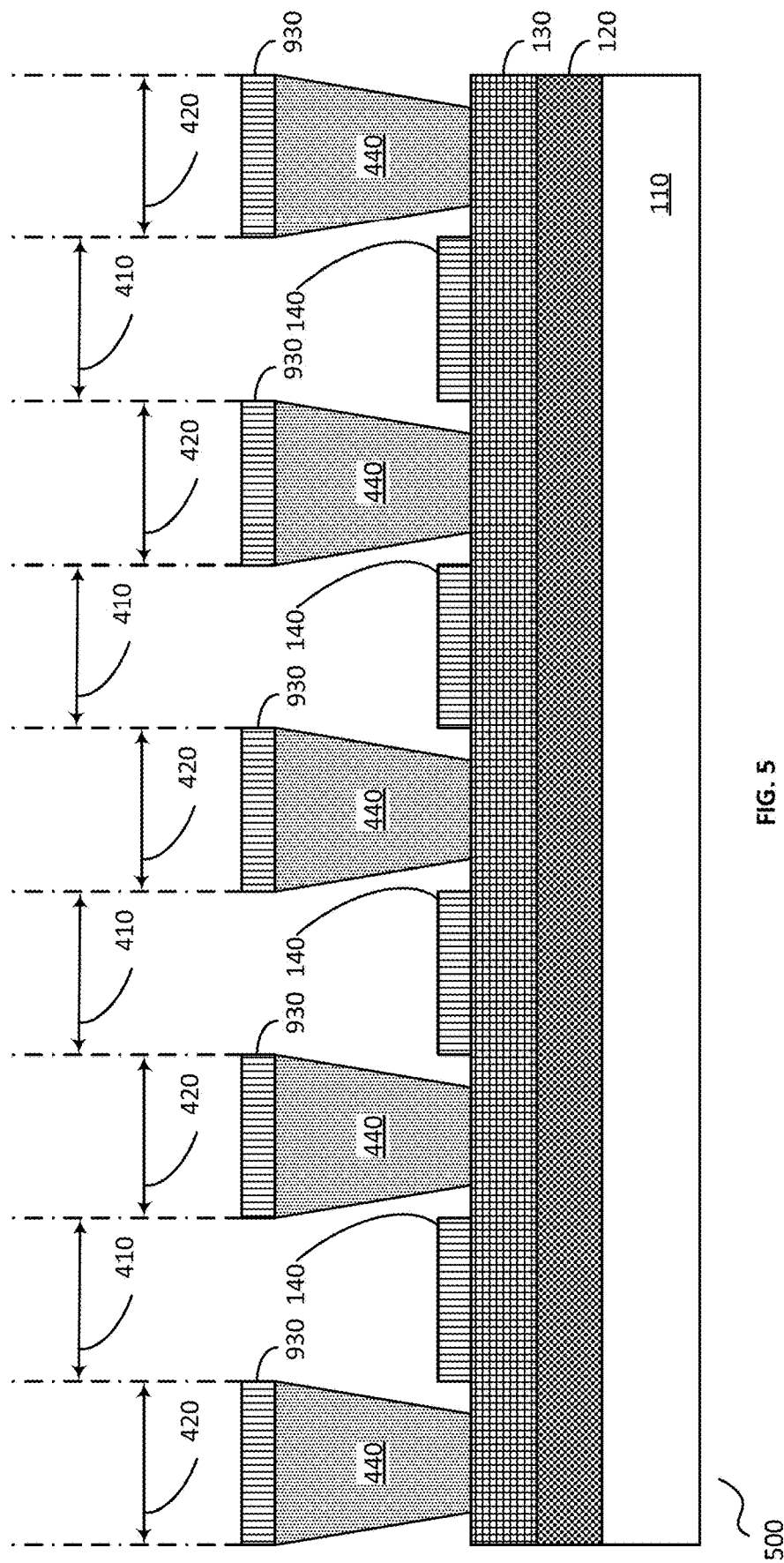
FIG. 5 is a cross-sectional view of the electro-luminescent device of FIG. 1, showing at least one example pixel definition layer (PDL) of increased thickness supporting patterned deposition of at least one second electrode of the device.

FIG. 5 shows an example cross-sectional view of a device 500 that is substantially similar to the device 100, but further comprises a plurality of raised PDLs 440 across the lateral aspect(s) 420 of non-emissive regions surrounding the lateral aspect(s) 410 of emissive region(s) corresponding to pixel(s) 340 (and/or sub-pixel(s) 2541-2543 thereof).

When the conductive coating 930 is deposited, in some non-limiting examples, using an open-mask and/or a mask-free deposition process, the conductive coating 930 is deposited across the lateral aspect(s) 410 of emissive region(s) corresponding to pixel(s) 340 (and/or sub-pixel(s) 2541-2543 thereof) to form the (in the figure) second electrode 140 thereon, and also across the lateral aspect(s) 420 of non-emissive regions surrounding them, to form regions of conductive coating 930 on top of the PDLs 440. To ensure that each (segment) of the second electrode 140 is not electrically coupled to any of the at least one conductive region(s) 930, a thickness of the PDL(s) 440 is greater than a thickness of the second electrode(s) 140. In some non-limiting examples, the PDL(s) 440 may be provided, as shown in the figure, with an undercut profile to further decrease a likelihood that any (segment) of the second electrode(s) 140 will be electrically coupled to any of the at least one conductive region(s) 930.

In some non-limiting examples, application of a barrier coating 1650 over the device 500 may result in poor adhesion of the barrier coating 1650 to the device 500, having regard to the highly non-uniform surface topography of the device 500.

Such shadow masks may, in some non-limiting examples be FMMs.

Those having ordinary skill in the relevant art will appreciate that an FMM may, in some non-limiting examples, be used to form relatively small features, with a feature size on the order of tens of microns or smaller.

In some non-limiting examples, an FMM may be deformed during a shadow mask deposition process, especially at high temperatures, such as may be employed for deposition of a conductive coating 930.

In some non-limiting examples, limitations on the mechanical (including, without limitation, tensile) strength of the FMM and/or shadowing effects, especially in a high-temperature deposition process, may impart a constraint on an aspect ratio of features that may be achievable using such FMMs.

In some non-limiting examples, the type and number of patterns that may be achievable using such FMMs may be constrained. By way of non-limiting example, each portion of the FMM will be physically supported. As a result, in some non-limiting examples, some patterns may not be achievable in a single processing stage, including by way of non-limiting example, where a pattern specifies an isolated feature.

In some non-limiting examples, FMMs that may be used to produce repeating structures, including without limitation, auxiliary electrodes 1650 and/or busbar structures, spread across the entire surface of a device 100, may call for a large number of apertures to be formed in the FMM. In some non-limiting examples, the formation of a large number of apertures may compromise the structural integrity of the FMM. In some non-limiting examples, especially in a high-temperature deposition process, such FMMs may be subject to significant warping or deformation during processing, which may distort the shape and position of apertures therein, which may cause the selective deposition pattern to be varied, with a degradation in performance and/or yield.

In some non-limiting examples, such FMMs may exhibit a tendency to warp during a high-temperature deposition process, which may, in some non-limiting examples, distort the shape and position of apertures therein, which may cause the selective deposition pattern to be varied, with a degradation in performance and/or yield.

In some non-limiting examples, repeated use of such FMMs in successive depositions, especially in a high-temperature deposition process, may cause the deposited material to adhere thereto, which may obfuscate features of the FMM and which may cause the selective deposition pattern to be varied, with a degradation in performance and/or yield.

In some non-limiting examples, FMMs may be periodically cleaned to remove such adhered material. Such cleaning procedures may, in some non-limiting examples, be time-consuming and/or expensive.

In some non-limiting examples, irrespective of any such cleaning processes, continued use of such FMMs, especially in a high-temperature deposition process, may render them ineffective at producing a desired patterning, at which they may be discarded and/or replaced, in a complex and expensive process.

In some non-limiting examples, it may be desirable to tune optical microcavity effects associated with sub-pixel(s) 2541-2543 of different colours (and/or wavelengths) by varying a thickness of the organic layer (and/or a semiconducting layer thereof) across the lateral aspect 410 of emissive region(s) corresponding to sub-pixel(s) 2541-2543 of one colour relative to the lateral aspect 410 of emissive region(s) corresponding to sub-pixel(s) 2541-2543 of another colour. In some non-limiting examples, the use of FMMs to perform patterning may not provide a precision called for to provide such optical microcavity tuning effects in at least some cases and/or, in some non-limiting examples, in a production environment for OLED displays 100.

Nucleation Inhibiting and/or Promoting Material Properties

In some non-limiting examples, a conductive coating 930 may be employed as, or as at least one of a plurality of layers of conductive coatings 930 to form, an electrode 120, 140 and/or an auxiliary electrode 1650, may exhibit a relatively low affinity towards being deposited on an underlying exposed surface, so that the deposition of the thin film conductive coating 930 is inhibited.

The relative affinity or lack thereof of a material and/or a property thereof to having a conductive coating 930 deposited thereon may be referred to as being "nucleation promoting" and/or "nucleation inhibiting" respectively.

In the present disclosure, "nucleation inhibiting" refers to a coating, material and/or a layer thereof that has a surface that exhibits a relatively low affinity toward deposition of a conductive coating 930 and/or material, such that the deposition of the conductive coating 930 on such surface is inhibited.

In the present disclosure, "nucleation promoting" refers to a coating, material and/or a layer thereof that has a surface that exhibits a relatively high affinity toward deposition of a conductive coating 930 and/or material, such that the deposition of the conductive coating 930 on such surface is facilitated.

The term "nucleation" in these terms references the nucleation stage of a thin film formation process, in which molecules in a vapor phase condense onto the surface t form nuclei.

Without wishing to be bound by a particular theory, it is postulated that the shapes and sizes of such nuclei and the subsequent growth of such nuclei into islands and thereafter into a thin film may depend upon a number of factors, including without limitation, interfacial tensions between the vapor, the surface and the condensed film nuclei.

In the present disclosure, such affinity may be measured in a number of fashions.

One measure of a nucleation inhibiting and/or nucleation promoting property of a surface is an initial sticking probability or initial sticking coefficient $S_0$ of the surface for a given electrically conductive material, including without limitation, Mg. In the present disclosure, the terms "sticking probability" and "sticking coefficient" may be used interchangeably.

In some non-limiting examples, the sticking probability S may be given by:

$$S = \frac{N_{ads}}{N_{total}}$$

where $N_{ads}$ is a number of adsorbed monomers that remain on an exposed surface 111 (that is, are incorporated into a film) and $N_{total}$ is a total number of impinging monomers on the surface. A sticking probability S equal to 1 indicates that all monomers that impinge on the surface are adsorbed and subsequently incorporated into a growing film. A sticking probability S equal to 0 indicates that all monomers that impinge on the surface are desorbed and subsequently no film is formed on the surface. A sticking probability S of metals on various surface can be evaluated using various techniques of measuring the sticking probability S, including without limitation, a dual quartz crystal microbalance (QCM) technique as described by Walker et al., *J. Phys. Chem. C* 2007, 111, 765 (2006).

As the density of islands increases (e.g., increasing average film thickness), a sticking probability S may change. By way of non-limiting example, a low initial sticking probability $S_0$ may increase with increasing average film thickness. This can be understood based on a difference in sticking probability S between an area of a surface with no islands, by way of non-limiting example, a bare substrate 110 and an area with a high density of islands. By way of non-limiting example, a monomer that impinges on a surface of an island may have a sticking probability S that approaches 1.

An initial sticking probability $S_0$ may therefore be specified as a sticking probability S of a surface prior to the formation of any significant number of critical nuclei. One measure of an initial sticking probability $S_0$ can involve a sticking probability S of a surface for a material during an initial stage of deposition of the material, where an average thickness of the deposited material across the surface is at or below a threshold value. In the description of some non-limiting examples a threshold value for an initial sticking probability $S_0$ can be specified as, by way of non-limiting example, 1 nm. An average sticking probability $\overline{S}$ may then be given by:

$$\overline{S} = S_0(1 - A_{nuc}) + S_{nuc}(A_{nuc})$$

where $S_{nuc}$ is a sticking probability S of an area covered by islands, and $A_{nuc}$ is a percentage of an area of a substrate surface covered by islands.

Figure 6:
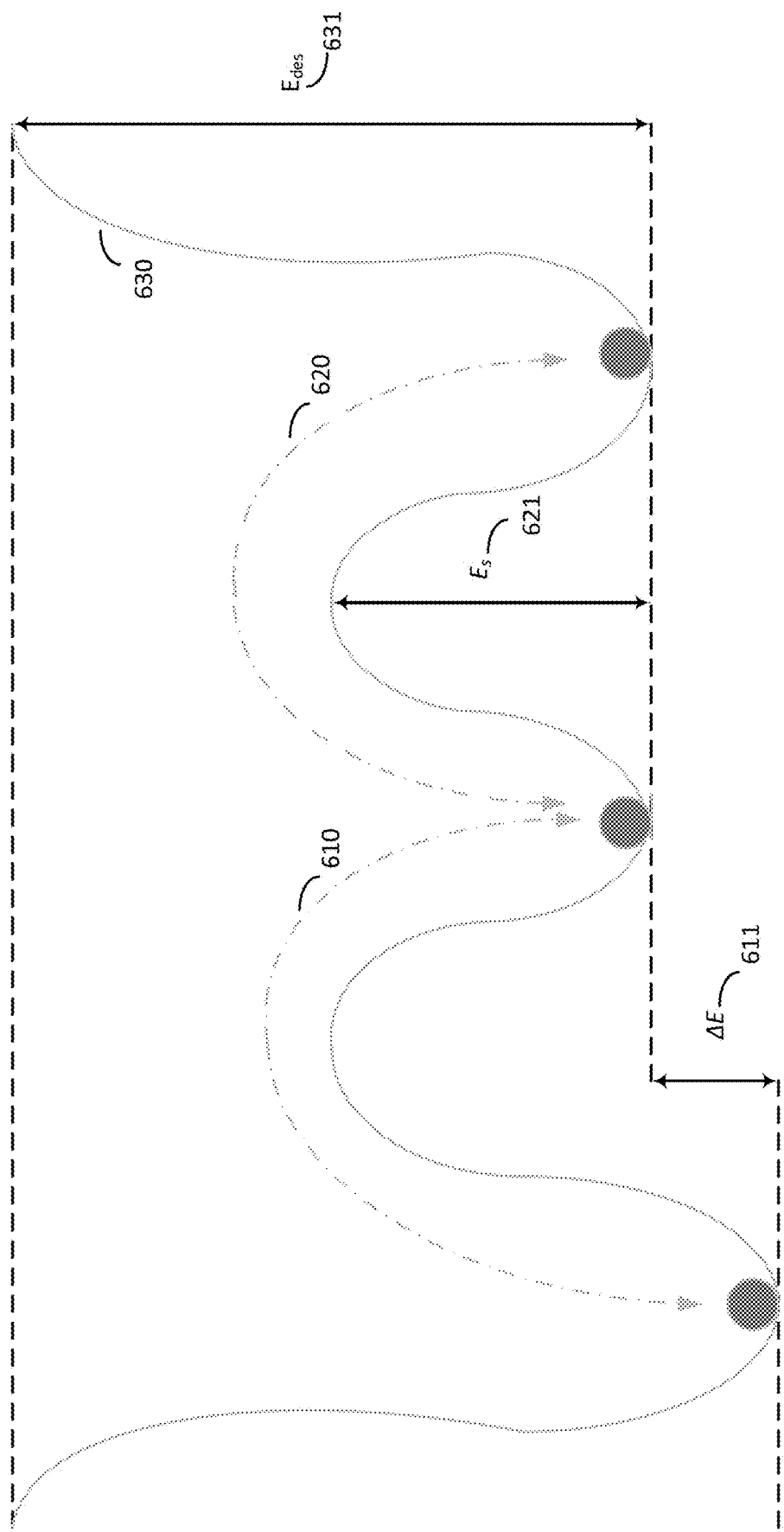
FIG. 6 is an example energy profile illustrating relative energy states of an adatom adsorbed onto a surface according to an example in the present disclosure.

An example of an energy profile of an adatom adsorbed onto an exposed surface 111 of an underlying material (in the figure, the substrate 110) is illustrated in FIG. 6. Specifically, FIG. 6 illustrates example qualitative energy profiles corresponding to: an adatom escaping from a local low energy site (610); diffusion of the adatom on the exposed surface 111 (620); and desorption of the adatom (630).

In 610, the local low energy site may be any site on the exposed surface 111 of an underlying material, onto which an adatom will be at a lower energy. Typically, the nucleation site may comprise a defect and/or an anomaly on the exposed surface 111, including without limitation, a step edge, a chemical impurity, a bonding site and/or a kink. Once the adatom is trapped at the local low energy site, there may in some non-limiting examples, typically be an energy barrier before surface diffusion takes place. Such energy barrier is represented as $\Delta E$ 611 in FIG. 6. In some non-limiting examples, if the energy barrier $\Delta E$ 611 to escape the local low energy site is sufficiently large the site may act as a nucleation site.

In 620, the adatom may diffuse on the exposed surface 111. By way of non-limiting example, in the case of localized absorbates, adatoms tend to oscillate near a minimum of the surface potential and migrate to various neighboring sites until the adatom is either desorbed, and/or is incorporated into a growing film and/or growing islands formed by a cluster of adatoms. In FIG. 6, the activation energy associated with surface diffusion of adatoms is represented as $E_s$ 621.

In 630, the activation energy associated with desorption of the adatom from the surface is represented as $E_{des}$ 631. Those having ordinary skill in the relevant art will appreciate that any adatoms that are not desorbed may remain on the exposed surface 111. By way of non-limiting example, such adatoms may diffuse on the exposed surface 111, be incorporated as part of a growing film and/or coating, and/or become part of a cluster of adatoms that form islands on the exposed surface 111.

Based on the energy profiles 610, 620, 630 shown in FIG. 6, it may be postulated that NIC 910 materials exhibiting relatively low activation energy for desorption ($E_{des}$ 631) and/or relatively high activation energy for surface diffusion ($E_s$ 631) may be particularly advantageous for use in various applications.

One measure of a nucleation inhibiting and/or nucleation promoting property of a surface is an initial deposition rate of a given electrically conductive material, including without limitation, Mg, on the surface, relative to an initial deposition rate of the same conductive material on a reference surface, where both surfaces are subjected to and/or exposed to an evaporation flux of the conductive material.
Selective Coatings for Impacting Nucleation Inhibiting and/or Promoting Material Properties In some non-limiting examples, one or more selective coatings 710 (FIG. 7), may be selectively applied to at least a first portion 701 (FIG. 7) of an exposed surface 111 of an underlying material to alter a nucleation inhibiting property (and/or conversely a nucleation promoting property) to be presented for application of a thin film conductive coating 930 thereon. In some non-limiting examples, there may be a second portion 703 (FIG. 7) of the exposed surface 111 of an underlying material to which no such selective coating(s) 710, has been applied, such that its nucleation inhibiting property (and/or conversely its nucleation promoting property) is not substantially altered.

Such a selective coating 710 may be an NIC 910 and/or a nucleation promoting compound and/or coating (NPC 1020 (FIG. 10)).

It will be appreciated by those having ordinary skill in the relevant art that the use of such a selective coating 710 may, in some non-limiting examples, facilitate and/or permit the selective deposition of the conductive coating 930 without employing an FMM during the stage of depositing the conductive coating 930.

In some non-limiting examples, such selective deposition of the conductive coating 930 may be in a pattern. In some non-limiting examples, such pattern may facilitate providing and/or increasing transmissivity of at least one of the top and/or bottom of the device 100, within the lateral aspect 410 of one or more emissive region(s) of a pixel 340 (and/or a sub-pixel thereof) and/or within the lateral aspect 420 of one or more non-emissive region(s) that may, in some non-limiting examples, surround such emissive region(s).

In some non-limiting examples, the conductive coating 930 may be deposited to form, and/or in some non-limiting examples, a layer thereof, a conductive structure for the device 100, which in some non-limiting examples may be an electrode, including without limitation, the first electrode 120 and/or the second electrode 140 to act as one of an anode 341 and/or a cathode 342, and/or an auxiliary electrode 1650 to support conductivity thereof.

In some non-limiting examples, an NIC 910 with respect to a given conducting coating 930, including without limitation Mg, may refer to a compound and/or coating having a surface that exhibits a relatively low initial sticking probability $S_0$ for the conductive coating 930 (in the example Mg) in vapor form, such that deposition of the conductive coating 930 (in the example Mg) onto the exposed surface 111 is inhibited. Thus, in some non-limiting examples, selective application of an NIC 910 may reduce an initial sticking probability $S_0$ of an exposed surface 111 (of the NIC 910) presented for deposition of the conductive coating 930 thereon.

In some non-limiting examples, an NPC 1020, with respect to a given conductive coating 930, including without limitation Mg, may refer to a compound and/or coating having an exposed surface 111 that exhibits a relatively high initial sticking probability $S_0$ for the conductive coating 930 (in the example Mg) in vapor form, such that deposition of the conductive coating 930 (in the example Mg) onto the exposed surface 111 is facilitated. Thus, in some non-limiting examples, selective application of an NPC 1020 may increase an initial sticking probability $S_0$ of an exposed surface 111 (of the NPC 1020) presented for deposition of the conductive coating 930 thereon.

When the selective coating 710 is an NIC 910, the first portion 701 of the exposed surface 111 of the underlying material, upon which the NIC 910 is applied, will thereafter present a treated surface (of the NIC 910) whose nucleation inhibiting property has been increased or alternatively, whose nucleation promoting property has been reduced (in either case, the surface of the NIC 910 applied to the first portion 701 has a reduced affinity for deposition of the conductive coating 930 thereon). By contrast the second portion 703, upon which no such NIC 910 has been applied, will continue to present an exposed surface 111 of the underlying substrate 110) whose nucleation inhibiting property or alternatively, whose nucleation promoting property (in either case, the exposed surface 111 of the underlying substrate 110 that is substantially devoid of the selective coating 710, has an affinity for deposition of the conductive coating 930 thereon that has not been substantially altered.

When the selective coating 710 is an NPC 1020, the first portion 701 of the exposed surface 111 of the underlying material, upon which the NPC 1020 is applied, will thereafter present a treated surface (of the NPC 1020) whose nucleation inhibiting property has been reduced or alternatively, whose nucleation promoting property has been increased (in either case, the surface of the NPC 1020 applied to the first portion 701 has an increased affinity for deposition of the conductive coating 930 thereon). By contrast, the second portion 703, upon which no such NPC 1020 has been applied, will continue to present an exposed surface 111 (of the underlying substrate 110) whose nucleation inhibiting property or alternatively, whose nucleation promoting property (in either case, the exposed surface 111 of the underlying substrate 110 that is substantially devoid of the NPC 1020, has an affinity for deposition of the conductive coating 930 thereon that has not been substantially altered.

In some non-limiting examples, both an NIC 910 and an NPC 1020 may be selectively applied to respective first portions 701 and NPC portions 1002 of an exposed surface 111 of an underlying material to respectively alter a nucleation inhibiting property (and/or conversely a nucleation promoting property) to be presented for application of a thin film conductive coating 930 thereon. In some non-limiting examples, there may be a second portion 703 of the exposed surface 111 of an underlying material to which no selective coating 710 has been applied, such that its nucleation inhibiting property (and/or conversely its nucleation promoting property) is not substantially altered.

In some non-limiting examples, the first portion 701 and NPC portion 1002 may overlap, such that a first coating of an NIC 910 and/or an NPC 1020 may be selectively applied to the exposed surface 111 of the underlying material in such overlapping region and the second one of the NIC 910 and/or the NPC 1020 may be selectively applied to the treated exposed surface of the first coating. In some non-limiting examples, the first coating is an NIC 910. In some non-limiting examples, the first coating is an NPC 1020.

In some non-limiting examples, the first portion 701 (and/or NPC portion 1002) to which the selective coating 710 has been applied, may comprise a removal region, in which the applied selective coating 710 has been removed, to present the uncovered surface of the underlying material for application of a thin film conductive coating 930 thereon, such that its nucleation inhibiting property (and/or conversely its nucleation promoting property) is not substantially altered.

In some non-limiting examples, the underlying material may be at least one layer selected from the substrate 110 and/or at least one of the frontplane 10 layers, including without limitation, the first electrode 120, the second electrode 140, the organic layer 130 (and/or at least one of the semiconducting layers thereof) and/or any combination of any of these.

In some non-limiting examples, the conductive coating 930 may have specific material properties. In some non-limiting examples, the conductive coating 930 may comprise Mg, whether alone or in a compound and/or alloy.

By way of non-limiting example, pure and/or substantially pure Mg may not be readily deposited onto some organic surfaces due to a low sticking probability S of Mg on some organic surfaces.

Application of Selective Coatings

In some non-limiting examples, a thin film comprising the selective coating 710, may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof.

Figure 7:
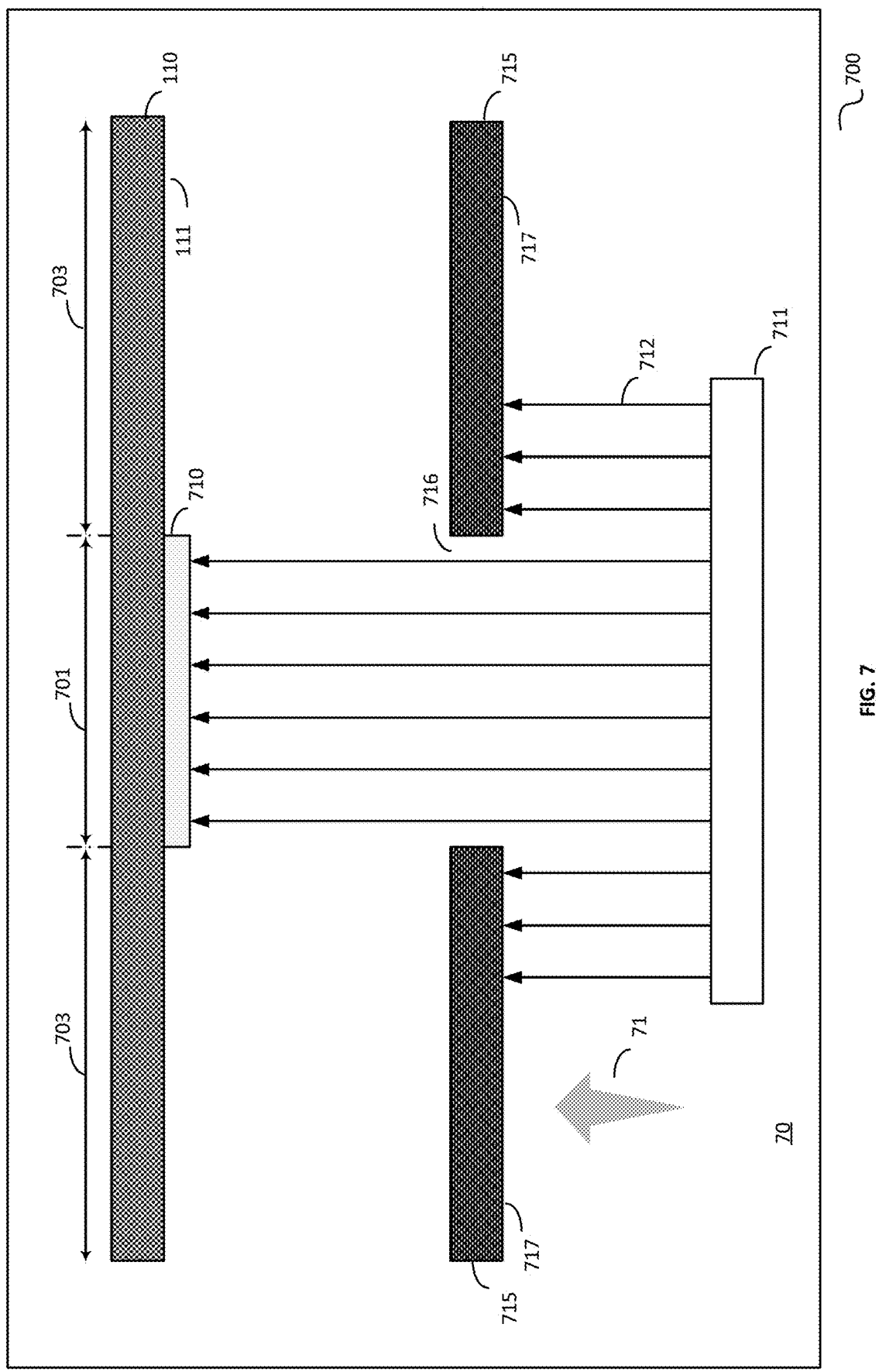
FIG. 7 is a schematic diagram showing an example process for depositing a selective coating in a first pattern on an exposed surface of an underlying material, according to an example in the present disclosure.

FIG. 7 is an example schematic diagram illustrating a non-limiting example of an evaporative process, shown generally at 700, in a chamber 70, for selectively depositing a selective coating 710 onto a first portion 701 of an exposed surface 111 of an underlying material (in the figure, for purposes of simplicity of illustration only, the substrate 110).

In the process 700, a quantity of a selective coating material 711, is heated under vacuum, to evaporate and/or sublime 712 the selective coating material 711. In some non-limiting examples, the selective coating material 711 comprises entirely, and/or substantially, a material used to form the selective coating 710. Evaporated selective coating material 712 disperses throughout the chamber 70, including in a direction indicated by arrow 71, toward the exposed surface 111. When the evaporated selective coating material 712 is incident on the exposed surface 111, that is, in the first portion 701, the selective coating 710 is formed thereon.

In some non-limiting examples, deposition of the selective coating material 711 may be performed using an open mask and/or mask-free deposition process, such that the selective coating 710 is formed substantially across the entire exposed surface 111 of the underlying material (in the figure, the substrate 110) to produce a treated surface (of the selective coating 710).

It will be appreciated by those having ordinary skill in the relevant art that, contrary to that of an FMM, the feature size of an open mask is generally comparable to the size of a device 100 being manufactured. In some non-limiting examples, such an open mask may have an aperture that may generally correspond to a size of the device 100, which in some non-limiting examples, may correspond, without limitation, to about 1 inch for micro-displays, about 4-6 inches for mobile displays, and/or about 8-17 inches for laptop and/or tablet displays, so as to mask edges of such device 100 during manufacturing. In some non-limiting examples, the feature size of an open mask may be on the order of about 1 cm and/or greater. In some non-limiting examples, an aperture formed in an open mask may in some non-limiting examples be sized to encompass the lateral aspect(s) 410 of a plurality of emissive regions each corresponding to a pixel 340 (and/or a sub-pixel thereof) and/or surrounding and/or the lateral aspect(s) 420 of surrounding and/or intervening non-emissive region(s).

It will be appreciated by those having ordinary skill in the relevant art that, in some non-limiting examples, the use of an open mask may be omitted, if desired. In some non-limiting examples, an open mask deposition process described herein may alternatively be conducted without the use of an open mask, such that an entire target exposed surface 111 may be exposed.

In some non-limiting examples, as shown in the figure for the process 700, the selective coating 710 may be selectively deposited only onto a portion, in the example illustrated, the first portion 701, of the exposed surface 111, by the interposition, between the selective coating material 711 and the exposed surface 111, of a shadow mask 715, which in some non-limiting examples, may be an FMM. The shadow mask 715 has at least one aperture 716 extending therethrough such that a portion of the evaporated selective coating material 712 passes through the aperture 716 and is incident on the exposed surface 111 to form the selective coating 710. Where the evaporated selective coating material 712 does not pass through the aperture 716 but is incident on the surface 717 of the shadow mask 715, it is precluded from being disposed on the exposed surface 111 to form the selective coating 710 within the second portion 703. The second portion 703 of the exposed surface 111 is thus substantially devoid of the selective coating 710. In some non-limiting examples (not shown), the selective coating material 711 that is incident on the shadow mask 715 may be deposited on the surface 717 thereof.

Accordingly, a patterned surface is produced upon completion of the deposition of the selective coating 710.

In some non-limiting examples, for purposes of simplicity of illustration, the selective coating 710 employed in FIG. 7 may be an NIC 910. In some non-limiting examples, for purposes of simplicity of illustration, the selective coating 710 employed in FIG. 7 may be an NPC 1020.

FIGS. 8A-8D illustrate non-limiting examples of open masks.

Figure 8A:
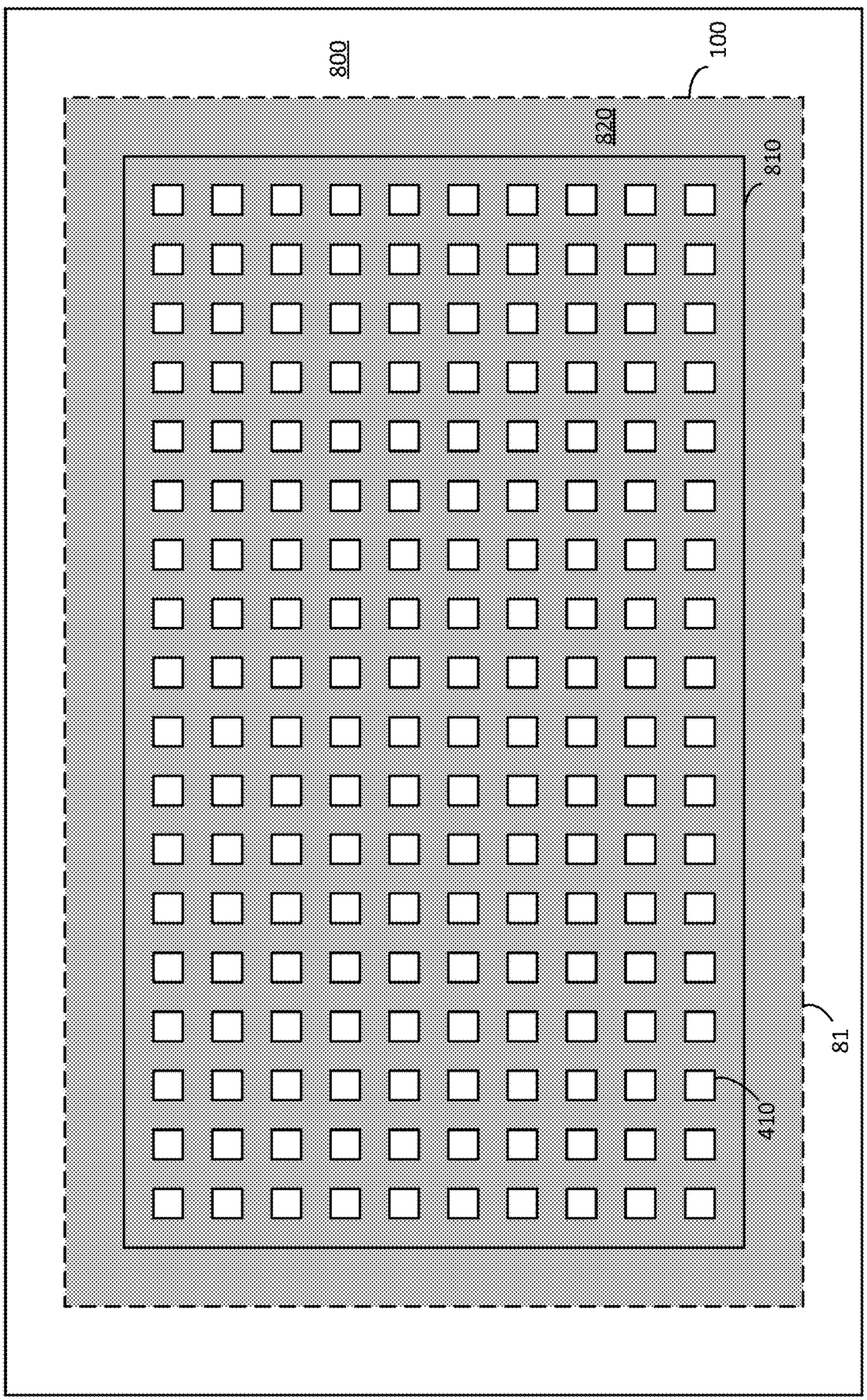
FIG. 8A is a schematic diagram showing an example open mask, suitable for use with the process of FIG. 7, having an aperture therewithin that does not obscure the lateral aspect(s) of any emissive regions corresponding to pixel(s) (and/or sub-pixel(s) thereof) according to an example in the present disclosure.

FIG. 8A illustrates a non-limiting example of an open mask 800 having and/or defining an aperture 810 formed therein. In some non-limiting examples, such as shown, the aperture 810 of the open mask 800 is smaller than a size of a device 100, such that when the mask 800 is overlaid on the device 100, the mask 800 covers edges of the device 100. In some non-limiting examples, as shown, the lateral aspect(s) 410 of the emissive regions corresponding to all and/or substantially all of pixel(s) 340 (and/or sub-pixel(s) 2541-2543 thereof) of the device 100 are exposed through the aperture 810, while an unexposed region 820 is formed between outer edges 81 of the device 100 and the aperture 810. It will be appreciated by those having ordinary skill in the relevant art that, in some non-limiting examples, electrical contacts and/or other components (not shown) of the device 100 may be located in such unexposed region 820, such that these components remain substantially unaffected throughout an open mask deposition process.

Figure 8B:
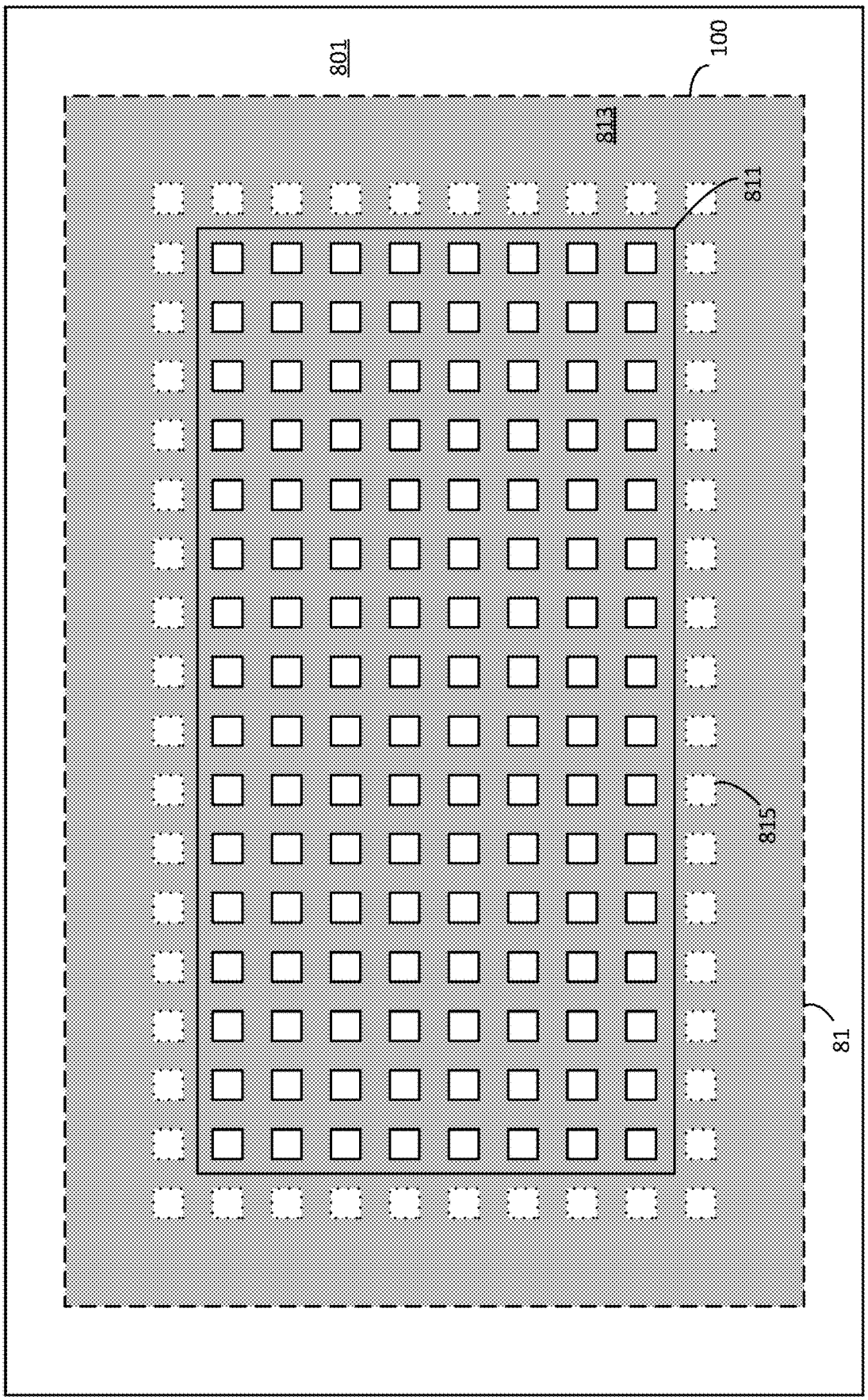
FIG. 8B is a schematic diagram showing an example open mask, suitable for use with the process of FIG. 7, having an aperture therewithin that obscures the lateral aspect(s) of emissive regions corresponding to outlying pixel(s) (and/or sub-pixel(s) thereof) according to an example in the present disclosure.

FIG. 8B illustrates a non-limiting example of an open mask 801 having and/or defining an aperture 811 formed therein that is smaller than the aperture 810 of FIG. 8A, such that when the mask 801 is overlaid on the device 100, the mask 801 covers at least the lateral aspect(s) 815 of the emissive region(s) corresponding to at least some pixel(s) 340 (and/or sub-pixel(s) 2541-2543 thereof). As shown, in some non-limiting examples, the lateral aspect(s) 815 of the emissive region(s) corresponding to outermost pixel(s) 340 (and/or sub-pixel(s) 2541-2543 thereof) are located within an unexposed region 813 of the device 100, formed between the outer edges 81 of the device 100 and the aperture 811, are masked during an open mask deposition process to inhibit evaporated selective coating material 712 from being incident on the unexposed region 813.

Figure 8C:
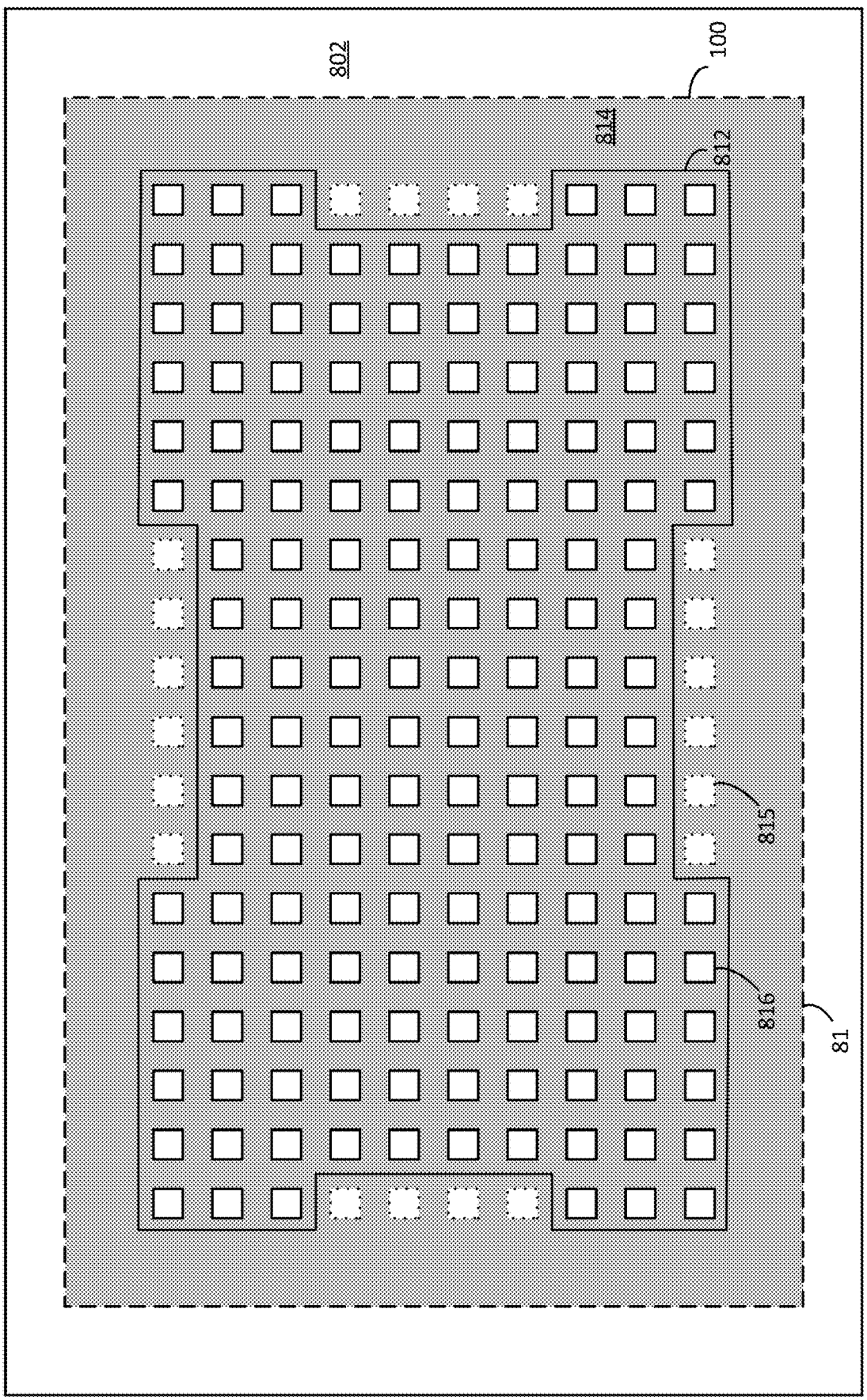
FIG. 8C is a schematic diagram showing an example open mask, suitable for use with the process of FIG. 7, having an aperture therewithin that obscures the lateral aspect(s) of emissive regions corresponding to some but not all outlying pixel(s) (and/or sub-pixel(s) thereof) according to an example in the present disclosure.

FIG. 8C illustrates a non-limiting example of an open mask 802 having and/or defining an aperture 812 formed therein defines a pattern that covers the lateral aspect(s) 815 of the emissive region(s) corresponding to at least some pixel(s) 340 (and/or sub-pixel(s) 2541-2543 thereof), while exposing the lateral aspect(s) 816 of the emissive region(s) corresponding to at least some pixel(s) 340 (and/or sub-pixel(s) 2541-2543 thereof). As shown, in some non-limiting examples, the lateral aspect(s) 815 of the emissive region(s) corresponding to at least some pixel(s) 340 (and/or sub-pixel(s) 2541-2543 thereof) located within an unexposed region 814 of the device 100, are masked during an open mask deposition process to inhibit evaporated selective coating material 712 from being incident on the unexposed region 814.

While in FIGS. 8A-8C, the lateral aspects 815 of the emissive region(s) corresponding to at least some of the outermost pixels 340 (and/or sub-pixel(s) 2541-2543 thereof) have been masked, as illustrated, those having ordinary skill in the relevant art will appreciate that, in some non-limiting examples, an aperture of an open mask 800-802 may be shaped to mask the lateral aspects 410 of other emissive region(s) and/or the lateral aspects 420 of non-emissive region(s) of the device 100.

Furthermore, while FIGS. 8A-8C show open masks 800-802 having a single aperture 810-812, those having ordinary skill in the relevant art will appreciate that such open masks 800-802 may, in some non-limiting examples (not shown), additional apertures (not shown) for exposing multiple regions of an exposed surface 111 of an underlying material of a device 100.

Figure 8D:
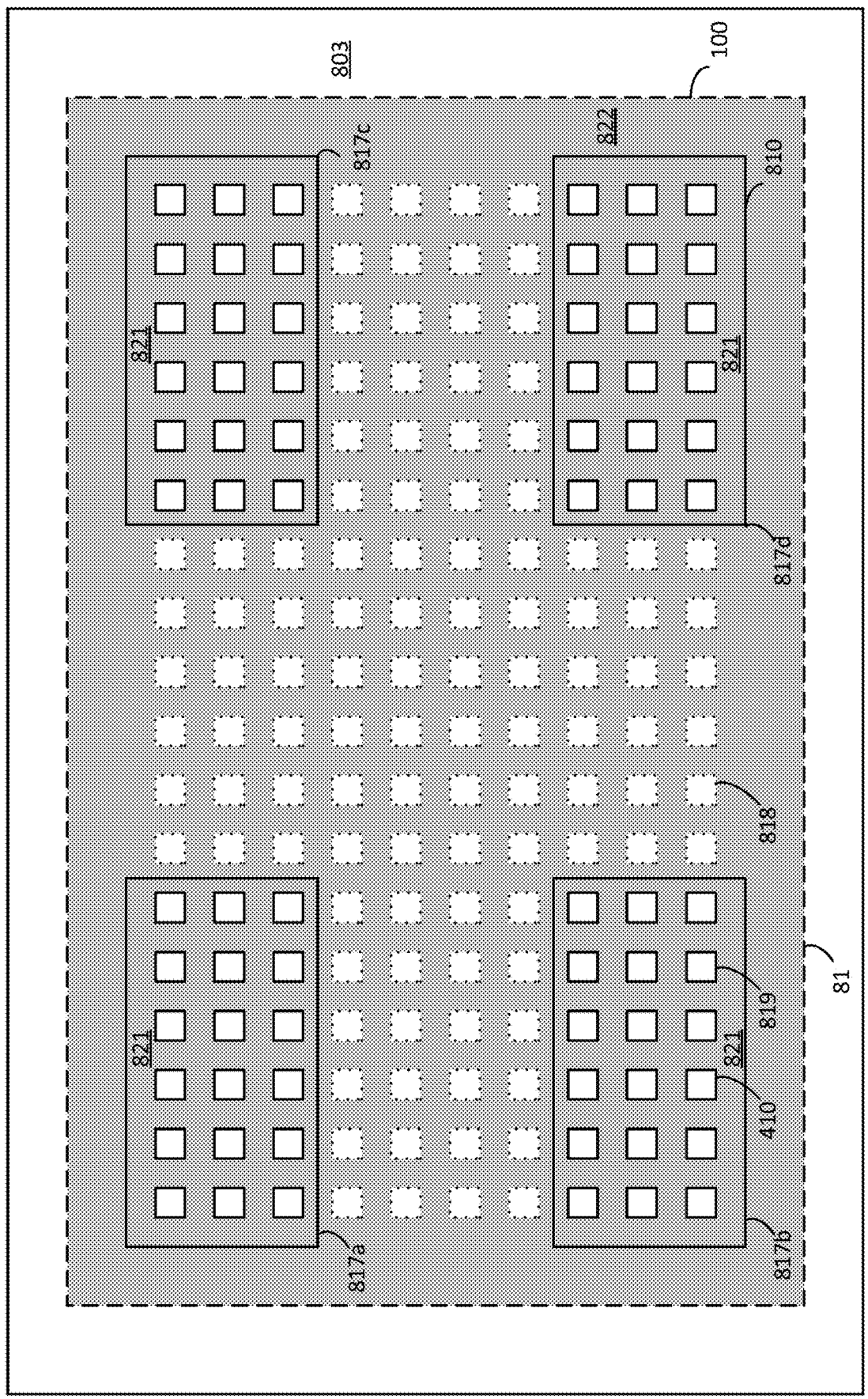
FIG. 8D is a schematic diagram showing an example open mask, suitable for use with the process of FIG. 7, having a plurality of apertures therewithin that each define a first set of regions that do not obscure the lateral aspect(s) of emissive regions corresponding to some pixel(s) (and/or sub-pixel(s) thereof) lying therewithin but that obscure the lateral aspect(s) of emissive regions corresponding to some pixel(s) (and/or sub-pixel(s) thereof) that lie beyond such regions.

FIG. 8D illustrates a non-limiting example of an open mask 803 having and/or defining a plurality of apertures 817a-817d. The apertures 817a-817d are, in some non-limiting examples, positioned such that they may selectively expose certain regions 821 of the device 100, while masking other regions 822. In some non-limiting examples, the lateral aspects 819 of certain emissive region(s) corresponding to at least some pixel(s) 340 (and/or sub-pixel(s) 2541-2543 thereof) are exposed through the apertures 817a-817d in the regions 821, while the lateral aspects 818 of other emissive region(s) corresponding to at least one some pixel(s) 340 (and/or sub-pixel(s) 2541-2543 thereof) lie within regions 822 and are thus masked.

Figure 9:
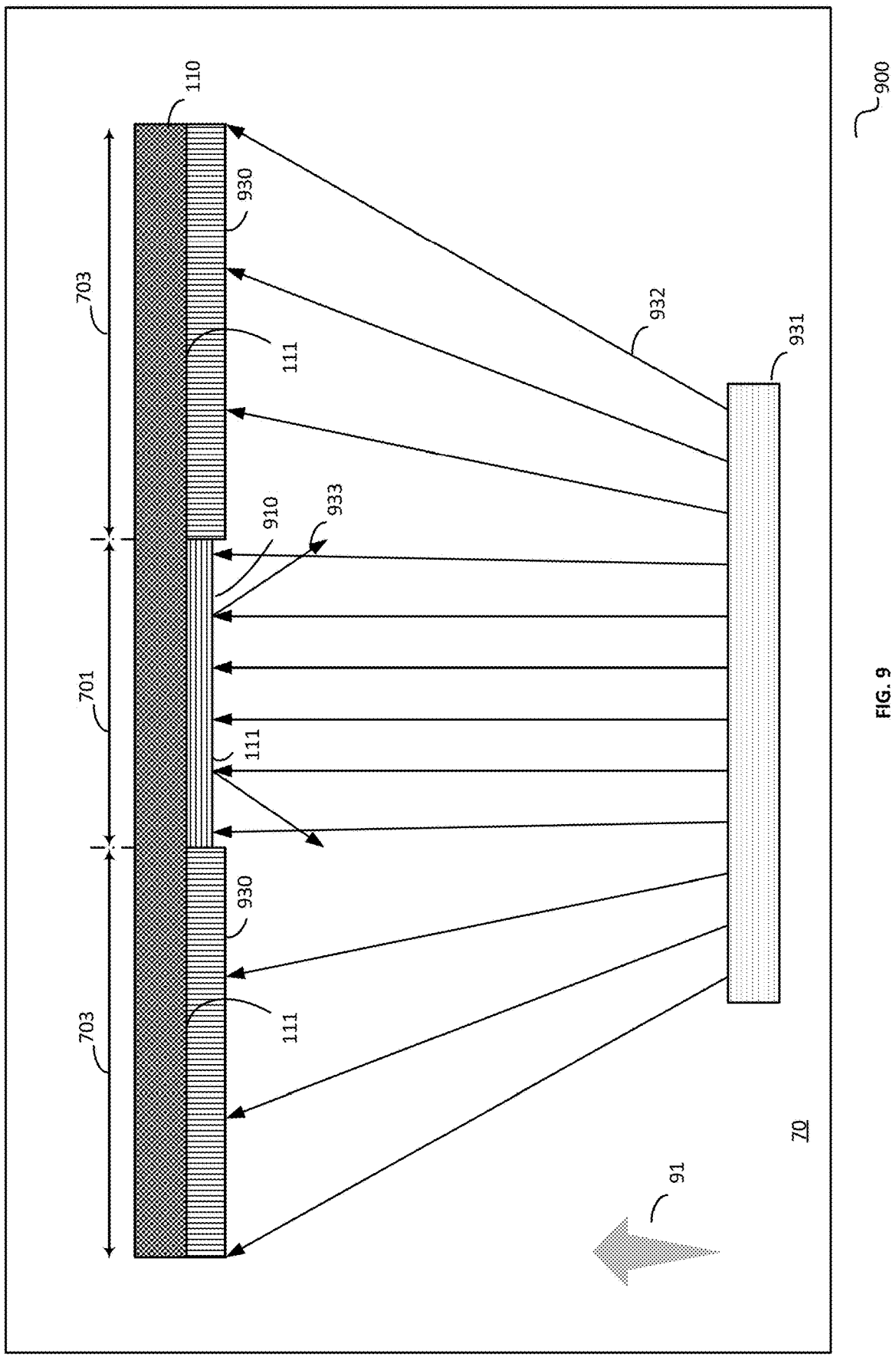
FIG. 9 is a schematic diagram showing an example process for depositing a conductive coating in the first pattern on an exposed surface that comprises the deposited pattern of the selective coating of FIG. 7 where the selective coating is a nucleation inhibiting coating (NIC)

FIG. 9 is an example schematic diagram illustrating a non-limiting example of a result of an evaporative process, shown generally at 900, in a chamber 70, for selectively depositing a conductive coating 930 onto a second portion 703 of an exposed surface 111 of an underlying material (in the figure, for purposes of simplicity of illustration only, the substrate 110) that is substantially devoid of the NIC 910 that was selectively deposited onto a first portion 701, including without limitation, by the evaporative process 700 of FIG. 7. In some non-limiting examples, the second portion 703 comprises that portion of the exposed surface 111 that lies beyond the first portion 701.

Once the NIC 910 has been deposited on a first portion 701 of an exposed surface 111 of an underlying material (in the figure, the substrate 110), the conductive coating 930 may be deposited on the second portion 703 of the exposed surface 111 that is substantially devoid of the NIC 910.

In the process 900, a quantity of a conductive coating material 931, is heated under vacuum, to evaporate and/or sublime 932 the conductive coating material 931. In some non-limiting examples, the conductive coating material 931 comprises entirely, and/or substantially, a material used to form the conductive coating 930. Evaporated conductive coating material 932 disperses throughout the chamber 70, including in a direction indicated by arrow 91, toward the exposed surface 111 of the first portion 701 and of the second portion 703. When the evaporated conductive coating material 932 is incident on the second portion 703 of the exposed surface 111, the conductive coating 930 is formed thereon.

In some non-limiting examples, as shown in the figure for the process 900, deposition of the conductive coating 930 may be performed using an open mask and/or mask-free deposition process, such that the conductive coating 930 is formed substantially across the entire exposed surface 111 of the underlying material (in the figure, of the substrate 110) to produce a treated surface (of the conductive coating 930).

In some non-limiting examples (not shown), the conductive coating 930 may be selectively deposited only onto a portion of the exposed surface 111 of the underlying material, by the interposition, between the conductive coating material 931 and the exposed surface 111, of a shadow mask (not shown), which in some non-limiting examples, may be an open mask.

Indeed, as shown in FIG. 9, the evaporated conductive coating material 932 is incident both on an exposed surface 111 of NIC 910 across the first portion 701 as well as the exposed surface 111 of the substrate 110 across the second portion 703 that is substantially devoid of NIC 910.

Since the exposed surface 111 of the NIC 910 in the first portion 701 exhibits a relatively low initial sticking probability $S_0$ compared to the exposed surface 111 of the substrate 110 in the second portion 703, the conductive coating 930 is selectively deposited substantially only on the exposed surface of the substrate 110 in the second portion 703 that is substantially devoid of the NIC 910. By contrast, the evaporated conductive coating material 932 incident on the exposed surface 111 of NIC 910 across the first portion 701 tends not to be deposited, as shown (933) and the exposed surface 111 of NIC 910 across the first portion 701 is substantially devoid of the conductive coating 930.

In some non-limiting examples, an initial deposition rate of the evaporated conductive coating material 932 on the exposed surface 111 of the substrate 110 in the second portion 703 may be at least and/or greater than about 200 times, at least and/or greater than about 550 times, at least and/or greater than about 900 times, at least and/or greater than about 1,000 times, at least and/or greater than about 1,500 times, at least and/or greater than about 1,900 times and/or at least and/or greater than about 2,000 times an initial deposition rate of the evaporated conductive coating material 932 on the exposed surface 111 of the NIC 910 in the first portion 701.

Figure 10A:
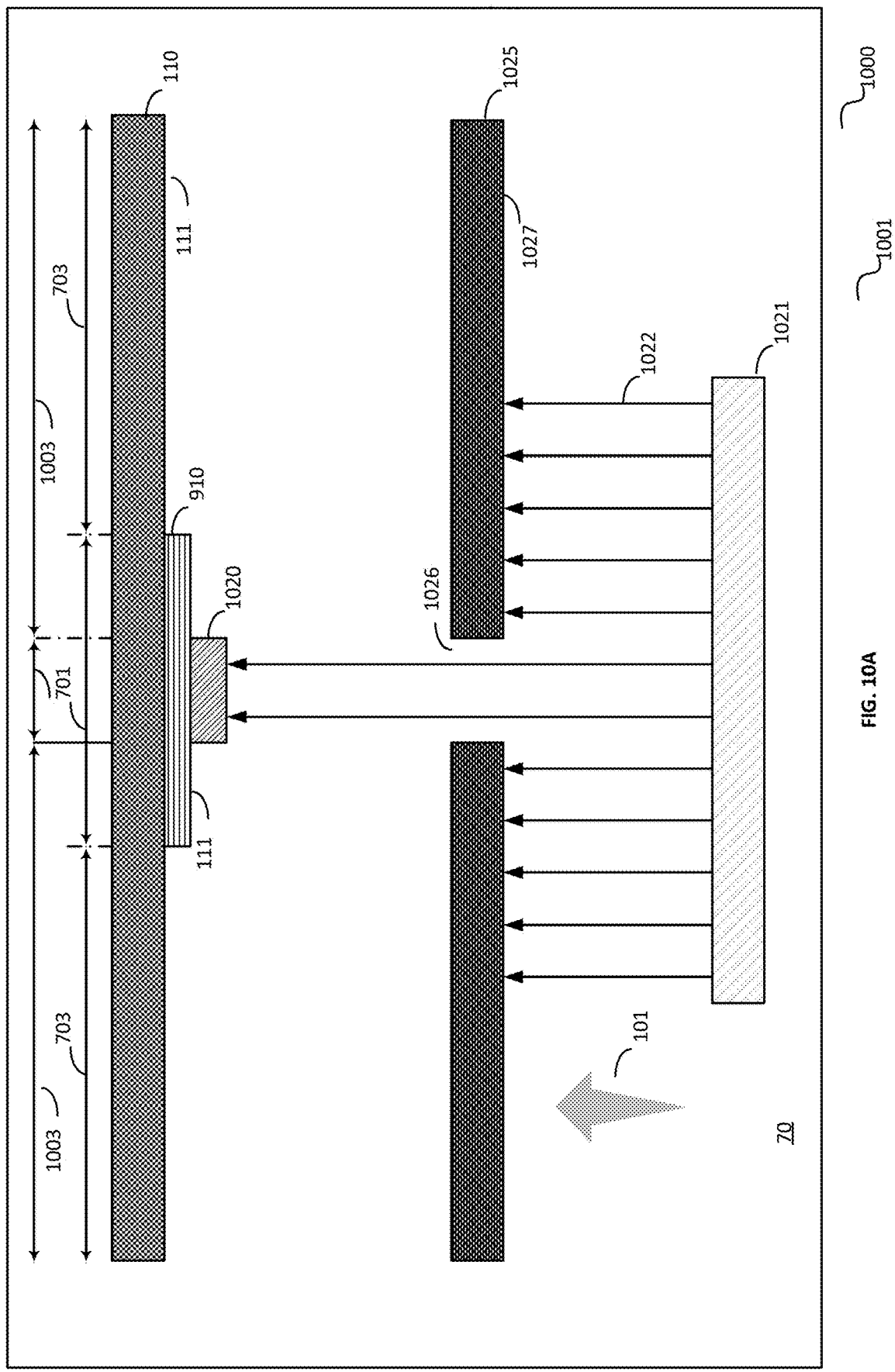
FIG. 10A is a schematic diagram showing an example process for depositing a selective coating that is a nucleation promoting coating (NPC) in a second pattern on an exposed surface that comprises the deposited pattern of the selective coating of FIG. 7 where the selective coating is an NIC.
Figure 10B:
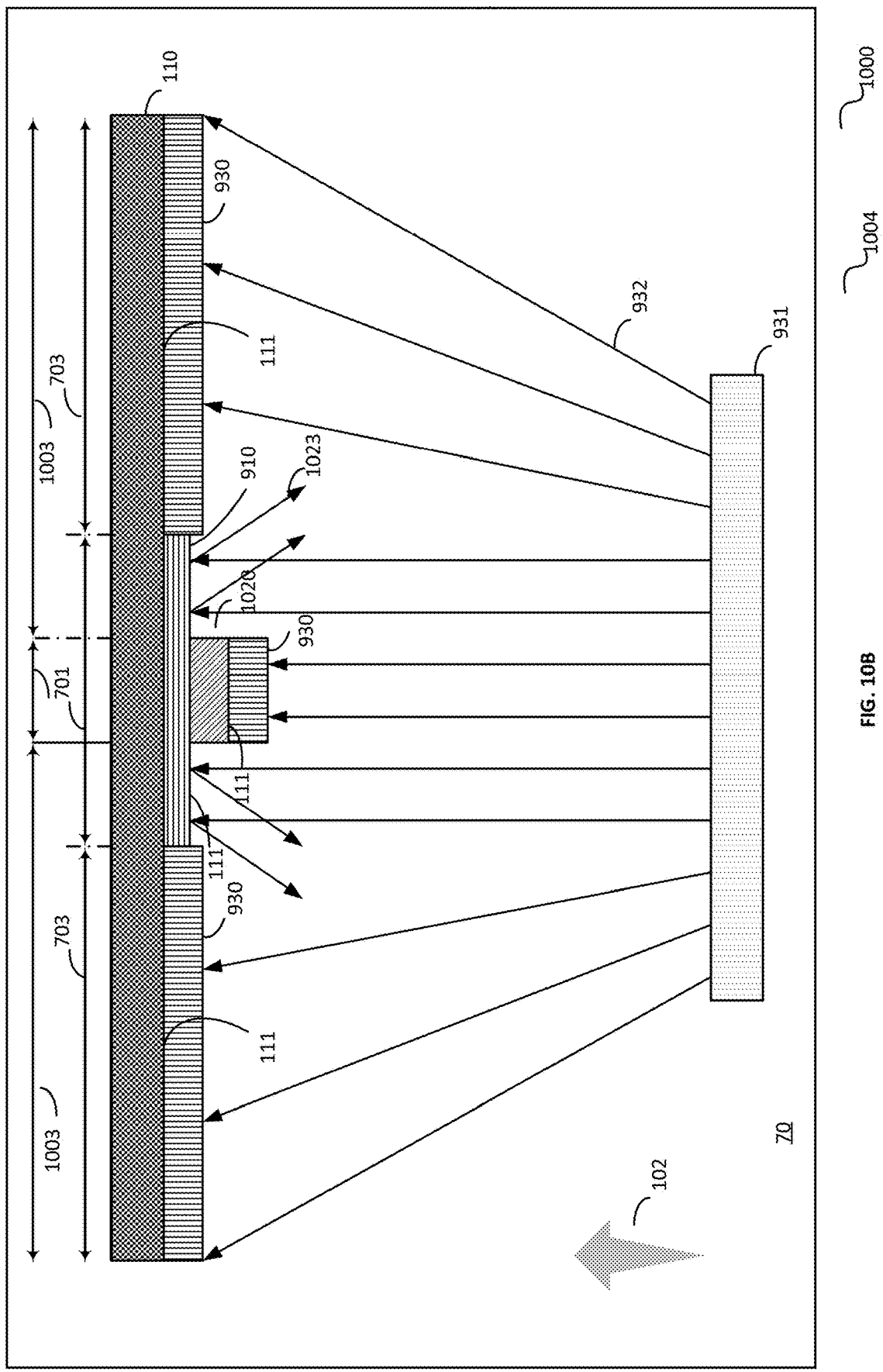
FIG. 10B is a schematic diagram showing an example process for depositing a conductive coating in a third pattern on an exposed surface that comprises the deposited second pattern of the NPC of FIG. 10A.

FIGS. 10A-10B illustrate a non-limiting example of an evaporative process, shown generally at 1000, in a chamber 70, for selectively depositing a conductive coating 930 onto a second portion 703 of an exposed surface 111 of an underlying material (in the figure, for purposes of simplicity of illustration only, the substrate 110), that is substantially devoid of the NIC 910 that was selectively deposited onto a first portion 701, including without limitation, by the evaporative process 700 of FIG. 7.

FIG. 10A describes a stage 1001 of the process 1000, in which, once the NIC 910 has been deposited on a first portion 701 of an exposed surface 111 of an underlying material (in the figure, the substrate 110), the NPC 1020 may be deposited on a NPC portion 1002 of the exposed surface 111. In the figure, by way of non-limiting example, the NPC portion 1002 extends completely within the first portion 701. As a result, in the figure, by way of non-limiting example, the second portion 703 comprises that portion of the exposed surface 111 that lies beyond the first portion 701.

In the stage 1001, a quantity of an NPC material 1021, is heated under vacuum, to evaporate and/or sublime 1022 the NPC material 1021. In some non-limiting examples, the NPC material 1021 comprises entirely, and/or substantially, a material used to form the NPC 1020. Evaporated NPC material 1022 is flowed throughout the chamber 70, including in a direction indicated by arrow 101, toward the exposed surface 111 of the first portion 701 and of the NPC portion 1002. When the evaporated NPC material 1022 is incident on the NPC portion 1002 of the exposed surface 111, the NPC 1020 is formed thereon.

In some non-limiting examples, deposition of the NPC material 1021 may be performed using an open mask and/or a mask-free deposition technique, such that the NPC 1020 is formed substantially across the entire exposed surface 111 of the underlying material (in the figure, the NIC 910) to produce a treated surface (of the NPC 1020).

In some non-limiting examples, as shown in the figure for the stage 1001, the NPC 1020 may be selectively deposited only onto a portion, in the example illustrated, the NPC portion 1002, of the exposed surface 111 (in the figure, of the NIC 910), by the interposition, between the NPC material 1021 and the exposed surface 111, of a shadow mask 1025, which in some non-limiting examples, may be an FMM. The shadow mask 1025 has at least one aperture 1026 extending therethrough such that a portion of the evaporated NPC material 1022 passes through the aperture 1026 and is incident on the exposed surface 111 (in the figure, by way of non-limiting example, of the NIC 910) to form the NPC 1020. Where the evaporated NPC material 1022 does not pass through the aperture 1026 but is incident on the surface 1027 of the shadow mask 1025, it is precluded from being disposed on the exposed surface 111 to form the NPC 1020 within the NPC portion 1002. The portion 1003 of the exposed surface 111 that lies beyond the NPC portion 1002, is thus substantially devoid of the NPC 1020. In some non-limiting examples (not shown), the NPC material 1021 that is incident on the shadow mask 1025 may be deposited on the surface 1027 thereof.

While the exposed surface 111 of the NIC 910 in the first portion 701 exhibits a relatively low initial sticking probability $S_0$ for the conductive coating 930, in some non-limiting examples, this may not necessarily be the case for the NPC coating 1020, such that the NPC coating 1020 is still selectively deposited on the exposed surface (in the figure, of the NIC 910) in the NPC portion 1002.

Accordingly, a patterned surface is produced upon completion of the deposition of the NPC 1020.

FIG. 10B describes a stage 1004 of the process 1000, in which, once the NIC 910 has been deposited on a first portion 701 of an exposed surface 111 of an underlying material (in the figure, the substrate 110) and the NPC 1020 has been deposited on a NPC portion 1002 of the exposed surface 111 (in the figure, of the NIC 910), the conductive coating 930 may be deposited on the NPC portion 1002 and a second portion 703 of the exposed surface 111 (in the figure, the substrate 110).

In the stage 1004, a quantity of a conductive coating material 931, is heated under vacuum, to evaporate and/or sublime 932 the conductive coating material 931. In some non-limiting examples, the conductive coating material 931 comprises entirely, and/or substantially, a material used to form the conductive coating 930. Evaporated conductive coating material 932 disperses throughout the chamber 70, including in a direction indicated by arrow 102, toward the exposed surface 111 of the first portion 701, of the NPC portion 1002 and of the second portion 703. When the evaporated conductive coating material 932 is incident on the NPC portion 1002 of the exposed surface 111 (of the NPC 1020) and on the second portion 703 of the exposed surface 111 (of the substrate 110), that is, other than on the exposed surface 111 of the NIC 910, the conductive coating 930 is formed thereon.

In some non-limiting examples, as shown in the figure for the stage 1004, deposition of the conductive coating 930 may be performed using an open mask and/or mask-free deposition process, such that the conductive coating 930 is formed substantially across the entire exposed surface 111 of the underlying material (other than where the underlying material is the NIC 910) to produce a treated surface (of the conductive coating 930).

In some non-limiting examples (not shown), the conductive coating 930 may be selectively deposited only onto a portion of the exposed surface 111 of the underlying material, by the interposition, between the conductive coating material 931 and the exposed surface 111, of a shadow mask (not shown), which in some non-limiting examples, may be an open mask.

Indeed, as shown in FIG. 10B, the evaporated conductive coating material 932 is incident both on an exposed surface 111 of NIC 910 across the first portion 701 that lies beyond the NPC portion 1002, as well as the exposed surface 111 of the NPC 1020 across the NPC portion 1002 and the exposed surface 111 of the substrate 110 across the second portion 703 that is substantially devoid of NIC 910.

Since the exposed surface 111 of the NIC 910 in the first portion 701 that lies beyond the NPC portion 1002 exhibits a relatively low initial sticking probability $S_0$ compared to the exposed surface 111 of the substrate 110 in the second portion 703, and/or since the exposed surface 111 of the NPC 1020 in the NPC portion 1002 exhibits a relatively high initial sticking probability $S_0$ compared to both the exposed surface 111 of the NIC 910 in the first portion 701 that lies beyond the NPC portion 1002 and the exposed surface 111 of the substrate 110 in the second portion 703, the conductive coating 930 is selectively deposited substantially only on the exposed surface of the substrate 110 in the NPC portion 1002 and the second portion 703, both of which is substantially devoid of the NIC 910. By contrast, the evaporated conductive coating material 932 incident on the exposed surface 111 of NIC 910 across the first portion 701 that lies beyond the NPC portion 1002, tends not to be deposited, as shown (823) and the exposed surface 111 of NIC 910 across the first portion 701 that lies beyond the NPC portion 1002 is substantially devoid of the conductive coating 930.

Accordingly, a patterned surface is produced upon completion of the deposition of the conductive coating 930.

Figure 11A:
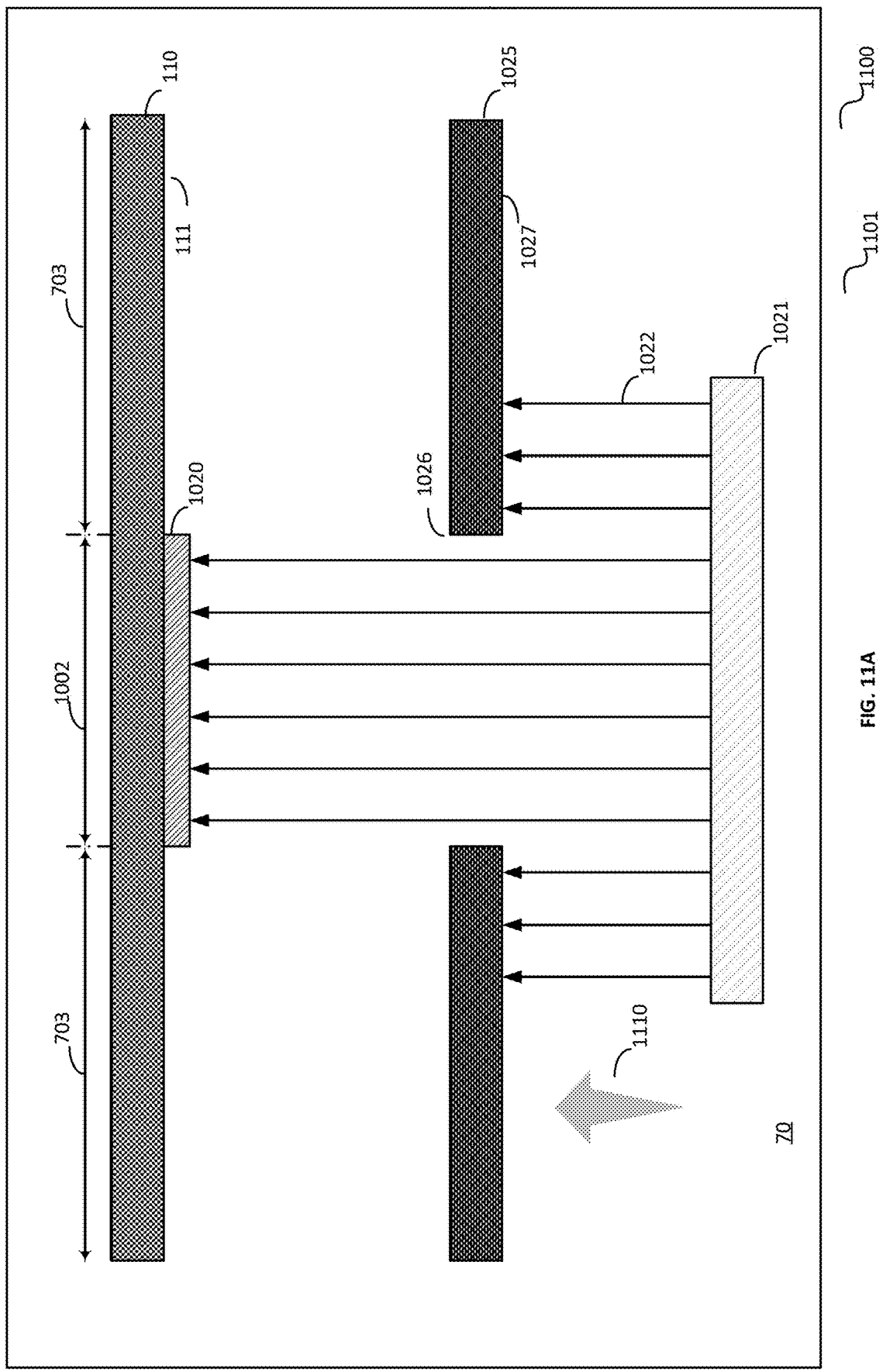
FIG. 11A is a schematic diagram showing an example process for depositing an NPC in a first pattern on an exposed surface of an underlying material, according to an example in the present disclosure.
Figure 11B:
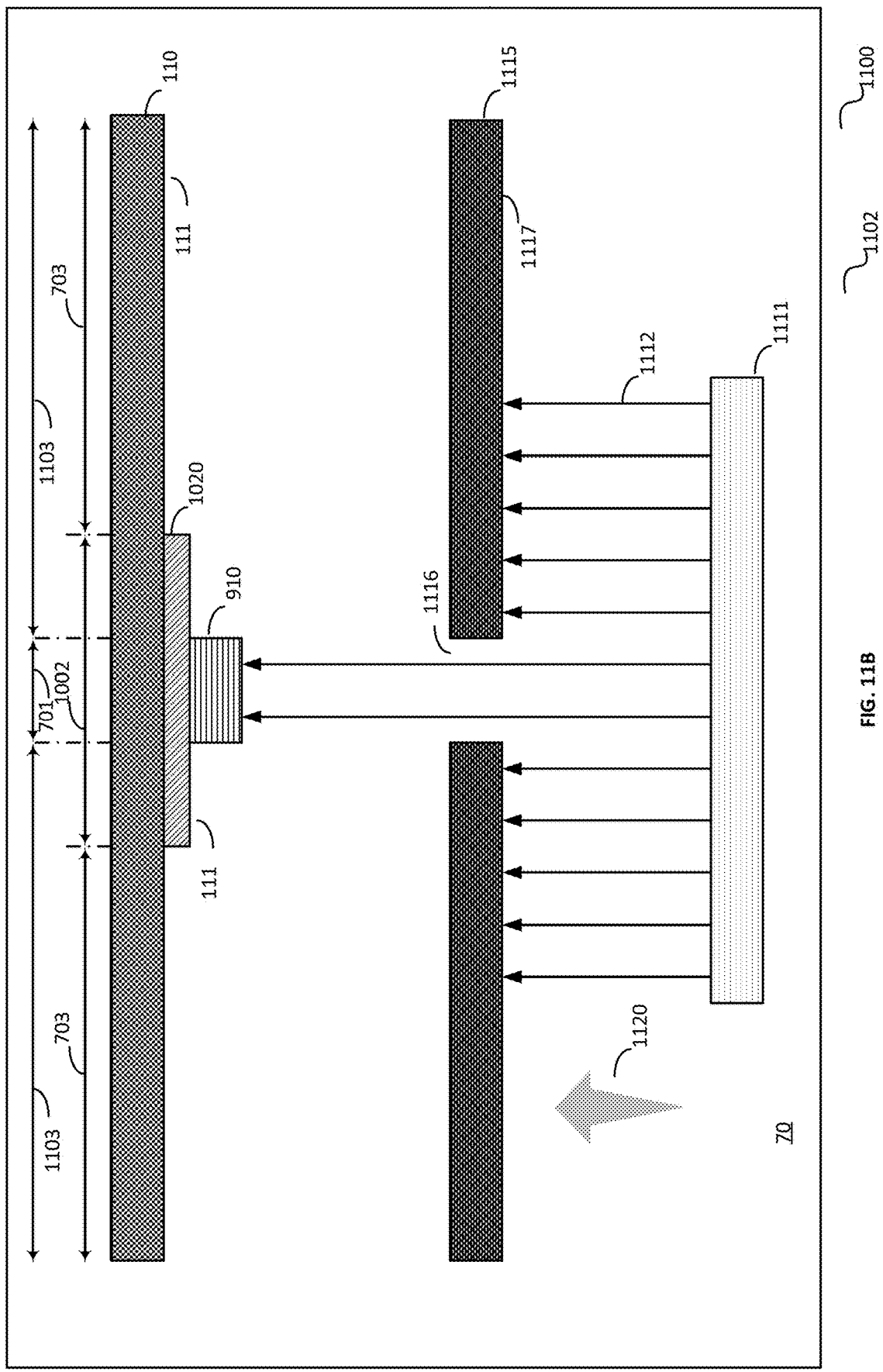
FIG. 11B is a schematic diagram showing an example process for depositing an NIC in a second pattern on an exposed surface that comprises the deposited pattern of the NPC of FIG. 11A.
Figure 11C:
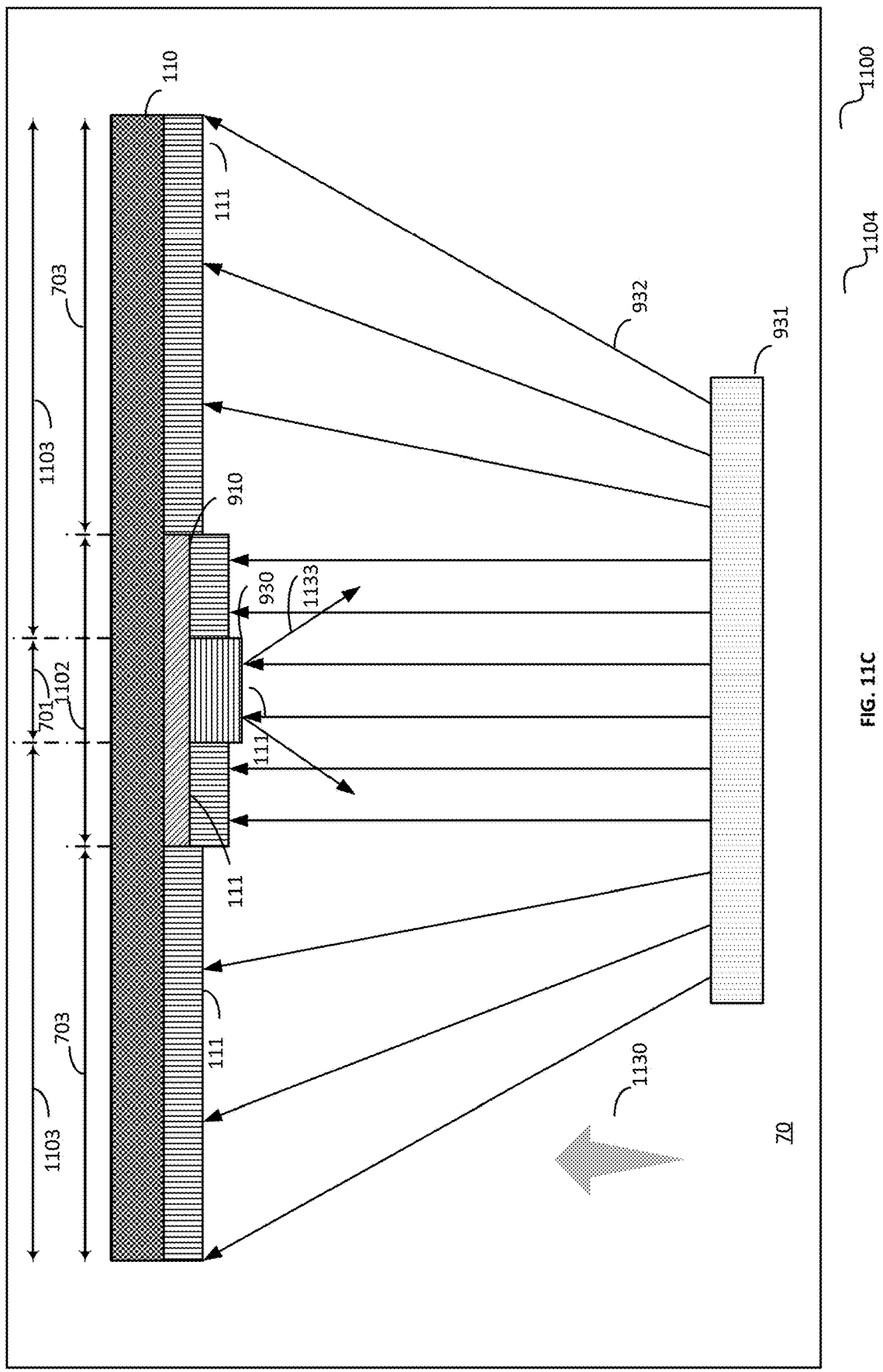
FIG. 11C is a schematic diagram showing an example process for depositing a conductive coating in a third pattern on an exposed surface that comprises the deposited second pattern of the NIC of FIG. 11B.

FIGS. 11A-11C illustrate a non-limiting example of an evaporative process, shown generally at 1100, in a chamber 70, for selectively depositing a conductive coating 930 onto a second portion 1103 (FIG. 11C) of an exposed surface 111 of an underlying material that is substantially devoid of the NIC 910 that was selectively deposited onto a first portion 701, including without limitation, by the evaporative process 700 of FIG. 7.

FIG. 11A describes a stage 1001 of the process 1100, in which, a quantity of an NPC material 1021, is heated under vacuum, to evaporate and/or sublime 1022 the NPC material 1021. In some non-limiting examples, the NPC material 1021 comprises entirely, and/or substantially, a material used to form the NPC 1020. Evaporated NPC material 1022 disperses throughout the chamber 70, including in a direction indicated by arrow 1110, toward the exposed surface 111 (in the figure, the substrate 110). When the evaporated NPC material 1022 is incident on the exposed surface 111, that is, in the NPC portion 1002, the NPC 1020 is formed thereon.

In some non-limiting examples, deposition of the NPC material 1021 may be performed using an open mask and/or mask-free deposition process, such that the NPC 1020 is formed substantially across the entire exposed surface 111 of the underlying material (in the figure, the substrate 110) to produce a treated surface (of the NPC 1020).

In some non-limiting examples, as shown in the figure for the stage 1001, the NPC 1020 may be selectively deposited only onto a portion, in the example illustrated, the NPC portion 1002, of the exposed surface 111, by the interposition, between the NPC material 1021 and the exposed surface 111, of a shadow mask 1025, which in some non-limiting examples, may be an FMM. The shadow mask 1025 has at least one aperture 1026 extending therethrough such that a portion of the evaporated NPC material 1022 passes through the aperture 1026 and is incident on the exposed surface 111 to form the NPC 1020. Where the evaporated NPC material 1022 does not pass through the aperture 1026 but is incident on the surface 1027 of the shadow mask 1025, it is precluded from being disposed on the exposed surface 111 to form the NPC 1020 within the portion 703 of the exposed surface 111 that lies beyond the NPC portion 1002. The portion 703 is thus substantially devoid of the NPC 1020. In some non-limiting examples (not shown), the NPC material 1021 that is incident on the shadow mask 1025 may be deposited on the surface 1027 thereof.

Accordingly, a patterned surface is produced upon completion of the deposition of the NPC 1020.

FIG. 11B describes a stage 1102 of the process 1100, in which, once the NPC 1020 has been deposited on a NPC portion 1002 of an exposed surface 111 of an underlying material (in the figure, the substrate 110), the NIC 910 may be deposited on a first portion 701 of the exposed surface 111. In the figure, by way of non-limiting example, the first portion 701 extends completely within the NPC portion 1002. As a result, in the figure, by way of non-limiting example, the second portion 1103 comprises that portion of the exposed surface 111 that lies beyond the first portion 701.

In the stage 1102, a quantity of an NIC material 1111, is heated under vacuum, to evaporate and/or sublime 1112 the NIC material 1111. In some non-limiting examples, the NIC material 1111 comprises entirely, and/or substantially, a material used to form the NIC 910. Evaporated NIC material 1112 disperses throughout the chamber 70, including in a direction indicated by arrow 1120, toward the exposed surface 111 of the first portion 701, of the NPC portion 1002 that extends beyond the first portion 701 and of the second portion 703. When the evaporated NIC material 1112 is incident on the first portion 701 of the exposed surface 111, the NIC 910 is formed thereon.

In some non-limiting examples, deposition of the NIC material 1111 may be performed using an open mask and/or mask-free deposition process, such that the NIC 910 is formed substantially across the entire exposed surface 111 of the underlying material to produce a treated surface (of the NIC 910).

In some non-limiting examples, as shown in the figure for the stage 1102, the NIC 910 may be selectively deposited only onto a portion, in the example illustrated, the first portion 701, of the exposed surface 111 (in the figure, of the NPC 1020), by the interposition, between the NIC material 1111 and the exposed surface 111, of a shadow mask 1115, which in some non-limiting examples, may be an FMM. The shadow mask 1115 has at least one aperture 1116 extending therethrough such that a portion of the evaporated NIC material 1112 passes through the aperture 1116 and is incident on the exposed surface 111 (in the figure, by way of non-limiting example, of the NPC 1020) to form the NIC 910. Where the evaporated NIC material 1112 does not pass through the aperture 1116 but is incident on the surface 1117 of the shadow mask 1115, it is precluded from being disposed on the exposed surface 111 to form the NIC 910 within the portion 1003 beyond the first portion 701. The portion 1003 of the exposed surface 111 that lies beyond the first portion 701, is thus substantially devoid of the NIC 910. In some non-limiting examples (not shown), the evaporated NIC material 1112 that is incident on the shadow mask 1115 may be deposited on the surface 1117 thereof.

While the exposed surface 111 of the NPC 1020 in the NPC portion 1002 exhibits a relatively high initial sticking probability $S_0$ for the conductive coating 930, in some non-limiting examples, this may not necessarily be the case for the NIC coating 910. Even so, in some non-limiting examples such affinity for the NIC coating 910 may be such that the NIC coating 910 is still selectively deposited on the exposed surface 111 (in the figure, of the NPC 1020) in the first portion 701.

Accordingly, a patterned surface is produced upon completion of the deposition of the NIC 910.

FIG. 11C describes a stage 1104 of the process 1100, in which, once the NIC 910 has been deposited on a first portion 701 of an exposed surface 111 of an underlying material (in the figure, the NPC 1020), the conductive coating 930 may be deposited on a second portion 1103 of the exposed surface 111 (in the figure, of the substrate 110 across the portion 703 beyond the NPC portion 1002 and of the NPC 1020 across the NPC portion 1002 beyond the first portion 701).

In the stage 1104, a quantity of a conductive coating material 931, is heated under vacuum, to evaporate and/or sublime 932 the conductive coating material 931. In some non-limiting examples, the conductive coating material 931 comprises entirely, and/or substantially, a material used to form the conductive coating 930. Evaporated conductive coating material 932 disperses throughout the chamber 70, including in a direction indicated by arrow 1130, toward the exposed surface 111 of the first portion 701, of the NPC portion 1002 and of the portion 703 beyond the NPC portion 1002. When the evaporated conductive coating material 932 is incident on the NPC portion 1002 of the exposed surface 111 (of the NPC 1020) beyond the first portion 701 and on the portion 703 beyond the NPC portion 1002 of the exposed surface 111 (of the substrate 110), that is, on the second portion 1103 other than on the exposed surface 111 of the NIC 910, the conductive coating 930 is formed thereon.

In some non-limiting examples, as shown in the figure for the stage 1104, deposition of the conductive coating 930 may be performed using an open mask and/or mask-free deposition process, such that the conductive coating 930 is formed substantially across the entire exposed surface 111 of the underlying material (other than where the underlying material is the NIC 910) to produce a treated surface (of the conductive coating 930).

In some non-limiting examples (not shown), the conductive coating 930 may be selectively deposited only onto a portion of the exposed surface 111 of the underlying material, by the interposition, between the conductive coating material 931 and the exposed surface 111, of a shadow mask (not shown), which in some non-limiting examples, may be an open mask.

Indeed, as shown in FIG. 11C, the evaporated conductive coating material 932 is incident both on an exposed surface 111 of NIC 910 across the first portion 701 that lies beyond the NPC portion 1002, as well as the exposed surface 111 of the NPC 1020 across the NPC portion 1002 and the exposed surface 111 of the substrate 110 across the portion 703 that lies beyond the NPC portion 1002.

Since the exposed surface 111 of the NIC 910 in the first portion 701 exhibits a relatively low initial sticking probability $S_0$ compared to the exposed surface 111 of the substrate 110 in the portion 703 that lies beyond the NPC portion 1002, and/or since the exposed surface 111 of the NPC 1020 in the NPC portion 1002 that lies beyond the first portion 701 exhibits a relatively high initial sticking probability $S_0$ compared to both the exposed surface 111 of the NIC 910 in the first portion 701 and the exposed surface 111 of the substrate 110 in the portion 703 that lies beyond the NPC portion 1002, the conductive coating 930 is selectively deposited substantially only on the exposed surface of the substrate 110 in the NPC portion 1002 that lies beyond the first portion 701 and the portion 703 that lies beyond the NPC portion 1002, both of which are substantially devoid of the NIC 910. By contrast, the evaporated conductive coating material 932 incident on the exposed surface 111 of NIC 910 across the first portion 701, tends not to be deposited, as shown (1133) and the exposed surface 111 of NIC 910 across the first portion 701 is substantially devoid of the conductive coating 930.

Accordingly, a patterned surface is produced upon completion of the deposition of the conductive coating 930.

In some non-limiting examples, an initial deposition rate of the evaporated conductive coating material 932 on the exposed surface 111 of the substrate 110 in the second portion 703 may be at least and/or greater than about 200 times, at least and/or greater than about 550 times, at least and/or greater than about 900 times, at least and/or greater than about 1,000 times, at least and/or greater than about 1,500 times, at least and/or greater than about 1,900 times and/or at least and/or greater than about 2,000 times an initial deposition rate of the evaporated conductive coating material 932 on the exposed surface 111 of the NIC 910 in the first portion 701.

FIGS. 12A-12C illustrate a non-limiting example of a printing process, shown generally at 1200, for selectively depositing a selective coating 710, which in some non-limiting examples may be an NIC 910 and/or an NPC 1020, onto an exposed surface 111 of an underlying material (in the figure, for purposes of simplicity of illustration only, the substrate 110).

FIG. 12A describes a stage of the process 1200, in which a stamp 1210 having a protrusion 1211 thereon is provided with the selective coating 710 on an exposed surface 1212 of the protrusion 1211. Those having ordinary skill in the relevant art will appreciate that the selective coating 710 may be deposited and/or applied to the protrusion surface 1212 using a variety of suitable mechanisms.

FIG. 12B describes a stage of the process 100, in which the stamp 1210 is brought into proximity 1201 with the exposed surface 111, such that the selective coating 710 comes into contact with the exposed surface 111 and adheres thereto.

FIG. 12C describes a stage of the process 1200, in which the stamp 1210 is moved away 1203 from the exposed surface 111, leaving the selective coating 710 applied to the exposed surface 111.

Selective Deposition of a Patterned Electrode

The foregoing may be combined in order to effect the selective deposition of at least one conductive coating 930 to form a patterned electrode, which may, in some non-limiting examples, may be the second electrode 140 (which may, in some non-limiting examples be a cathode 342) and/or an auxiliary electrode 1650, without employing an FMM within the high-temperature conductive coating 930 deposition process. In some non-limiting examples, such patterning may permit and/or enhance the transmissivity of the device.

Figure 13:
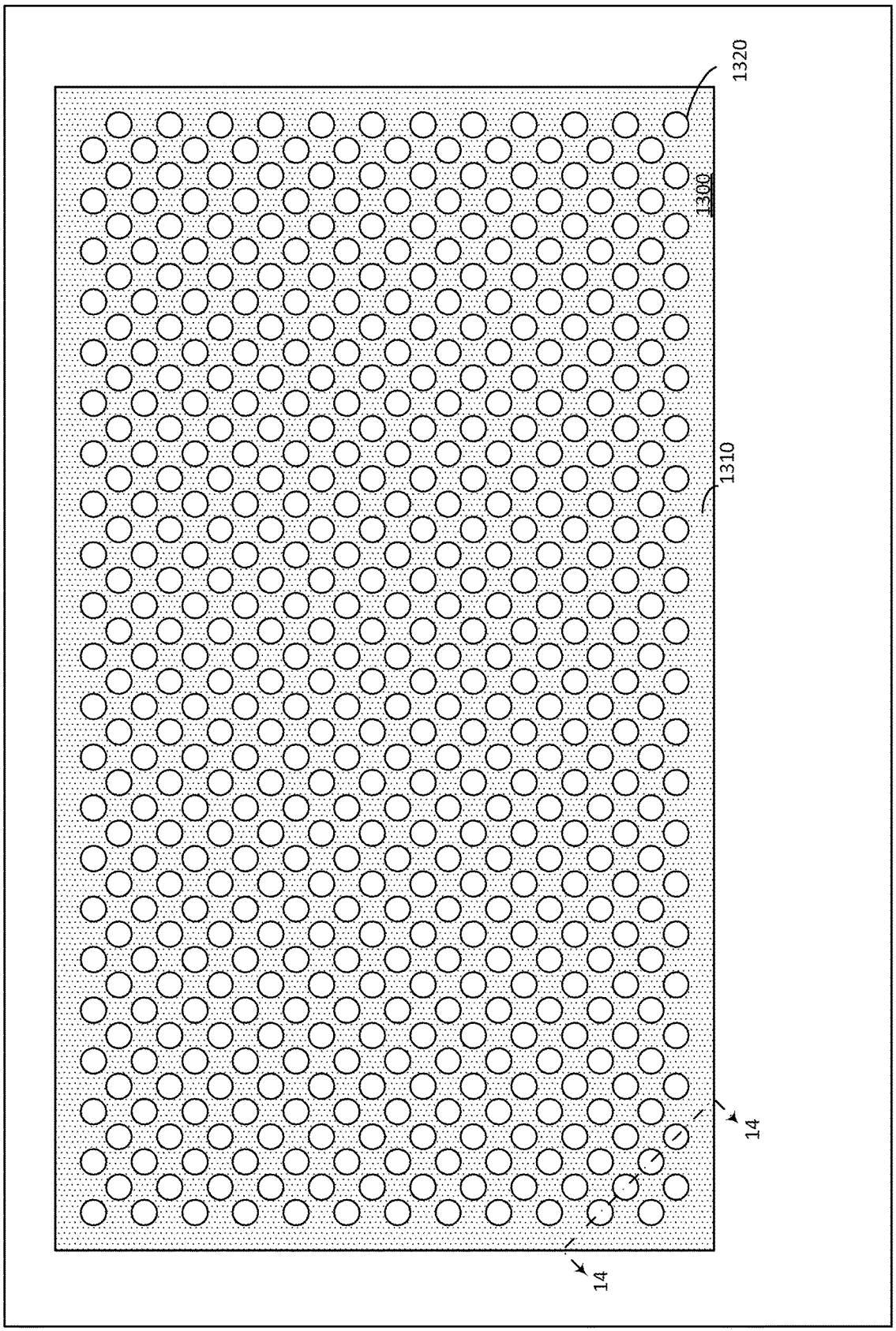
FIG. 13 is a schematic diagram illustrating, in plan view, an example patterned electrode suitable for use in the device of FIG. 1, according to an example in the present disclosure.

FIG. 13 shows an example patterned electrode 1300 in plan view, in the figure, the second electrode 140, acting as a cathode 342 suitable for use in an electro-luminescent device 1400 (FIG. 14), that is, except for the patterned electrode 1300, substantially similar to the device 100. The electrode 1300 is formed in a pattern 1310 that comprises a single continuous structure, having or defining a patterned plurality of apertures 1220 therewithin, in which the apertures 1220 correspond to regions of the device 100 where there is no cathode 342.

In the figure, by way of non-limiting example, the pattern 1310 is disposed across the entire lateral extent of the device 100, without differentiation between the lateral aspect(s) 410 of emissive region(s) corresponding to pixel(s) 340 (and/or sub-pixel(s) 2541-2543 thereof) and the lateral aspect(s) 420 of non-emissive region(s) corresponding to pixel(s) 340 (and/or sub-pixel(s) 2541-2543 thereof) surrounding such emissive region(s). Thus, the example illustrated may correspond to a device 100 that is substantially transmissive relative to light incident on an external surface thereof, such that a substantial portion such externally-incident light may be transmitted through the device 100, in addition to the emission (in a top-emission, bottom-emission and/or double-sided emission) of photons generated internally within the device 100 as disclosed herein.

The transmittivity of the device 100 may be adjusted and/or modified by altering the pattern 1310 employed, including without limitation, an average size of the apertures 1220, and/or a spacing and/or density of the apertures 1220.

Figure 14:
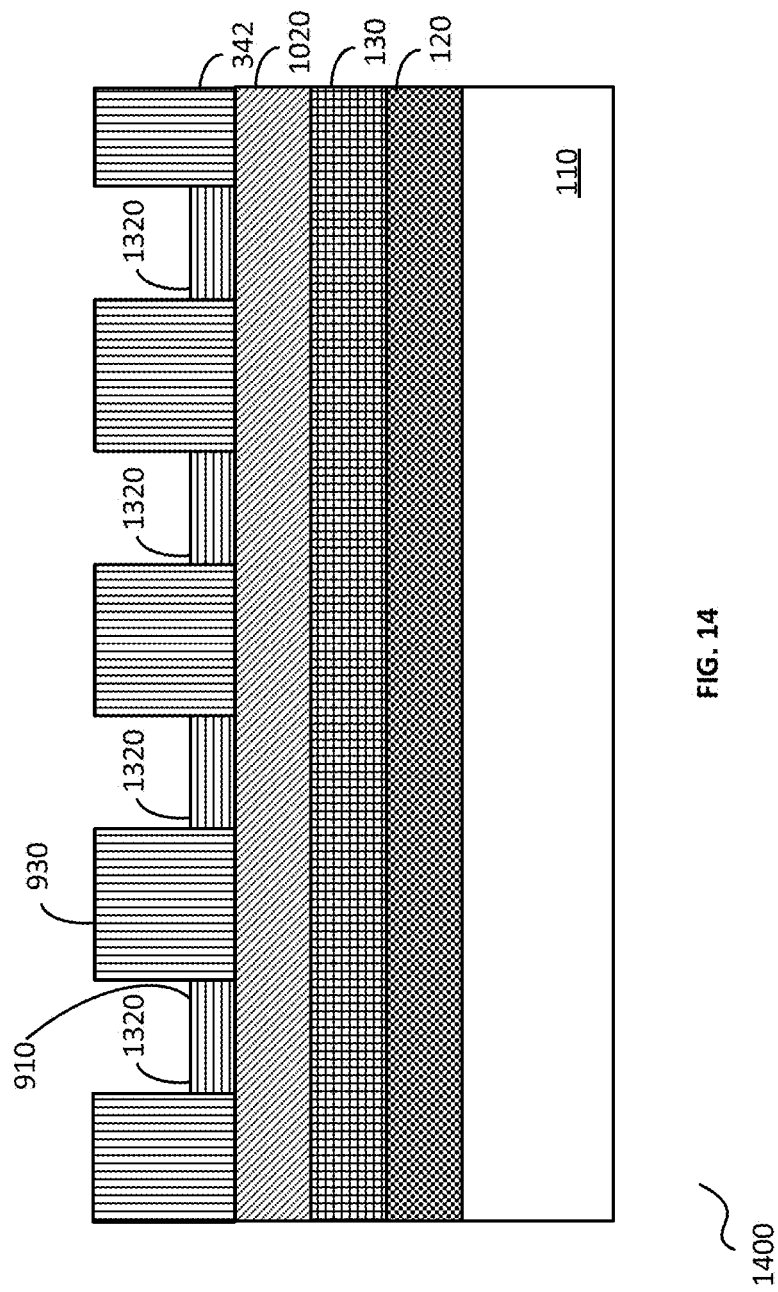
FIG. 14 is a schematic diagram illustrating an example cross-sectional view of the device of FIG. 14 taken along line 13-13.

Turning now to FIG. 14, there is shown a cross-sectional view of the device 1400, taken along line 14-14 in FIG. 13. In the figure, the device 1400 is shown as comprising the substrate 110; the first electrode 120, which in some non-limiting examples may be the anode 341, and the organic layer 130. In some non-limiting examples, a selective coating 710, namely an NPC 1020 is disposed on substantially all of the exposed surface 111 of the organic layer 130. In some non-limiting examples, the NPC 1020 could be omitted.

A selective coating 710, namely an NIC 910 is selectively disposed in a pattern substantially corresponding to the pattern 1310 on the exposed surface 111 of the underlying material, which, as shown in the figure, is the NPC 1020 but, in some non-limiting examples, could be the organic layer 130 if the NPC has been omitted).

A conductive coating 930 suitable for forming the patterned electrode 1300, which in the figure is the second electrode 140, which in some non-limiting examples may be the cathode 342, is disposed on substantially all of the exposed surface 111 of the underlying material, using an open mask and/or a mask-free deposition process, either of which does not employ any FMM during the high-temperature conductive coating deposition process. The underlying material comprises both regions of the NIC 910, disposed in the pattern 1310, and regions of NPC 1020 (or in some non-limiting examples, the organic layer 130 if the NPC 1020 has been omitted), in the pattern 1310 where the NIC 910 has not been deposited. In some non-limiting examples, the regions of the NIC 910 may correspond substantially to the apertures 1320 shown in the pattern 1310, while the regions of the NPC 1020 (or the organic layer 130 if the NPC 1020 has been omitted) may correspond substantially to the second portions 703 of the pattern 1310.

Because of the nucleation-inhibiting properties of those regions of the pattern 1310 where the NIC 910 was disposed (corresponding to the apertures 1320), the conductive coating 930 disposed on such regions tends not to remain, resulting in a pattern of selective deposition of the conductive coating 930, that corresponds substantially to the second portions 703 of the pattern 1310, leaving those regions of the pattern 1310 corresponding to the apertures 1320 substantially devoid of the conductive coating 930.

In other words, the conductive coating 930 that will form the cathode 342 is selectively deposited substantially only on those regions of the NPC 1020 (or in some non-limiting examples, the organic layer 130 if the NPC 1020 has been omitted), that surround but do not occupy the apertures 1320 in the pattern 1310.

Figure 15A:
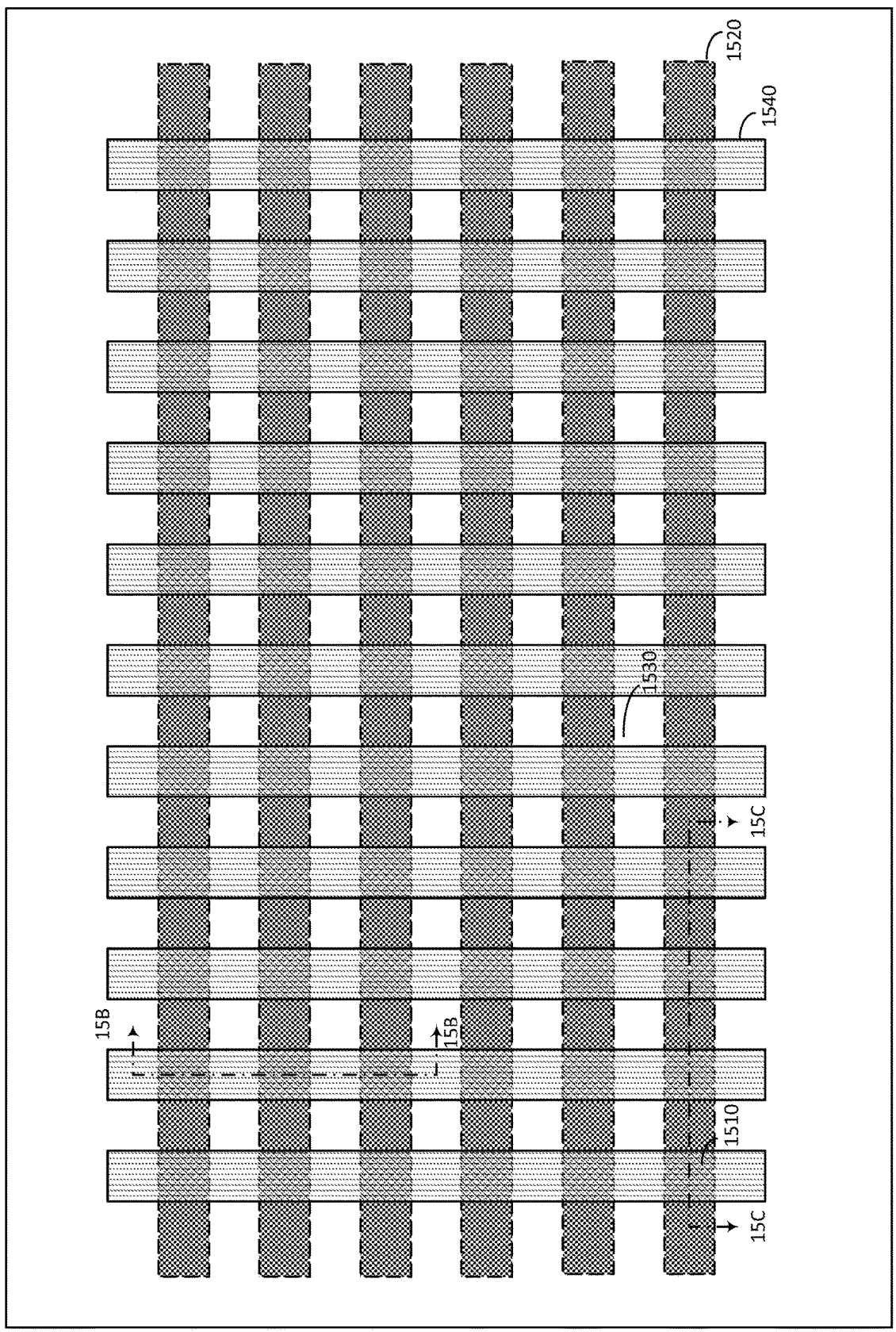
FIG. 15A is a schematic diagram illustrating, in plan view, a plurality of example patterns of electrodes suitable for use in the device of FIG. 1, according to an example in the present disclosure.

FIG. 15A shows, in plan view, a schematic diagram showing a plurality of patterns of electrodes 1520, 1540.

In some non-limiting examples, a first pattern of electrodes 1520 comprises a plurality of elongated, spaced-apart regions that extend in a first lateral direction. In some non-limiting examples, the first pattern of electrodes 1520 may comprise a plurality of first electrodes 120, at least one of which may, in some non-limiting examples, be an anode 341. In some non-limiting examples, a plurality of the regions that comprise the first pattern of electrodes 1520 may be electrically coupled.

In some non-limiting examples, a second pattern of electrodes 1540 comprises a plurality of elongated, spaced-apart regions that extend in a second lateral direction. In some non-limiting examples, the second lateral direction may be substantially normal to the first lateral direction. In some non-limiting examples, the second pattern of electrodes 1540 may comprise a plurality of second electrodes 140, at least one of which may, in some non-limiting examples, be a cathode 342. In some non-limiting examples, a plurality of the regions that comprise the second pattern of electrodes 1540 may be electrically coupled.

In some non-limiting examples, the first pattern of electrodes 1520 and the second pattern of electrodes 1540 may form part of a device, shown generally at 1500, which may comprise a plurality of PMOLED elements 1401.

In some non-limiting examples, the lateral aspect(s) 1510 of emissive region(s) corresponding to pixel(s) 340 (and/or sub-pixel(s) 2541-2543 thereof) are formed where the first pattern of electrodes 1620 overlaps the second pattern of electrodes 1440. In some non-limiting examples, the lateral aspect(s) 1530 of non-emissive regions correspond to any lateral aspect other than the lateral aspect(s) 1610.

In some non-limiting examples, a first terminal, which, in some non-limiting examples, may be a positive terminal, of the power source 15, is electrically coupled to at least one of the first pattern of electrodes 1520. In some non-limiting examples, the first terminal is coupled to the at least one of the first pattern of electrodes 1520 through at least one driving circuit 300. In some non-limiting examples, a second terminal, which, in some non-limiting examples, may be a negative terminal, of the power source 15, is electrically coupled to at least one of the second pattern of electrodes 1540. In some non-limiting examples, the second terminal is coupled to the at least one of the second pattern of electrodes 1540 through the at least one driving circuit 300.

Figure 15B:
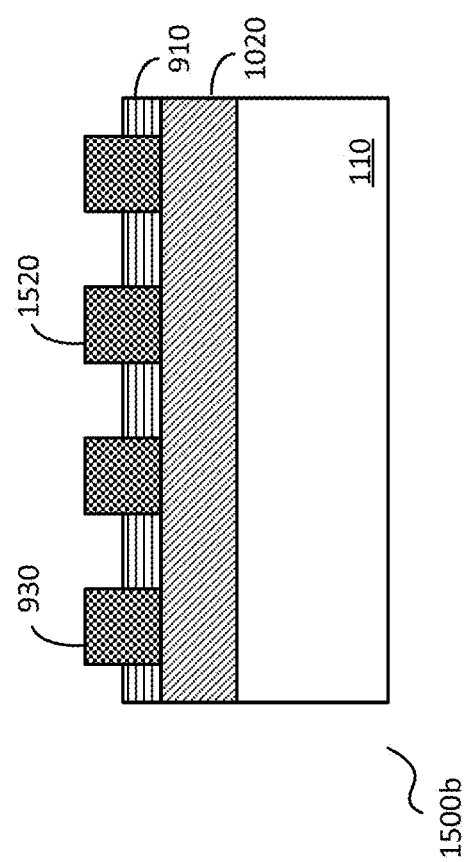
FIG. 15B is a schematic diagram illustrating an example cross-sectional view, at an intermediate stage, of the device of FIG. 15A taken along line 15B-15B.

Turning now to FIG. 15B, there is shown a cross-sectional view of the device 1500, at an intermediate deposition stage 1500b, taken along line 15B-15B in FIG. 15A. In the figure, the device at the stage 1500b is shown as comprising the substrate 110. In some non-limiting examples, a selective coating 710, namely an NPC 1020 is disposed on substantially all of the exposed surface 111 of the substrate 110. In some non-limiting examples, the NPC 1020 could be omitted.

A selective coating 710, namely an NIC 910 is selectively disposed in a pattern substantially corresponding to the first pattern of electrodes 1520 on the exposed surface 111 of the underlying material, which, as shown in the figure, is the NPC 1020 but, in some non-limiting examples, could be the substrate 110 if the NPC has been omitted).

A conductive coating 930 suitable for forming the first pattern of electrodes 1520, which in the figure is the first electrode 120, which in some non-limiting examples may be the anode 341, is disposed on substantially all of the exposed surface 111 of the underlying material, using an open mask and/or a mask-free deposition process, either of which does not employ any FMM during the high-temperature conductive coating deposition process. The underlying material comprises both regions of the NIC 910, disposed in the first pattern 1520, and regions of NPC 1020 (or in some non-limiting examples, the substrate 110 if the NPC 1020 has been omitted), in the first pattern 1520 where the NIC 910 has not been deposited. In some non-limiting examples, the regions of the NPC 1020 (or the substrate 110 if the NPC 1020 has been omitted) may correspond substantially to the elongated spaced-apart regions of the first pattern 1520, while the regions of the NIC 910 may correspond substantially to the gaps therebetween.

Because of the nucleation-inhibiting properties of those regions of the first pattern 1520 where the NIC 910 was disposed (corresponding to the gaps therebetween), the conductive coating 930 disposed on such regions tends not to remain, resulting in a pattern of selective deposition of the conductive coating 930, that corresponds substantially to elongated spaced-apart regions of the first pattern 1520, leaving the gaps therebetween substantially devoid of the conductive coating 930.

In other words, the conductive coating 930 that will form the first pattern of electrodes 1520 is selectively deposited substantially only on those regions of the NPC 1020 (or in some non-limiting examples, the substrate 110 if the NPC 1020 has been omitted), that define the elongated spaced-apart regions of the first pattern 1520.

Figure 15C:
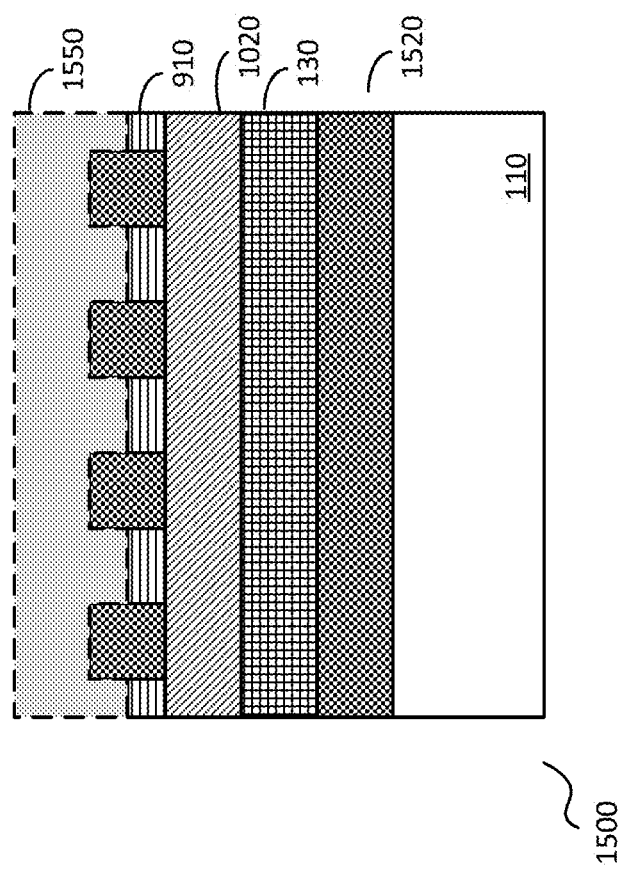
FIG. 15C is a schematic diagram illustrating an example cross-sectional view of the device of FIG. 15A taken along line 15C-15C.

Turning now to FIG. 15C, there is shown a cross-sectional view of the device 1500, taken along line 15C-15C in FIG. 15A. In the figure, the device 1500 is shown as comprising the substrate 110; the first pattern of electrodes 1520 deposited as shown in FIG. 15B, which in some non-limiting examples may be the anode 341, and the organic layer(s) 130.

In some non-limiting examples, the organic layer(s) 130 may be provided as a common layer across substantially all of the lateral aspect(s) of the device 1500. In some non-limiting examples, the organic layer(s) 130 may comprise any number of layers of organic and/or inorganic materials, including without limitation, the HIL 131, HTL 133, the EL 135, the ETL 137 and/or the EIL 139.

In some non-limiting examples, a selective coating 710, namely an NPC 1020 is disposed on substantially all of the exposed surface 111 of the organic layer 130. In some non-limiting examples, the NPC 1020 could be omitted.

A selective coating 710, namely an NIC 910 is selectively disposed in a pattern substantially corresponding to the second pattern of electrodes 1540 on the exposed surface 111 of the underlying material, which, as shown in the figure, is the NPC 1020 but, in some non-limiting examples, could be the organic layer 130 if the NPC has been omitted).

A conductive coating 930 suitable for forming the second pattern of electrodes 1540, which in the figure is the second electrode 140, which in some non-limiting examples may be the cathode 342, is disposed on substantially all of the exposed surface 111 of the underlying material, using an open mask and/or a mask-free deposition process, either of which does not employ any FMM during the high-temperature conductive coating deposition process. The underlying material comprises both regions of the NIC 910, disposed in the second pattern 1540, and regions of NPC 1020 (or in some non-limiting examples, the organic layer 130 if the NPC 1020 has been omitted), in the second pattern 1540 where the NIC 910 has not been deposited. In some non-limiting examples, the regions of the NPC 1020 (or the organic layer 130 if the NPC 1020 has been omitted) may correspond substantially to the elongated spaced-apart regions of the second pattern 1540, while the regions of the NIC 910 may correspond substantially to the gaps therebetween.

Because of the nucleation-inhibiting properties of those regions of the second pattern 1540 where the NIC 910 was disposed (corresponding to the gaps therebetween), the conductive coating 930 disposed on such regions tends not to remain, resulting in a pattern of selective deposition of the conductive coating 930, that corresponds substantially to elongated spaced-apart regions of the second pattern 1540, leaving the gaps therebetween substantially devoid of the conductive coating 930.

In other words, the conductive coating 930 that will form the second pattern of electrodes 1540 is selectively deposited substantially only on those regions of the NPC 1020 (or in some non-limiting examples, the organic layer 130 if the NPC 1020 has been omitted), that define the elongated spaced-apart regions of the second pattern 1540.

In some non-limiting examples, a thickness of the NIC 910 and of the conductive coating 930 applied thereafter for forming either or both of the first pattern of electrodes and/or the second pattern of electrodes 1540 may be varied according to a variety of parameters, including without limitation, a desired application and desired performance characteristics. In some non-limiting examples, the thickness of the NIC 910 may be comparable to and/or substantially less than the thickness of conductive coating 930 applied thereafter. Use of a relatively thin NIC 910 to achieve selective patterning of a conductive coating applied thereafter may be suitable to provide flexible devices 1500, including without limitation, PMOLED devices. In some non-limiting examples, a relatively thin NIC 910 may provide a relatively planar surface on which a barrier coating 1550 may be applied. In some non-limiting examples, providing such a relatively planar surface for application of the barrier coating 1550 may increase adhesion of the barrier coating 1550 to such surface.

At least one of the first pattern of electrodes 1520 and at least one of the second pattern of electrodes 1540 may be electrically coupled to the power source 15, whether directly and/or, in some non-limiting examples, through their respective driving circuit(s) 300 to control photon emission from the lateral aspect(s) 1510 of the emissive region(s) corresponding to pixel(s) 340 (and/or sub-pixel(s) 2541-2543 thereof).

Those having ordinary skill in the relevant art will appreciate that the process of forming the second electrode 140 in the second pattern of electrodes 1540 shown in FIGS. 15A-15C may, in some non-limiting examples, be used in similar fashion to form an auxiliary electrode 1650 for the device 1500. In some non-limiting examples, the second electrode 140 thereof may comprise a common electrode, which may, in some non-limiting examples be a cathode 342, and the auxiliary electrode 1650 may be deposited in the second pattern of electrodes 1540, in some non-limiting examples, above and/or in some non-limiting examples below the second electrode 140 and electrically coupled thereto. In some non-limiting examples, the second pattern of electrodes 1540 for such auxiliary electrode 1650 may be such that the elongated spaced-apart regions of the second pattern 1540 lie substantially within the lateral aspect(s) 420 of non-emissive region(s) surrounding the lateral aspect(s) 410 of emissive region(s) corresponding to pixel(s) 340

(and/or sub-pixel(s) 2541-2543 thereof). In some non-limiting examples, the second pattern of electrodes 1540 for such auxiliary electrode 1650 may be such that the elongated spaced-apart regions of the second pattern 1540 lie substantially within the lateral aspect(s) 410 of emissive region(s) corresponding to pixel(s) 340 (and/or sub-pixel(s) 2541-2543 thereof) and/or the lateral aspect(s) 420 of non-emissive region(s) surrounding them.

Figure 16:
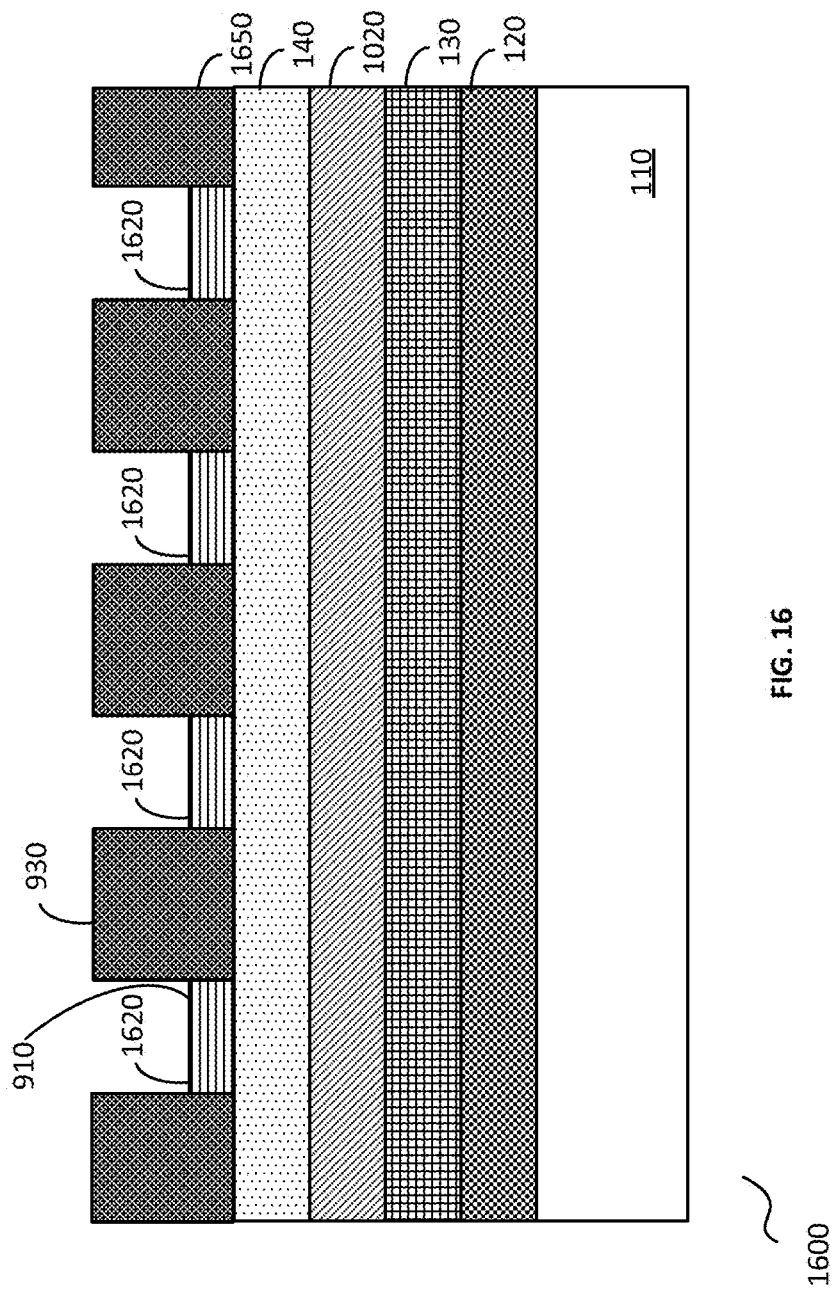
FIG. 16 is a schematic diagram illustrating a cross-sectional view of a device having an example patterned auxiliary electrode according to an example in the present disclosure.

FIG. 16 shows an example cross-sectional view of a device 1600 that is substantially similar to the device 100, but further comprises at least one auxiliary electrode 1650 disposed in a pattern above and electrically coupled (not shown) with the second electrode 140, which, in some non-limiting examples, may be a cathode 342.

The device 1600 is shown as comprising the substrate 110; the first electrode 120, which in some non-limiting examples may be the anode 341 and the organic layer 130.

In some non-limiting examples, a selective coating 710, namely an NPC 1020 is disposed on substantially all of the exposed surface 111 of the organic layer 130. In some non-limiting examples, the NPC 1020 could be omitted.

The second electrode 140, which in some non-limiting examples, may be a cathode 342, is disposed on substantially all of the exposed surface of the NPC 1020 (or the organic layer 130, if the NPC 1020 has been omitted).

In some non-limiting examples, particularly in a top-emission device 1600, the second electrode 140, which, may in some non-limiting examples, may be a cathode 342 may be formed by depositing a relatively thin layer of conductive coating 930 (not shown) in order, by way of non-limiting example, to reduce optical interference (including, without limitation, attenuation, reflections and/or diffusion) related to the presence of the second electrode 140. In some non-limiting examples, as discussed elsewhere, a reduced thickness of the second electrode 140, which may in some non-limiting examples, may be a cathode 342, may generally increase a sheet resistance of the second electrode 140, which may, in some non-limiting examples, reduce the performance and/or efficiency of the device 1600. By providing the auxiliary electrode 1650 that is electrically coupled to the second electrode 140, the sheet resistance and thus, the IR drop associated with the second electrode 140, may, in some non-limiting examples, be decreased.

In some non-limiting examples, the device 1600 may be a bottom-emission and/or double-sided emission device 1600. In such examples, the second electrode 140 may be formed as a relatively thick layer without substantially affecting optical characteristics of such a device 1600. Nevertheless, even in such scenarios, the second electrode 140 may nevertheless be formed as a relatively thin layer of conductive coating 930 (not shown), by way of non-limiting example, so that the device 1600 may be substantially transmissive relative to light incident on an external surface thereof, such that a substantial portion such externally-incident light may be transmitted through the device 100, in addition to the emission of photons generated internally within the device 100 as disclosed herein.

A selective coating 710, namely an NIC 910 is selectively disposed in a pattern on the exposed surface 111 of the underlying material, which, as shown in the figure, is the NPC 1020 but, in some non-limiting examples, could be the organic layer 130 if the NPC has been omitted). In some non-limiting examples, as shown in the figure, the NIC 910 may be disposed, in the pattern, as a series of parallel rows 1620.

A conductive coating 930 suitable for forming the patterned auxiliary electrode 1650, is disposed on substantially all of the exposed surface 111 of the underlying material, using an open mask and/or a mask-free deposition process, either of which does not employ any FMM during the high-temperature conductive coating deposition process. The underlying material comprises both regions of the NIC 910, disposed in the pattern of rows 1620, and regions of NPC 1020 (or in some non-limiting examples, the organic layer 130 if the NPC 1020 has been omitted), where the NIC 910 has not been deposited.

Because of the nucleation-inhibiting properties of those rows 1620 where the NIC 910 was disposed, the conductive coating 930 disposed on such rows 1620 tends not to remain, resulting in a pattern of selective deposition of the conductive coating 930, that corresponds substantially to the second portions 703 of the pattern, leaving the rows 1620 substantially devoid of the conductive coating 930.

In other words, the conductive coating 930 that will form the auxiliary electrode 1650 is selectively deposited substantially only on those regions of the NPC 1020 (or in some non-limiting examples, the organic layer 130 if the NPC 1020 has been omitted), that surround but do not occupy the rows 1620.

In some non-limiting examples, selectively depositing the auxiliary electrode 1650 to cover only certain rows 1620 of the lateral aspect of the device 1600, while other regions thereof remain uncovered, may control and/or reduce optical interference related to the presence of the auxiliary electrode 1650.

In some non-limiting examples, the auxiliary electrode 1650 may be selectively deposited in a pattern that cannot be readily detected by the naked eye from a typical viewing distance.

In some non-limiting examples, the auxiliary electrode 1650 may be formed in devices other than OLED devices, including for decreasing an effective resistance of the electrodes of such devices.

Auxiliary Electrode 1650

The ability to pattern electrodes including without limitation, the the second electrode 140 and/or the auxiliary electrode 1650 without employing FMMs during the high-temperature conductive coating 930 deposition process by employing a selective coating 710, which in some non-limiting examples may be an NIC 910 and/or an NPC 1020, including without limitation, the process depicted in the FIG. 16, allows numerous configurations of auxiliary electrodes 1650 to be deployed.

Figure 17B:
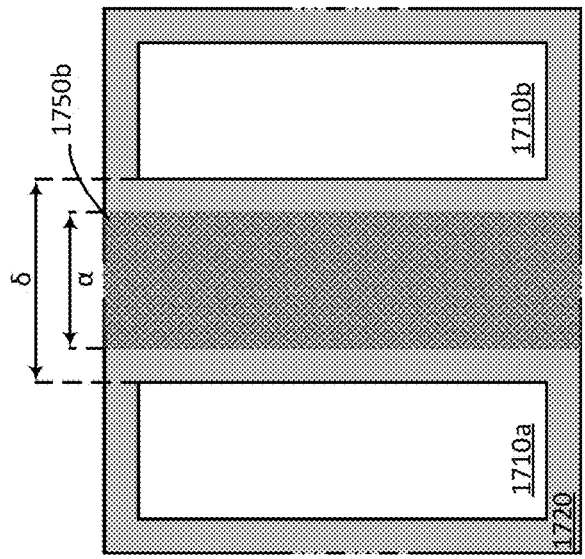
FIG. 17B is a schematic diagram illustrating a segment of a portion of FIG. 17A, showing a first example auxiliary electrode overlaying a non-emissive region according to an example in the present disclosure.
Figure 17D:
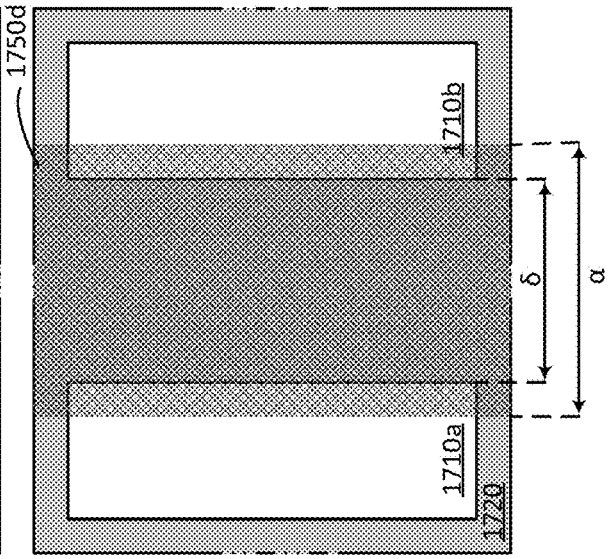
FIG. 17D is a schematic diagram illustrating a segment of a portion of FIG. 17A, showing a third example auxiliary electrode overlaying a non-emissive region according to an example in the present disclosure.
Figure 17A:
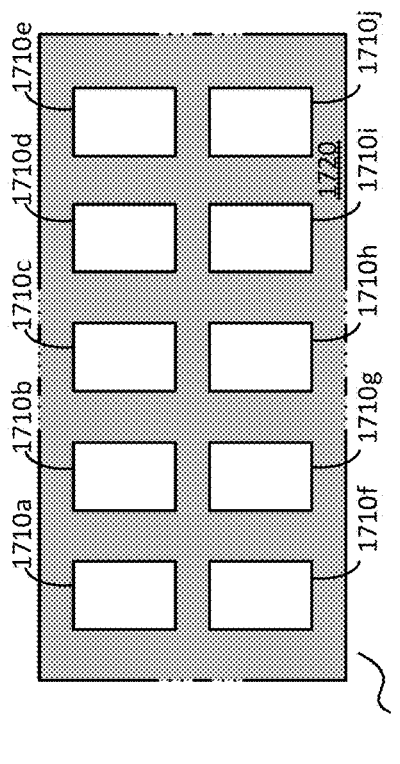
FIG. 17A is a schematic diagram illustrating, in plan view, an example arrangement of emissive region(s) and/or non-emissive regions according to an example in the present disclosure.

FIG. 17A shows, in plan view, a portion of an electroluminescent device 1700 having a plurality of emissive regions 1710a-1710j and at least one non-emissive region 1720 surrounding them. In some non-limiting examples the device 1700 may be an AMOLED device in which each of the emissive regions 1710a-1710j corresponds to a pixel 340 and/or a sub-pixel thereof.

Figure 17C:
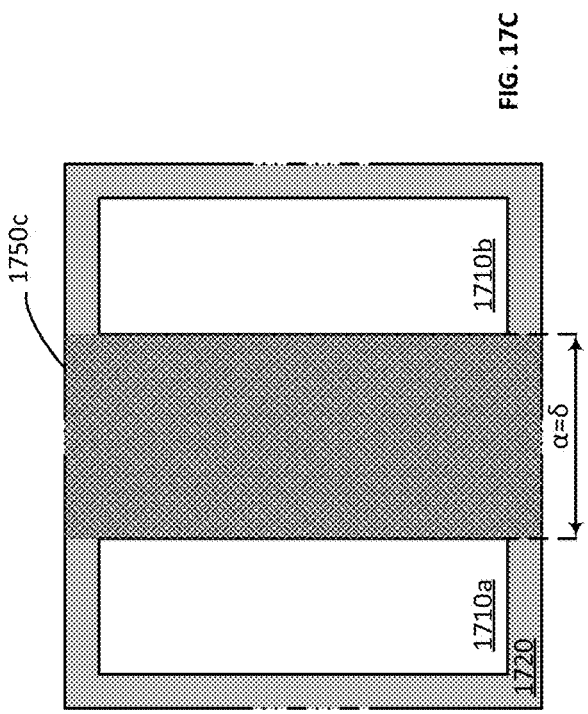
FIG. 17C is a schematic diagram illustrating a segment of a portion of FIG. 17A, showing a second example auxiliary electrode overlaying a non-emissive region according to an example in the present disclosure.

FIGS. 17B-17D show examples of a portion of the device 1700 corresponding to neighbouring emissive regions 1710a and 1710b thereof and a portion of the at least one non-emissive region 1720 therebetween, in conjunction with different configurations 1750b-1750d of an auxiliary electrode 1650 overlaid thereon. In some non-limiting examples, while not expressly illustrated in FIGS. 17B-17D, the second electrode 140 of the device 1700, which in some non-limiting examples may be a common cathode 342, is understood to substantially cover at least both emissive regions 1710a and 1710b thereof and the portion of the at least one non-emissive region 1720 therebetween.

In FIG. 17B, the auxiliary electrode configuration 1750b is disposed between the two neighbouring emissive regions 1710*a* and 1710*b* and electrically coupled to the second electrode 140. In this example, a width a of the auxiliary electrode configuration 1750*b* is less than a separation distance 5 between the neighbouring emissive regions 1710*a* and 1710*b*. As a result, there exists a gap within the at least one non-emissive region 1720 on each side of the auxiliary electrode configuration 1730*b*. In some non-limiting examples, such an arrangement may reduce a likelihood that the auxiliary electrode configuration 1750*b* would interfere with an optical output of the device 1700, in some non-limiting examples, from at least one of the emissive regions 1710*a* and 1710*b*. In some non-limiting examples, such an arrangement may be appropriate where the auxiliary electrode configuration 1750*b* is relatively thick (in some non-limiting examples, greater than several hundred nanometers and/or on the order of a few microns In thickness). In some non-limiting examples, a ratio of a height (thickness) of the auxiliary electrode configuration 1750*b* a width thereof ("aspect ratio") may be greater than about 0.05, such as about 0.1 or greater, about 0.2 or greater, about 0.5 or greater, about 0.8 or greater, about 1 or greater, and/or about 2 or greater. By way of non-limiting example, a height (thickness) of the auxiliary electrode configuration 1750*b* may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater.

In FIG. 17C, the auxiliary electrode configuration 1750*c* is disposed between the two neighbouring emissive regions 1710*a* and 1710*b* and electrically coupled to the second electrode 140. In this example, the width a of the auxiliary electrode configuration 1750*c* is substantially the same as the separation distance 5 between the neighbouring emissive regions 1710*a* and 1710*b*. As a result, there is no gap within the at least one non-emissive region 1720 on either side of the auxiliary electrode configuration 1750*c*. In some non-limiting examples, such an arrangement may be appropriate where the separation distance 5 between the neighbouring emissive regions 1710*a* and 1710*b* is relatively small, by way of non-limiting example, in a high pixel density device 1700.

In FIG. 17D, the auxiliary electrode 1750*d* is disposed between the two neighbouring emissive regions 1710*a* and 1710*b* and electrically coupled to the second electrode 140. In this example, the width a of the auxiliary electrode configuration 1750*d* is greater than the separation distance 5 between the neighbouring emissive regions 1710*a* and 1710*b*. As a result, a portion of the auxiliary electrode configuration 1750*d* overlaps a portion of at least one of the neighbouring emissive regions 171*a* and/or 1710*b*. While the figure shows that the extent of overlap of the auxiliary electrode configuration 1750*d* with each of the neighbouring emissive regions 1710*a* and 1710*b*, in some non-limiting examples, the extent of overlap and/or in some non-limiting examples, a profile of overlap between the auxiliary electrode configuration 1750*d* and at least one of the neighbouring emissive regions 1710*a* and 1710*b* may be varied and/or modulated.

Figure 18:
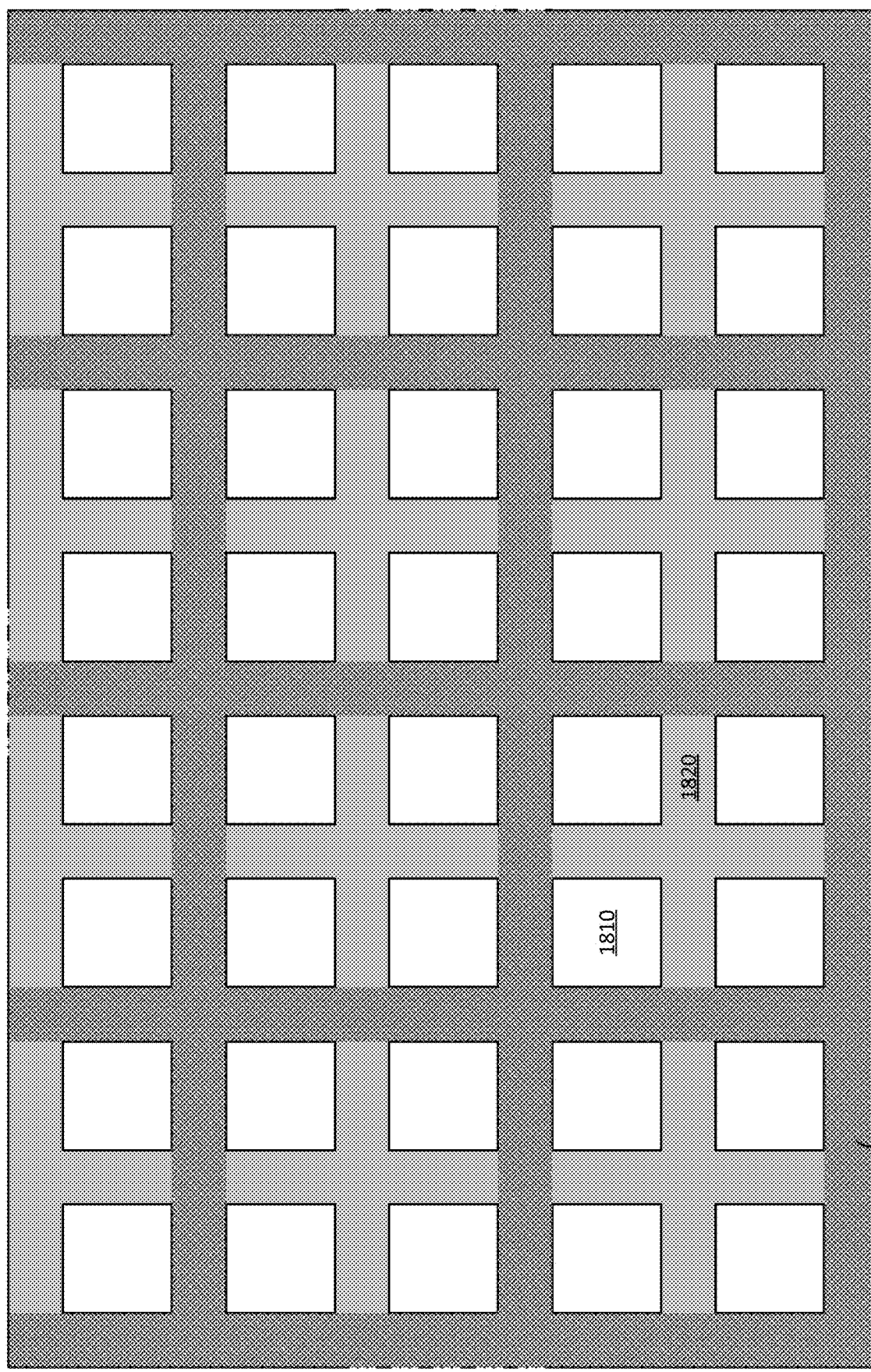
FIG. 18 is a schematic diagram illustrating, in plan view an example pattern of an auxiliary electrode overlaying at least one emissive region and at least one non-emissive region according to an example in the present disclosure.

FIG. 18 shows, in plan view, a schematic diagram showing an example of a pattern 1850 of the auxiliary electrode 1650 formed as a grid that is overlaid over both the lateral aspects of emissive regions 1810, which may correspond to pixel(s) 340 (and/or sub-pixel(s) 2541-2543 thereof) of a device 1800, and the lateral aspects of non-emissive regions 1820 surrounding the emissive regions 1810.

In some non-limiting examples, the auxiliary electrode pattern 1850 extends substantially only over some but not all of the lateral aspects of non-emissive regions 1820, so as not to substantially cover any of the lateral aspects of the emissive regions 1810.

Those having ordinary skill in the relevant art will appreciate that while, in the figure, the auxiliary electrode pattern 1850 is shown as being formed as a continuous structure such that all elements thereof are both physically connected and electrically coupled with one another and electrically coupled to at least one electrode, which in some non-limiting examples may be the first electrode 120 and/or the second electrode 140, in some non-limiting examples, the auxiliary electrode pattern 1850 may be provided as a plurality of discrete elements of the auxiliary electrode pattern 1850 that, while remaining electrically coupled to one another, are not physically connected to one another. Even so, such discrete elements of the auxiliary electrode pattern 1850 may still substantially lower a sheet resistance of the at least one electrode with which they are electrically coupled, and consequently of the device 1800, so as to increase an efficiency of the device 1800 without substantially interfering with its optical characteristics.

In some non-limiting examples, auxiliary electrodes 1650 may be employed in devices 100 with a variety of arrangements of pixel(s) 340 (and/or sub-pixel(s) 2541-2543 thereof). In some non-limiting examples, the (sub-)pixel arrangement may be substantially diamond-shaped.

Figure 19A:
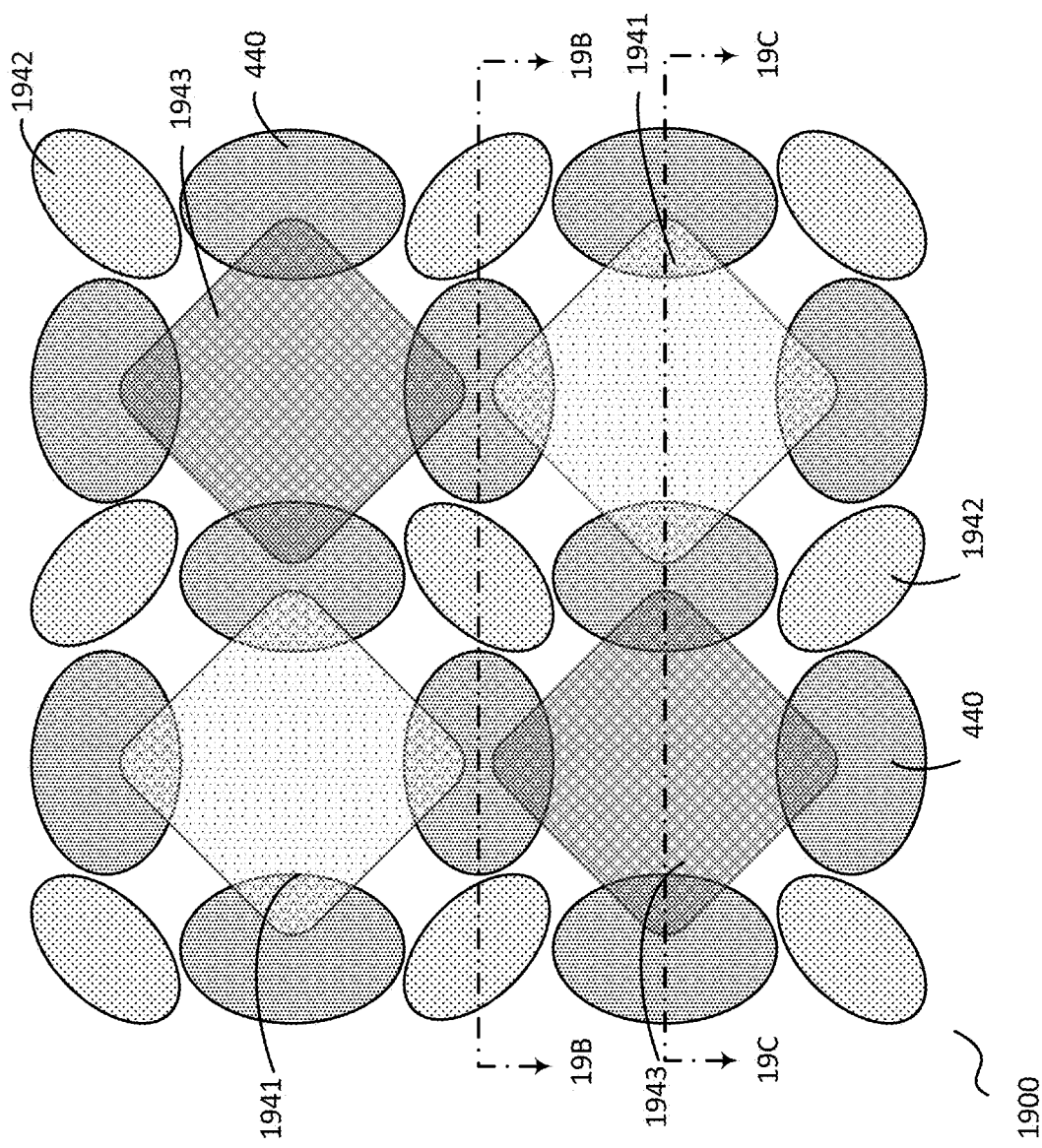
FIG. 19A is a schematic diagram illustrating, in plan view, an example pattern of a device having a plurality of groups of emissive regions in a diamond configuration according to an example in the present disclosure.

By way of non-limiting example, FIG. 19A shows, in plan view, in a device 1900, a plurality of groups of emissive regions 1941-1943 each corresponding to a sub-pixel, surrounded by the lateral aspects of a plurality of non-emissive regions comprising PDLs 440 in a diamond configuration. In some non-limiting examples, the configuration is defined by patterns of emissive regions 1941-1943 and PDLs 440 in an alternating pattern of first and second rows.

In some non-limiting examples, the lateral aspects of the non-emissive regions comprising PDLs 440 may be substantially elliptically-shaped. In some non-limiting examples, the major axes of the lateral aspects of the non-emissive regions in the first row are aligned and substantially normal to the major axes of the lateral aspects of the non-emissive regions in the second row. In some non-limiting examples, the major axes of the lateral aspects of the non-emissive regions in the first row are substantially parallel to an axis of the first row.

In some non-limiting examples, a first group 1941 correspond to sub-pixels 2541-2543 that emit light at a first wavelength, in some non-limiting examples the sub-pixels 2541-2543 of the first group 1941 may correspond to red (R) sub-pixels 2541. In some non-limiting examples, the lateral aspects of the emissive regions of the first group 1941 may have substantially diamond-shaped configuration. In some non-limiting examples, the emissive regions of the first group 1941 lie in the pattern of the first row, preceded and followed by PDLs 440. In some non-limiting examples, the lateral aspects of the emissive regions of the first group 1941 slightly overlap the lateral aspects of the preceding and following non-emissive regions comprising PDLs 440 in the same row, as well as of the lateral aspects of adjacent non-emissive regions comprising PDLs 440 in a preceding and following pattern of the second row.

In some non-limiting examples, a second group 1942 correspond to sub-pixels 2541-2543 that emit light at a second wavelength, in some non-limiting examples the sub-pixels 2541-2543 of the second group 1942 may correspond to green (G) sub-pixels 2542. In some non-limiting examples, the lateral aspects of the emissive regions of the second group 1941 may have substantially elliptical configuration. In some non-limiting examples, the emissive regions of the second group 1941 lie in the pattern of the second row, preceded and followed by PDLs 440. In some non-limiting examples, the major axis of some of the lateral aspects of the emissive regions of the second group 1941 may be at a first angle, which in some non-limiting examples, may be 45° relative to an axis of the second row. In some non-limiting examples, the major axis of others of the lateral aspects of the emissive regions of the second group 1941 may be at a second angle, which in some non-limiting examples may be substantially normal to the first angle. In some non-limiting examples, the emissive regions of the first group 1941, whose lateral aspects have a major axis at the first angle, alternate with the emissive regions of the first group 1941, whose lateral aspects have a major axis at the second angle.

In some non-limiting examples, a third group 1943 correspond to sub-pixels 2541-2543 that emit light at a third wavelength, in some non-limiting examples the sub-pixels 2541-2543 of the third group 1943 may correspond to blue (B) sub-pixels 2543. In some non-limiting examples, the lateral aspects of the emissive regions of the third group 1943 may have substantially diamond-shaped configuration. In some non-limiting examples, the emissive regions of the third group 1943 lie in the pattern of the first row, preceded and followed by PDLs 440. In some non-limiting examples, the lateral aspects of the emissive regions of the third group 1943 slightly overlap the lateral aspects of the preceding and following non-emissive regions comprising PDLs 440 in the same row, as well as of the lateral aspects of adjacent non-emissive regions comprising PDLs 440 in a preceding and following pattern of the second row. In some non-limiting examples, the pattern of the second row comprises emissive regions of the first group 1941 alternating regions of the third group 1943, each preceded and followed by PDLs 440.

Figure 19B:
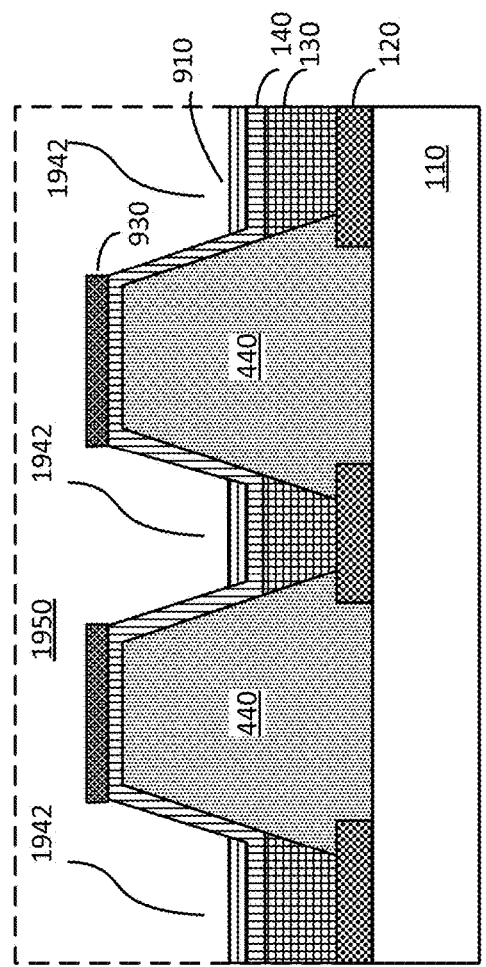
FIG. 19B is a schematic diagram illustrating an example cross-sectional view of the device of FIG. 19A taken along line 19B-19B.

Turning now to FIG. 19B, there is shown an example cross-sectional view of the device 1900, taken along line 19B-19B in FIG. 19A. In the figure, the device 1900 is shown as comprising a substrate 110 and a plurality of elements of a first electrode 120, which in some non-limiting examples may be anode(s) 341, formed on a surface thereof. The substrate 110 may comprise the base substrate 112 (not shown for purposes of simplicity of illustration) and/or at least one driving circuit 300 (not shown for purposes of simplicity of illustration), comprising at least one TFT structure 200, corresponding to each sub-pixel. PDLs 440 are formed over the substrate 110 between elements of the first electrode 120, to define emissive region(s) over each element of the first electrode 120, separated by non-emissive region(s) comprising the PDL(s) 440. In the figure, the emissive region(s) all correspond to the second group 1942.

In some non-limiting examples, an organic layer 130 is deposited on each element of the first electrode 120, between the surrounding PDLs 440. In some non-limiting examples, the organic layer 130 may comprise a plurality of organic and/or inorganic semiconducting layers, including without limitation, an HTL 131, an HIL 133, an EL 135, an EIL 137 and/or an ETL 139.

In some non-limiting examples, a second electrode 140, which in some non-limiting examples, may be a cathode 342, and in some non-limiting examples, a common cathode, may be deposited over the emissive region(s) of the second group 1942 to form the sub-pixel(s) 2541-2543 thereof and over the surrounding PDLs 440.

In some non-limiting examples, an NIC 910 is selectively deposited over the second electrode 140 across the lateral aspects of the emissive region(s) of the second group 1942 of sub-pixels 2541-2543 to allow selective deposition of a conductive coating 930 over portions of the second electrode 140 that is substantially devoid of the NIC 910, namely across the lateral aspects of the non-emissive region(s) comprising the PDLs 440. In some non-limiting examples, the conductive coating 930 may tend to accumulate along the substantially planar portions of the PDLs 440, as the conductive coating 930 may not tend to remain on the inclined portions of the PDLs 440, but tends to descend to a base of such inclined portions, which are coated with the NIC 910. In some non-limiting examples, the conductive coating 930 on the substantially planar portions of the PDLs 440 may form at least one auxiliary electrode 1650 that may be electrically coupled to the second electrode 140.

In some non-limiting examples, the NIC 910 may also act as an index-matching coating. In some non-limiting examples, the NIC 910 may also act as an outcoupling layer.

In some non-limiting examples, a thin film encapsulation (TFE) layer 1950 may be provided to encapsulate the device 1900. In some non-limiting examples, TFE may be considered a type of barrier coating 1550.

Figure 19C:
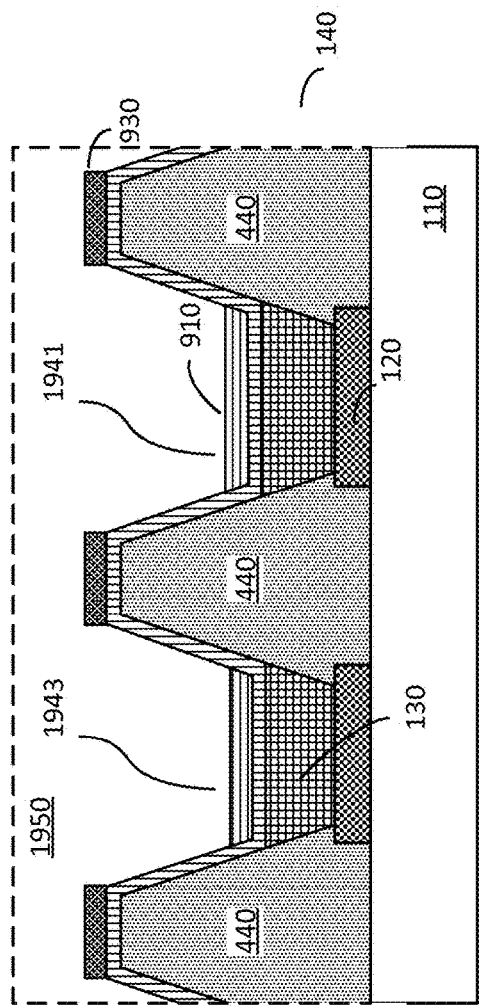
FIG. 19C is a schematic diagram illustrating an example cross-sectional view of the device of FIG. 19A taken along line 19C-19C.

Turning now to FIG. 19C, there is shown an example cross-sectional view of the device 1900, taken along line 19C-19C in FIG. 19A. In the figure, the device 1900 is shown as comprising a substrate 110 and a plurality of elements of a first electrode 120, which in some non-limiting examples may be anode(s) 341, formed on a surface thereof. The substrate 110 may comprise the base substrate 112 (not shown for purposes of simplicity of illustration) and/or at least one driving circuit 300 (not shown for purposes of simplicity of illustration), comprising at least one TFT structure 200, corresponding to each sub-pixel. PDLs 440 are formed over the substrate 110 between elements of the first electrode 120, to define emissive region(s) over each element of the first electrode 120, separated by non-emissive region(s) comprising the PDL(s) 440. In the figure, the emissive region(s) correspond to the first group 1941 and to the third group 1943 in alternating fashion.

In some non-limiting examples, an organic layer 130 is deposited on each element of the first electrode 120, between the surrounding PDLs 440. In some non-limiting examples, the organic layer 130 may comprise a plurality of organic and/or inorganic semiconducting layers, including without limitation, an HTL 131, an HIL 133, an EL 135, an EIL 137 and/or an ETL 139.

In some non-limiting examples, a second electrode 140, which in some non-limiting examples, may be a cathode 342, and in some non-limiting examples, a common cathode, may be deposited over the emissive region(s) of the second group 1942 to form the sub-pixel(s) 2541-2543 thereof and over the surrounding PDLs 440.

In some non-limiting examples, an NIC 910 is selectively deposited over the second electrode 140 across the lateral aspects of the emissive region(s) of the first group 1941 of sub-pixels 2541-2543 and of the third group of sub-pixels 2541-2543 to allow selective deposition of a conductive coating 930 over portions of the second electrode 140 that is substantially devoid of the NIC 910, namely across the lateral aspects of the non-emissive region(s) comprising the PDLs 440. In some non-limiting examples, the conductive coating 930 may tend to accumulate along the substantially planar portions of the PDLs 440, as the conductive coating 930 may not tend to remain on the inclined portions of the PDLs 440, but tends to descend to a base of such inclined portions, which are coated with the NIC 910. In some non-limiting examples, the conductive coating 930 on the substantially planar portions of the PDLs 440 may form at least one auxiliary electrode 1650 that may be electrically coupled to the second electrode 140.

In some non-limiting examples, the NIC 910 may also act as an index-matching coating. In some non-limiting examples, the NIC 910 may also act as an outcoupling layer.

In some non-limiting examples, a thin film encapsulation layer 1950 may be provided to encapsulate the device 1900.

Figure 20:
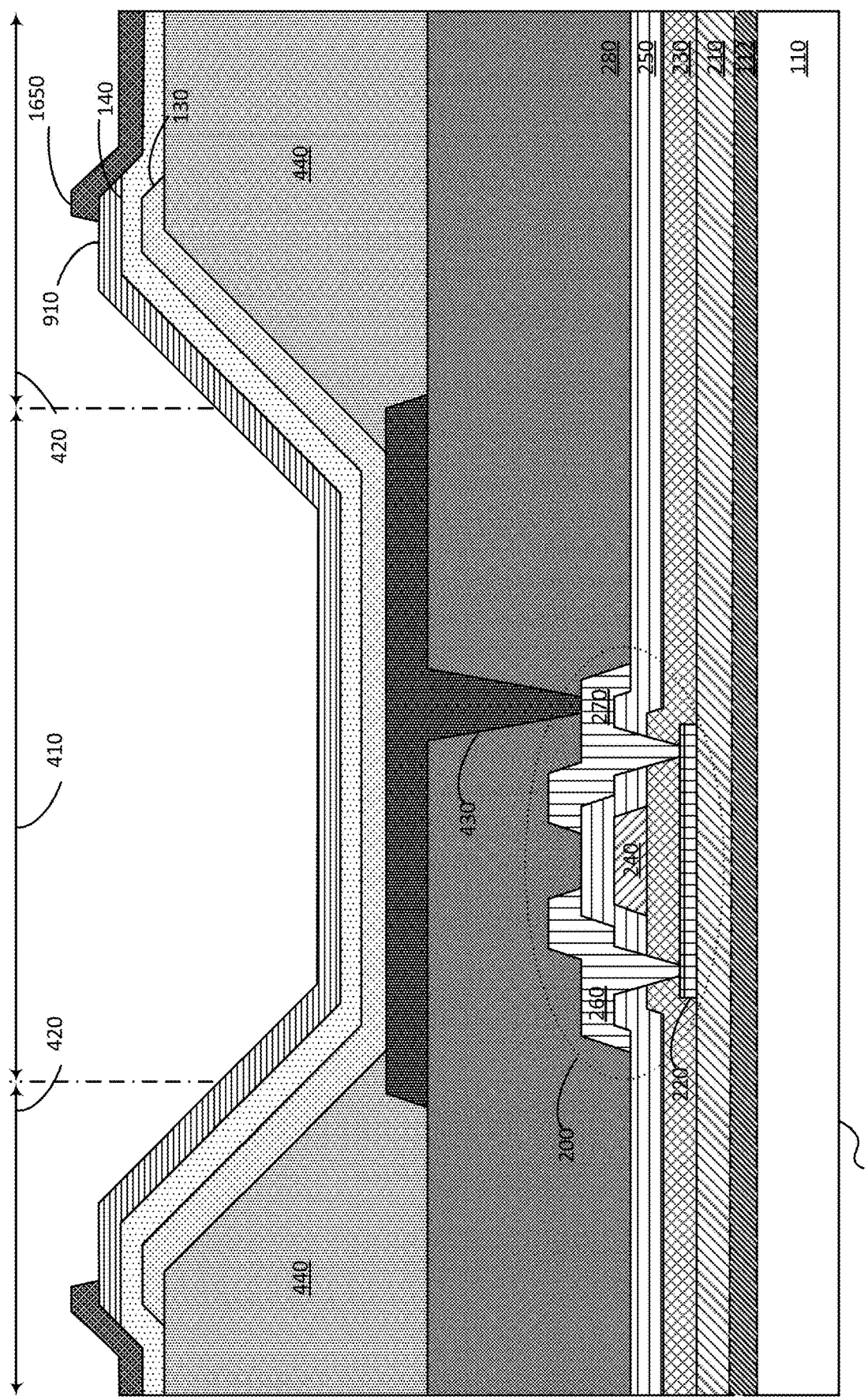
FIG. 20 is a schematic diagram illustrating an example cross-sectional view of the device of FIG. 4 with additional example deposition steps according to a first example in the present disclosure.

Turning now to FIG. 20, there is shown a device 2000, which encompasses the device 100 shown in cross-sectional view in FIG. 4, but with a number of additional deposition steps that are described herein.

The device 2000 shows an NIC 910 selectively deposited over the exposed surface of the underlying material, in the figure, the second electrode 140, which in some non-limiting examples be a cathode 342, within a first portion 701 of the device 2000, corresponding substantially to the lateral aspect 410 of emissive region(s) corresponding to pixel(s) 340 (and/or sub-pixel(s) 2541-2543 thereof) and not within a second portion 703 of the device 2000, corresponding substantially to the lateral aspect(s) 420 of non-emissive region(s) surrounding the first portion 701.

In some non-limiting examples, the NIC 910 may be selectively deposited using a shadow mask.

The NIC 910 provides, within the first portion 701, a surface with a relatively low initial sticking probability $S_0$ (in other words, a relatively low desorption energy) for a conductive coating 930 to be thereafter applied to form an auxiliary electrode 1650.

After selective deposition of the NIC 910, the conductive coating 930 is deposited over the device 2000 but remains substantially only within the second portion 703, which is substantially devoid of NIC 910, to form the auxiliary electrode 1650.

In some non-limiting examples, the conductive coating 930 may be deposited using an open mask and/or a mask-free deposition process.

The auxiliary electrode 1650 is electrically coupled to the second electrode 140 so as to reduce a sheet resistance of the second electrode 140, including, as shown, by lying above and in physical contact with the second electrode 140 across the second portion 703 that is substantially devoid of NIC 910.

In some non-limiting examples, the conductive coating 930 may comprise substantially the same material as the second electrode 140, so as to ensure a high initial sticking probability $S_0$ for the conductive coating 930 in the second portion 703.

In some non-limiting examples, the second electrode 140 may comprise substantially pure Mg and/or an alloy of Mg and another metal, including without limitation, Ag. In some non-limiting examples, an Mg:Ag alloy composition may range from about 1:9 to about 9:1 by volume. In some non-limiting examples, the second electrode 140 may comprise metal oxides, including without limitation, ternary metal oxides, such as, without limitation, ITO and/or IZO, and/or a combination of metals and/or metal oxides.

In some non-limiting examples, the conductive coating 930 used to form the auxiliary electrode 1650 may comprise substantially pure Mg.

Figure 21:
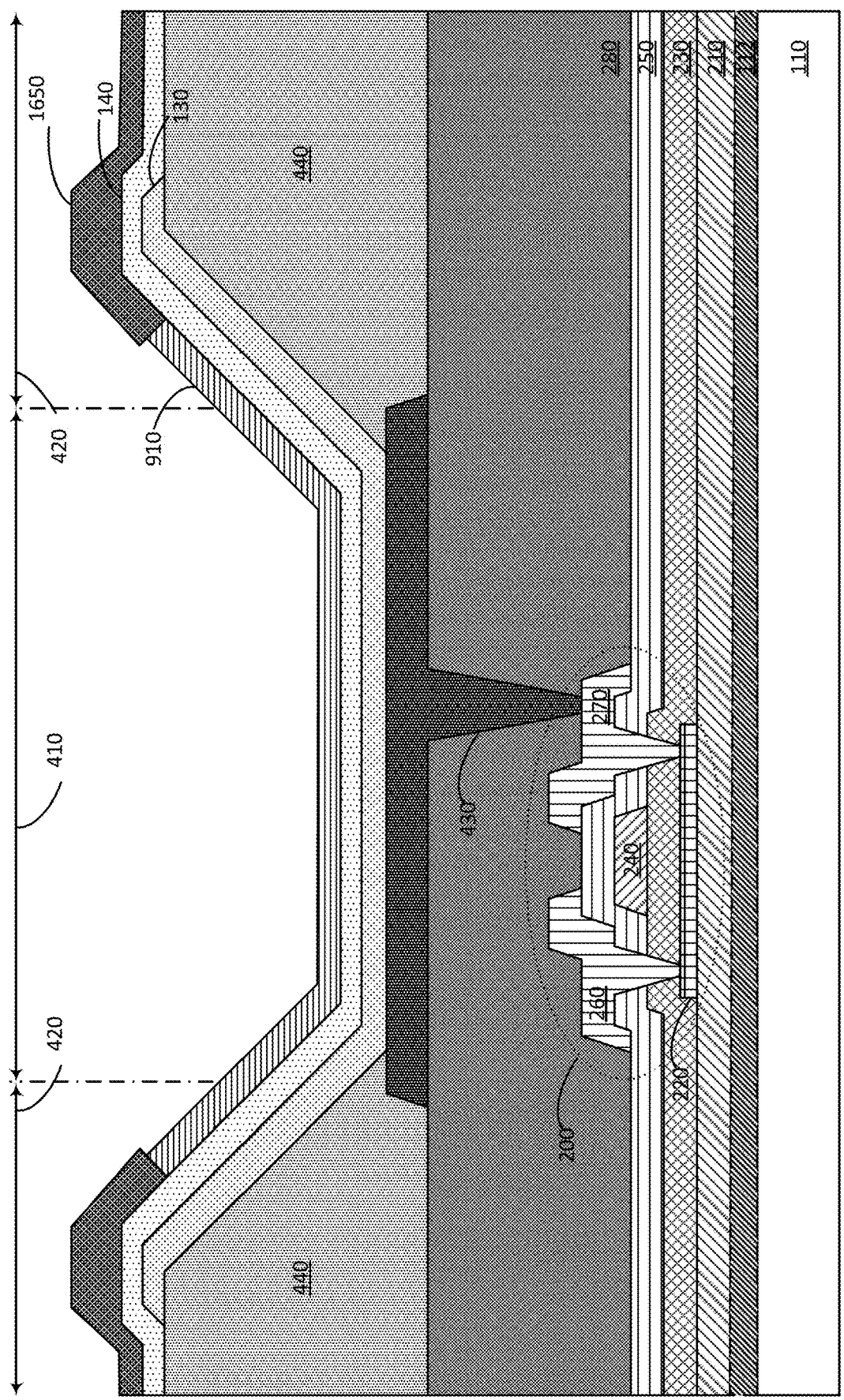
FIG. 21 is a schematic diagram illustrating an example cross-sectional view of the device of FIG. 4 will additional example deposition steps according to a second example in the present disclosure.

Turning now to FIG. 21, there is shown a device 2100, which encompasses the device 100 shown in cross-sectional view in FIG. 4, but with a number of additional deposition steps that are described herein.

The device 2100 shows an NIC 910 selectively deposited over the exposed surface of the underlying material, in the figure, the second electrode 140, which in some non-limiting examples be a cathode 342, within a first portion 701 of the device 2100, corresponding substantially to a portion of the lateral aspect 410 of emissive region(s) corresponding to pixel(s) 340 (and/or sub-pixel(s) 2541-2543 thereof), and not within a second portion 703. In the figure, the first portion 701 extends partially along the extent of an inclined portion of the PDLs 440 defining the emissive region(s).

In some non-limiting examples, the NIC 910 may be selectively deposited using a shadow mask.

The NIC 910 provides, within the first portion 701, a surface with a relatively low initial sticking probability $S_0$ (in other words, a relatively low desorption energy) for a conductive coating 930 to be thereafter applied to form an auxiliary electrode 1650.

After selective deposition of the NIC 910, the conductive coating 930 is deposited over the device 2100 but remains substantially only within the second portion 703, which is substantially devoid of NIC 910, to form the auxiliary electrode 1650. As such, in the device 2011, the auxiliary electrode extends partly across the inclined portion of the PDLs 440 defining the emissive region(s).

In some non-limiting examples, the conductive coating 930 may be deposited using an open mask and/or a mask-free deposition process.

The auxiliary electrode 1650 is electrically coupled to the second electrode 140 so as to reduce a sheet resistance of the second electrode 140, including, as shown, by lying above and in physical contact with the second electrode 140 across the second portion 703 that is substantially devoid of NIC 910.

In some non-limiting examples, the material of which the second electrode 140 may be comprised, may not have a high initial sticking probability $S_0$ for the conductive coating 930.

Figure 22:
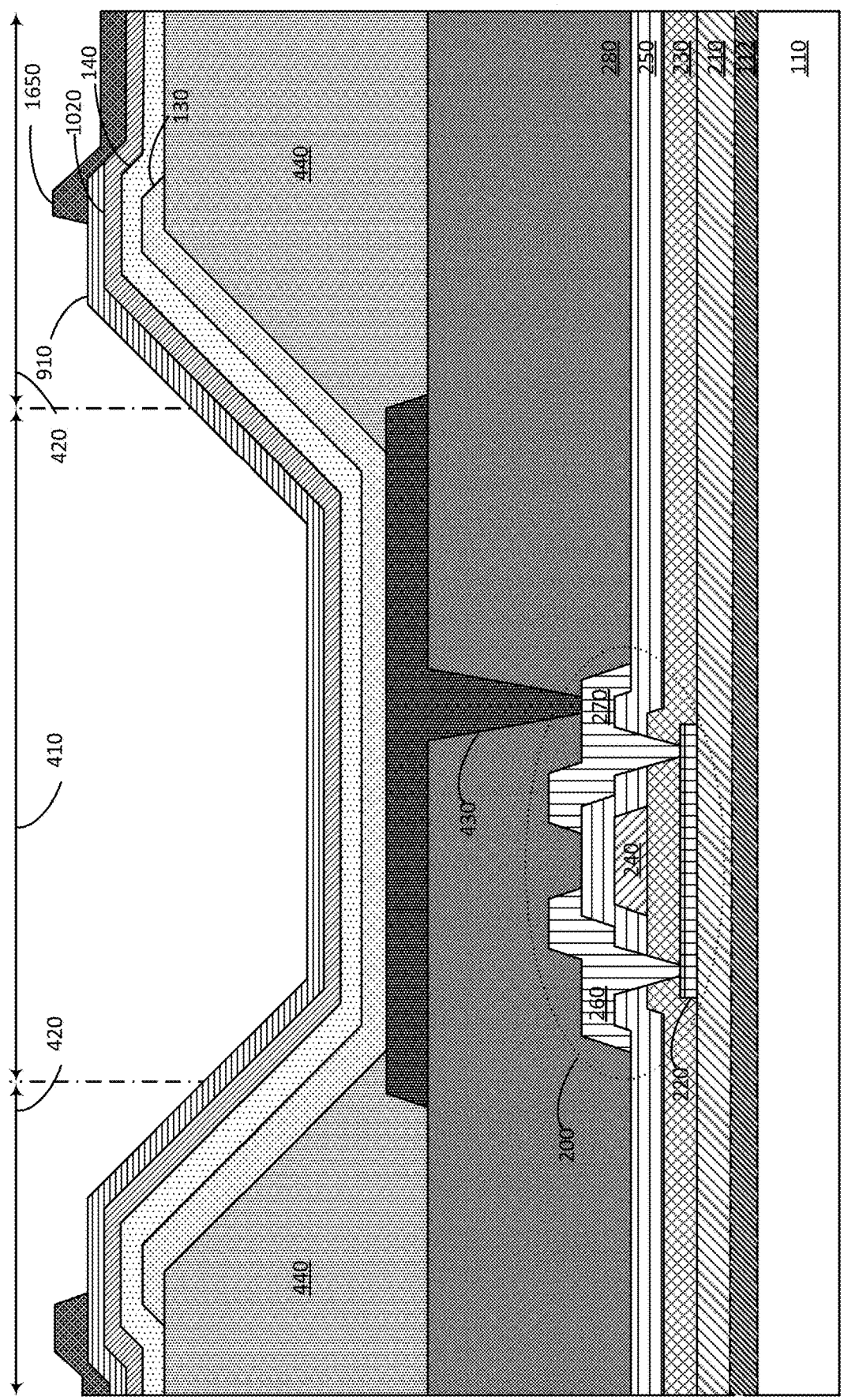
FIG. 22 is a schematic diagram illustrating an example cross-sectional view of the device of FIG. 4 will additional example deposition steps according to a third example in the present disclosure.

FIG. 22 illustrates such a scenario, in which there is shown a device 2200, which encompasses the device 100 shown in cross-sectional view in FIG. 4, but with a number of additional deposition steps that are described herein.

The device 2200 shows an NPC 1020 deposited over the exposed surface of the underlying material, in the figure, the second electrode 140, which in some non-limiting examples, may be a cathode 342.

In some non-limiting examples, the NPC 1020 may be deposited using an open mask and/or a mask-free deposition process.

Thereafter, an NIC 910 is deposited selectively deposited over the exposed surface of the underlying material, in the figure, the NPC 1020, within a first portion 701 of the device 2100, corresponding substantially to a portion of the lateral aspect 410 of emissive region(s) corresponding to pixel(s) 340 (and/or sub-pixel(s) 2541-2543 thereof), and not within a second portion 703 of the device 2000, corresponding substantially to the lateral aspect(s) 420 of non-emissive region(s) surrounding the first portion 701.

In some non-limiting examples, the NIC 910 may be selectively deposited using a shadow mask.

The NIC 910 provides, within the first portion 701, a surface with a relatively low initial sticking probability $S_0$ (in other words, a relatively low desorption energy) for a conductive coating 930 to be thereafter applied to form an auxiliary electrode 1650.

After selective deposition of the NIC 910, the conductive coating 930 is deposited over the device 2100 but remains substantially only within the second portion 703, which is substantially devoid of NIC 910, to form the auxiliary electrode 1650.

In some non-limiting examples, the conductive coating 930 may be deposited using an open mask and/or a mask-free deposition process.

The auxiliary electrode 1650 is electrically coupled to the second electrode 140 so as to reduce a sheet resistance of the second electrode 140. While, as shown, the auxiliary electrode 1650 is not lying above and in physical contact with the second electrode 140, those having ordinary skill in the relevant art will nevertheless appreciate that the auxiliary electrode 1650 may be electrically coupled to the second electrode 140 by a number of well-understood mechanisms. By way of non-limiting example, the presence of a relatively thin film (in some non-limiting examples, of up to about 50 nm) of an NIC 910 and/or an NPC 1020 may still allow a current to pass therethrough, thus allowing a sheet resistance of the second electrode 140 to be reduced.

Figure 23:
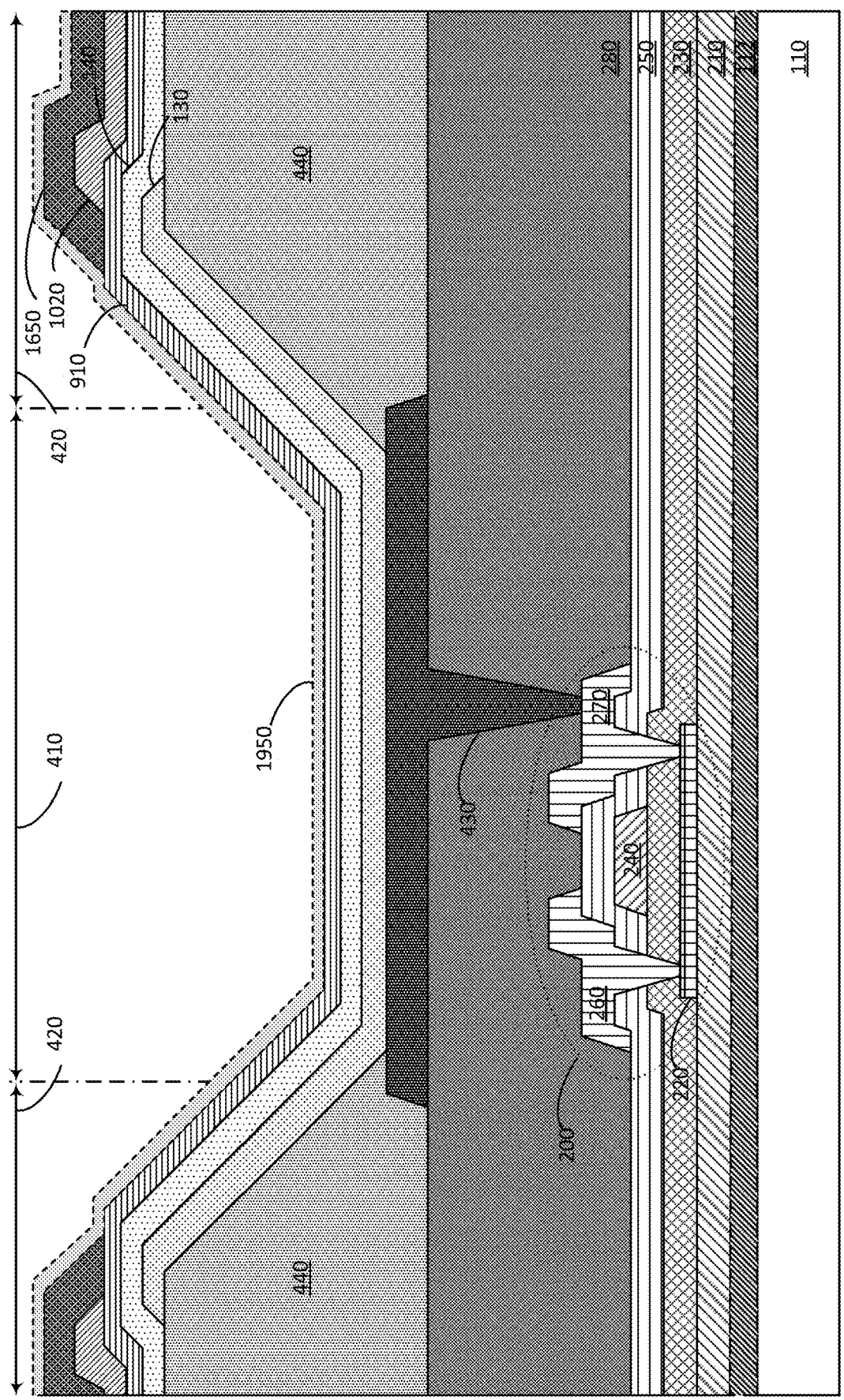
FIG. 23 is a schematic diagram illustrating an example cross-sectional view of the device of FIG. 4 will additional example deposition steps according to a fourth example in the present disclosure.

Turning now to FIG. 23, there is shown a device 2300, which encompasses the device 100 shown in cross-sectional view in FIG. 4, but with a number of additional deposition steps that are described herein.

The device 2300 shows an NIC 910 deposited over the exposed surface of the underlying material, in the figure, the second electrode 140, which in some non-limiting examples be a cathode 342.

In some non-limiting examples, the NIC 910 may be deposited using an open mask and/or a mask-free deposition process.

The NIC 910 provides a surface with a relatively low initial sticking probability $S_0$ (in other words, a relatively low desorption energy) for a conductive coating 930 to be thereafter applied to form an auxiliary electrode 1650.

After deposition of the NIC 910, an NPC 1020 is selectively deposited over the exposed surface of the underlying material, in the figure, the NIC 910, within a NPC portion 1002 of the device 2300, corresponding substantially to a portion of the lateral aspect 410 of non-emissive region(s) surrounding a second portion 703 of the device 2300, corresponding substantially to the lateral aspect(s) 410 corresponding to pixel(s) 340 (and/or sub-pixel(s) 2541-2543 thereof).

In some non-limiting examples, the NPC 1020 may be selectively deposited using a shadow mask.

The NPC 1020 provides, within the first portion 701, a surface with a relatively high initial sticking probability $S_0$ (in other words, a relatively high desorption energy) for a conductive coating 930 to be thereafter applied to form an auxiliary electrode 1650.

After selective deposition of the NPC 1020, the conductive coating 930 is deposited over the device 2000 but remains substantially only within the NPC portion 1002, in which the NIC 910 has been overlaid with the NPC 1020, to form the auxiliary electrode 1650.

In some non-limiting examples, the conductive coating 930 may be deposited using an open mask and/or a mask-free deposition process.

The auxiliary electrode 1650 is electrically coupled to the second electrode 140 so as to reduce a sheet resistance of the second electrode 140. While, as shown, the auxiliary electrode 1650 is not lying above and in physical contact with the second electrode 140, those having ordinary skill in the relevant art will nevertheless appreciate that the auxiliary electrode 1650 may be electrically coupled to the second electrode 140 by a number of well-understood mechanisms. By way of non-limiting example, the presence of a relatively thin film (in some non-limiting examples, of up to about 100 nm) of an NIC 910 and/or an NPC 1020 may still allow a current to pass therethrough, thus allowing a sheet resistance of the second electrode 140.

Removal of Selective Coatings

In some non-limiting examples, the NIC 910 may be removed subsequent to deposition of the conductive coating 930, such that at least a portion of a previously exposed surface 111 of an underlying material covered by the NIC 910 may become exposed once again. In some non-limiting examples, the NIC 910 may be selectively removed by etching and/or dissolving the NIC 910 and/or by employing plasma and/or solvent processing techniques that do not substantially affect or erode the conductive coating 930.

Turning now to FIG. 24A, there is shown an example cross-sectional view of a device 2400, at a deposition stage 2400a, in which a nucleation inhibition coating 910 has been selectively deposited on an exposed surface 111 of an underlying material. In the figure, the underlying material may be the substrate 110.

In FIG. 24B, the device 2400 is shown at a deposition stage 2400b, in which a conductive coating 930 is applied on the exposed surface 111 of the underlying material, that is, on both the exposed surface of NIC 910 where the NIC 910 has been deposited during the stage 2400a, as well as the exposed surface 111 of the substrate 110 where that NIC 910 has not been deposited during the stage 2400a.

In FIG. 24C, the device 2400 is shown at a deposition stage 2400c, in which the NIC 910 has been removed from the exposed surface 111 of the substrate 110, such that the conductive coating 930 deposited during the stage 2400b remains on the substrate 110 and regions of the substrate 110 on which the NIC 910 had been deposited during the stage 2400a are now exposed or uncovered.

In some non-limiting examples, the removal of the NIC 910 in the stage 2400c may be effected by exposing the device 2400 to a solvent and/or a plasma that reacts with and/or etches away the NIC 910 without substantially impacting the conductive coating 930.

Transparent OLED

Figure 25A:
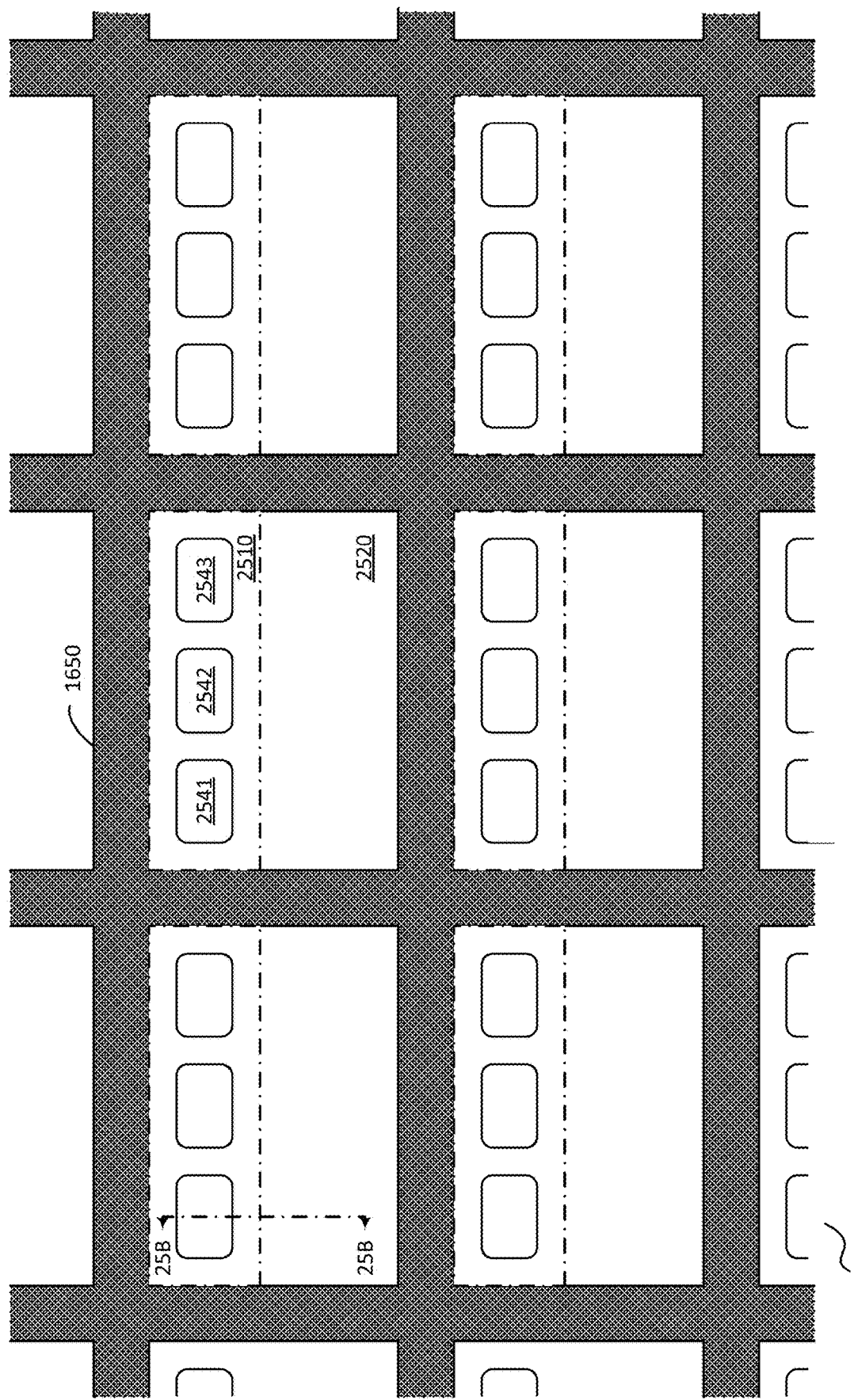
FIG. 25A is a schematic diagram illustrating, in plan view, an example of a transparent electro-luminescent device comprising at least one example pixel region and at least one example light-transmissive region, with at least one auxiliary electrode according to an example in the present disclosure.

Turning now to FIG. 25A, there is shown an example plan view of a light transmissive (transparent) device, shown generally at 2500. In some non-limiting examples, the device 2500 is an AMOLED device having a plurality of pixel regions 2510 and a plurality of light transmissive regions 2520. In some non-limiting examples, at least one auxiliary electrode 1650 may be deposited on an exposed surface 111 of an underlying material between the pixel region(s) 2510 and/or the light transmissive region(s) 2520.

In some non-limiting examples, each pixel region 2510 may comprise a plurality of emissive regions each corresponding to a sub-pixel 2541-2543. In some non-limiting examples, the sub-pixels 2541-2543 may correspond to, respectively, R(ed) sub-pixels 2541, G(reen) sub-pixels and/or B(lue) sub-pixels 2543.

In some non-limiting examples, each light transmissive region 2520 is substantially light-transmissive (transparent) and allows light to pass through the entirety of a cross-sectional aspect thereof.

Figure 25B:
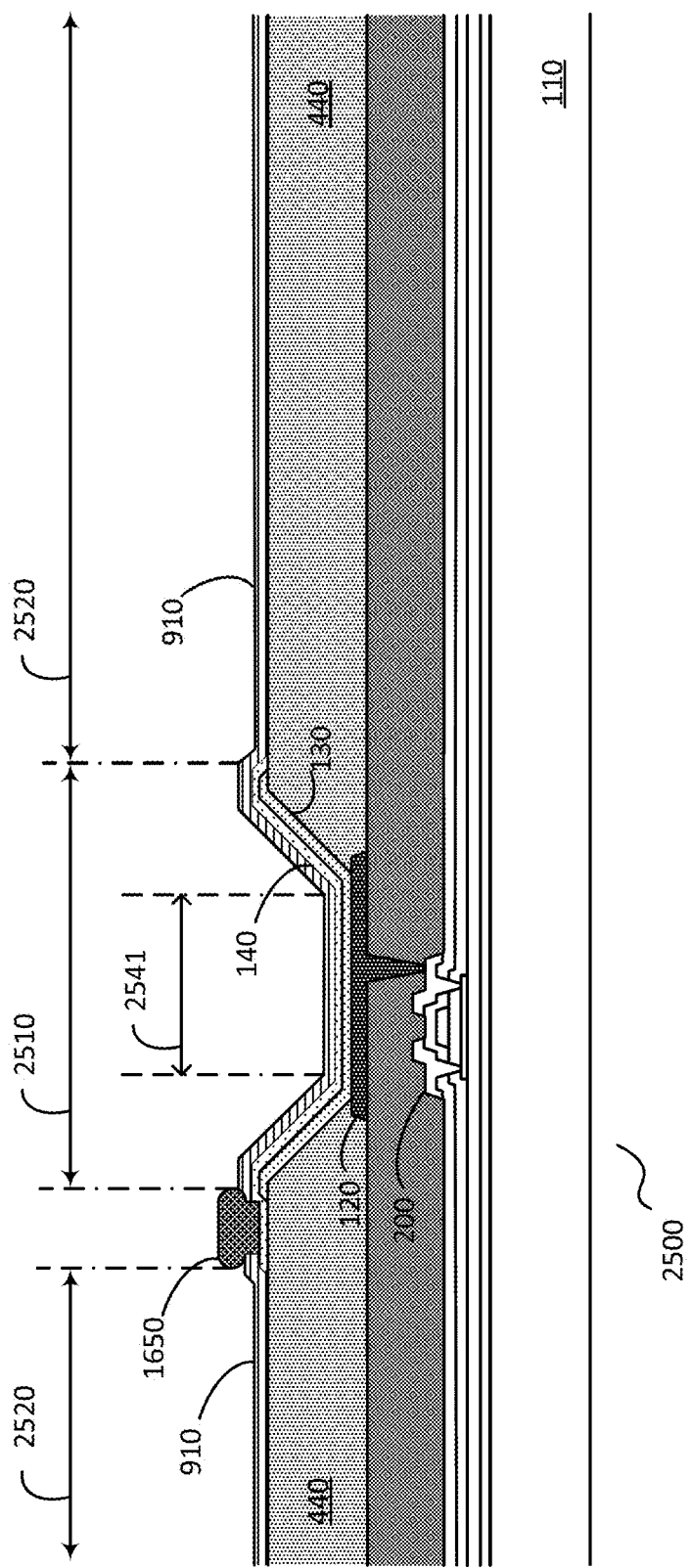
FIG. 25B is a schematic diagram illustrating an example cross-sectional view of the device of FIG. 25A taken along line 25B-25B.

Turning now to FIG. 25B, there is shown an example cross-sectional view of the device 2500, taken along line 25B-25B in FIG. 25A. In the figure, the device 2500 is shown as comprising a substrate 110, a TFT insulating layer 280 and a first electrode 120, which in some non-limiting examples may be an anode 341, formed on a surface of the TFT insulating layer 280. The substrate 110 may comprise the base substrate 112 (not shown for purposes of simplicity of illustration) and/or at least one driving circuit 300 (not shown for purposes of simplicity of illustration), comprising at least one TFT structure 200, corresponding to each sub-pixel 2541-2543 and positioned substantially thereunder and electrically coupled to the first electrode 120. PDL(s) 440 are formed over the substrate 110, to define emissive region(s) also corresponding to each sub-pixel 2541-2543, over the first electrode 120 corresponding thereto. The PDL(s) 440 cover edges of the first electrode 120.

In some non-limiting examples, at least one organic layer 130 is deposited over exposed region(s) of the first electrode 120 and portions of the surrounding PDLs 440. In some non-limiting examples, the organic layer(s) 130 may comprise a plurality of organic and/or inorganic semiconducting layers, including without limitation, an HTL 131, an HIL 133, an EL 135, an EIL 137 and/or an ETL 139.

In some non-limiting examples, a second electrode 140, which in some non-limiting examples, may be a cathode 342, may be deposited over the organic layer(s) 130, including over the pixel region 2510 to form the sub-pixel(s) 2541 thereof and over the surrounding PDLs 440 in the light transmissive region 2520.

In some non-limiting examples, an NIC 910 is selectively deposited over portions of the device 2500, comprising both the pixel region 2510 and the light transmissive region 2520 but not the region of the second electrode 140 corresponding to the auxiliary electrode 1650.

In some non-limiting examples, the entire surface of the device 2500 is then exposed to a vapour flux of the conductive coating 930, which in some non-limiting examples may be Mg. The conductive coating 930 is selectively deposited over portions of the second electrode 140 that is substantially devoid of the NIC 910 to form an auxiliary electrode 1650 that is electrically coupled to and in some non-limiting examples, in physical contact with uncoated portions of the second electrode 140.

At the same time, the light transmissive region 1520 of the device 2500 remains substantially devoid of any materials that may substantially affect the transmission of light therethrough. In particular, as shown in the figure, the TFT structure 200, the first electrode 120 are positioned, in a cross-sectional aspect below the sub-pixel 2541 corresponding thereto, and together with the auxiliary electrode 1650, lie beyond the light transmissive region 1520. As a result, these components do not attenuate or impede light from being transmitted through the light transmissive region 1520. In some non-limiting examples, such arrangement allows a viewer viewing the device 2500 from a typical viewing distance to see through the device 2500, in some non-limiting examples, when all of the pixel(s) 340 (and/or sub-pixel(s) 2541-2543 thereof) are not emitting, thus creating a transparent AMOLED display 2500.

While not shown in the figure, in some non-limiting examples, the device 2500 may further comprise an NPC disposed between the auxiliary electrode 1650 and the second electrode 140. In some non-limiting examples, the NPC may also be disposed between the NIC 910 and the second electrode 140.

Those having ordinary skill in the relevant art will appreciate that in some non-limiting examples, various other layers and/or coatings, including without limitation those forming the organic layer(s) 130 and/or the second electrode 140, may cover a portion of the light transmissive region 2520, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s), to further facilitate light transmission through the light transmissive region 2520.

Those having ordinary skill in the relevant art will appreciate that pixel 340 (and/or sub-pixel 2541-2543) arrangements other than the arrangement shown in FIGS. 25A and 25B may, in some non-limiting examples, be employed.

Those having ordinary skill in the relevant art will appreciate that arrangements of the auxiliary electrode(s) 1650 other than the arrangement shown in FIGS. 25A and 25B may, in some non-limiting examples, be employed. By way of non-limiting example, the auxiliary electrode(s) 1650 may be disposed between the pixel region 2510 and the light transmissive region 2520. By way of non-limiting example, the auxiliary electrode(s) 1650 may be disposed between sub-pixel(s) 2541-2543 within a pixel region 2510.

Turning now to FIG. 26A, there is shown an example plan view of a light transmissive (transparent) device, shown generally at 2600. In some non-limiting examples, the device 2600 is an AMOLED device having a plurality of pixel regions 2510 and a plurality of light transmissive regions 2520. The device 2600 differs from device 2500 in that no auxiliary electrode(s) lie between the pixel region(s) 2510 and/or the light transmissive region(s) 2520.

In some non-limiting examples, each pixel region 2510 may comprise a plurality of emissive regions each corresponding to a sub-pixel 2541-2543. In some non-limiting examples, the sub-pixels 2541-2543 may correspond to, respectively, R(ed) sub-pixels 2541, G(reen) sub-pixels and/or B(lue) sub-pixels 2543.

In some non-limiting examples, each light transmissive region 2520 is substantially light-transmissive (transparent) and allows light to pass through the entirety of a cross-sectional aspect thereof.

Figure 26B:
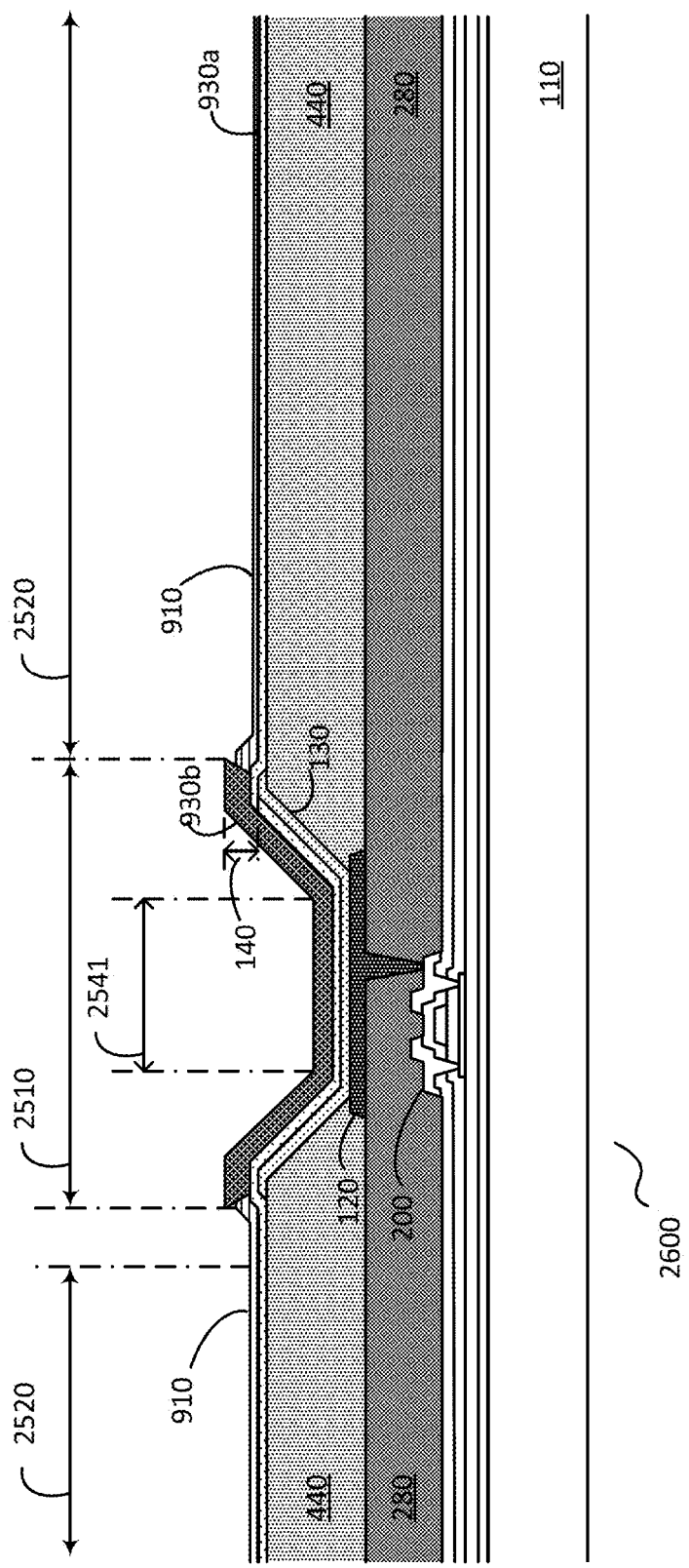
FIG. 26B is a schematic diagram illustrating an example cross-sectional view of the device of FIG. 26A taken along line 26B-26B.

Turning now to FIG. 26B, there is shown an example cross-sectional view of the device 2600, taken along line 26B-26B in FIG. 26A. In the figure, the device 2600 is shown as comprising a substrate 110, a TFT insulating layer 280 and a first electrode 120, which in some non-limiting examples may be an anode 341, formed on a surface of the TFT insulating layer 280. The substrate 110 may comprise the base substrate 112 (not shown for purposes of simplicity of illustration) and/or at least one driving circuit 300 (not shown for purposes of simplicity of illustration), comprising at least one TFT structure 200 corresponding to each sub-pixel 2541-2543 and positioned substantially thereunder and electrically coupled to the first electrode 120. PDL(s) 440 are formed over the substrate 110, to define emissive region(s) also corresponding to each sub-pixel 2541-2543, over the first electrode 120 corresponding thereto. The PDL(s) 440 cover edges of the first electrode 120.

In some non-limiting examples, at least one organic layer 130 is deposited over exposed region(s) of the first electrode 120 and portions of the surrounding PDLs 440. In some non-limiting examples, the organic layer(s) 130 may comprise a plurality of organic and/or inorganic semiconducting layers, including without limitation, an HTL 131, an HIL 133, an EL 135, an EIL 137 and/or an ETL 139.

In some non-limiting examples, a first conductive coating 930a may be deposited over the organic layer(s) 130, including over the pixel region 2510 to form the sub-pixel(s) 2541 thereof and over the surrounding PDLs 440 in the light transmissive region 2520. In some non-limiting examples, the thickness of the first conductive coating 930a may be relatively thin such that the presence of the first conductive coating 930a across the light transmissive region 2520 does not substantially attenuate transmission of light therethrough. In some non-limiting examples, the first conductive coating 930a may be deposited using an open mask and/or mask-free deposition process.

In some non-limiting examples, an NIC 910 is selectively deposited over portions of the device 2600, comprising the light transmissive region 2520.

In some non-limiting examples, the entire surface of the device 2600 is then exposed to a vapour flux of the conductive coating 930, which in some non-limiting examples may be Mg to selectively deposit a second conductive coating 930b over portions of the first conductive coating 930a that are substantially devoid of the NIC 910, in some examples, the pixel region 2510, such that the second conductive coating 930b is electrically coupled to and in some non-limiting examples, in physical contact with uncoated portions of the first conductive coating 930a, to form the second electrode 140 which may be, in some non-limiting examples, a cathode 342.

In some non-limiting examples, a thickness of the first conductive coating 930a may be less than a thickness of the second conductive coating 930b. In this way, relatively high light transmittance may be maintained in the light transmissive region 2520, over which only the first conductive coating 930a extends. In some non-limiting examples, the thickness of the first conductive coating 930a may be less than about 30 nm, less than about 25 nm, less than about 20 nm, less than about 15 nm, less than about 10 nm, less than about 8 nm, and/or less than about 5 nm. In some non-limiting examples, the thickness of the second conductive coating 930b may be less than about 30 nm, less than about 25 nm, less than about 20 nm, less than about 15 nm, less than about 10 nm and/or less than about 8 nm.

Thus, in some non-limiting examples, a thickness of the second electrode 140 may be less than about 40 nm, and/or in some non-limiting examples, between about 5 nm and 30 nm, between about 10 nm and about 25 nm and/or between about 15 nm and about 25 nm In some non-limiting examples, the thickness of the first conductive coating 930a may be greater than the thickness of the second conductive coating 930b. In some non-limiting examples, the thickness of the first conductive coating 930a and the thickness of the second conductive coating 930b may be substantially the same.

In some non-limiting examples, at least one material used to form the first conductive coating 930a may be substantially the same as at least one material used to form the second conductive coating 930b. In some non-limiting examples, such at least one material may be substantially as described herein in respect of the first electrode 120, the second electrode 140, the auxiliary electrode 1650 and/or a conductive coating 930 thereof.

In some non-limiting examples, the light transmissive region 1520 of the device 2600 remains substantially devoid of any materials that may substantially affect the transmission of light therethrough. In particular, as shown in the figure, the TFT structure 200, the first electrode 120 are positioned, in a cross-sectional aspect below the sub-pixel 2541 corresponding thereto and beyond the light transmissive region 1520. As a result, these components do not attenuate or impede light from being transmitted through the light transmissive region 1520. In some non-limiting examples, such arrangement allows a viewer viewing the device 2600 from a typical viewing distance to see through the device 2500, in some non-limiting examples, when all of the pixel(s) 340 (and/or sub-pixel(s) 2541-2543 thereof) are not emitting, thus creating a transparent AMOLED display 2600.

While not shown in the figure, in some non-limiting examples, the device 2600 may further comprise an NPC disposed between the second conductive coating 930b and the first conductive coating 930a. In some non-limiting examples, the NPC may also be disposed between the NIC 910 and the first conductive coating 930a.

In some non-limiting examples, the NIC 910 may be formed concurrently with at least one of the organic layer(s) 130. By way of non-limiting example, at least one material used to form the NIC 910 may also be used to form at least one of the organic layer(s) 130. In such non-limiting example, a number of stages for fabricating the device 2600 may be reduced.

Those having ordinary skill in the relevant art will appreciate that in some non-limiting examples, various other layers and/or coatings, including without limitation those forming the organic layer(s) 130 and/or the first conductive coating 930a, may cover a portion of the light transmissive region 2520, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s), to further facilitate light transmission through the light transmissive region 2520.

Those having ordinary skill in the relevant art will appreciate that pixel 340 (and/or sub-pixel 2541-2543) arrangements other than the arrangement shown in FIGS. 26A and 26B may, in some non-limiting examples, be employed.

Figure 26C:
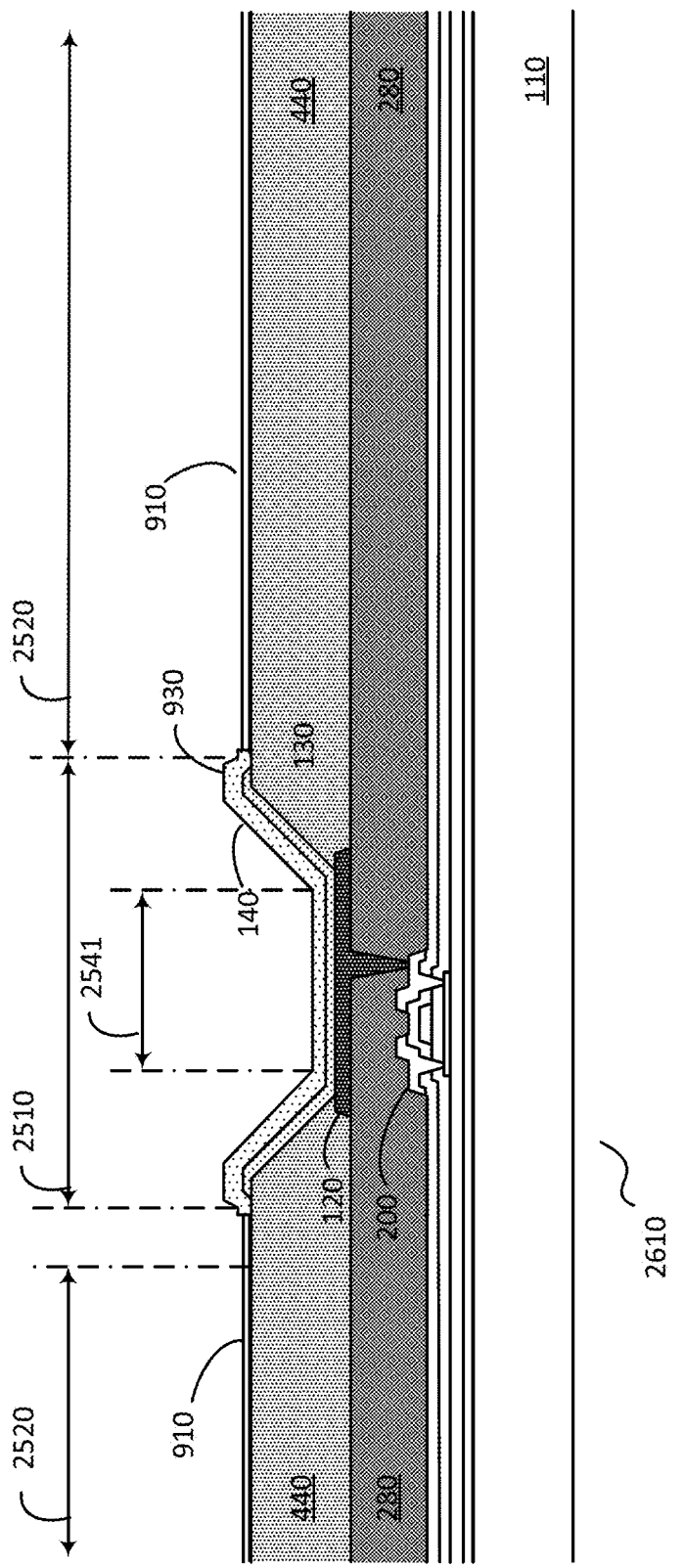
FIG. 26C illustrates an example cross-sectional view of a view of device 2610, taken along the same line 26B-26B as shown in FIG. 26A.

Turning now to FIG. 26C, there is shown an example cross-sectional view of a different example of the device 2600, shown as device 2610, taken along the same line 26B-26B in FIG. 26A. In the figure, the device 2610 is shown as comprising a substrate 110, a TFT insulating layer 280 and a first electrode 120, which in some non-limiting examples may be an anode 341, formed on a surface of the TFT insulating layer 280. The substrate 110 may comprise the base substrate 112 (not shown for purposes of simplicity of illustration) and/or at least one driving circuit 300 (not shown for purposes of simplicity of illustration), comprising at least one TFT structure 200 corresponding to each sub-pixel 2541-2543 and positioned substantially thereunder and electrically coupled to the first electrode 120. PDL(s) 440 are formed over the substrate 110, to define emissive region(s) also corresponding to each sub-pixel 2541-2543, over the first electrode 120 corresponding thereto. The PDL(s) 440 cover edges of the first electrode 120.

In some non-limiting examples, at least one organic layer 130 is deposited over exposed region(s) of the first electrode 120 and portions of the surrounding PDLs 440. In some non-limiting examples, the organic layer(s) 130 may comprise a plurality of organic and/or inorganic semiconducting layers, including without limitation, an HTL 131, an HIL 133, an EL 135, an EIL 137 and/or an ETL 139.

In some non-limiting examples, an NIC 910 is selectively deposited over portions of the device 2600, comprising the light transmissive region 2520.

In some non-limiting examples, a conductive coating 930 may be deposited over the organic layer(s) 130, including over the pixel region 2510 to form the sub-pixel(s) 2541 thereof but not over the surrounding PDLs 440 in the light transmissive region 2520. In some non-limiting examples, the first conductive coating 930a may be deposited using an open mask and/or mask-free deposition process. In some non-limiting examples, such deposition may be effected by exposing the entire surface of the device 2610 to a vapour flux of the conductive coating 930, which in some non-limiting examples may be Mg to selectively deposit the conductive coating 930 over portions of the organic layer(s) 130 that are substantially devoid of the NIC 910, in some examples, the pixel region 2510, such that the conductive coating 930 is deposited on the organic layer(s) 130 to form the second electrode 140, which may be, in some non-limiting examples, a cathode 342.

In some non-limiting examples, the light transmissive region 1520 of the device 2610 remains substantially devoid of any materials that may substantially affect the transmission of light therethrough. In particular, as shown in the figure, the TFT structure 200, the first electrode 120 are positioned, in a cross-sectional aspect below the sub-pixel 2541 corresponding thereto and beyond the light transmissive region 1520. As a result, these components do not attenuate or impede light from being transmitted through the light transmissive region 1520. In some non-limiting examples, such arrangement allows a viewer viewing the device 2600 from a typical viewing distance to see through the device 2500, in some non-limiting examples, when all of the pixel(s) 340 (and/or sub-pixel(s) 2541-2543 thereof) are not emitting, thus creating a transparent AMOLED display 2600.

By providing a light transmissive region 2520 that is free and/or substantially devoid of any conductive coating 930, the light transmittance in such region may, in some non-limiting examples, be favorably enhanced, by way of non-limiting example, by comparison to the device 2600 of FIG. 26B.

While not shown in the figure, in some non-limiting examples, the device 2600 may further comprise an NPC disposed between the conductive coating 930 and the organic layer(s) 130. In some non-limiting examples, the NPC may also be disposed between the NIC 910 and the PDL(s) 440.

In some non-limiting examples, the NIC 910 may be formed concurrently with at least one of the organic layer(s) 130. By way of non-limiting example, at least one material used to form the NIC 910 may also be used to form at least one of the organic layer(s) 130. In such non-limiting example, a number of stages for fabricating the device 2610 may be reduced.

Those having ordinary skill in the relevant art will appreciate that in some non-limiting examples, various other layers and/or coatings, including without limitation those forming the organic layer(s) 130 and/or the conductive coating 930, may cover a portion of the light transmissive region 2520, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s), to further facilitate light transmission through the light transmissive region 2520.

Those having ordinary skill in the relevant art will appreciate that pixel 340 (and/or sub-pixel 2541-2543) arrangements other than the arrangement shown in FIGS. 26A and 26B may, in some non-limiting examples, be employed.

Selective Deposition of a Conductive Coating over Emissive Region(s)

As discussed above, modulating the thickness of an electrode 120, 140, 1650 in and across a lateral aspect 410 of emissive region(s) of a pixel 340 (and/or sub-pixel(s) 2541-2543 thereof) may impact the microcavity effect observable. In some non-limiting examples, selective deposition of at least one conductive coating 930 through application of at least one selective coating 710, such as an NIC 910 and/or an NPC 1020, in the lateral aspects 410 of emissive region(s) corresponding to different sub-pixel(s) 2541-2543 in a pixel region 2510 may allow the optical microcavity effect in each emissive region to controlled and/or modulated to optimize desirable optical microcavity effects on a sub-pixel basis, including without limitation, an emission spectrum, a luminous intensity and/or an angular dependence of a brightness and/or a color shift of emitted light.

Such effects may be controlled by modulating the thickness of the selective coating 710, such as an NIC 910 and/or an NPC 1020, disposed in each emissive region of the sub-pixel(s) 2541-2543 independently of one another. By way of non-limiting example, the thickness of an NIC 910 disposed over a blue sub-pixel 2543 may be less than the thickness of an NIC 910 disposed over a green sub-pixel 2542, and the thickness of the NIC disposed over a green sub-pixel 2542 may be less than the thickness of an NIC 910 disposed over a red sub-pixel 2541.

In some non-limiting examples, such effects may be controlled to an even greater extent by independently modulating the thickness of not only the selective coating 710, which may be an NIC 910 and/or an NPC 1020, but also the conductive coating 930 applied in portion(s) of each emissive region of the sub-pixel(s) 2541-2543.

Such a mechanism is illustrated in the schematic diagrams of FIGS. 27A-27D. These diagrams illustrate various stages of manufacturing a device, shown generally at 2700.

Figure 27A:
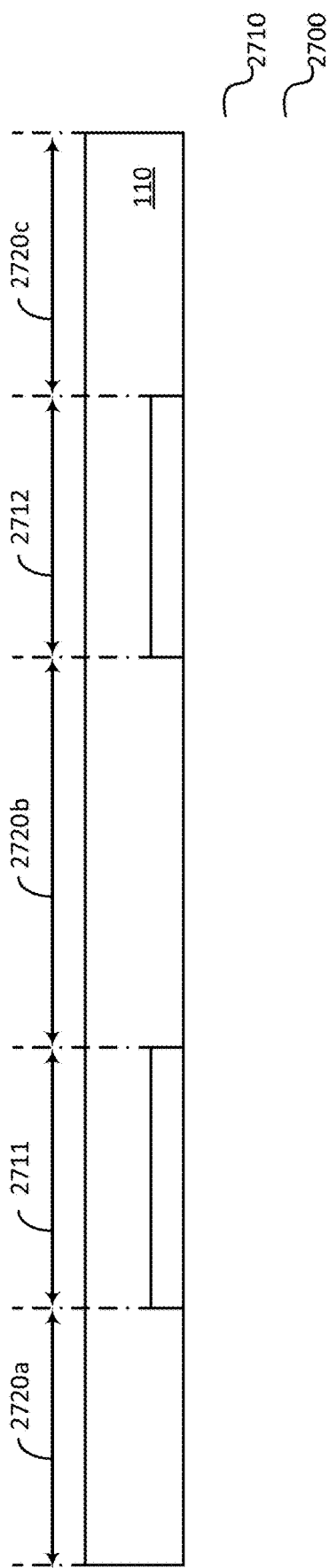
FIGS. 27A-27D are schematic diagrams that show example stages of an example process for manufacturing a device to provide emissive regions having a second electrode of different thickness according to an example in the present disclosure.

FIG. 27A shows a stage 2710 of manufacturing the device 2700. In the stage 2710, a substrate 110 is provided. The substrate 110 comprises a first emissive region 2711 and a second emissive region 2712. In some non-limiting examples, the first emissive region 2711 and/or the second emissive region 2712 may be surrounded and/or spaced-apart by at least one non-emissive region 2720a-2720c. In some non-limiting examples, the first emissive region 2711 and/or the second emissive region 2712 may each correspond to a pixel 340 (and/or a sub-pixel 2541-2543 thereof).

Figure 27B:
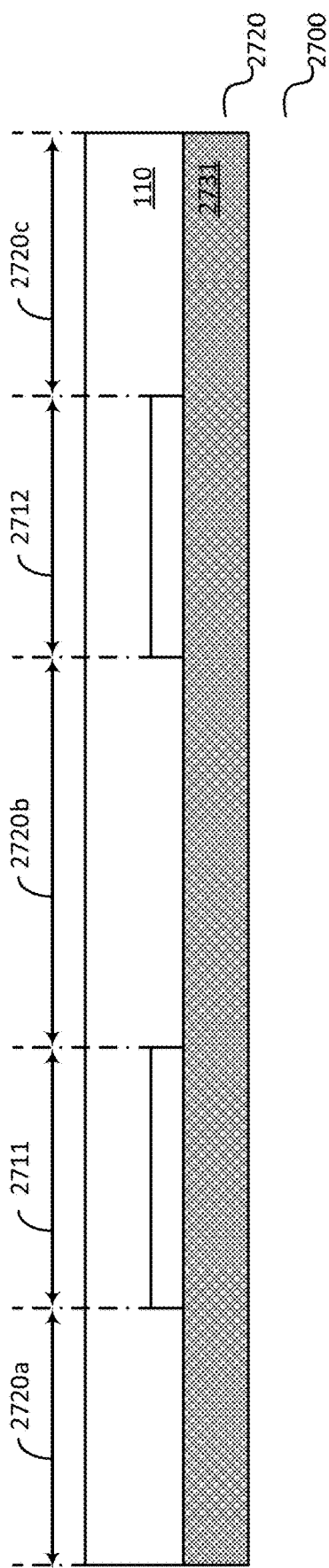

FIG. 27B shows a stage 2720 of manufacturing the device 2700. In the stage 2720, a first conductive coating 2731 is deposited on an exposed surface 111 of an underlying material, in this case the substrate 110. The first conductive coating 2731 is deposited across the first emissive region 2711 and the second emissive region 2712. In some non-limiting examples, the first conductive coating 2731 is deposited across at least one of the non-emissive regions 2720a-2720c.

In some non-limiting examples, the first conductive coating 2731 may be deposited using an open mask and/or a mask-free deposition process.

Figure 27C:
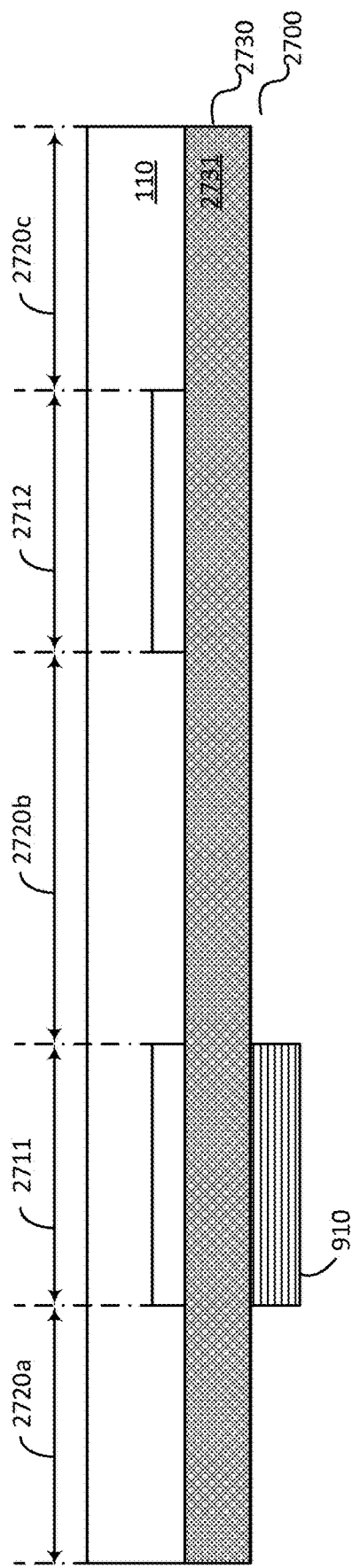

FIG. 27C shows a stage 2730 of manufacturing the device 2700. In the stage 2730, an NIC 910 is selectively deposited over a portion of the first conductive coating 2731. As shown in the figure, in some non-limiting examples, the NIC 910 is deposited across the first emissive region 2711, while in some non-limiting examples, the second emissive region 2712/or in some non-limiting examples, at least one of the non-emissive regions 2720a-2720c are substantially devoid of the NIC 910.

Figure 27D:
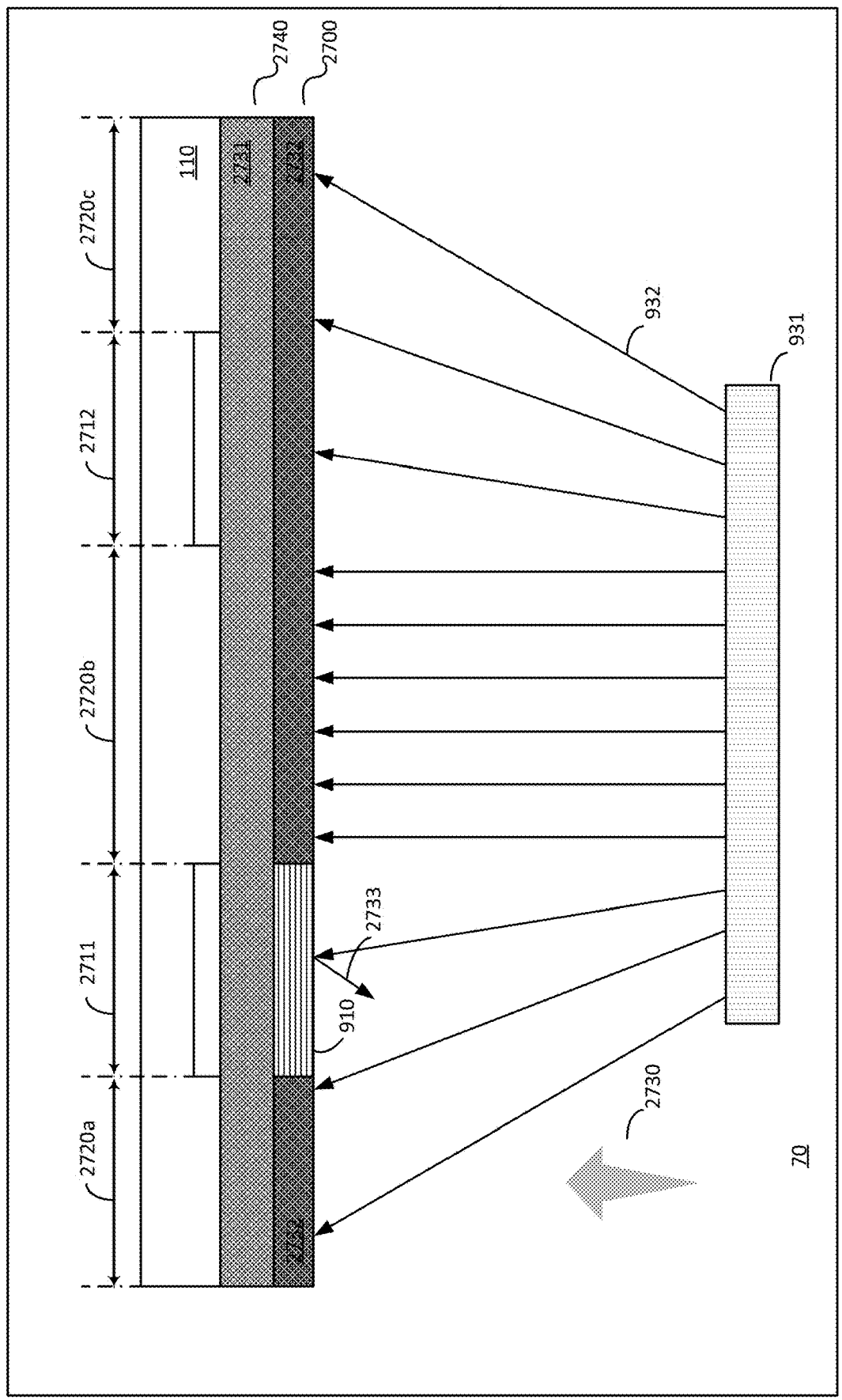

FIG. 27D shows a stage 2740 of manufacturing the device 2700. In the stage 2740, a second conductive coating 2732 may be deposited across those portions of the device 2700 that is substantially devoid of the NIC 910. In some non-limiting examples, the second conductive coating 2732 may be deposited across the second emissive region 2712 and/or, in some non-limiting examples, at least one of the non-emissive regions 2720a-2720c.

Those having ordinary skill in the relevant art will appreciate that the evaporative process shown in FIG. 27D and described in detail in connection with any one or more of FIGS. 7, 9, 10A-10B and/or 11A-11C may, although not shown, for simplicity of illustration, equally be applied in any one or more of the preceding stages described in FIGS. 27A-27C.

Those having ordinary skill in the relevant art will appreciate that the manufacture of the device 2700 may in some non-limiting examples, encompass additional stages that are not shown for simplicity of illustration. Such additional stages may include, without limitation, depositing one or more NICs 910, depositing one or more NPCs 1020, depositing one or more additional conductive coatings 930, depositing an outcoupling coating and/or encapsulation of the device 2700.

Those having ordinary skill in the relevant art will appreciate that while the manufacture of the device 2700 has been described and illustrated in connection with a first emissive region 2711 and a second emissive region 2712, in some non-limiting examples, the principles derived therefrom may equally be applied to the manufacture of devices having more than two emissive regions.

In some non-limiting examples, such principles may be applied to deposit conductive coating(s) of varying thickness for emissive region(s) corresponding to sub-pixel(s) 2541-2543, in some non-limiting examples, in an OLED display device, having different emission spectra. In some non-limiting examples, the first emissive region 2711 may correspond to a sub-pixel 2541-2543 configured to emit light of a first wavelength and/or emission spectrum and/or in some non-limiting examples, the second emissive region 2712 may correspond to a sub-pixel 2541-2543 configured to emit light of a second wavelength and/or emission spectrum. In some non-limiting examples, the device 2700 may comprise a third emissive region 2813 (FIG. 28A) that may correspond to a sub-pixel 2541-2543 configured to emit light of a third wavelength and/or emission spectrum.

In some non-limiting examples, the first wavelength may be less than, greater than, and/or equal to at least one of the second wavelength and/or the third wavelength. In some non-limiting examples, the second wavelength may be less than, greater than, and/or equal to at least one of the first wavelength and/or the third wavelength. In some non-limiting examples, the third wavelength may be less than, greater than, and/or equal to at least one of the first wavelength and/or the second wavelength.

In some non-limiting examples, the device 2700 may also comprise at least one additional emissive region (not shown) that may in some non-limiting examples be configured to emit light having a wavelength and/or emission spectrum that is substantially identical to at least one of the first emissive region 2711, the second emissive region 2712 and/or the third emissive region 2813.

In some non-limiting examples the NIC 910 may be selectively deposited using a shadow mask that may also have been used to deposit the at least one organic layer 130 of the first emissive region 2711. In some non-limiting examples, such shared use of a shadow mask may allow the optical microcavity effect(s) to be tuned for each sub-pixel 2541-2542 in a cost-effective manner.

The use of such mechanism to create a device 2800 having sub-pixel(s) 2541-2543 of a given pixel 340 with modulated micro-cavity effects is described in FIGS. 28A-28D.

Figure 28A:
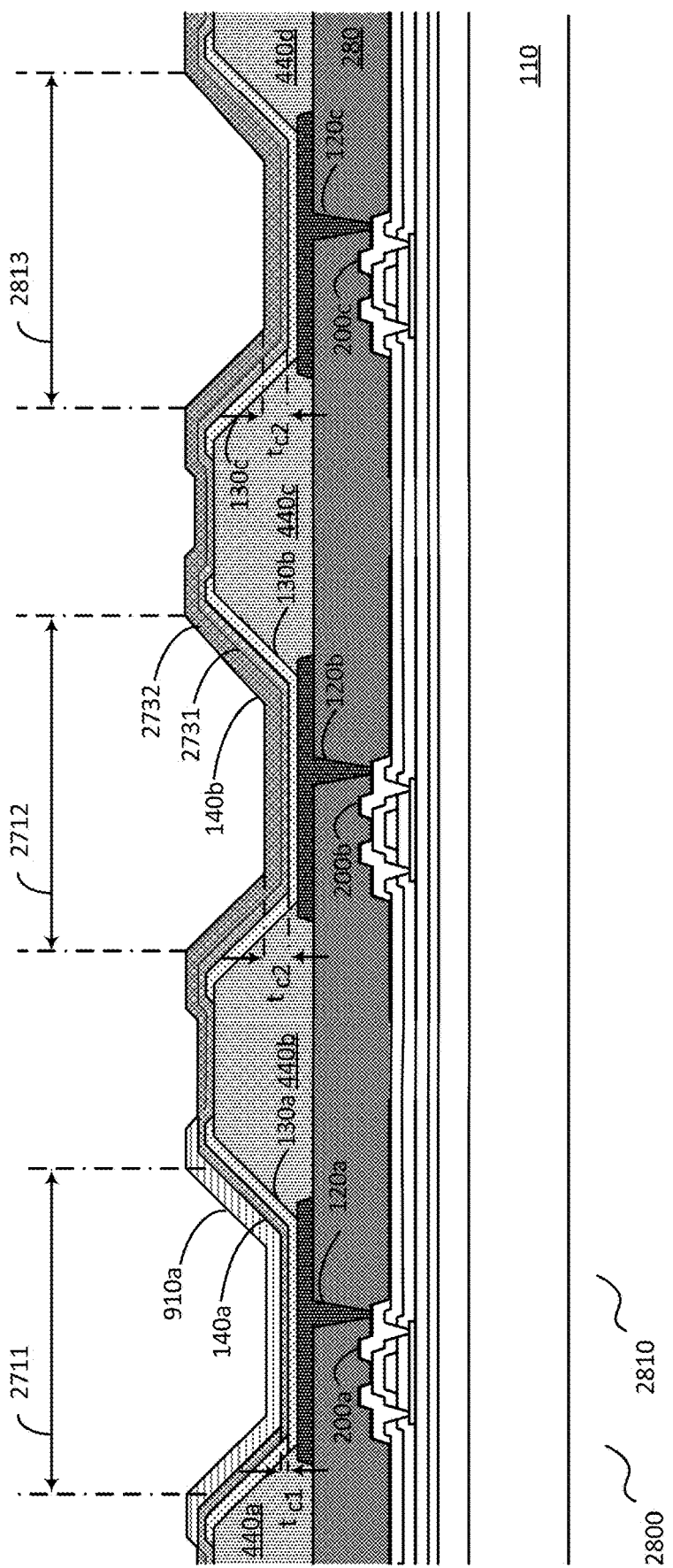
FIGS. 28A-28D are schematic diagrams that show example stages of an example process for manufacturing a device having sub-pixel regions having a second electrode of different thickness according to an example in the present disclosure.

In FIG. 28A, a stage 2810 of manufacture of the device 2800 is shown as comprising a substrate 110, a TFT insulating layer 280 and a plurality of first electrodes 120a-120c, any of which in some non-limiting examples may be an anode 341, formed on a surface of the TFT insulating layer 280.

The substrate 110 may comprise the base substrate 112 (not shown for purposes of simplicity of illustration) and/or at least one driving circuit 300 (not shown for purposes of simplicity of illustration), comprising at least one TFT structure 200a-200c corresponding to an emissive region 2711-2713 each having a corresponding sub-pixel 2541-2543, and positioned substantially thereunder and electrically coupled to its associated first electrode 120a-120c. PDL(s) 440a-440d are formed over the substrate 110, to define emissive region(s) 2711-2713. The PDL(s) 440a-440d cover edges of their respective first electrodes 120a-120c In some non-limiting examples, at least one organic layer 130a-130c is deposited over exposed region(s) of their respective first electrodes 120a-120c and portions of the surrounding PDLs 440a-440d. In some non-limiting examples, the organic layer(s) 130a-130c may comprise a plurality of organic and/or inorganic semiconducting layers, including without limitation, an HTL 131, an HIL 133, an EL 135, an EIL 137 and/or an ETL 139.

In some non-limiting examples, a first conductive coating 2731 may be deposited over the organic layer(s) 130a-130c. In some non-limiting examples, the first conductive coating 2731 may be deposited using an open mask and/or mask-free deposition process. In some non-limiting examples, such deposition may be effected by exposing the entire exposed surface 111 of the device 2800 to a vapour flux of the first conductive coating 2731, which in some non-limiting examples may be Mg, to deposit the first conductive coating 2731 over the organic layer(s) 130a-130c to form a first layer of the second electrode 140a (not shown), which in some non-limiting examples may be a cathode 342 and/or in some non-limiting examples, a common electrode, at least for the first emissive region 2711. Such common electrode has a first thickness $t_{c1}$ in the first emissive region 2711. The first thickness $t_{c1}$ may correspond to a thickness of the first conductive coating 2731.

In some non-limiting examples, a first NIC 910a is selectively deposited over portions of the device 2810, comprising the first emissive region 2711.

In some non-limiting examples, a second conductive coating 2732 may be deposited over the device 2800. In some non-limiting examples, the second conductive coating 2732 may be deposited using an open mask and/or mask-free deposition process. In some non-limiting examples, such deposition may be effected by exposing the entire exposed surface 111 of the device 2810 to a vapour flux of the second conductive coating 2732, which in some non-limiting examples may be Mg, to deposit the second conductive coating 2732 over the first conductive coating 2731 that is substantially devoid of the first NIC 910a, in some examples, the second and third emissive regions 2712, 2713 and/or at least portion(s) of the non-emissive regions in which the PDLs 440a-440d lie, such that the second conductive coating 2732 is deposited on the portion(s) of the first conductive coating 2731 that are substantially devoid of the first NIC 910a to form a second layer of the second electrode 140b (not shown), which in some non-limiting examples, may be a cathode 342 and/or in some non-limiting examples, a common electrode, at least for the second emissive region 2712. Such common electrode has a second thickness $t_{c2}$ in the second emissive region 2712. The second thickness $t_{c2}$ may correspond to a combined thickness of the first conductive coating 2731 and of the second conductive coating 2732 and may in some non-limiting examples be greater than the first thickness $t_{c1}$.

Figure 28B:
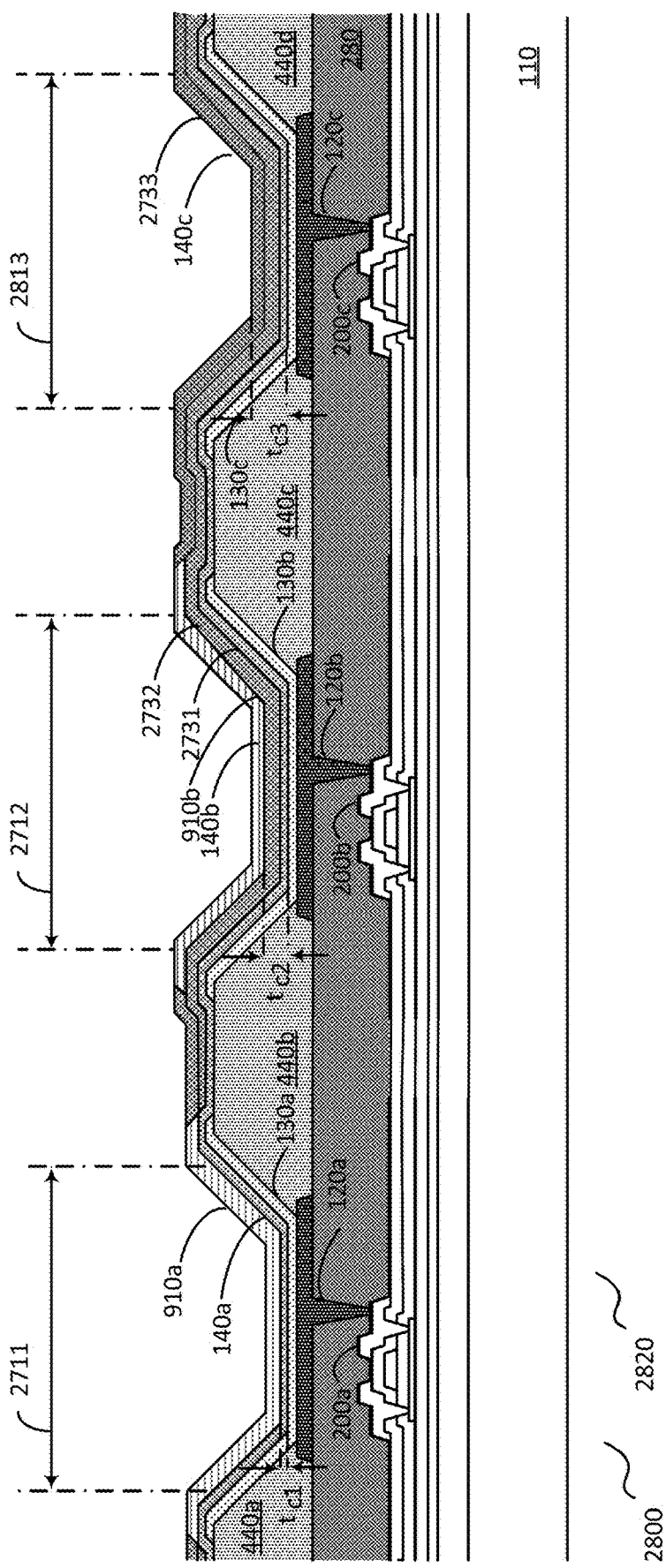

In FIG. 28B, a stage 2820 of manufacture of the device 2800 is shown.

In some non-limiting examples, a second NIC 910b is selectively deposited over portions of the device 2800, comprising the second emissive region 2712.

In some non-limiting examples, a third conductive coating 2733 may be deposited over the device 2800. In some non-limiting examples, the third conductive coating 2733 may be deposited using an open mask and/or mask-free deposition process. In some non-limiting examples, such deposition may be effected by exposing the entire exposed surface 111 of the device 2800 to a vapour flux of the third conductive coating 2733, which in some non-limiting examples may be Mg, to deposit the third conductive coating 2733 over the second conductive coating 2731 that is substantially devoid of either the first NIC 910a or the second NIC 910b, in some examples, the third emissive region 2713 and/or at least portion(s) of the non-emissive regions in which the PDLs 440a-440d lie, such that the third conductive coating 2733 is deposited on the portion(s) of the second conductive coating 2732 that are substantially devoid of the second NIC 910b to form a third layer of the second electrode 140c (not shown), which in some non-limiting examples, may be a cathode 342 and/or in some non-limiting examples, a common electrode, at least for the third emissive region 2713. Such common electrode has a third thickness $t_{c3}$ in the third emissive region 2713. The third thickness $t_{c3}$ may correspond to a combined thickness of the first conductive coating 2731, the second conductive coating 2732 and the third conductive coating 2733 and may in some non-limiting examples be greater than either or both of the first thickness $t_{c1}$ and the second thickness $t_{c2}$.

Figure 28C:
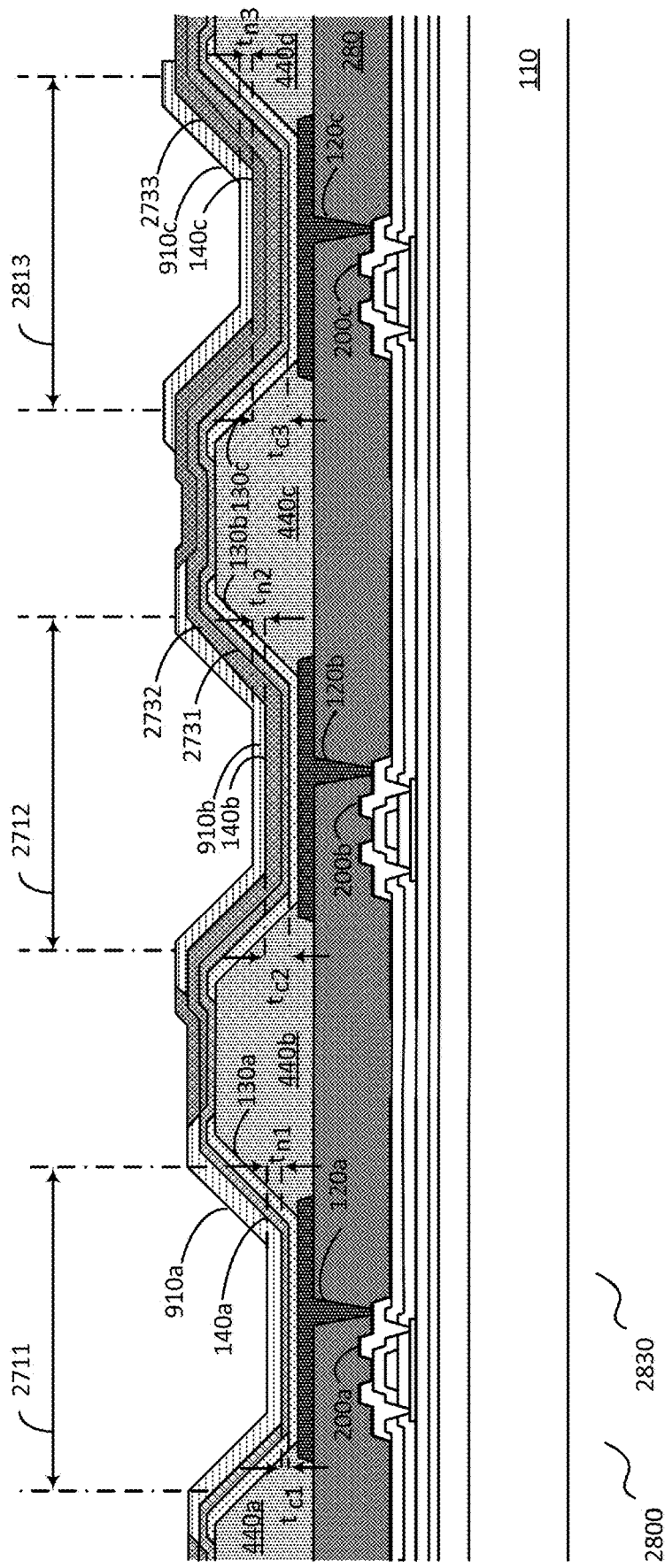

In FIG. 28C, a stage 2830 of manufacture of the device 2800 is shown.

In some non-limiting examples, a third NIC 910c is selectively deposited over portions of the device 2800, comprising the third emissive region 2712.

Figure 28D:
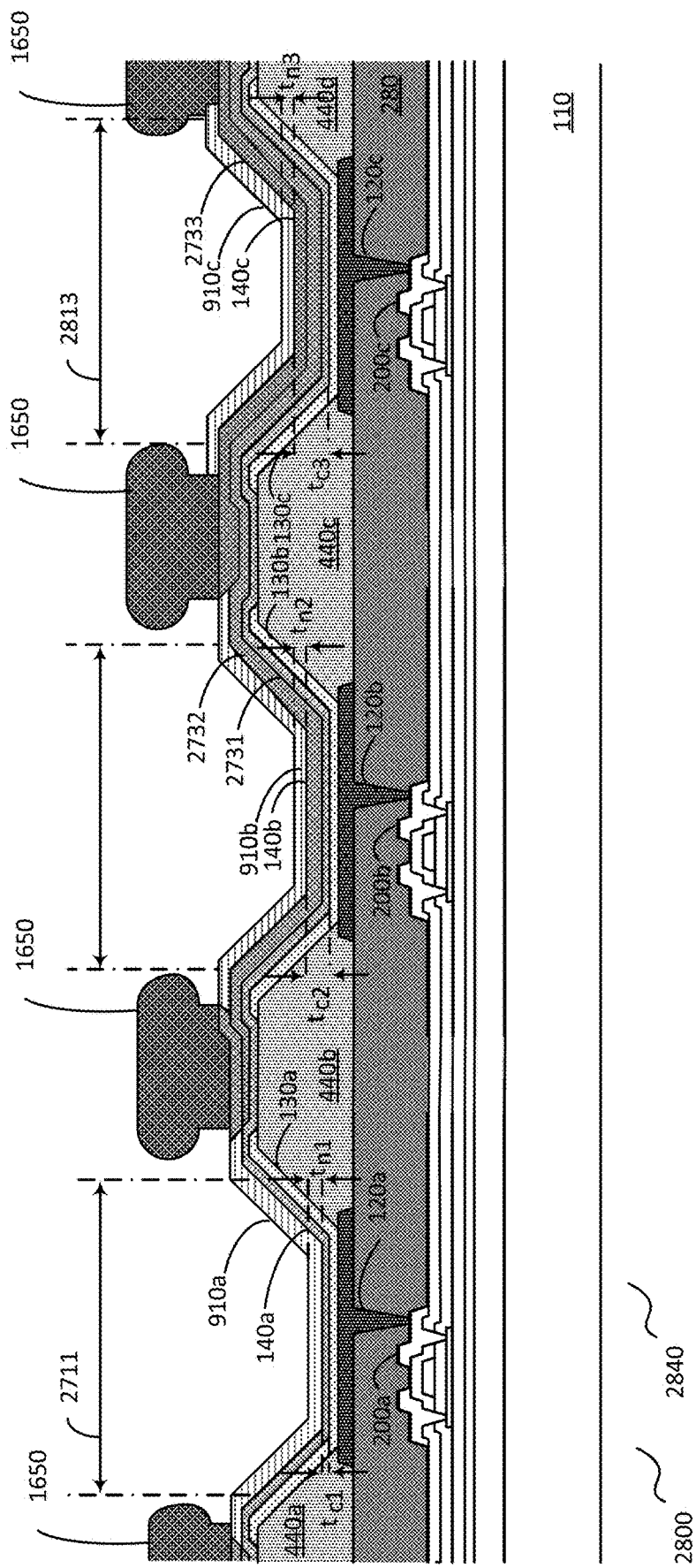

In FIG. 28D, a stage 2840 of manufacture of the device 2800 is shown.

In some non-limiting examples, at least one auxiliary electrode 1650 is disposed in the non-emissive regions of the device 2800 between neighbouring emissive regions 2711-2713 thereof and in some non-limiting examples, over the PDLs 440a-440d. In some non-limiting examples, the conductive coating 930 used to deposit the at least one auxiliary electrode 1650 may be deposited using an open mask and/or mask-free deposition process. In some non-limiting examples, such deposition may be effected by exposing the entire exposed surface 111 of the device 2800 to a vapour flux of the conductive coating 930, which in some non-limiting examples may be Mg, to deposit the conductive coating 930 over the exposed portions of the first conductive coating 2731, the second conductive coating 2732 and the third conductive coating 2733 that is substantially devoid of any of the first NIC 910a the second NIC 910b and/or the third NIC, such that the conductive coating 930 is deposited on the exposed portion(s) of the first conductive coating 2731, the second conductive coating 2732 and/or the third conductive coating 2733 that are substantially devoid of any of the first NIC 910a, the second NIC 910b and/or the third NIC 910c to form the at least one auxiliary electrode 1650. Each of the at least one auxiliary electrode 1650 is electrically coupled to a respective one of the second electrodes 140a-140c. In some non-limiting examples, each of the at least one auxiliary electrode 1650 is in physical contact with such second electrode 140a-140c.

In some non-limiting examples, the first emissive region 2711, the second emissive region 2712 and the third emissive region 2713 may be substantially devoid of the material used to form the at least one auxiliary electrode 1650.

In some non-limiting examples, at least one of the first conductive coating 2731, the second conductive coating 2732 and/or the third conductive coating 2733 may be light transmissive and/or substantially transparent in at least a portion of the visible wavelength range of the electromagnetic spectrum. Thus, if the second conductive coating 2732 and/or the third conductive coating 2731 (and/or any additional conductive coating(s)) is disposed on top of the first conductive coating 2731 to form a multi-coating electrode 120, 140, 1650, such electrode 120, 140, 1650 may also be light transmissive and/or substantially transparent in at least a portion of the visible wavelength range of the electromagnetic spectrum. In some non-limiting examples, the light transmittance of any one or more of the first conductive coating 2731, the second conductive coating 2732, the third conductive coating, any additional conductive coating(s), and/or the multi-coating electrode 120, 140, 1650 may be greater than about 30%, greater than about 40% greater than about 45%, greater than about 50%, greater than about 60%, greater than about 70%, greater than about 75%, and/or greater than about 80% in at least a portion of the visible wavelength range of the electromagnetic spectrum.

In some non-limiting examples, a thickness of the first conductive coating 2731, the second conductive coating 2732 and/or the third conductive coating 2733 may be made relatively thin to maintain a relatively high light transmittance. In some non-limiting examples, the thickness of the first conductive coating 2731 may be about 5 to 30 nm, about 8 to 25 nm, and/or about 10 to 20 nm. In some non-limiting examples, the thickness of the second conductive coating 2732 may be about 1 to 25 nm, about 1 to 20 nm, about 1 to 15 nm, about 1 to 10 nm, and/or about 3 to 6 nm. In some non-limiting examples, the thickness of the third conductive coating 2733 may be about 1 to 25 nm, about 1 to 20 nm, about 1 to 15 nm, about 1 to 10 nm, and/or about 3 to 6 nm. In some non-limiting examples, the thickness of a multi-coating electrode formed by a combination of the first conductive coating 2731, the second conductive coating 2732, the third conductive coating 2733 and/or any additional conductive coating(s) may be about 6 to 35 nm, about 10 to 30 nm, about 10 to 25 nm and/or about 12 to 18 nm.

In some non-limiting examples, a thickness of the at least one auxiliary electrode 1650 may be greater than the thickness of the first conductive coating 2731, the second conductive coating 2732, the third conductive coating 2733 and/or a common electrode. In some non-limiting examples, the thickness of the at least one auxiliary electrode 1650 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 μm, greater than about 1.2 μm, greater than about 1.5 μm, greater than about 2 μm, greater than about 2.5 μm, and/or greater than about 3 μm.

In some non-limiting examples, the at least one auxiliary electrode 1650 may be substantially non-transparent and/or opaque. However, since the at least one auxiliary electrode 1650 may be in some non-limiting examples provided in a non-emissive region of the device 2800, the at least one auxiliary electrode 1650 may not cause or contribute to significant optical interference. In some non-limiting examples, the light transmittance of the at least one auxiliary electrode 1650 may be less than about 50%, less than about 70%, less than about 80%, less than about 85%, less than about 90%, and/or less than about 95% in at least a portion of the visible wavelength range of the electromagnetic spectrum.

In some non-limiting examples, the at least one auxiliary electrode 1375 may absorb light in at least a portion of the visible wavelength range of the electromagnetic spectrum.

In some non-limiting examples, a thickness of the first NIC 910a, the second NIC 910b, and/or the third NIC 910c disposed in the first emissive region 2711, the second emissive region 2712 and/or the third emissive region 2713 respectively, may be varied according to a colour and/or emission spectrum of light emitted by each emissive region 2711-2713. As shown in FIGS. 28C-28D, the first NIC 910a may have a first NIC thickness $t_{n1}$, the second NIC 910b may have a second NIC thickness $t_{n2}$ and/or the third NIC 910c may have a third NIC thickness $t_{n3}$. In some non-limiting examples, the first NIC thickness $t_{n1}$, the second NIC thickness $t_{n2}$ and/or the third NIC thickness $t_{n3}$ may be substantially the same as one another. In some non-limiting examples, the first NIC thickness $t_{n1}$, the second NIC thickness $t_{n2}$ and/or the third NIC thickness $t_{n3}$ may be different from one another.

In some non-limiting examples, the device 2800 may also comprise any number of emissive regions, 2711-2713, pixels 340 and/or sub-pixel(s) 2541-2543 thereof. In some non-limiting examples, a device may comprise a plurality of pixels 340, wherein each pixel 340 comprises 2, 3 or more sub-pixel(s) 2541-2543.

Those having ordinary skill in the relevant art will appreciate that the specific arrangement of pixels 340 (and/or sub-pixel(s) 2541-2543 thereof) may be varied depending on the device design. In some non-limiting examples, the sub-pixel(s) 2541-2543 may be arranged according to known arrangement schemes, including without limitation, RGB side-by-side, diamond and/or PenTile®.

Figure 29:
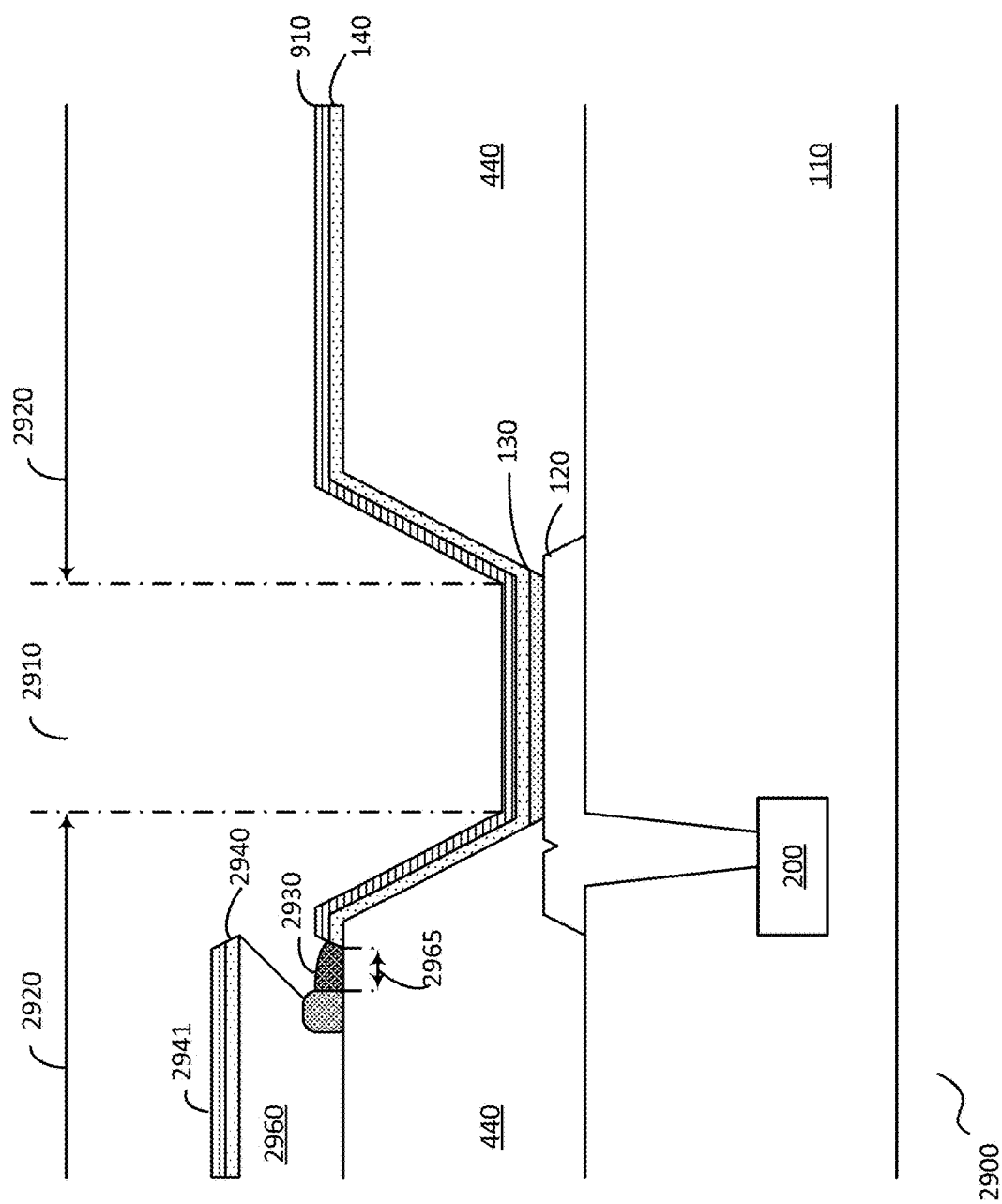
FIG. 29 is a schematic diagram illustrating an example cross-sectional view of a device in which a second electrode is coupled to an auxiliary electrode according to an example in the present disclosure.

Conductive Coating for Electrically Coupling an Electrode to an Auxiliary Electrode Turning to FIG. 29, there is shown a cross-sectional view of an example opto-electronic device 2900. The device 2900 comprises in a lateral aspect, an emissive region 2910 and an adjacent non-emissive region 2920.

In some non-limiting examples, the emissive region 2910 corresponds to a sub-pixel 2541-2543 of the device 2900. The emissive region 2910 has a substrate 110, a first electrode 120, which in some non-limiting examples may be an anode 341, a second electrode 140 which in some non-limiting examples may be a cathode 342 and at least one semiconducting or organic layer 130 arranged therebetween.

The first electrode 120 is disposed on a surface of the substrate 110. The substrate 110 comprises a TFT structure 200, that is electrically coupled to the first electrode 120. The edges and/or perimeter of the first electrode 120 is generally covered by at least one PDL 440.

The non-emissive region 2920 has an auxiliary electrode 2960 and a first part of the non-emissive region 2920 has a patterning structure 2960 arranged to project over and overlap a lateral aspect of the auxiliary electrode 2950. The patterning structure 2960 extends laterally to provide a shadowed region 2965. By way of non-limiting example, the patterning structure 2960 may be recessed at and/or near the auxiliary electrode 2950 on at least one side to provide the shadowed region 2965. As shown, the shadowed region 2965 may in some non-limiting examples, correspond to a region on a surface of the PDL 440 that overlaps with a lateral projection of the patterning structure 2960. The non-emissive region 2920 further comprises a conductive coating 2930 disposed in the shadowed region 2965. The conductive coating 2930 electrically couples the auxiliary electrode 2950 with the second electrode 140.

An NIC 910 is disposed in the emissive region 2910 over the surface of the second electrode 140. In some non-limiting examples, a surface of the patterning structure 2960 is coated with a residual conductive coating 2940 from deposition of a conductive coating 930 to form the second electrode 140. In some non-limiting examples, a surface of the residual conductive coating 2940 is coated with a residual NIC 2941 from deposition of the NIC 910.

However, because of the lateral projection of the patterning structure 2960 over the shadowed region 2965, the shadowed region 2965 is substantially devoid of NIC 910. Thus, when a conductive coating 2930 is deposited on the device 2900 after deposition of the NIC 910, the conductive coating 2930 is deposited on and/or migrates to the shadowed region to couple the auxiliary electrode 2950 to the second electrode 140.

Those having ordinary skill in the relevant art will appreciate that a non-limiting example has been shown in FIG. 29 and that various modifications may be apparent. By way of non-limiting example, the patterning structure 2960 may provide a shadowed region 2965 along at least two of its sides. In some non-limiting examples, the patterning structure 2960 may be omitted and the auxiliary electrode 2950 may include a recessed portion that defines the shadowed region 2965. In some non-limiting examples, the auxiliary electrode 2950 and the conductive coating 2930 may be disposed directly on a surface of the substrate 110, instead of the PDL 440.

Selective Deposition of Optical Coating

In some non-limiting examples, a device (not shown), which in some non-limiting examples may be an opto-electronic device comprises a substrate 110, an NIC 910 and an optical coating. The NIC 910 covers a first lateral portion of the substrate 110. The optical coating covers a second lateral portion of the substrate. At least a portion of the NIC 910 is substantially devoid of the optical coating.

In some non-limiting examples, the optical coating may be used to modulate optical properties of light being transmitted, emitted and/or absorbed by the device, including without limitation, plasmon modes. By way of non-limiting example, the optical coating may be used as an optical filter, index-matching coating, optical out-coupling coating, scattering layer, diffraction grating, and/or portions thereof.

In some non-limiting examples, the optical coating may be used to modulate at least one optical microcavity effect in the device by, without limitation, tuning the total optical path length and/or the refractive index thereof. At least one optical property of the device may be affected by modulating at least one optical microcavity effect including without limitation, the output light, including without limitation, an angular dependence of a brightness and/or a color shift thereof. In some non-limiting examples, the optical coating may be a non-electrical component, that is, the optical coating may not be configured to conduct and/or transmit electrical current during normal device operations.

In some non-limiting examples, the optical coating may be formed of any material used as a conductive coating 930 and/or employing any mechanism of depositing a conductive coating 930 as described herein.

Edge Effects of NICs and Conductive Coatings

Figure 30A:
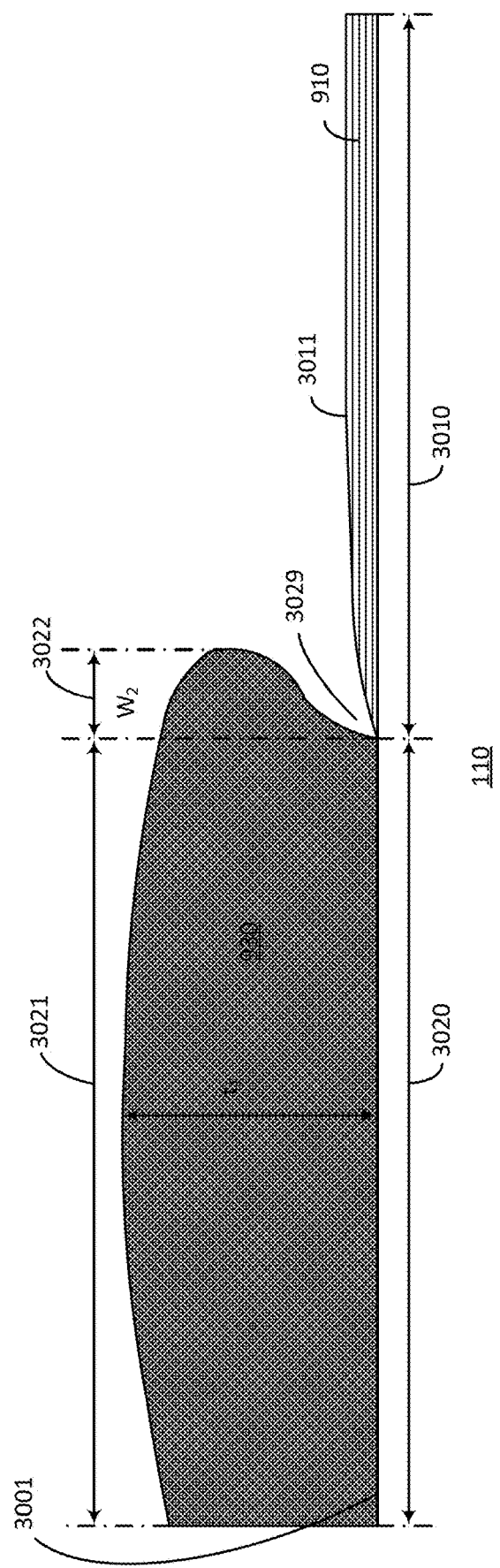

FIGS. 30A-1 describe various potential behaviours of NICs 910 at a deposition interface with conductive coatings 930.

Turning to FIG. 30A, there is shown a first example of a portion of a device 3000 at an NIC deposition boundary. The device 3000 comprises a substrate 110 having a surface 3001. An NIC 910 is deposited over a first region 3010 of the surface 3001. A conductive coating 930 is deposited over a second region 3020 of the surface 3001. As shown, by way of non-limiting example, the first region 3010 and the second region 3020 are distinct and non-overlapping regions of the surface 3001.

The conductive coating 930 comprises a first part 3021 and a remaining part 3022. As shown, by way of non-limiting example, the first part 3021 of the conductive coating 930 substantially covers the second region 3020 and the second part 3022 of the conductive coating 930 partially projects over and/or overlaps a first part of the NIC 910.

In some non-limiting examples, the NIC 910 is formed such that its surface 3011 exhibits a relatively low affinity or initial sticking probability $S_0$ against a material used to form the conductive coating 930, there is a gap 3024 formed between the projecting and/or overlapping second part 3022 of the conductive coating 930 and the surface 3011 of the NIC 910. As a result, the second part 3022 is not in direct physical contact with the NIC but is spaced-apart therefrom by a gap 3029 in a cross-sectional aspect. In some non-limiting examples, the first part 3021 of the conductive coating 930 may be in direct physical contact with the NIC at an interface and/or boundary between the first region 3010 and the second region 3020.

In some non-limiting examples, the projecting and/or overlapping second part 3022 of the conductive coating 930 may extend laterally over the NIC 910 by a comparable extent as a thickness $t_1$ of the conductive coating 930. By way of non-limiting example, as shown, a width $w_2$ of the second part 3022 may be comparable to the thickness $t_1$. In some non-limiting examples, a ratio of $w_2:t_1$ may be in a range of about 1:1 to about 1:3, about 1:1 to about 1:1.5, and/or about 1:1 to about 1:2. While the thickness $t_1$ may in some non-limiting examples be relatively uniform across the conductive coating 930, in some non-limiting examples, the extent to which the second part 3022 projects and/or overlaps with the NIC 910 (namely $w_2$) may vary to some extent across different portions of the surface 3001.

Figure 30B:
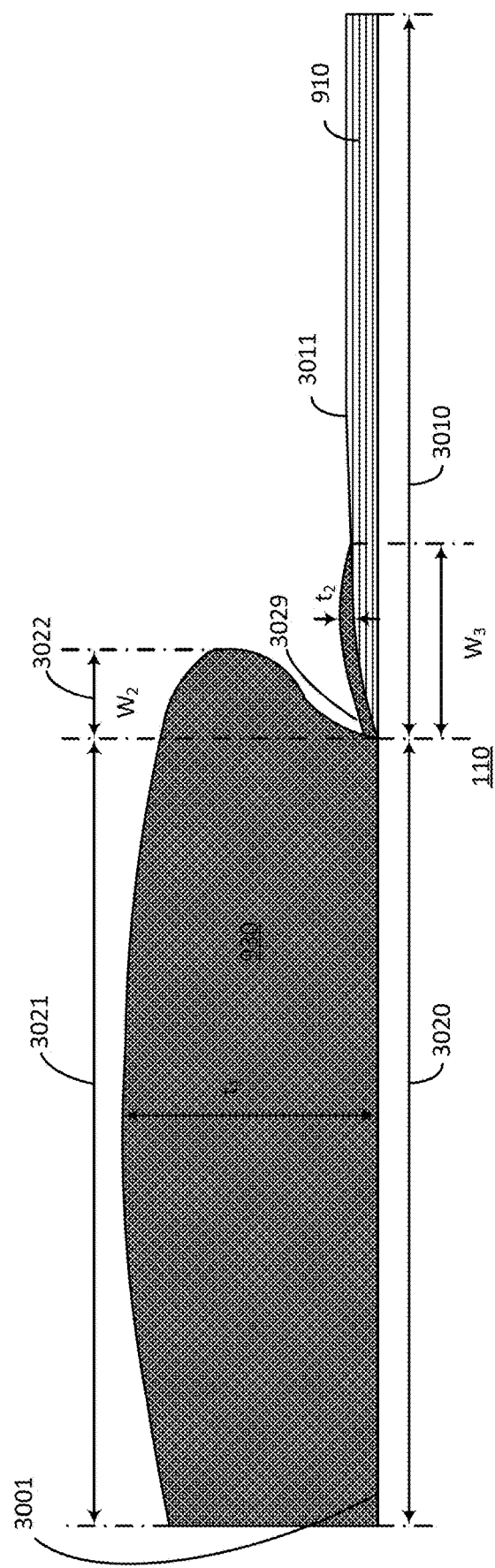

Turning now to FIG. 30B, the conductive coating 930 is shown to include a third portion 3023 disposed between the second part 3022 and the NIC 910. As shown, the second part 3022 of the conductive coating 930 extends laterally over and is spaced apart from the third portion 3023 of the conductive coating 930 and the third portion 3023 may be in direct physical contact with the surface 3011 of the NIC 910. A thickness $t_3$ of the third portion 3023 of the conductive coating 930 may be less and in some non-limiting examples, substantially less than the thickness $t_1$ of the first part 3021 thereof. In some non-limiting examples, a width $w_3$ of the third portion 3023 may be greater than the width $w_2$ of the second part 3022. In some non-limiting examples, the third portion 3023 may extend laterally to overlap the NIC 910 to a greater extent than the second part 3022. In some non-limiting examples, a ratio of $w_3:t_1$ may be in a range of about 1:2 to about 3:1 and/or about 1:1.2 to about 2.5:1. While the thickness $t_1$ may in some non-limiting examples be relatively uniform across the conductive coating 930, in some non-limiting examples, the extent to which the third portion 3023 projects and/or overlaps with the NIC 910 (namely $w_3$) may vary to some extent across different portions of the surface 3001.

The thickness $t_3$ of the third portion 3023 may be no greater than and/or less than about 5% of the thickness $t_1$ of the first part 3021. By way of non-limiting example, $t_3$ may be no greater than and/or less than about 4%, no greater than and/or less than about 3%, no greater than and/or less than about 2%, no greater than and/or less than about 1%, and/or no greater than and/or less than about 0.5% of $t_1$. Instead of, and/or in addition to, the third portion 3023 being formed as a thin film, as shown, the material of the conductive coating 930 may form as islands and/or disconnected clusters on a portion of the NIC 910. By way of non-limiting example, such islands and/or disconnected clusters may comprise features that are physically separated from one another, such that the islands and/or clusters do not form a continuous layer.

Figure 30C:
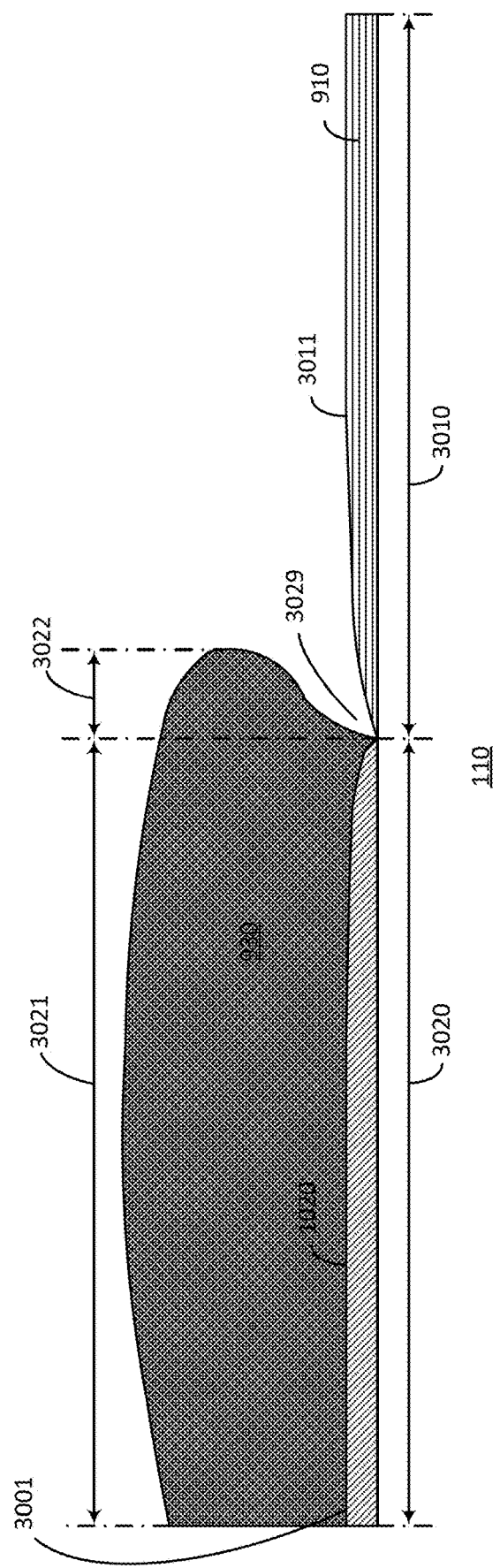

Turning now to FIG. 30C, an NPC 1020 is disposed between the substrate 110 and the conductive coating 930. The NPC 1010 is disposed between the first part 3021 of the conductive coating 930 and the second region 3020 of the substrate 110. The NPC 1020 is illustrated as being disposed on the second region 3020 and not on the first region 3010, where the NIC 910 has been deposited. The NPC 1020 may be formed such that, at an interface and/or boundary between the NPC 1020 and the conductive coating 930, a surface of the NPC 1020 exhibits a relatively high affinity or initial sticking probability $S_0$ for the material of the conductive coating 930. As such, the presence of the NPC 1020 may promote the formation and/or growth of the conductive coating 930 during deposition.

Figure 30D:
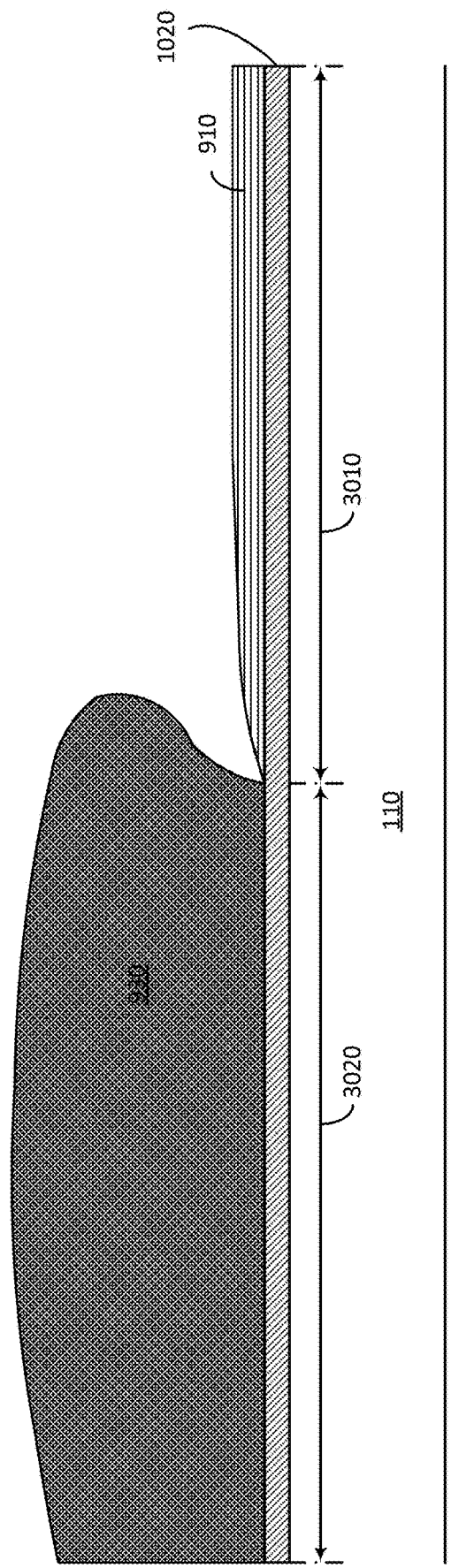

Turning now to FIG. 30D, the NPC 1020 is disposed on both the first region 3010 and the second region 3020 of the substrate 110 and the NIC 910 covers a portion of the NPC 1020 disposed on the first region 3010. Another portion of the NPC 1020 is substantially devoid of the NIC 910 and the conductive coating 930 covers such portion of the NPC 1020.

Figure 30E:
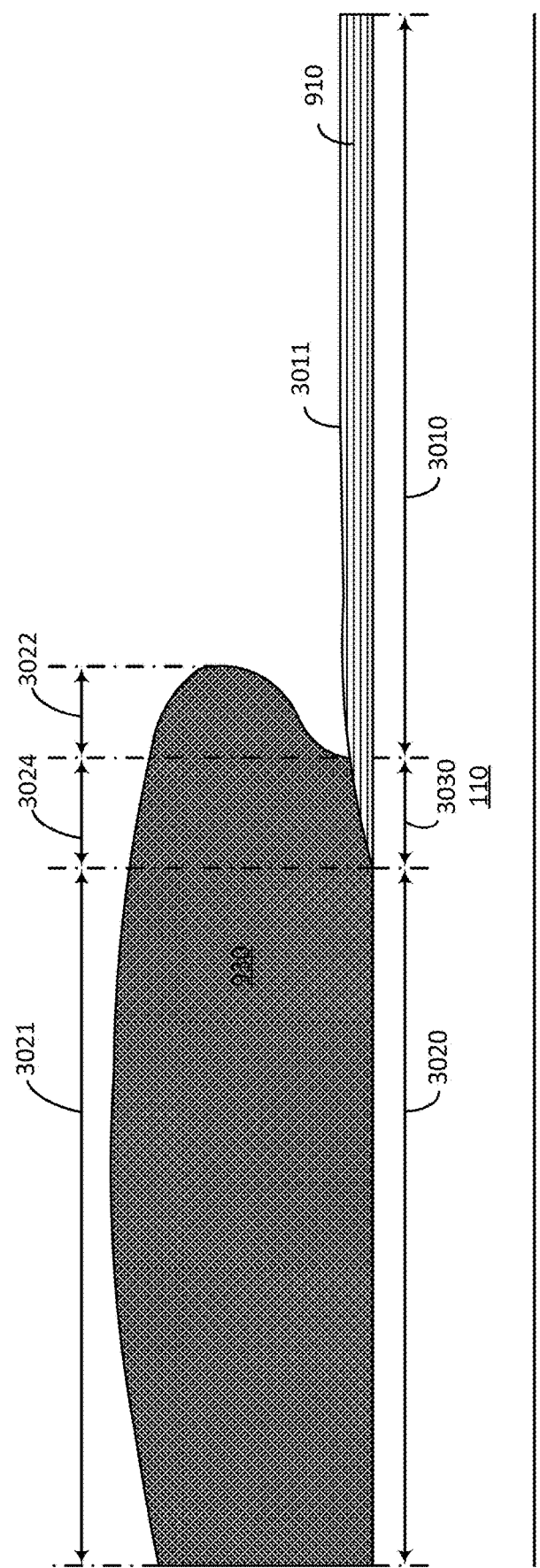

Turning now to FIG. 30E, the conductive coating 930 is shown to partially overlap a portion of the NIC 910 in a third region 3030 of the substrate 110. In some non-limiting examples, in addition to the first part 3021 and the second part 3022, the conductive coating 930 further includes a fourth portion 3024. As shown, the fourth portion 3024 of the conductive coating 930 is disposed between the first part 3021 and the second part 3022 of the conductive coating 930 and the fourth portion 3024 may be in direct physical contact with the surface 3011 of the NIC 910. In some non-limiting examples, the overlap in the third region 3030 may be formed as a result of lateral growth of the conductive coating 930 during an open mask and/or mask-free deposition process. In some non-limiting examples, while the surface 3011 of the NIC 910 may exhibit a relatively low initial sticking probability $S_0$ for the material of the conductive coating 930, and thus the probability of the material nucleating the surface 3011 is low, as the conductive coating 930 grows in thickness, the conductive coating 930 may also grow laterally and may cover apportion of the NIC 910 as shown.

Turning now to FIG. 30F, the first region 3010 of the substrate 110 is coated with the NIC 910 and the second region 3020 adjacent thereto is coated with the conductive coating 930. In some non-limiting examples, it has been observed that conducting an open mask and/or mask-free deposition of the conductive coating 930 may result in the conductive coating 930 exhibiting a tapered cross-sectional profile at and/or near an interface between the conductive coating 930 and the NIC 910.

In some non-limiting examples, a thickness of the conductive coating 930 at and/or near the interface may be less than an average thickness of the conductive coating 930. While such tapered profile is shown as being curved and/or arched, in some non-limiting examples, the profile may, in some non-limiting examples be substantially linear and/or non-linear. By way of non-limiting example, the thickness of the conductive coating 930 may decrease, without limitation, in a substantially linear, exponential, quadratic fashion in a region proximal to the interface.

It has been observed that the contact angle $\theta_c$ of the conductive coating 930 at and/or near the interface between the conductive coating 930 and the NIC 910 may vary depending on properties of the NIC 910, such as a relative affinity and/or an initial sticking probability $S_0$. It is further postulated that the contact angle of the nuclei may in some non-limiting examples, dictate the thin film contact angle of the conductive coating 930 formed by deposition. Referring to FIG. 30F by way of non-limiting example, the contact angle $\theta_c$ may be determined by measuring a slope of a tangent of the conductive coating 930 at or near the interface between the conductive coating 930 and the NIC 910. In some non-limiting examples, where the cross-sectional taper profile of the conductive coating 930 is substantially linear, the contact angle $\theta_c$ may be determined by measuring the slope of the conductive coating 930 at and/or near the interface. As will be appreciated by those having ordinary skill in the relevant art, the contact angle $\theta_c$ may be generally measured relative to an angle of the underlying surface. In the present disclosure, for purposes of simplicity of illustration, the coatings are shown deposited on a planar surface. However, those having ordinary skill in the relevant art will appreciate that such coatings may be deposited on non-planar surfaces.

Figure 30G:
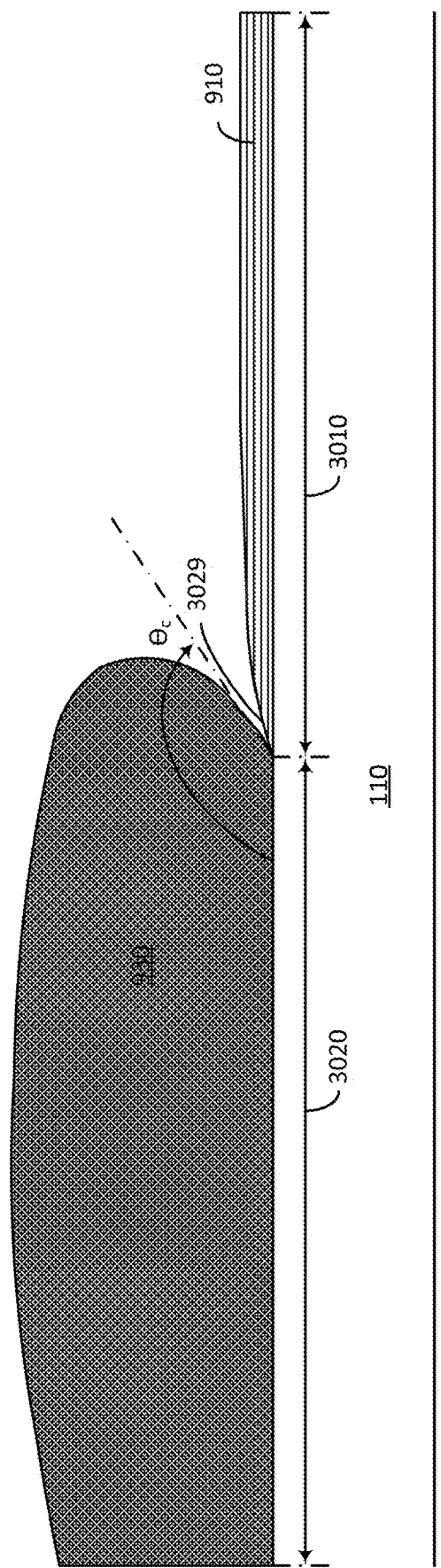

In some non-limiting examples, the contact angle of the conductive coating 930 may be greater than about 90°. Referring now to FIG. 30G, by way of non-limiting example, the conductive coating 930 is shown as including a portion extending past the interface between the NIC 910 and the conductive coating 930, and is spaced apart from the NIC by a gap 3028. In such non-limiting scenario, the contact angle $\theta_c$ may, in some non-limiting examples, be greater than about 90°.

In some non-limiting examples, it may be advantageous to form a conductive coating 930 exhibiting a relatively high contact angle $\theta_c$. By way of non-limiting example, the contact angle $\theta_c$ may be greater than about 10°, greater than about 15°, greater than about 20°, greater than about 25°, greater than about 30°, greater than about 35°, greater than about 40°, greater than about 50°, greater than about 70°, greater than about 70°, greater than about 75°, and/or greater than about 80°. By way of non-limiting example, a conductive coating 930 having a relatively high contact angle $\theta_c$ may allow for creation of finely patterned features while maintaining a relatively high aspect ratio. By way of non-limiting example, it may be desirable to form a conductive coating 930 exhibiting a contact angle $\theta_c$ greater than about 90°. By way of non-limiting example, the contact angle $\theta_c$ may be greater than about 90°, greater than about 95°, greater than about 100°, greater than about 105°, greater than about 110° greater than about 120°, greater than about 130°, greater than about 135°, greater than about 140°, greater than about 145°, greater than about 150° and/or greater than about 170°.

Figure 30H:
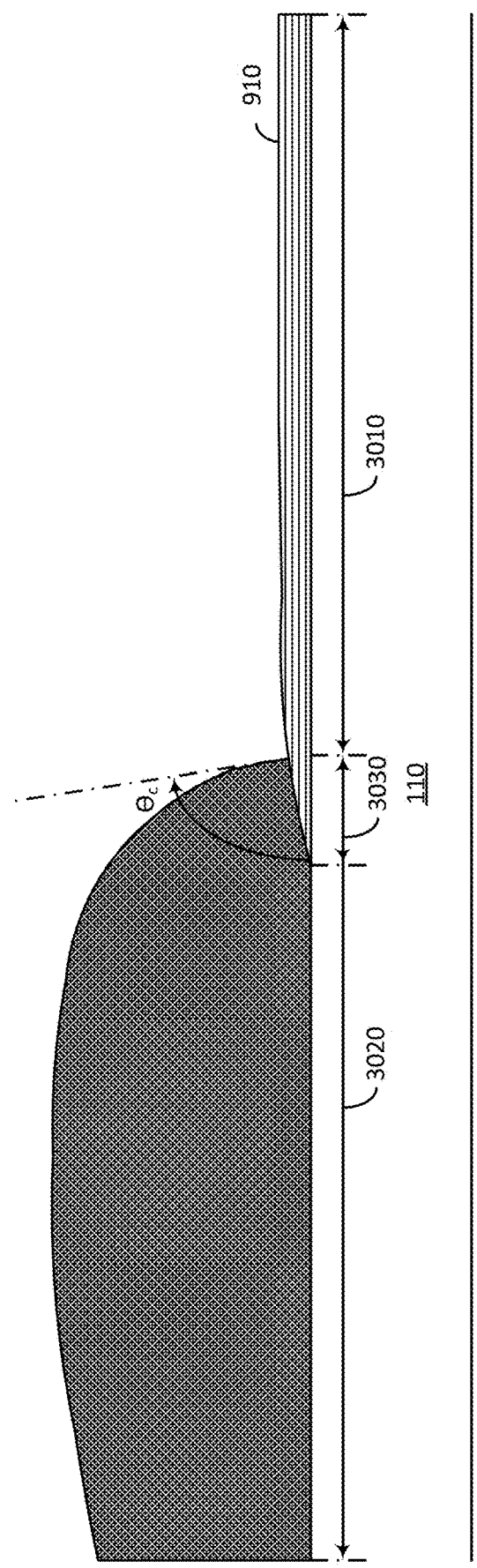
Figure 30I:
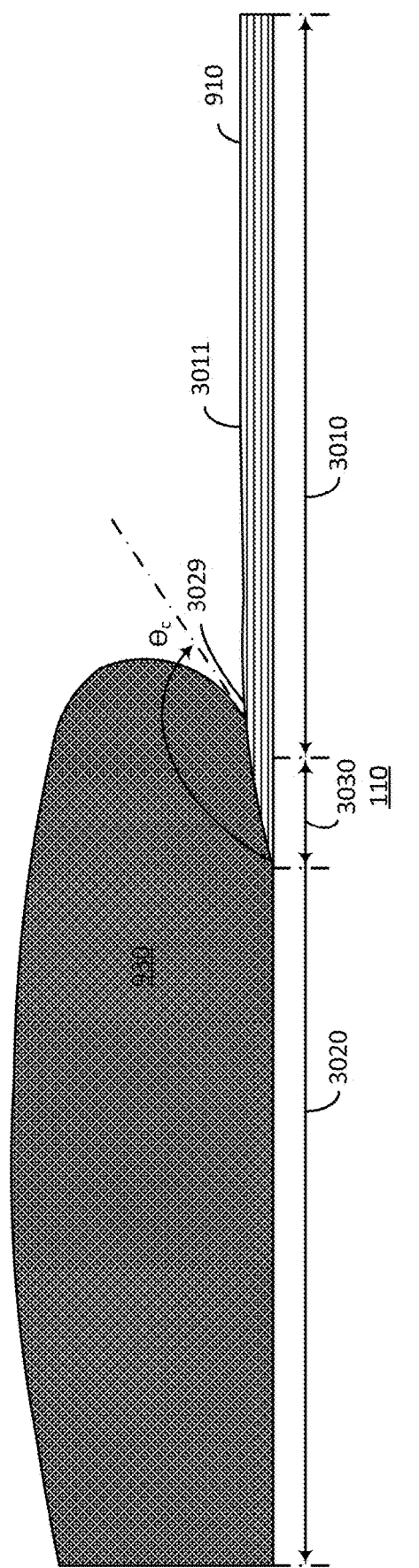

Turning now to FIGS. 30H-30I, the conductive coating 930 partially overlaps a portion of the NIC 910 in the third region 3033 of the substrate 100, which is disposed between the first region 3010 and the second region 3020 thereof. As shown, the portion of the conductive coating 930 partially overlapping a portion of the NIC 910 may be in direct physical contact with the surface 3011 thereof. In some non-limiting examples, the overlap in the third region 3030 may be formed as a result of lateral growth of the conductive coating 930 during an open mask and/or mask-free deposition process. In some non-limiting examples, while the surface 3011 of the NIC 910 may exhibit a relatively low affinity or initial sticking probability $S_0$ for the material of the conductive coating 930 and thus the probability of the material nucleating on the surface 3011 is low, as the conductive coating 930 grows in thickness, the conductive coating 930 may also grow laterally and may cover a portion of the NIC 910.

In the case of FIGS. 30H-30I, the contact angle $\theta_c$ of the conductive coating 930 may be measured at an edge thereof near the interface between it and the NIC 910, as shown. In FIG. 30I, the contact angle $\theta_c$ may be greater than about 90°, which may in some non-limiting examples result in a portion of the conductive coating 930 being spaced apart from the NIC 910 by a gap 3028.

NPCs 1020

In some non-limiting examples, suitable materials for use to form an NPC 1020, may include those exhibiting or characterized as having an initial sticking probability $S_0$ for a material of a conductive coating 930 of at least about 0.6 (or 70%), at least about 0.7, at least about 0.75, at least about 0.8, at least about 0.9, at least about 0.93, at least about 0.95, at least about 0.98, and/or at least about 0.99.

Based on findings and experimental observations, it is postulated that nucleation promoting materials, including without limitation, fullerenes, metals, including without limitation, Ag and/or Yb, and/or metal oxides, including without limitation, ITO and/or IZO, as discussed further herein, may act as nucleation sites for the deposition of a conductive coating 930, including without limitation Mg.

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell and which may be, without limitation, spherical and/or semi-spherical in shape. In some non-limiting examples, a fullerene molecule can be designated as $C_n$, where n is an integer corresponding to a number of carbon atoms included in a carbon skeleton of the fullerene molecule. Non-limiting examples of fullerene molecules include $C_n$, where n is in the range of 50 to 250, such as, without limitation, $C_{70}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube and/or a cylindrical shape, including without limitation, single-walled carbon nanotubes and/or multi-walled carbon nanotubes.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, less than a monolayer of an NPC 1020, including without limitation, fullerene, may be provided on the treated surface to act as nucleation sites for deposition of Mg.

In some non-limiting examples, treating a surface by depositing several monolayers of an NPC 1020 thereon may result in a higher number of nucleation sites and accordingly, a higher initial sticking probability $S_0$.

Those having ordinary skill in the relevant art will appreciate than an amount of material, including without limitation, fullerene, deposited on a surface, may be more, or less than one monolayer. By way of non-limiting example, such surface may be treated by depositing 0.1 monolayer, 1 monolayer, 10 monolayers, or more of a nucleation promoting material and/or a nucleation inhibiting material.

In some non-limiting examples, a thickness of the NPC 1020 deposited on an exposed surface of underlying material(s) may be between about 1 nm and about 5 nm and/or between about 1 nm and about 3 nm.

While the present disclosure discusses thin film formation, in reference to at least one layer and/or coating, in terms of vapor deposition, those having ordinary skill in the relevant art will appreciate that, in some non-limiting examples, various components of the electro-luminescent device 100 may be deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD, OVPD, laser annealing, LITI patterning, ALD, coating (including without limitation, spin coating, dip coating, line coating and/or spray coating) and/or combinations thereof. Such processes may be used in combination with a shadow mask to achieve various patterns.

NICs 910

Without wishing to be bound by a particular theory, it is postulated that, during thin film nucleation and growth at and/or near an interface between the exposed surface 111 of the substrate 110 and the NIC 910, a relatively high contact angle $\theta_c$ between the edge of the film and the substrate 110 be observed due to "dewetting" of the solid surface of the thin film by the NIC 910. Such dewetting property may be driven by minimization of surface energy between the substrate 110, thin film, vapor 712 and the NIC 910 layer. Accordingly, it may be postulated that the presence of the NIC 910 and the properties thereof may have, in some non-limiting examples, an effect on nuclei formation and a growth mode of the edge of the conductive coating 930.

Without wishing to be bound by a particular theory, it is postulated that, in some non-limiting examples, the contact angle $\theta_c$ of the conductive coating 930 may be determined, based at least partially on the properties (including, without limitation, initial sticking probability $S_0$) of the NIC 910 disposed adjacent to the area onto which the conductive coating 930 is formed. Accordingly, NIC 910 material that allow selective deposition of conductive coatings 930 exhibiting relatively high contact angles $\theta_c$ may provide some benefit.

Figure 31:
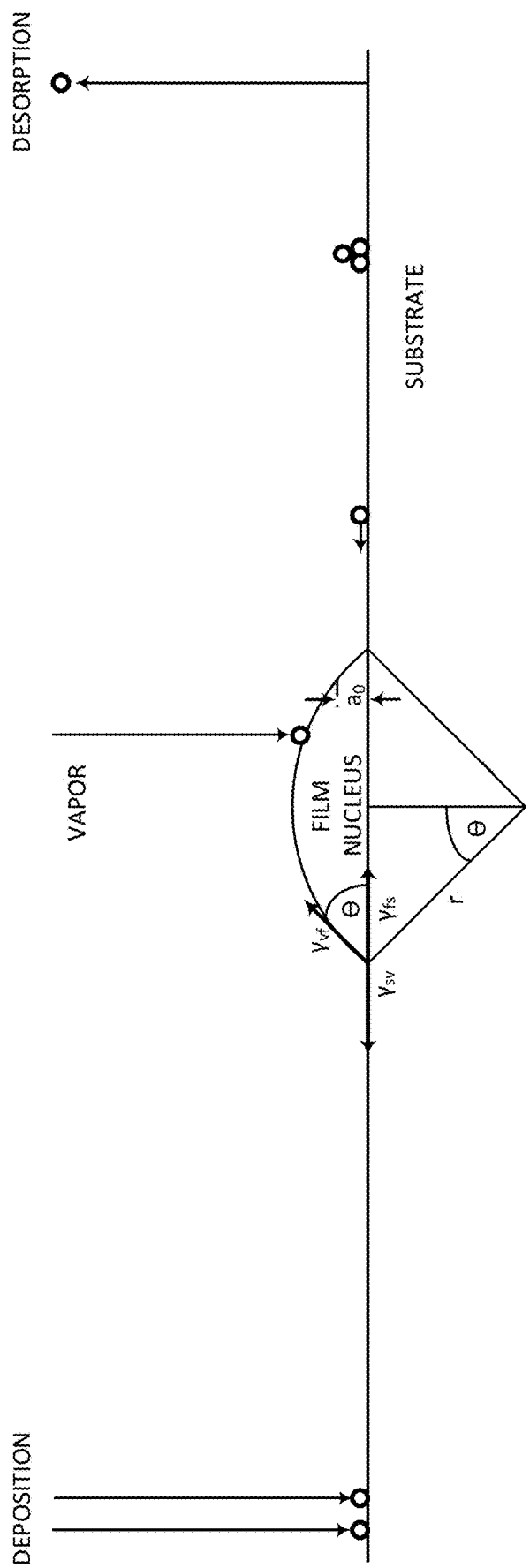
FIG. 31 is a schematic diagram illustrating the formation of a film nucleus according to an example in the present disclosure.

Without wishing to be bound by a particular theory, it is postulated that, in some non-limiting examples, the relationship between various interfacial tensions present during nucleation and growth may be dictated according to Young's equation in capillarity theory:

$$\gamma_{sv} = \gamma_{fs} + \gamma_{vf} \cos \theta$$

wherein $\gamma_{sv}$ corresponds to the interfacial tension between substrate 110 and vapor 712, $\gamma_{fs}$ corresponds to the interfacial tension between the thin film and the substrate 110, $\gamma_{vf}$ corresponds to the interfacial tension between the vapor 712 and the film, and $\theta$ is the film nucleus contact angle. FIG. 31 illustrates the relationship between the various parameters represented in this equation.

On the basis of Young's equation, it may be derived that, for island growth, the film nucleus contact angle $\theta$ is greater than 0 and therefore $\theta_{sv} < \theta_{fs} + \theta_{vf}$.

For layer growth, where the deposited film "wets" the substrate 110, the nucleus contact angle $\theta = 0$, and therefore $\theta_{sv} = \theta_{fs} + \theta_{vf}$.

For Stranski-Krastanov (S-K) growth, where the strain energy per unit area of the film overgrowth is large with respect to the interfacial tension between the vapor 712 and the film, $\theta_{sv} > \theta_{fs} + \theta_{vf}$.

It may be postulated that the nucleation and growth mode of the conductive coating 930 at an interface between the NIC 910 and the exposed surface of the substrate 110 may follow the island growth model, where $\theta > 0$. Particularly in cases where the NIC 910 exhibits a relatively low affinity and/or low initial sticking probability $S_0$ (i.e. dewetting) towards the material used to form the conductive coating 930, resulting in a relatively high thin film contact angle of the conductive coating 930. On the contrary, when a conductive coating 930 is selectively deposited on a surface without the use of an NIC 910, by way of non-limiting example, by employing a shadow mask, the nucleation and growth mode of the conductive coating 930 may differ. In particular, it has been observed that the conductive coating 930 formed using a shadow mask patterning process may, at least in some non-limiting examples, exhibit relatively low thin film contact angle of less than about 10°.

Those having ordinary skill in the relevant art will appreciate that, while not explicitly illustrated, a material 711 used to form the NIC 910 may also be present to some extent at an interface between the conductive coating 930 and an underlying surface (including without limitation, a surface of a NPC 1020 layer and/or the substrate 110). Such material may be deposited as a result of a shadowing effect, in which a deposited pattern is not identical to a pattern of a mask and may, in some non-limiting examples, result in some evaporated material 712 being deposited on a masked portion of a target surface 111. By way of non-limiting examples, such material 712 may form as islands and/or disconnected clusters, and/or as a thin film having a thickness that may be substantially less than an average thickness of the NIC 910.

In some non-limiting examples, it may be desirable for the activation energy for desorption ($E_{des}$ 631) to be less than about 2 times the thermal energy ($k_B T$), less than about 1.5 times the thermal energy ($k_B T$), less than about 1.3 times the thermal energy ($k_B T$), less than about 1.2 times the thermal energy ($k_B T$), less than the thermal energy ($k_B T$), less than about 0.8 times the thermal energy ($k_B T$), and/or less than about 0.5 times the thermal energy ($k_B T$). In some non-limiting examples, it may be desirable for the activation energy for surface diffusion ($E_s$ 621) to be greater than the thermal energy ($k_B T$), greater than about 1.5 times the thermal energy ($k_B T$), greater than about 1.8 times the thermal energy ($k_BT$), greater than about 2 times the thermal energy ($k_BT$), greater than about 3 times the thermal energy ($k_BT$), greater than about 5 times the thermal energy ($k_BT$), greater than about 7 times the thermal energy ($k_BT$), and/or greater than about 10 times the thermal energy ($k_BT$).

In some non-limiting examples, suitable materials for use to form an NIC 910, may include those exhibiting and/or characterized as having an initial sticking probability $S_0$ for a material of a conductive coating 930 of no greater than and/or less than about 0.1 (or 10%) and/or no greater than and/or less than about 0.05, no greater than and/or less than 0.03, no greater than and/or less than 0.02, no greater than and/or less than 0.01, no greater than and/or less than about 0.08, no greater than and/or less than about 0.005, no greater than and/or less that about 0.003, no greater than and/or less than about 0.001, no greater than and/or less than about 0.0008, no greater than and/or less than about 0.0005, and/or no greater than and/or less than about 0.0001.

In some non-limiting examples, suitable materials for use to form an NIC 910, may include organic materials, such as small molecule organic materials and/or organic polymers. Non-limiting examples of suitable organic materials include without limitation polycyclic aromatic compounds including without limitation organic molecules, including without limitation, optionally one or more heteroatoms, including without limitation, nitrogen (N), sulfur (S), oxygen (O), phosphorus (P) and/or aluminum (Al). In some non-limiting examples, a polycyclic aromatic compound may include, without limitation, organic molecules each including a core moiety and at least one terminal moiety bonded to the core moiety. A non-limiting number of terminal moieties may be 1 or more, 2 or more, 3 or more, and/or 4 or more. Without limiting the generality of the foregoing, in the case of 2 or more terminal moieties, the terminal moieties may be the same and/or different, and/or a subset of the terminal moieties may be the same but different from at least one remaining moiety.

Suitable materials for use to form an NIC 910 include those exhibiting and/or characterized as having an initial sticking probability $S_0$ for a material of a conductive coating of no greater than and/or less than about 0.1 (or 10%) and/or no greater than and/or less than about 0.05, and, more particularly, no greater than and/or less than about 0.03, no greater than and/or less than about 0.02, no greater than and/or less than about 0.01, no greater than and/or less than about 0.08, no greater than and/or less than about 0.005, no greater than and/or less than about 0.003, no greater than and/or less than about 0.001, no greater than and/or less than about 0.0008, no greater than and/or less than about 0.0005, and/or no greater than and/or less than about 0.0001. Suitable materials for use to form a nucleation promoting coating include those exhibiting and/or characterized as having an initial sticking probability $S_0$ for a material of a conductive coating of at least about 0.6 (or 60%), at least about 0.7, at least about 0.75, at least about 0.8, at least about 0.9, at least about 0.93, at least about 0.95, at least about 0.98, and/or at least about 0.99.

Suitable nucleation inhibiting materials include organic materials, such as small molecule organic materials and organic polymers.

In some non-limiting examples, the NIC 910 comprises a compound of Formula (I), (II), (III), (IV), (V), (VI), (VII), or (VIII).

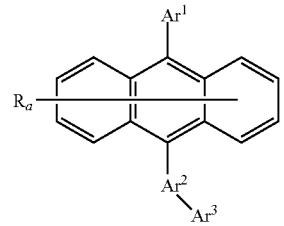

Formula (I)

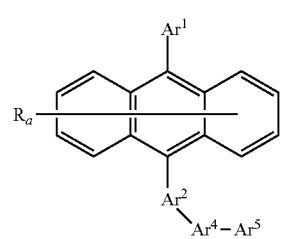

Formula (II)

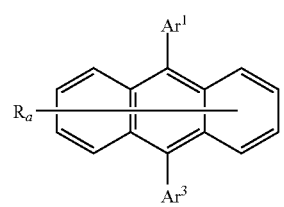

Formula (III)

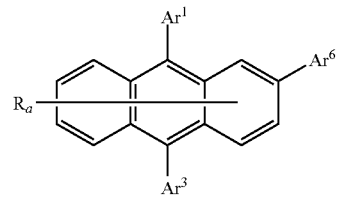

Formula (IV)

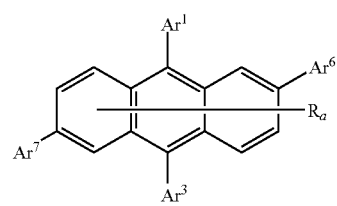

Formula (V)

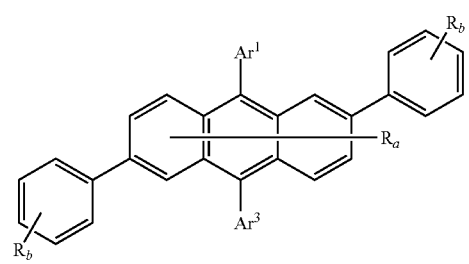

Formula (VI)

Formula (VII)

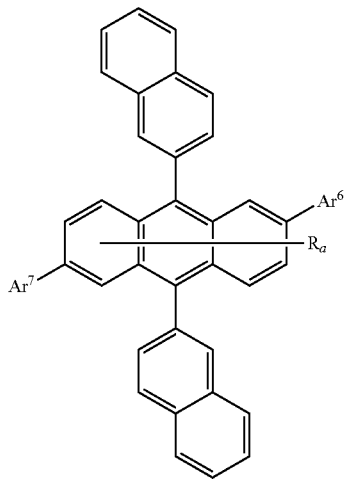

Formula (VIII)

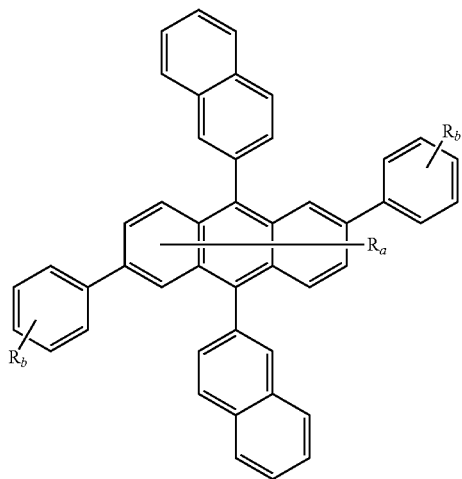

In Formula (I), (II), (III), (IV), (V), and (VI), $Ar^1$ represents a substituted or unsubstituted aryl group having 6 to 50 carbon atoms; a substituted or unsubstituted arylene group having 6 to 60 carbon atoms; a substituted or unsubstituted heteroaryl group having 4 to 50 carbon atoms; and/or a substituted or unsubstituted heteroarylene group having 5 to 60 carbon atoms. Examples of $Ar^1$ include, but are not limited to the following: 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl (including 5-, 6-, 7-, 8- and 9-benzathracenyl); pyrenyl (including 1-, 2-, and 4-pyrenyl); pyridine; quinoline; isoquinoline, pyrazine; quinoxaline; arcidine; pyrimidine; quinazoline; pyridazine; cinnoline and phthalazine. In some non-limiting examples, $Ar^1$ represents a substituted or unsubstituted aryl group having 6-50 carbon atoms, and/or 4-50 carbon atoms. In some non-limiting examples, $Ar^1$ represents a substituted or unsubstituted arylene group having 6-50 carbon atoms, and/or 4-50 carbon atoms.

In Formula (I), (II), (III), (IV), (V), (VI), (VII), (VIII), $R_a$ and $R_b$ each represents the optional presence of one or more substituent groups, which are independently selected from: D (deutero), F, Cl, alkyl including $C_1$-$C_6$ alkyl, cycloalkyl, silyl, fluoroalkyl, arylalkyl, aryl, haloaryl, heteroaryl, alkoxy, haloalkoxy, fluoroalkoxy, fluoroaryl, trifluoroaryl, and a combination of any two and/or more thereof. In some non-limiting examples, the one and/or more substituent groups is independently selected from: methyl, methoxy, ethyl, t-butyl, fluoromethyl, difluoromethyl, trifluoromethyl, fluoroalkoxy, difluoromethoxy, trifluoromethoxy, fluoroethyl, polyfluoroethyl, 4-fluorophenyl, 3,4,5-trifluorophenyl and 4-(trifluoromethoxy)phenyl. It will be appreciated that, in some non-limiting examples described herein, each $R_a$ and/or $R_b$ may denote the optional presence of one, two, three, four, five, and/or more substituents, which may be selected independently of one another in each instance.

In some non-limiting examples, $R_b$ contains at least one fluorine atom. By way of non-limiting example, $R_b$ may be selected from: F, fluoroalkyl, fluoroalkoxy, fluoroaryl, and trifluoroaryl.

In Formula (I) and (II), $Ar^2$ represents a substituted or unsubstituted arylene group having 6 to 50 carbon atoms, and/or a substituted or unsubstituted heteroarylene group having 4 to 50 carbon atoms. Examples of $Ar^2$ include, but are not limited to the following: phenylene; naphthylene; anthracylene; phenanthrylene; benzanthracylene; and pyrenylene.

In Formula (I), (III), (IV), (V), and (VI), $Ar^3$ represents a substituted or unsubstituted aryl group having 6 to 50 carbon atoms; a substituted or unsubstituted arylene group having 6 to 60 carbon atoms; a substituted or unsubstituted heteroaryl group having 4 to 50 carbon atoms; and/or a substituted or unsubstituted heteroarylene group having 5 to 60 carbon atoms. Examples of $Ar^3$ include, but are not limited to the following: 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl (including 5-, 6-, 7-, 8- and 9-benzathracenyl); pyrenyl (including 1-, 2-, and 4-pyrenyl); pyridine; quinoline; isoquinoline, pyrazine; quinoxaline; arcidine; pyrimidine; quinazoline; pyridazine; cinnoline and phthalazine. In some non-limiting examples, $Ar^3$ represents a substituted or unsubstituted aryl group having 6-50 carbon atoms, and/or 4-50 carbon atoms. In some non-limiting examples, $Ar^3$ represents a substituted or unsubstituted arylene group having 6-50 carbon atoms, and/or 4-50 carbon atoms.

In Formula (II), $Ar^4$ represents a substituted or unsubstituted arylene group having 6 to 50 carbon atoms, and/or a substituted or unsubstituted heteroarylene group having 4 to 50 carbon atoms. Examples of $Ar^4$ include, but are not limited to the following: phenylene; naphthylene; anthracylene; phenanthrylene; benzanthracylene; pyrenylene. In some non-limiting examples, $Ar^4$ is benzimidazole.

In Formula (II), $Ar^5$ represents a substituted or unsubstituted aryl group having 6 to 50 carbon atoms; a or unsubstituted arylene group having 6 to 60 carbon atoms; a or unsubstituted heteroaryl group having 4 to 50 carbon atoms; and/or a or unsubstituted heteroarylene group having 5 to 60 carbon atoms. Examples of $Ar^5$ include, but are not limited to the following: phenyl; 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl (including 5-, 6-, 7-, 8- and 9-benzathracenyl); and pyrenyl (including 1-, 2-, and 4-pyrenyl).

In Formula (IV) and (V), $Ar^6$ and $Ar^7$ each individually represents a or unsubstituted aryl group having 6 to 50 carbon atoms; a or unsubstituted haloaryl group having 6 to 50 carbon atoms, an arylene group having 6 to 60 carbon atoms which may have a substituent; and/or a or unsubstituted heteroaryl group having 5 to 60 carbon atoms. Examples of $Ar^6$ and $Ar^7$ include, but are not limited to the following: phenyl, 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl (including 5-, 6-, 7-, 8- and 9-benzathracenyl); pyrenyl (including 1-, 2-, and 4-pyrenyl); 4-fluorophenyl, 3,4,5-trifluorophenyl, 4-(trifluoromethoxy)phenyl.

In some non-limiting examples, in the compound of Formula (III), (IV), (V), and/or (VI), $Ar^1$ represents a or unsubstituted aryl group having 6 to 50 carbon atoms and $Ar^3$ represents a or unsubstituted heteroaryl group having 4 to 50 carbon atoms. In some non-limiting examples, in the compound of Formula (III), (IV), (V), and/or (VI), $R_a$ represents a or unsubstituted heteroaryl group having 4 to 50 carbon atoms. In some non-limiting examples, in the compound of Formula (IV) and/or (V), $Ar^6$ represents a or unsubstituted heteroaryl group having 4 to 50 carbon atoms.

In some non-limiting examples, the group corresponding to each of $Ar^1$, $Ar^2$, $Ar^3$, $Ar^4$, $Ar^5$, $Ar^6$, and $Ar^7$ may be substituted by one and/or more substituent groups ($R_c$). In some non-limiting examples, the one and/or more substituent group ($R_c$) is individually selected from: D (deutero), F, Cl, alkyl including $C_1$-$C_6$ alkyl, cycloalkyl, silyl, fluoroalkyl, arylalkyl, aryl, haloaryl, heteroaryl, alkoxy, fluoroalkoxy, fluoroaryl, trifluoroaryl, and a combination of any two and/or more thereof. In some non-limiting examples, the one and/or more substituent group ($R_c$) is independently selected from: methyl, methoxy, ethyl, t-butyl, fluoromethyl, difluoromethyl, trifluoromethyl, fluoroalkoxy, difluoromethoxy, trifluoromethoxy, fluoroethyl, polyfluoroethyl, 4-fluorophenyl, 3,4,5-trifluorophenyl and 4-(trifluoromethoxy)phenyl.

In some non-limiting examples, in the compound of Formula (V) and/or (VI), $Ar^1$ and $Ar^3$ each individually represents 2-naphthyl. In some non-limiting examples, at least one of $Ar^6$ and $Ar^7$ is 3,4,5-trifluorophenyl.

In some non-limiting examples, $R_a$, $R_b$ and $R_c$ may each represent two and/or more substituent groups. In some non-limiting examples, two and/or more of such substituent groups may be fused t form aryl ring(s) and/or heteroaryl ring(s). In some non-limiting examples, fused heteroaryl ring(s) contain(s) at least one heteroatom. In some non-limiting examples, the fused aryl ring(s) and/or heteroaryl ring(s) are unsubstituted or substituted by one and/or more additional substituent groups. Non-limiting examples of such fused heteroaryl ring(s) include, without limitation, a group consisting of Formulae S1 to S15 illustrated below.

S1

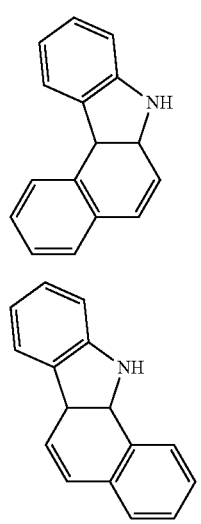

S2

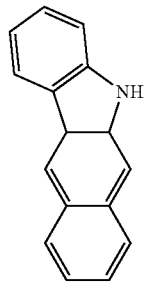

S3

S4

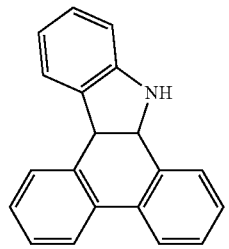

S5

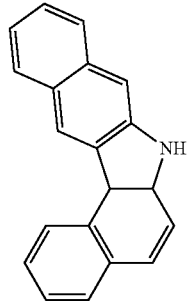

S6

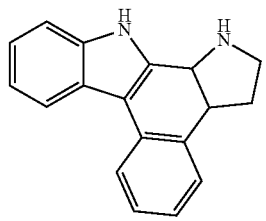

S7

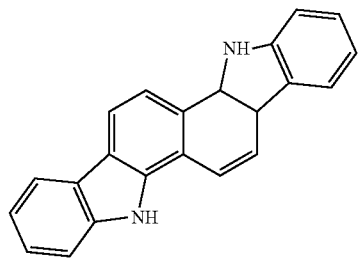

S8

S9
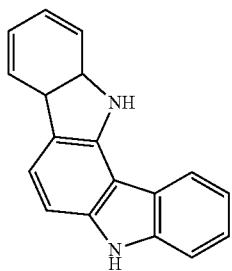
S10
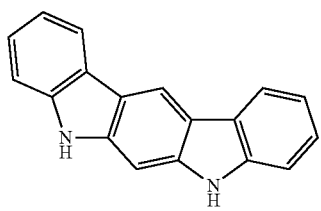
S11
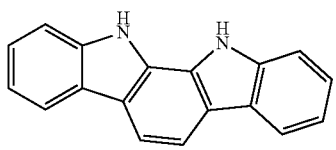
S12
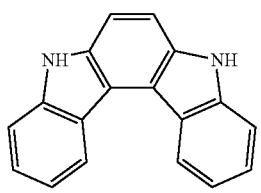
S13
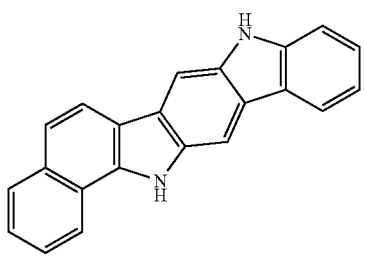
S14
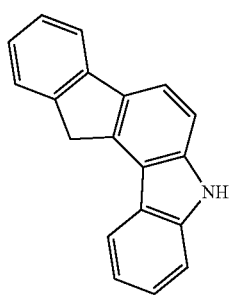
S15
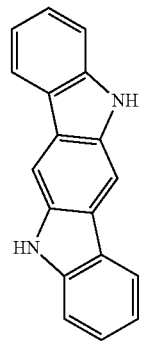
Those having ordinary skill in the relevant art will appreciate that any of the above fussed heteroaryl ring(s) S1 to S15 may be bonded in various configurations and/or positions to a portion of the molecule.
In some non-limiting examples, the arylene group referred to herein is selected from a group consisting of Formulae (A-0) to (R-0) illustrated below.
(A-0)
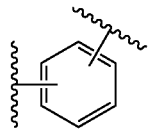
(A-1)
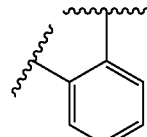
(A-2)
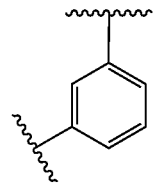
(A-3)
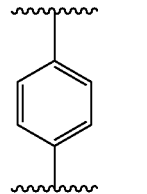
(B-0)
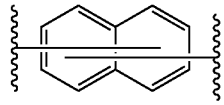
(B-1)
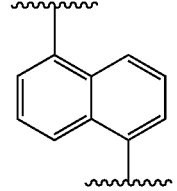

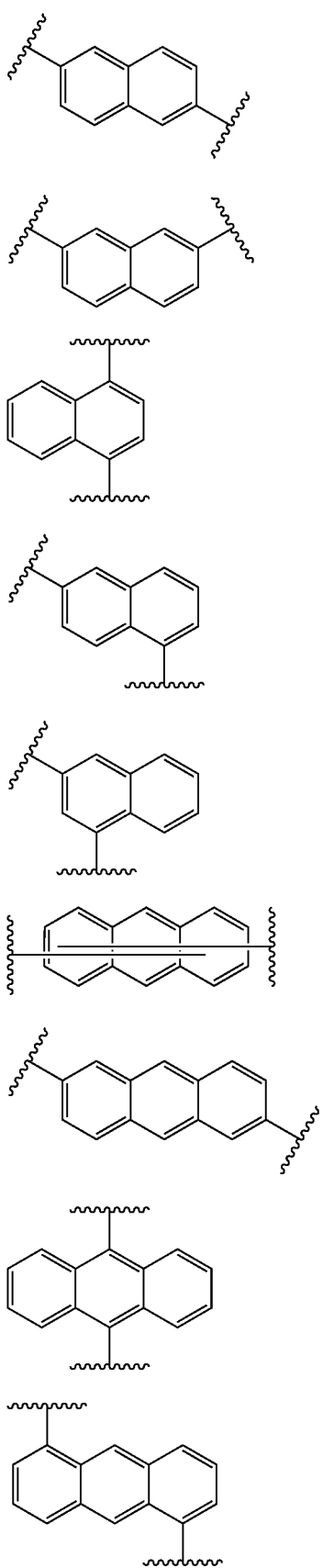
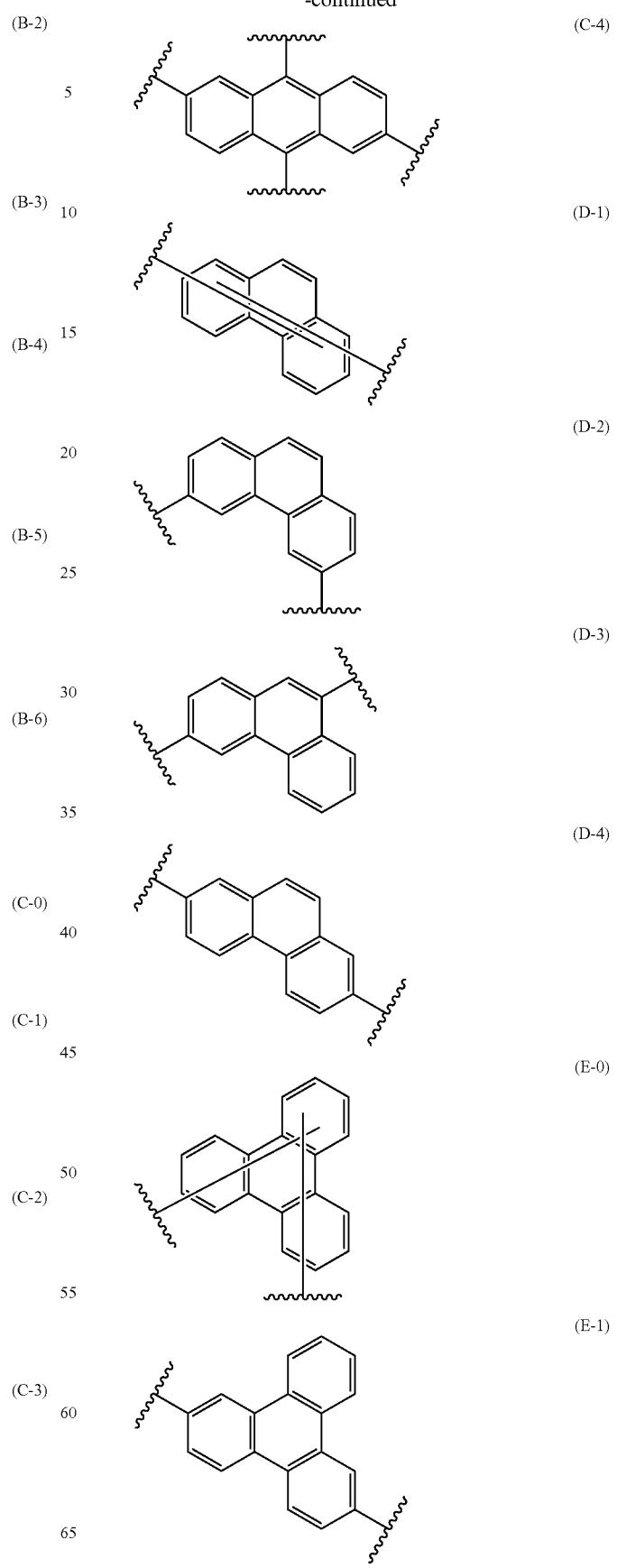

-continued
(E-2)
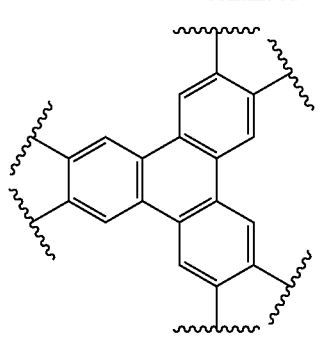
(F-0)
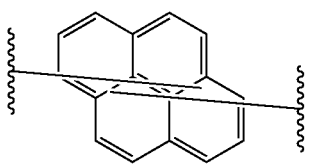
(F-1)
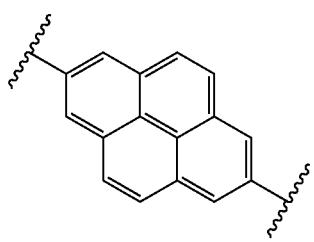
(F-2)
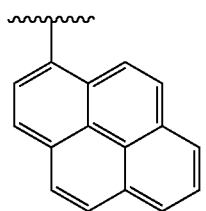
(F-3)
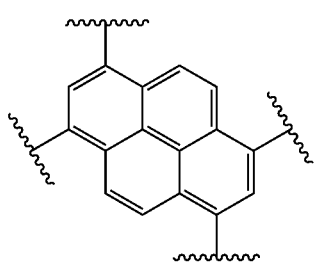
(F-4)
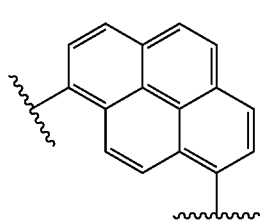
-continued
(G-0)
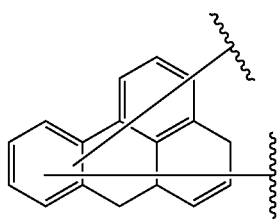
(G-1)
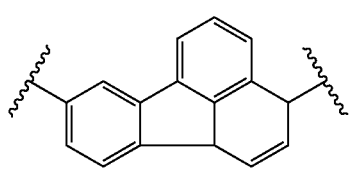
(H-0)
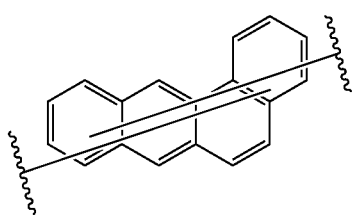
(H-1)
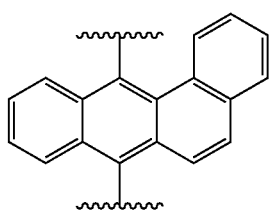
(I-0)
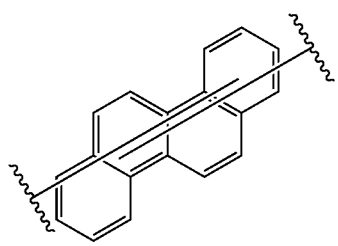
(I-1)
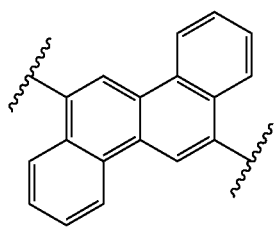
(I-2)
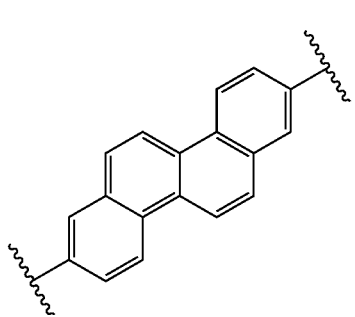

-continued
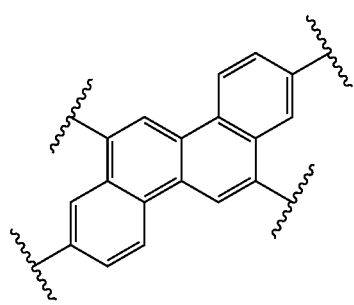
(I-3)
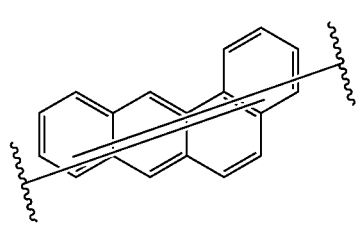
(J-0)
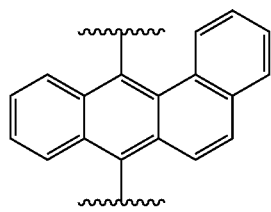
(J-1)
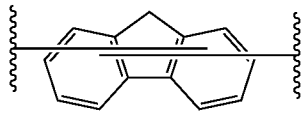
(K-0)
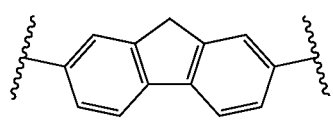
(K-1)
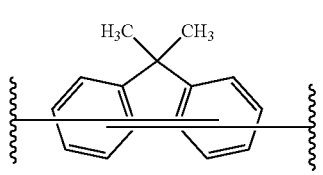
(L-0)
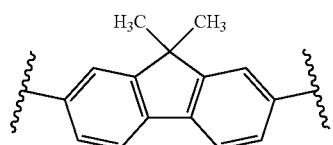
(L-1)
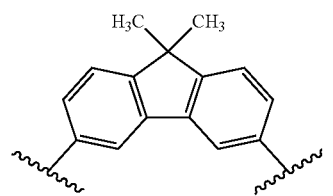
(L-2)
-continued
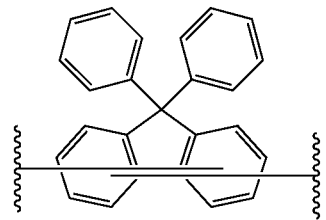
(M-0)
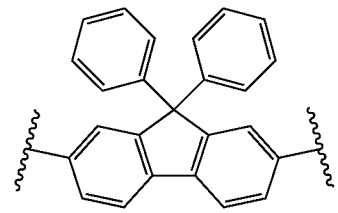
(M-1)
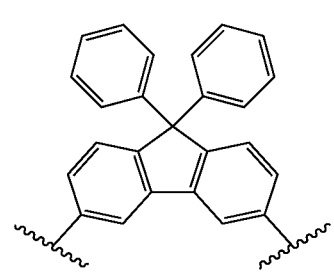
(M-2)
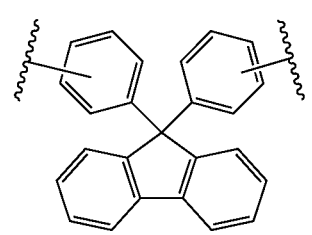
(N-0)
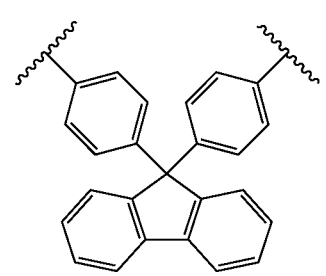
(N-1)
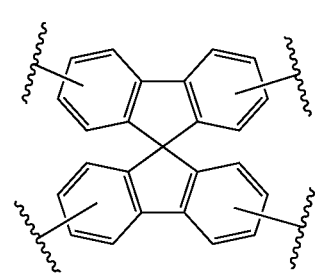
(O-0)

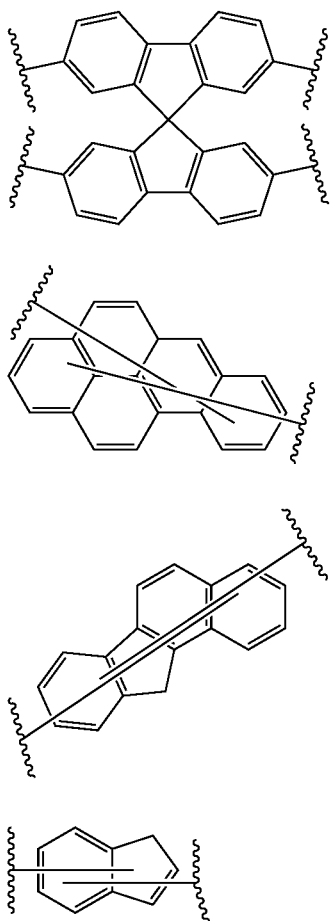 (O-1)

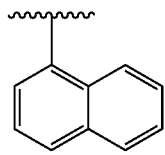 (BX-1)

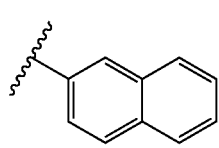 (BX-2)

(P-0)

(Q-0)

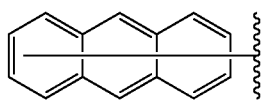 (CX-0)

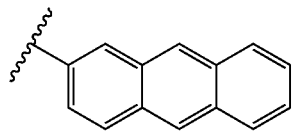 (CX-1)

(R-0)

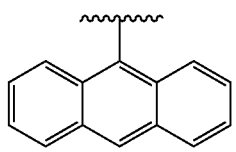 (CX-2)

In some non-limiting examples, any of the arylene group selected from Formulae (A-0) to (R-0) may be optionally substituted by one and/or more substituent groups. Non-limiting examples of such substituent groups include, without limitation, those described in relation to $R_a$, $R_b$ and $R_c$ herein.

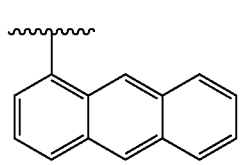 (CX-3)

In some non-limiting examples, the aryl group is selected from a group consisting of Formulae (AX-0) to (RX-0) illustrated below.

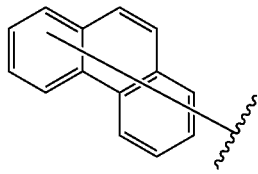 (DX-0)

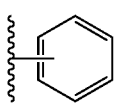 (AX-0)

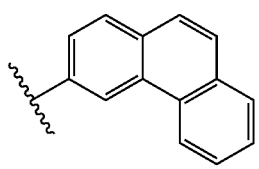 (DX-1)

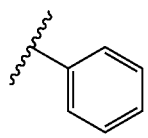 (AX-1)

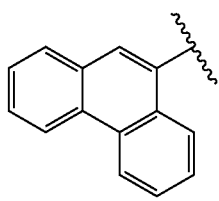 (DX-2)

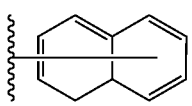 (BX-0)

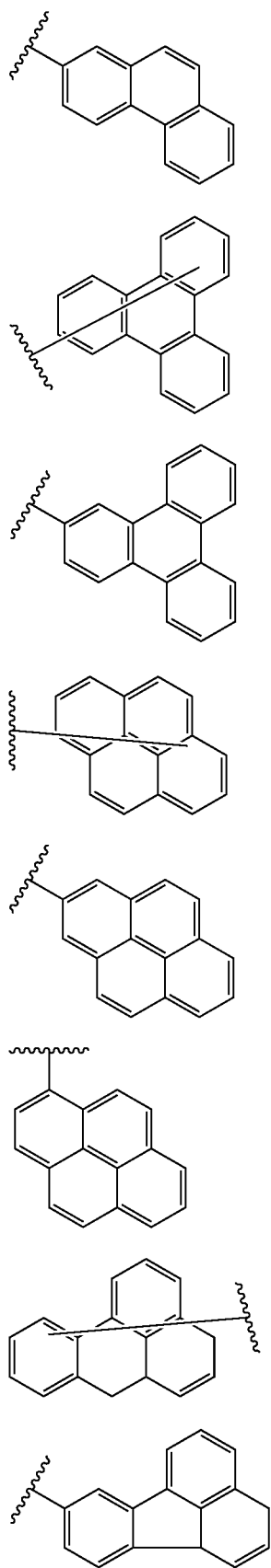
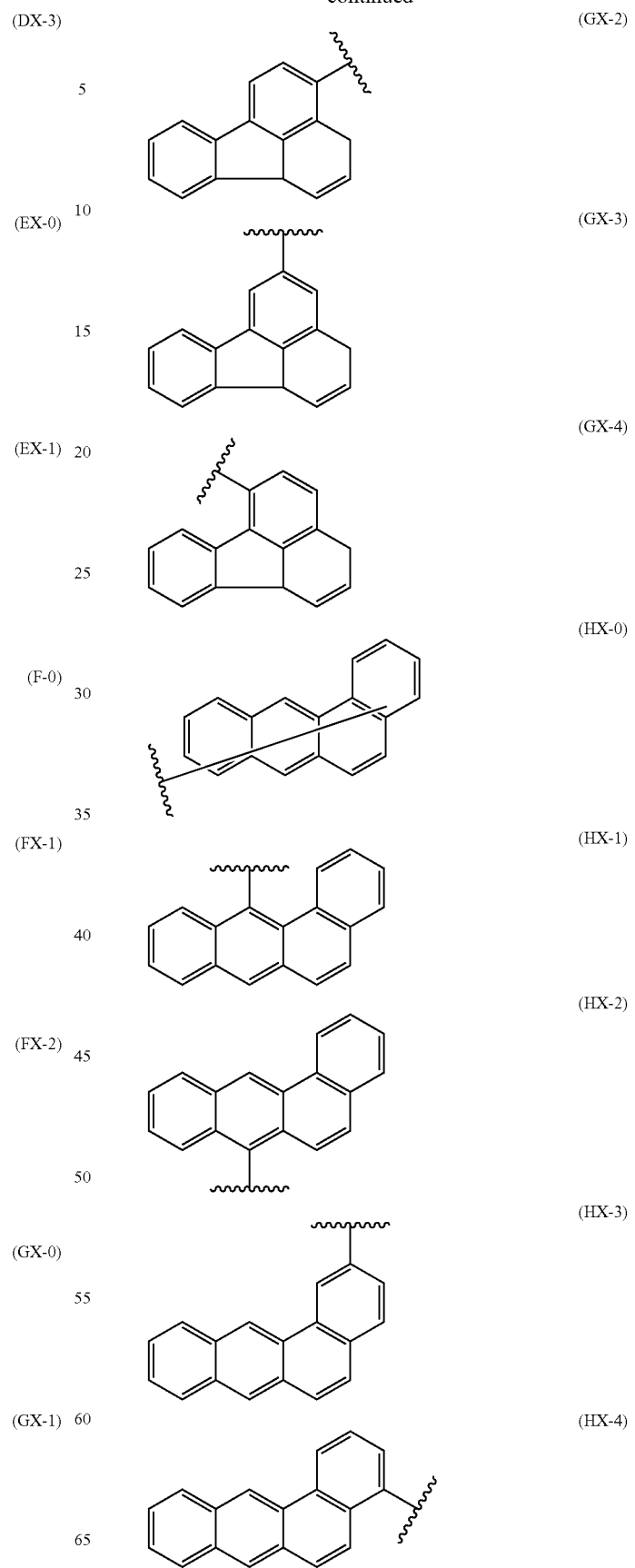

(IX-0)
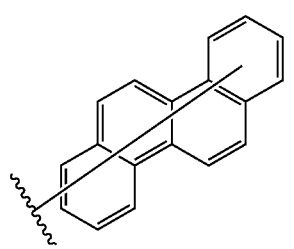
(IX-1)
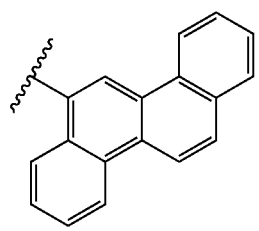
(IX-2)
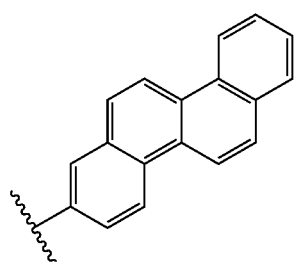
(KX-0)
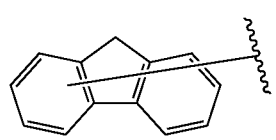
(KX-1)
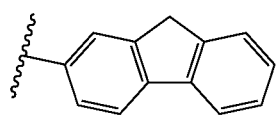
(LX-0)
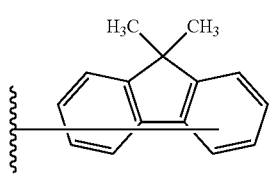
(LX-1)
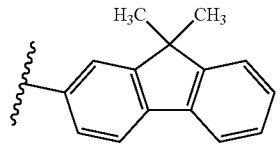
(LX-2)
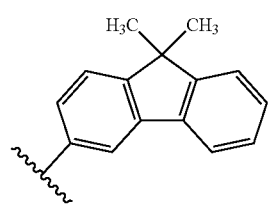
(MX-0)
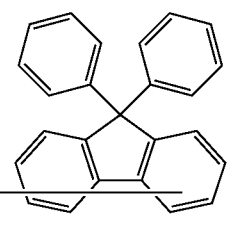
(MX-1)
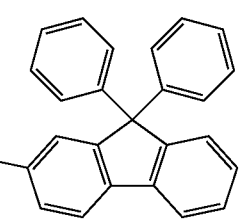
(MX-2)
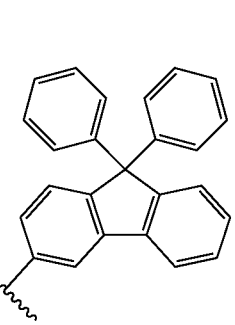
(NX-0)
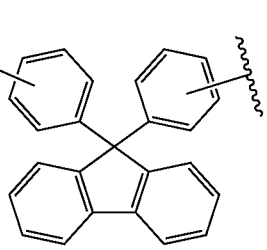
(NX-1)
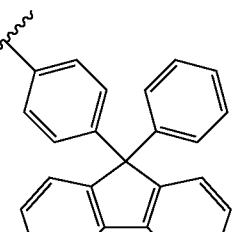
(OX-0)
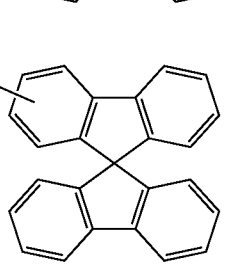

-continued

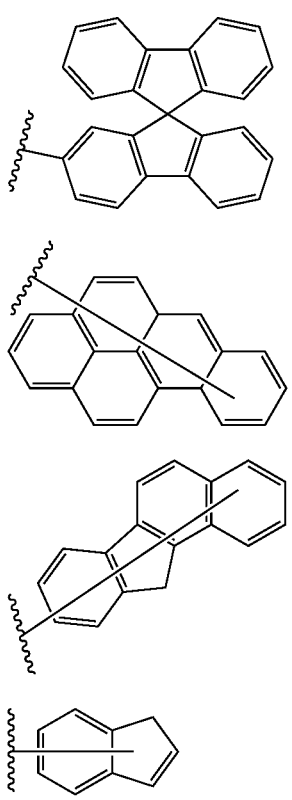

(OX-1)

(PX-0)

(QX-0)

(RX-0)

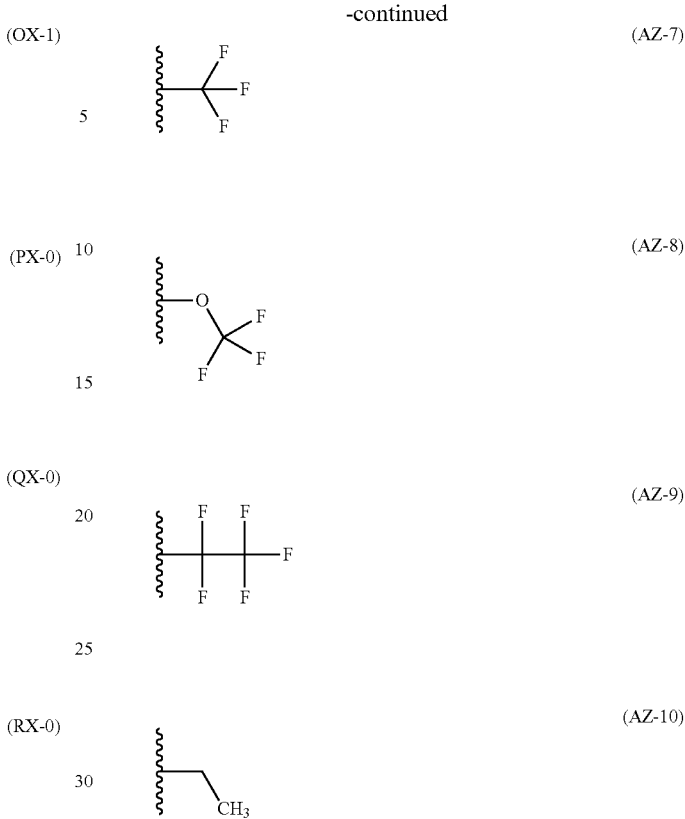

(AZ-7)

(AZ-8)

(AZ-9)

(AZ-10)

(AZ-11)

(AZ-12)

(AZ-13)

In some non-limiting examples, the substituent group $R_a$, $R_b$ and/or $R_c$ is independently selected from a group consisting of Formulae (AZ-1) to (AZ-13) illustrated below.

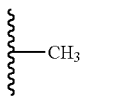

(AZ-1)

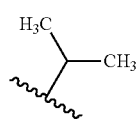

(AZ-2)

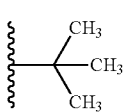

(AZ-3)

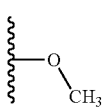

(AZ-4)

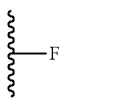

(AZ-5)

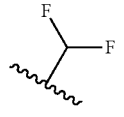

(AZ-6)

In some non-limiting examples, the substituent group $R_a$, $R_b$ and/or $R_c$ is independently selected from a group consisting of Formulae (AZ-5), (AZ-6), (AZ-7), (AZ-8), (AZ-9), (AZ-11), (AZ-12) and/or (AZ-13).

In some non-limiting examples, the NIC 910 comprises a compound of Formula (I-1), (I-2), (II-1), (III-1), (III-2), (III-3), (III-4), (III-5), (III-6), (III-7), (III-8), (III-9),

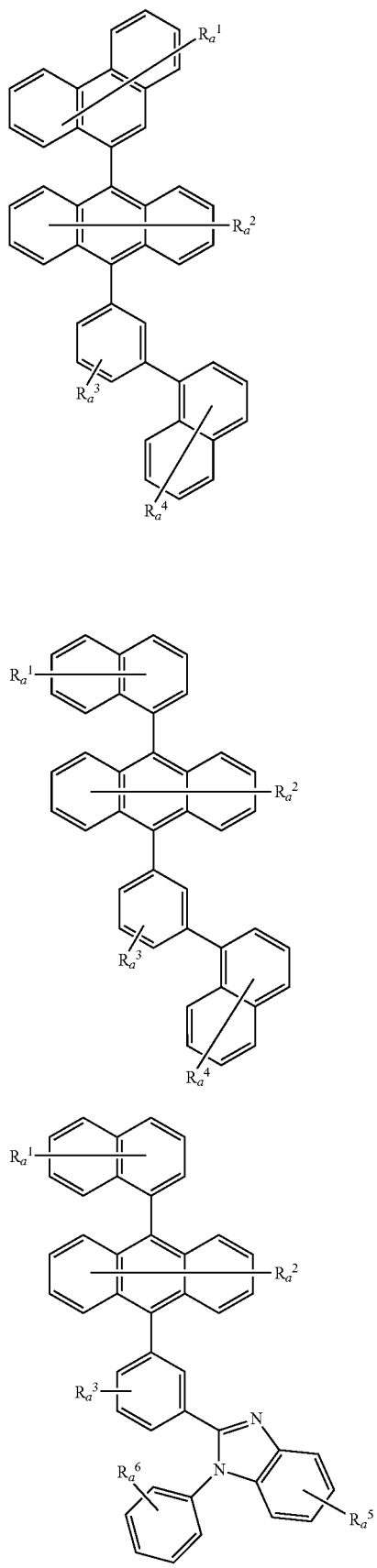
(I-1)
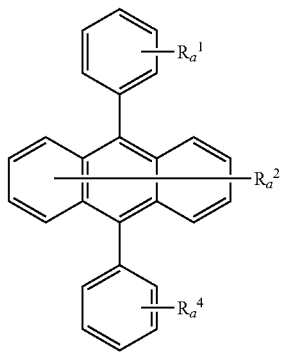
(I-2)
(II-1)
(III-1)
(III-2)
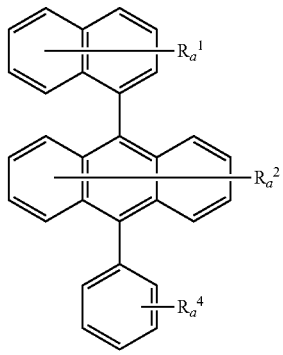
(III-3)
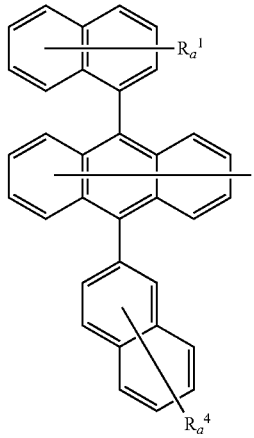
(III-4)
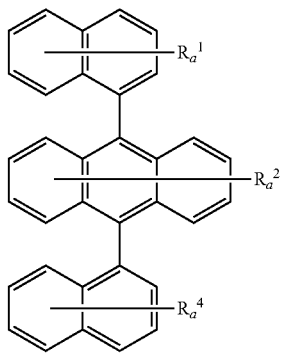

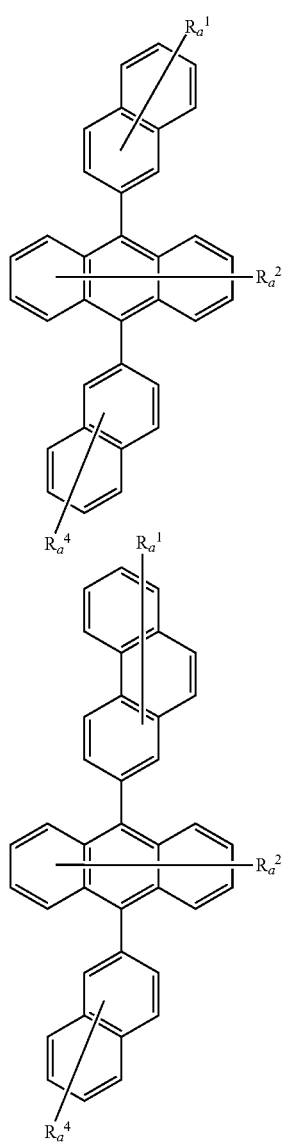
(III-5)
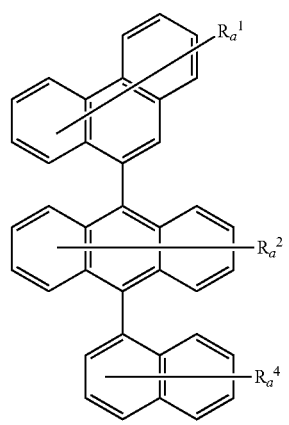
(III-8)
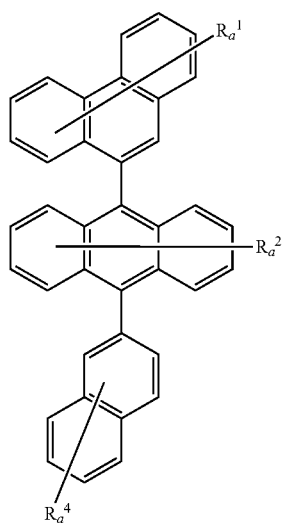
(III-6)
(III-7)
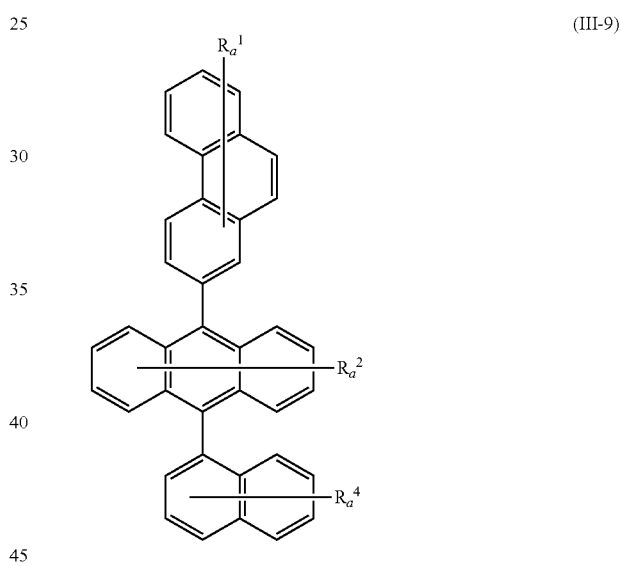
(III-9)
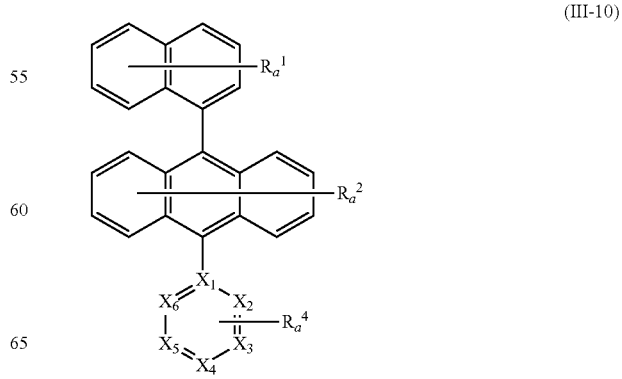
(III-10)

(III-11)

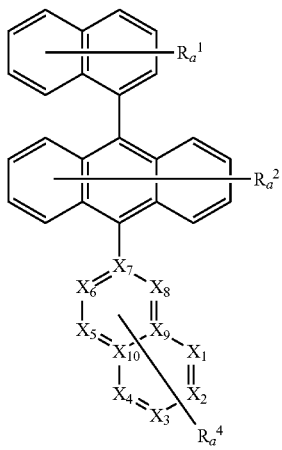

(IV-1)

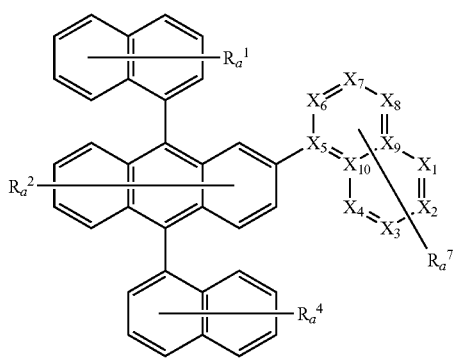

(IV-2)

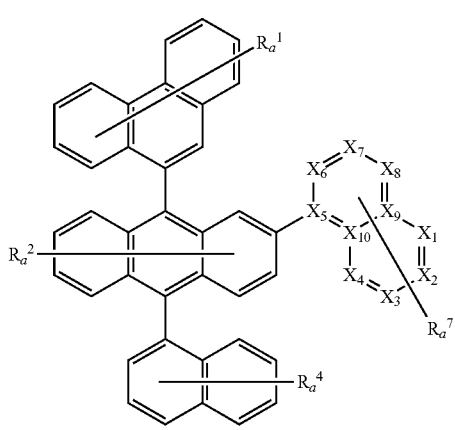

(VIII-1)

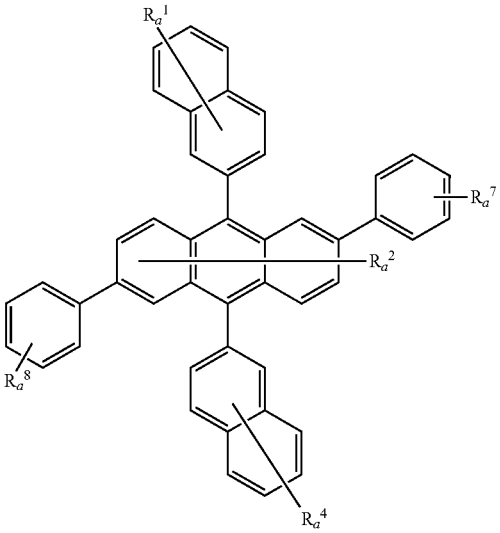

$Ra^1$, $Ra^2$, $Ra^3$, $Ra^4$, $Ra^5$, $Ra^6$, $Ra^7$, and $Ra^8$ each represents the optional presence of one and/or more substituent groups, which are independently selected from: D (deutero), F, Cl, alkyl including $C_1$-$C_6$ alkyl, cycloalkyl, silyl, fluoroalkyl, arylalkyl, aryl, heteroaryl, alkoxy, fluoroalkoxy, and a combination of any two and/or more thereof. In some non-limiting examples, the one and/or more substituent groups is independently selected from: methyl, methoxy, ethyl, t-butyl, fluoro, fluoromethyl, difluoromethyl, trifluoromethyl, trifluoromethoxy, fluoroethyl, polyfluoroethyl; 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl (including 5-, 6-, 7-, 8- and 9-benzathracenyl); pyrenyl (including 1-, 2-, and 4-pyrenyl); pyridine; quinoline; isoquinoline, pyrazine; quinoxaline; arcidine; pyrimidine; quinazoline; pyridazine; cinnoline and phthalazine.

In some non-limiting examples, $Ra^1$, $Ra^2$, $Ra^3$, $Ra^4$, $Ra^5$, $Ra^6$, $Ra^7$ and $Ra^8$ are each independently selected from Formulae (AZ-1) to (AZ-12) described above. In some non-limiting examples, $Ra^1$, $Ra^2$, $Ra^3$, $Ra^4$, $Ra^5$, $Ra^6$, $Ra^7$ and $Ra^8$ are each independently selected from a group consisting of Formulae (AZ-5), (AZ-6), (AZ-7), (AZ-8), (AZ-9), (AZ-11), (AZ-12) and/or (AZ-13).

In some non-limiting examples, $Ra^1$, $Ra^2$, $Ra^3$, $Ra^4$, $Ra^5$, $Ra^6$, $Ra^7$, and $Ra^8$ are each independently selected from: D (deutero), F, Cl, t-butyl, trifluoromethyl, and trifluoromethoxy.

In some non-limiting examples, $Ra^1$ and $Ra^4$ are in each instance aryl, and $Ra^2$ is heteroaryl.

Referring to Formula (III-10), $X_1$, $X_2$, $X_3$, $X_4$, $X_5$, and $X_6$ is each independently carbon and/or nitrogen. In some non-limiting examples, at least one of $X_1$, $X_2$, $X_3$, $X_4$, $X_5$, and $X_6$ is nitrogen, and the remainder are carbon. In some non-limiting examples, at least two of $X_1$, $X_2$, $X_3$, $X_4$, $X_5$, and $X_6$ are nitrogen, and the remainder are carbon.

Referring to Formula (III-11), (IV-1), and (IV-2), $X_1$, $X_2$, $X_3$, $X_4$, $X_5$, $X_6$, $X_7$, $X_8$, $X_9$, and $X_{10}$ is each independently carbon and/or nitrogen. In some non-limiting examples, at least one of $X_1$, $X_2$, $X_3$, $X_4$, $X_5$, $X_6$, $X_7$, $X_8$, $X_9$, and $X_{10}$ is nitrogen, and the remainder are carbon. In some further non-limiting examples, at least two of $X_1$, $X_2$, $X_3$, $X_4$, $X_5$, $X_6$, $X_7$, $X_8$, $X_9$, and $X_{10}$ are nitrogen, and the remainder are carbon.

Referring to Formula (III-11), in some non-limiting examples, at least one of $X_1$, $X_2$, $X_3$, $X_4$, $X_5$, and $X_6$ is nitrogen, and the remainder are carbon. In some non-limiting examples, $X_5$ is nitrogen and $X_1$, $X_2$, $X_3$, $X_4$, $X_6$, $X_7$, $X_8$, $X_9$, and $X_{10}$ are carbon.

Referring to Formula (IV-1) and (IV-2), at least one of $X_1$, $X_2$, $X_3$, $X_4$, $X_5$, $X_6$, $X_7$, $X_8$, is nitrogen, and the remainder are carbon. In some non-limiting examples, at least one of $X_1$, $X_4$, $X_5$, $X_6$, and $X_8$, is nitrogen, and the remainder are carbon.

In some non-limiting examples, the NIC 910 comprises a compound of Formula III-12, IV-4, and VIII-2.

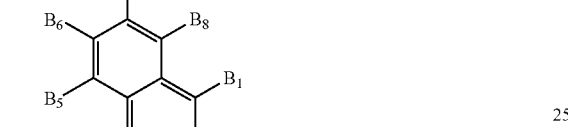

(III-12)

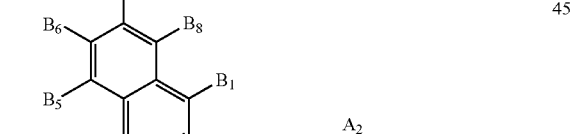

(IV-4)

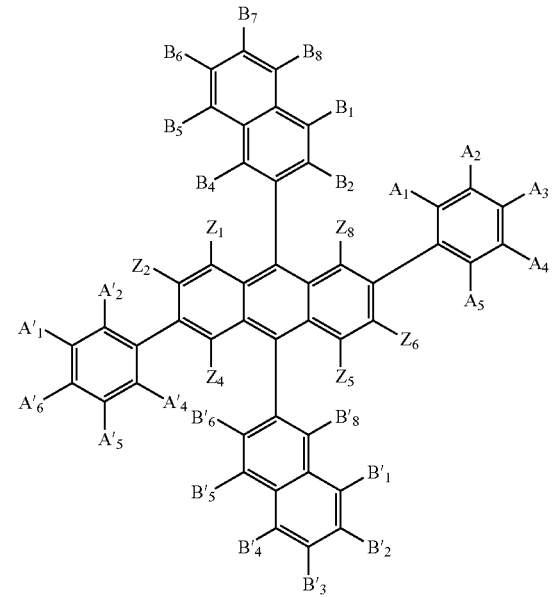

(VIII-2)

In Formula III-12, $B_1$, $B_2$, $B_4$, $B_5$, $B_6$, $B_7$, $B_8$, $Z_1$, $Z_2$, $Z_3$, $Z_4$, $Z_5$, $Z_6$, $Z_7$, $Z_8$, $B'_1$, $B'_2$, $B'_3$, $B'_4$, $B'_5$, $B'_6$ and $B'_8$, each represents the optional presence of one and/or more substituent groups, which are independently selected from: D (deutero), F, Cl, alkyl including $C_1$-$C_6$ alkyl, cycloalkyl, silyl, fluoroalkyl, arylalkyl, haloaryl, heteroaryl, alkoxy, haloalkoxy, fluoroaryl and trifluoroaryl and a combination of any two and/or more thereof. In some non-limiting examples, the one and/or more substituent groups is independently selected from: methyl, methoxy, ethyl, t-butyl, fluoromethyl, difluoromethyl, trifluoromethyl, fluoroalkoxy, difluoromethoxy, trifluoromethoxy, fluoroethyl, polyfluoroethyl, 4-fluorophenyl, 3,4,5-trifluorophenyl and 4-(trifluoromethoxy)phenyl.

In some non-limiting examples, at least one of $Z_2$, $Z_3$, $Z_6$ and $Z_7$, is 3,4,5-trifluorophenyl.

In some non-limiting examples, at least one of $Z_2$ and $Z_6$ is 3,4,5-trifluorophenyl.

In a non-limiting example, at least one of $Z_3$ and $Z_7$ is 3,4,5-trifluorophenyl.

In Formula IV-4, $B_1$, $B_2$, $B_4$, $B_5$, $B_6$, $B_7$, $B_8$, $Z_1$, $Z_2$, $Z_3$, $Z_4$, $Z_5$, $Z_6$, $Z_8$, $B'_1$, $B'_2$, $B'_3$, $B'_4$, $B'_5$, $B'_6$, $B'_8$, $A_1$, $A_2$, $A_3$, $A_4$ and $A_5$ each represents the optional presence of one and/or more substituent groups, which are independently selected from: D (deutero), F, Cl, alkyl including $C_1$-$C_6$ alkyl, cycloalkyl, silyl, fluoroalkyl, arylalkyl, haloaryl, heteroaryl, alkoxy, haloalkoxy, fluoroaryl and trifluoroaryl and a combination of any two and/or more thereof.

In some non-limiting examples, the one and/or more substituent groups is independently selected from: methyl, methoxy, ethyl, t-butyl, fluoromethyl, difluoromethyl, trifluoromethyl, fluoroalkoxy, difluoromethoxy trifluoromethoxy, fluoroethyl, polyfluoroethyl, 4-fluorophenyl, 3,4,5-trifluorophenyl and 4-(trifluoromethoxy)phenyl.

In some non-limiting examples, at least one of $A_1$, $A_2$, $A_3$, $A_4$ and $A_5$ is fluoro.

In some non-limiting examples, two and/or more, three and/or more, four and/or more of $A_1$, $A_2$, $A_3$, $A_4$ and $A_5$ are fluoro. In some non-limiting examples, each of $A_1$, $A_2$, $A_3$, $A_4$ and $A_5$ is fluoro.

In Formula VIII-2, $B_1$, $B_2$, $B_4$, $B_5$, $B_6$, $B_7$, $B_8$, $Z_1$, $Z_2$, $Z_3$, $Z_4$, $Z_5$, $Z_6$, $Z_8$, $B'_1$, $B'_2$, $B'_3$, $B'_4$, $B'_5$, $B'_6$, $B'_8$, $A_1$, $A_2$, $A_3$, $A_4$, $A_5$, $A'_1$, $A'_2$, $A'_4$, $A'_5$ and $A'_6$ each represents the optional presence of one and/or more substituent groups, which are independently selected from: D (deutero), F, Cl, alkyl including $C_1$-$C_6$ alkyl, cycloalkyl, silyl, fluoroalkyl, arylalkyl, haloaryl, heteroaryl, alkoxy, haloalkoxy, fluoroaryl and trifluoroaryl and a combination of any two and/or more thereof. In some non-limiting examples, the one and/or more substituent groups is independently selected from: methyl, methoxy, ethyl, t-butyl, fluoromethyl, difluoromethyl, trifluoromethyl, fluoroalkoxy, difluoromethoxy, trifluoromethoxy, fluoroethyl, polyfluoroethyl, 4-fluorophenyl, 3,4,5-trifluorophenyl and 4-(trifluoromethoxy)phenyl.

In some non-limiting examples, at least one of $A_1$, $A_2$, $A_3$, $A_4$, $A_5$, $A'_1$, $A'_2$, $A'_4$, $A'_5$ and $A'_6$ is, and/or contains, F (fluoro), trifluoromethoxy, or difluoromethoxy.

In some non-limiting examples, at least one of $A_1$, $A_2$, $A_3$, $A_4$, $A_5$, $A'_1$, $A'_2$, $A'_4$, $A'_5$ and $A'_6$ is fluoro.

In some non-limiting examples, at least one of $A_1$, $A_2$, $A_3$, $A_4$, $A_5$ is fluoro, and at least one of $A'_1$, $A'_2$, $A'_4$, $A'_5$ and $A'_6$ is fluoro.

In some non-limiting examples, two and/or more, three and/or more, and/or four and/or more of $A_1$, $A_2$, $A_3$, $A_4$, $A_5$ are fluoro, and two and/or more, three and/or more, and/or four and/or more of $A'_1$, $A'_2$, $A'_4$, $A'_5$ and $A'_6$ are fluoro.

In some non-limiting examples, each of $A_1$, $A_2$, $A_3$, $A_4$, $A_5$, $A'_1$, $A'_2$, $A'_4$, $A'_5$ and $A'_6$ is fluoro.

In some non-limiting examples, each of $A_2$, $A_3$, $A_4$, $A'_1$, $A'_5$ and $A'_6$ is fluoro.

In some non-limiting examples, at least one of $A_1$, $A_2$, $A_3$, $A_4$, $A_5$, $A'_1$, $A'_2$, $A'_4$, $A'_5$ and $A'_6$ is trifluoromethoxy.

In some non-limiting examples, at least one of $A_1$, $A_2$, $A_3$, $A_4$, and $A_5$, is trifluoromethoxy, and at least one of $A'_1$, $A'_2$, $A'_4$, $A'_5$ and $A'_6$ is trifluoromethoxy.

In some non-limiting examples, two and/or more, and/or three and/or more of $A_1$, $A_2$, $A_3$, $A_4$, $A_5$ are trifluoromethoxy, and two and/or more, and/or three and/or more of $A'_1$, $A'_2$, $A'_4$, $A'_5$ and $A'_6$ are trifluoromethoxy.

In some non-limiting examples, each of $A_2$, $A_3$, $A_4$, $A'_1$, $A'_5$ and $A'_6$ is trifluoromethoxy.

In some non-limiting examples, at least one of $A_1$, $A_2$, $A_3$, $A_4$, $A_5$, $A'_1$, $A'_2$, $A'_4$, $A'_5$ and $A'_6$ is difluoromethoxy.

In some non-limiting examples, at least one of $A_1$, $A_2$, $A_3$, $A_4$, and $A_5$ is difluoromethoxy, and at least one of $A'_1$, $A'_2$, $A'_4$, $A'_5$ and $A'_6$ is difluoromethoxy.

In some non-limiting examples, two or more, and/or three or more of $A_1$, $A_2$, $A_3$, $A_4$, and $A_5$, are difluoromethoxy, and two or more, and/or three or more of $A'_1$, $A'_2$, $A'_4$, $A'_5$ and $A'_6$ are difluoromethoxy.

In some non-limiting examples, each of $A_2$, $A_3$, $A_4$, $A'_1$, $A'_5$ and $A'_6$ is difluoromethoxy.

While the presence of resonance bonds in various aromatic groups are illustrated by alternating single and double bonds, it will be appreciated that the such representations are provided herein for purpose of illustration only, and are not intended to limit the bonding arrangement of aromatic groups to the specific arrangements illustrated. Moreover, it will be appreciated that the representation of single and double bonds in various aromatic structures may be reconfigured accordingly in some non-limiting examples wherein the aromatic structure includes one or more heteroatoms.

Aspects of some non-limiting examples will now be illustrated and described with reference to the following examples, which are not intended to limit the scope of the present disclosure in any way.

EXAMPLES

The following compounds were synthesized using the general synthesis procedure described below.

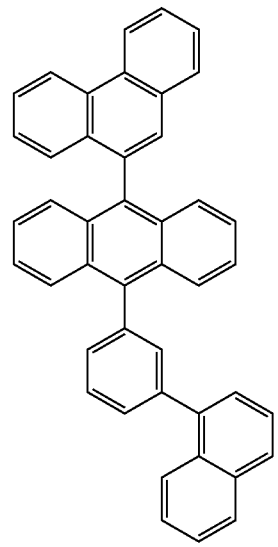

Compound 1

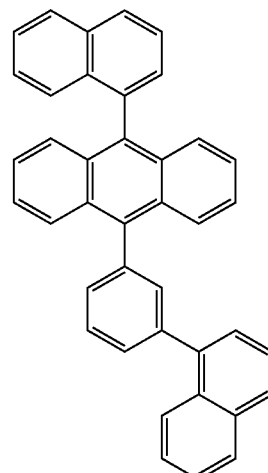

Compound 2

-continued

Compound 3

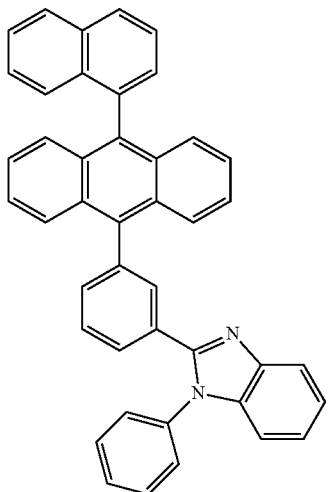

Compound 4

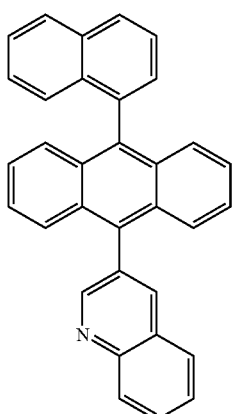

Compound 5

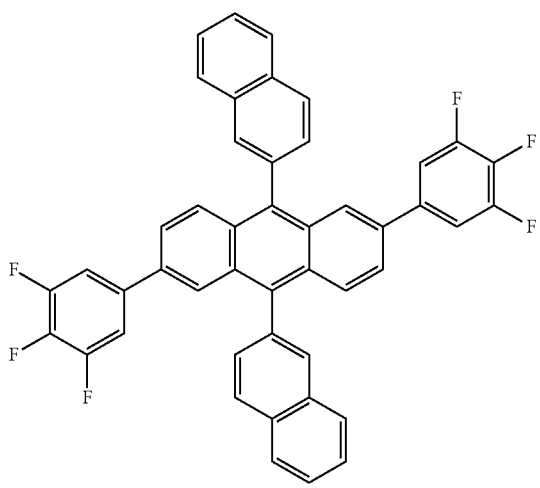

General Synthesis Procedure. The following reagents were mixed in a 500 mL reaction vessel: a brominated reagent; tetrakis(triphenylphosphine)palladium(0) (Pd(PPh$_3$)$_4$), potassium carbonate (K$_2$CO$_3$); and a boronic acid reagent. The reaction vessel containing the mixture was placed on a heating plate mantle and stirred using a magnetic stirrer. The reaction vessel was also connected to a water condenser. A well-stirred 300 ml solvent mixture containing a 9:1 volumetric ratio of n-methyl-2-pyrrolidone (NMP):water was prepared separately in a round-bottom flask. The flask containing the solvent mixture was sealed and degassed using N$_2$ for a minimum of 30 minutes before a cannula was used to transfer the solvent mixture from the round-bottom flask to the reaction vessel without exposure to air. Once all of the solvent mixture was transferred, the reaction vessel was purged with nitrogen, and heated to a temperature of 90° C. while stirring at around 1200 RPM and left to react for at least 12 hours under a nitrogen environment. Once the reaction was determined to be complete, the mixture was cooled to room temperature before being transferred to a 3500 mL Erlenmeyer flask. 3200 mL of water was slowly added to the flask while gently stirring the mixture. Once the mixture had separated into two phases, the precipitate was filtered using a Buchner funnel and allowed to dry. The product was then further purified using train sublimation under reduced pressure of 150-200 mTorr and using CO$_2$ as a carrier gas.

Synthesis of Compound 1: 9-(3-(naphthalen-1-yl)phenyl)-10-(phenanthren-9-yl)anthracene. Compound 1 was synthesized using the general synthesis procedure described above with the following reagents: 9-bromo-10-(phenanthracene-10-yl)anthracene (1.50 g); 3-naphthalen-1-yl)phenylboronic acid (1.12 g); Pd(PPh$_3$)$_4$ (0.226 g); and K$_2$CO$_3$ (0.96 g). Yield after sublimation was determined to be 54.7 mol %.

Synthesis of Compound 2: 9-(naphthalen-1-yl)-10-(3-(naphthalen-1-yl)phenyl)anthracene. Compound 2 was synthesized using the general synthesis procedure described above with the following reagents: 9-bromo-10-(naphthalene-1-yl)anthracene (1.50 g); 3-naphthalen-1-yl)phenylboronic acid (1.25 g); Pd(PPh$_3$)$_4$ (0.226 g); and K$_2$CO$_3$ (1.07 g). Yield after sublimation was determined to be 50.6 mol %.

Synthesis of Compound 3: 2-(3-(10-(naphthalen-1-yl)anthracen-9-yl)phenyl)-1-phenyl-1H-benzo[d]imidazole. Compound 3 was synthesized using the general synthesis procedure described above with the following reagents: 9-bromo-10-(naphthalene-1-yl)anthracene (1.50 g); 3-(1-phenyl-1H-benzo[d]imidazol-2-yl)phenylboronic acid (1.60 g); Pd(PPh$_3$)$_4$ (0.226 g); and K$_2$CO$_3$ (1.08 g). Yield after sublimation was determined to be 55.3 mol %.

Synthesis of Compound 4: 3-(10-(naphthalen-1-yl)anthracen-9-yl)quinoline. Compound 4 was synthesized using the general synthesis procedure described above with the following reagents: 9-bromo-10-(naphthalen-1-yl)anthracene; (Pd(PPh$_3$)$_4$; K$_2$CO$_3$; and 3-quinolineboronic acid.

Synthesis of Compound 5: 9,10-di(naphthalen-2-yl)-2,6-bis(3,4,5-trifluorophenyl)anthracene. Compound 5 was synthesized using the general synthesis procedure described above with the following reagents: 2,6-dibromo-9,10-di(naphthalen-2-yl)anthracene; Pd(PPh$_3$)$_4$; K$_2$CO$_3$; and 3,4,5-trifluorophenylboronic acid.

Example 1: Evaluation of Compounds 1-5. In order to characterize an effect of using various materials to form an NIC 910, a series of samples were prepared using each of Compounds 1 to 5 to form the NIC 910.

As used in the examples herein, a reference to a layer thickness of a material refers to an amount of the material deposited on a target surface (and/or target region(s) and/or portion(s) thereof of the surface in the case of selective deposition), which corresponds to an amount of the material to cover the target surface with a uniformly thick layer of the material having the referenced layer thickness. By way of example, depositing a layer thickness of 10 nm indicates that an amount of the material deposited on the surface corresponds to an amount of the material to form a uniformly thick layer of the material that is 10 nm thick. It will be appreciated that, by way of non-limiting example, due to possible stacking and/or clustering of molecules and/or atoms, an actual thickness of the deposited material may be non-uniform. By way of non-limiting example, depositing a layer thickness of 10 nm may yield some portions of the deposited material having an actual thickness greater than 10 nm, and/or other portions of the deposited material having an actual thickness less than 10 nm. A certain layer thickness of a material deposited on a surface can correspond to an average thickness of the deposited material across the surface.

A series of samples were fabricated by depositing an NIC 910 having a thickness of about 50 nm over a glass substrate. The surface of the NIC 910 was then subjected to open mask deposition of Mg. Each sample was subjected to an Mg vapor flux having an average evaporation rate of about 50 Å/s. In conducting the deposition of the Mg coating, a deposition time of about 100 seconds was used in order to obtain a reference layer thickness of Mg of about 500 nm.

Once the samples were fabricated, optical transmission measurements were taken to determine the relative amount of Mg deposited on the surface of the NIC 910. As will be appreciated, relatively thin Mg coatings having, by way of non-limiting example, thickness of less than a few nm are substantially transparent. However, light transmission decreases as the thickness of the Mg coating is increased. Accordingly, the relative performance of various NIC 910 materials may be assessed by measuring the light transmission through the samples, which directly correlates to the amount and/or thickness of Mg coating deposited thereon from the Mg deposition process. Upon accounting for any loss and/or absorption of light caused by the presence of the glass substrate and the NIC 910, it was found that samples prepared using Compounds 1, 2, 3, 4, and 5 all exhibited relatively high transmission of greater than about 90% across the visible portion of the electromagnetic spectrum. High optical transmission can directly be attributed to a relatively small amount of Mg coating, if any, being present on the surface of the NIC 910 to absorb the light being transmitted through the sample. Accordingly, these NIC 910 materials generally exhibit relatively low affinity and/or initial sticking probability $S_0$ to Mg and thus may be particularly useful for achieving selective deposition and patterning of Mg coating in certain applications.

As used in this and other examples described herein, a reference layer thickness refers to a layer thickness of Mg that is deposited on a reference surface exhibiting a high initial sticking probability $S_0$ (e.g., a surface with an initial sticking probability $S_0$ of about and/or close to 1.0). Specifically, for these examples, the reference surface was a surface of a quartz crystal positioned inside a deposition chamber for monitoring a deposition rate and the reference layer thickness. In other words, the reference layer thickness does not indicate an actual thickness of Mg deposited on a target surface (i.e., a surface of the NIC 910). Rather, the reference layer thickness refers to the layer thickness of Mg that would be deposited on the reference surface upon subjecting the target surface and reference surface to identical Mg vapor flux for the same deposition period (i.e. the surface of the quartz crystal). As would be appreciated, in the event that the target surface and reference surface are not subjected to identical vapor flux simultaneously during deposition, an appropriate tooling factor may be used to determine and monitor the reference thickness.

Without wishing to be bound by a particular theory, it is postulated, based on the theory of nucleation and growth discussed above, that surfaces formed by depositing materials such as Compound 1 generally exhibit a relatively low desorption energy ($E_{des}$) for adsorbed Mg adatoms, a high activation energy ($E_s$) for diffusion of an Mg adatom, and/or both. In this way, the critical nucleation rate ($\dot{N}_i$), which is determined according to the equation below, remains relatively low even when the vapor impingement rate of Mg ($\dot{R}$) is increased, thus substantially inhibiting deposition of Mg.

$$\dot{N}_i = \dot{R} a_0^2 n_0 \left(\frac{\dot{R}}{v n_0}\right)^i \exp\left(\frac{(i+1)E_{des} - E_s + E_i}{kT}\right)$$

It is postulated that the temperature of the substrate may be increased when the vapor impingement rate (i.e. the evaporation rate) is increased. By way of non-limiting example, the evaporation source is typically operated at a higher temperature when the evaporation rate is increased. Accordingly, at higher evaporation rate, the substrate may be subjected to higher level of thermal radiation, which can heat up the substrate. Other factors, which may result in increased substrate temperature, include heating of the substrate caused by energy transfer from greater number of evaporated molecules being incident on the substrate surface, as well as increased rate of condensation and/or desublimation of molecules on the substrate surface releasing energy in the process and causing heating.

For further clarity, the term "selectivity" when used in the context of NIC 910 would generally be understood to refer to the degree to which the NIC 910 inhibits and/or prevents deposition of the conductive coating thereon, upon being subjected to the vapor flux of the material used to form the conductive coating. By way of non-limiting example, an NIC 910 exhibiting relatively high selectivity for Mg would generally better inhibit and/or prevent deposition of Mg coating thereon compared to an NIC 910 having relatively low selectivity. In general, it has been observed that an NIC 910 exhibiting relatively high selectivity would also exhibit relatively low initial sticking probability $S_0$, and an NIC 910 exhibiting relatively low selectivity would exhibit relatively high initial sticking probability $S_0$.

Figure 32:
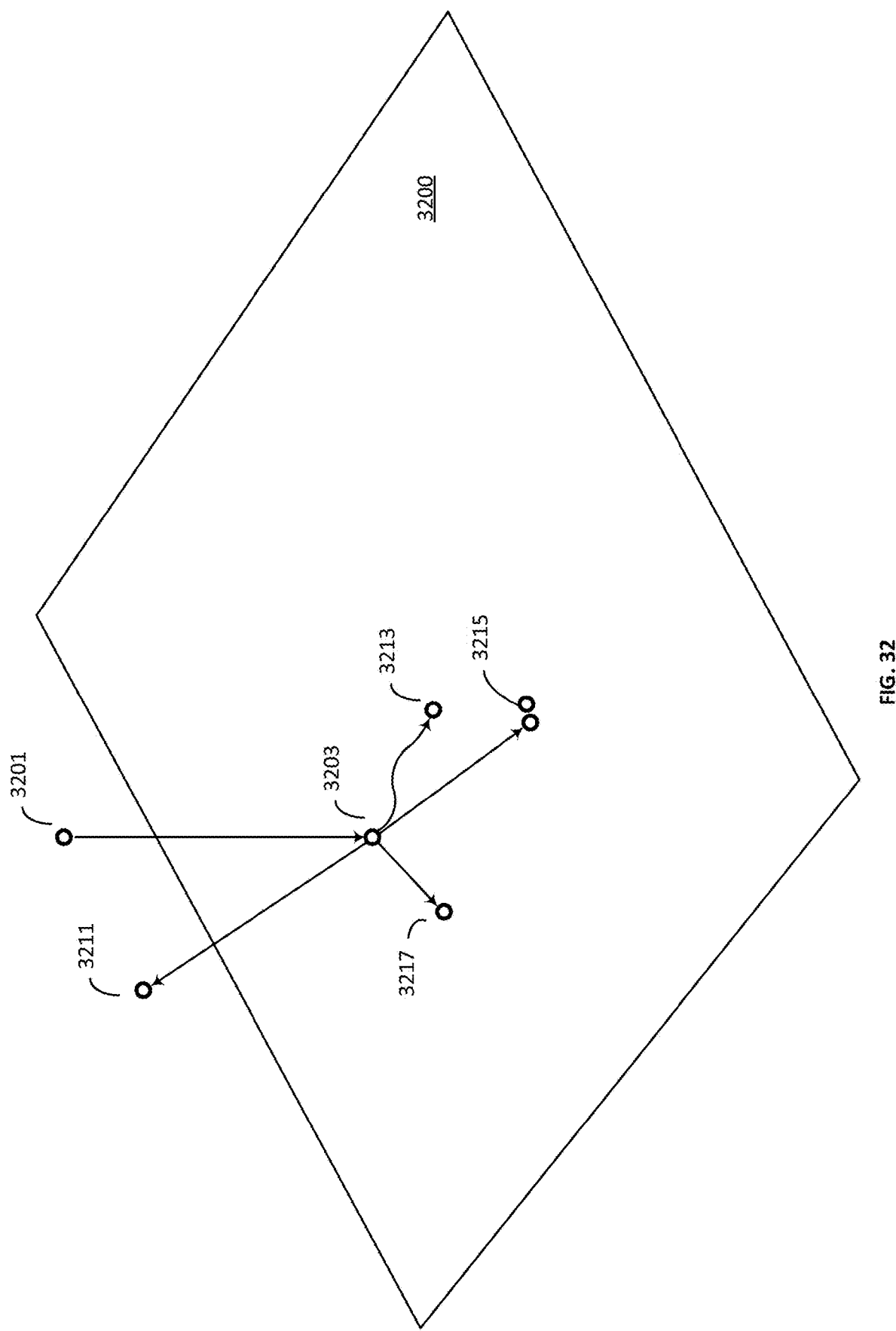
FIG. 32 is a schematic diagram illustrating various events taken into consideration under an example simulation model according to an example in the present disclosure.

Example 4. A series of kinetic Monte Carlo (KMC) calculations were conducted to simulate the deposition of metallic adatoms on surfaces exhibiting various activation energies. Specifically, the calculations were conducted to simulate the deposition of metallic adatoms, such as Mg adatoms, on surfaces having varying activation energy levels associated with desorption ($E_{des}$), diffusion ($E_s$), dissociation ($E_i$), and reaction to the surface ($E_b$) by subjecting such surfaces to evaporated vapor flux at a constant rate of monomer flux. FIG. 32 is a schematic illustration of the various "events" taken into consideration for the current example. In FIG. 32, an atom 3201 in the vapor phase is illustrated as being incident onto a surface 3200. Once the atom 3201 is adsorbed onto the surface 3200, it becomes an adatom 3203. The adatom 3203 may undergo various events including: (i) desorption, upon which a desorbed atom 3211 is created; (ii) diffusion, which gives rise to an adatom 3213 diffusing on the surface 3200; (iii) nucleation, in which a critical number of adatoms 3215 cluster to form a nucleus; and (iv) reaction to the surface, in which an adatom 3217 is reacted and becomes bound to the surface 3200.

The rate (R) at which desorption, diffusion, and/or dissociation occurs is calculated from the frequency of attempt (ω), activation energy of the respective event (E), the Boltzmann constant ($k_B$), and the temperature of the system (T), in accordance with the equation provided below:

$$R = \omega \exp\left(\frac{-E}{k_B T}\right)$$

For the purpose of the above calculations, i, the critical cluster size (i.e. critical number of adatoms to form a stable nucleus) was selected to be 2. The activation energy of diffusion for adatom-adatom interaction was selected to be greater than about 0.6 eV, the activation energy of desorption for adatom-adatom interaction was selected to be greater than about 1.5 eV, and the activation energy of desorption for adatom-adatom interaction was selected to be greater than about 1.25 times the activation energy of desorption for surface-adatom interaction. The above values and conditions were selected based on the values reported for Mg—Mg interactions. For the purpose of the simulations, a temperature (T) of 300 K was used. The calculations were repeated using values reported for other metal adatom-metal adatom activation interactions, such as that of tungsten-tungsten. The above referenced values have been reported, by way of non-limiting example, in Neugbauer, C. A., 1964, *Physics of Thin Films*, 2, 1, *Structural Disorder Phenomena in Thin Metal Films*.

Based on the results of the simulations, a cumulative sticking probability was determined by calculating the fraction of the number of adsorbed monomers which remain on a surface ($N_{ads}$) out of the total number of monomers which impinged on the surface ($N_{total}$) over a simulated period, in accordance with the equation provided below:

$$S = \frac{N_{ads}}{N_{total}}$$

The simulations were conducted to simulate depositions using a vapor flux rate corresponding to about 2 Å/s over a deposition period greater than about 8 minutes, which corresponded to a time period for depositing a film having a reference thickness greater than about 96 nm.

For typical surfaces, the desorption activation energy ($E_{des}$) is generally greater than and/or equal to the diffusion activation energy ($E_s$). Based on the simulations, it has now been found, at least in some cases, that surfaces exhibiting a relatively small difference between the desorption activation energy ($E_{des}$) and the diffusion activation energy ($E_s$) may be particularly useful in acting as surfaces of NICs 910. In some non-limiting examples, the desorption activation energy is greater than and/or equal to the diffusion activation energy of the surface and is less than and/or equal to about 1.1 times, less than and/or equal to about 1.3 times, less than and/or equal to about 1.5 times, less than and/or equal to about 1.6 times, less than and/or equal to about 1.75 times, less than and/or equal to about 1.8 times, less than and/or equal to about 1.9 times, less than and/or equal to about 2 times, and/or less than and/or equal to about 2.5 times the diffusion activation energy of the surface. In some non-limiting examples, the difference (e.g., in terms of absolute value) between the desorption activation energy and the diffusion activation energy is less than about and/or equal to about 0.5 eV, less than and/or equal to about 0.4 eV, less than and/or equal to about 0.35 eV, and in some non-limiting examples, less than and/or equal to about 0.3 eV, and/or less than and/or equal to about 0.2 eV. In some non-limiting examples, the difference between the desorption activation energy and the diffusion activation energy is between about 0.05 eV and about 0.4 eV, between about 0.1 eV and about 0.3 eV, and/or between about 0.1 eV and about 0.2 eV.

It has also now been found, at least in some cases, that surfaces exhibiting a relatively small difference between the desorption activation energy ($E_{des}$) and the dissociation activation energy ($E_i$) may be particularly useful in acting as surfaces of NICs 910. In some non-limiting examples, the desorption activation energy ($E_{des}$) is less than and/or equal to a multiplier times the dissociation activation energy ($E_i$). In some non-limiting examples, the desorption activation energy is less than and/or equal to about 1.5 times, less than and/or equal to about 2 times, less than and/or equal to about 2.5 times, less than and/or equal to about 2.8 times, less than and/or equal to about 3 times, less than and/or equal to about 3.2 times, less than and/or equal to about 3.5 times, less than and/or equal to about 4 times, and/or less than and/or equal to about 5 times the dissociation activation energy of the surface.

It has also now been found, at least in some cases, that surfaces exhibiting a relatively small difference between the diffusion activation energy ($E_s$) and the dissociation activation energy ($E_i$) may be particularly useful in acting as surfaces of NIC 910s. In some non-limiting examples, the diffusion activation energy ($E_s$) is less than and/or equal to a multiplier times the dissociation activation energy ($E_i$). In some non-limiting examples, the diffusion activation energy is less than and/or equal to about 2 times, less than and/or equal to about 2.5 times, less than and/or equal to about 2.8 times, less than and/or equal to about 3 times, less than and/or equal to about 3.2 times, less than and/or equal to about 3.5 times, less than and/or equal to about 4 times, and/or less than and/or equal to about 5 times the dissociation activation energy of the surface.

In some non-limiting examples, the relationship between the desorption activation energy ($E_{des}$), the diffusion activation energy ($E_s$), and the dissociation activation energy ($E_i$) of a surface of an NIC 910 may be represented as follows:

$$E_{des} \leq \alpha * E_s \leq \beta * E_i$$

wherein $\alpha$ may be any number selected from a range of between about 1.1 and about 2.5, and $\beta$ may be any number selected from a range of between about 2 and about 5. In some non-limiting examples, $\alpha$ may be any number selected from a range of between about 1.5 and about 2, and $\beta$ may be any number selected from a range of between about 2.5 and about 3.5. In another non-limiting example, $\alpha$ is selected to be about 1.75 and $\beta$ is selected to be about 3.

It has now been found that surfaces having the following relationship may, at least in certain cases, exhibit a cumulative sticking probability of less than about 0.1 for Mg vapor:

$$E_{des} \leq 1.75 * E_s \leq 3 * E_i$$

Accordingly, surfaces having the above activation energy relationship may be particularly advantageous for use as surfaces of NICs 910 in some non-limiting examples.

It has also now been found that surfaces which, in addition to the above activation energy relationships, exhibit a relatively small difference of less than and/or equal to about 0.3 eV between the diffusion activation energy and the dissociation activation energy may be particularly useful in certain applications, in which a cumulative sticking probability less than about 0.1 is desired. The energy difference ($\Delta E_{s-i}$) between the diffusion activation energy ($E_s$) and the dissociation activation energy ($E_i$) may be calculated according to the following equation:

$$\Delta E_{s\text{-}i} = E_s - E_i$$

By way of non-limiting example, it has now been found that, at least in some cases, surfaces wherein the energy difference between the diffusion activation energy and the dissociation activation energy is less than and/or equal to about 0.25 eV exhibits a cumulative sticking probability of less than and/or equal to about 0.07 for Mg vapor. In other examples, $\Delta E_{s\text{-}i}$ less than and/or equal to about 0.2 eV results in a cumulative sticking probability of less than and/or equal to about 0.05, $\Delta E_{s\text{-}i}$ less than and/or equal to about 0.1 eV results in a cumulative sticking probability of less than and/or equal to about 0.04, and $\Delta E_{s\text{-}i}$ less than and/or equal to about 0.05 eV results in a cumulative sticking probability of less than and/or equal to about 0.025.

Accordingly, in some non-limiting examples, surfaces are characterized by: a is any number selected from a range of between about 1.1 and about 2.5, and/or in some limiting examples, a range of between about 1.5 and about 2, such as by way of non-limiting example about 1.75, and β is any number selected from a range of between about 2 and about 5, and/or in some non-limiting examples, a range of between about 2.5 and about 3.5, such as by way of non-limiting example about 3, in the following inequality relationship:

$$E_{des} \leq \alpha^* E_s \leq \beta^* E_i$$

and wherein $\Delta E_{s\text{-}i}$ calculated according to the following equation is less than and/or equal to about 0.3 eV, less than and/or equal to about 0.25 eV, less than and/or equal to about 0.2 eV, less than and/or equal to about 0.15 eV, less than and/or equal to about 0.1 eV, and/or less than and/or equal to about 0.05 eV in the following equation:

$$\Delta E_{s\text{-}i} = E_s - E_i$$

The results of the calculations were also analyzed to determine the simulated initial sticking probability $S_0$, which, in the present example, was specified to be the sticking probability of Mg on a surface upon depositing onto such surface that yields an Mg coating having an average thickness of about 1 nm. Based on the analysis of the results, it has now been found that, at least in some cases, surfaces wherein the desorption activation energy ($E_{des}$) is less than about 2 times the diffusion activation energy ($E_s$), and the diffusion activation energy ($E_s$) is less than about 3 times the dissociation activation energy ($E_i$) generally exhibits a relatively low initial sticking probability $S_0$ of less than about 0.1.

Without wishing to be bound by any particular theory, it is postulated that the activation energies of various events and the respective relationships between these energies as described above would generally apply to surfaces wherein the activation energy of adatom reaction to the surface ($E_b$) is greater than the desorption activation energy ($E_{des}$). For surfaces wherein the activation energy of adatom reaction to the surface ($E_b$) is less than the desorption activation energy ($E_{des}$), it is postulated the initial sticking probability $S_0$ of adatoms on such surface would generally be greater than about 0.1.

Those having ordinary skill in the relevant art will appreciate that various activation energies described above are treated as non-negative values measured in any unit of energy, such as in electron volt (eV). In such cases, the various inequalities and equations relating to activation energies discussed above may be generally applicable.

While simulated values of various activation energies have been discussed above, it will be appreciated that these activation energies may also be experimentally measured and/or derived using various techniques. Examples of techniques and instruments which may be used for such purpose include, but are not limited to, thermal desorption spectroscopy, field ion microscopy (FIM), scanning tunneling microscopy (STM), transmission electron microscopy (TEM), and neutron activation-tracer scanning (NATS).

Generally, various activation energies described herein may be derived by conducting quantum chemistry simulations if the general composition and structure of the surface and adatoms are specified (e.g. through experimental measurements and analysis). For simulations, quantum chemistry simulations using methods such as, by way of non-limiting example, single energy points, transition states, energy surface scan, and local/global energy minima may be used. Various theories such as, by way of non-limiting example, Density Functional Theory (DFT), Hartree-Fock (HF), Self Consistent Field (SCF), and Full Configuration Interaction (FCI) may be used in conjunction with such simulation methods. As would be appreciated, various events such as diffusion, desorption and nucleation may be simulated by examining the relative energies of the initial state, the transition state and the final state. By way of non-limiting example, the relative energy difference between the transition state and the initial state may generally provide a relatively accurate estimate of the activation energy associated with various events.

Where features and/or aspects of the present disclosure are described in terms of Markush groups, it will be appreciated by those having ordinary skill in the relevant art that the present disclosure is also thereby described in terms of any individual member of sub-group of members of such Markush group.

Terminology

References in the singular form include the plural and vice versa, unless otherwise noted.

As used herein, relational terms, such as "first" and "second", and numbering devices such as "a", "b" and the like, may be used solely to distinguish one entity and/or element from another entity and/or element, without necessarily requiring and/or implying any physical and/or logical relationship and/or order between such entities and/or elements.

The terms "including" and "comprising" are used expansively and in an open-ended fashion, and thus should be interpreted to mean "including, but not limited to". The terms "example" and "exemplary" are used simply to identify instances for illustrative purposes and should not be interpreted as limiting the scope of the invention to the stated instances. In particular, the term "exemplary" should not be interpreted to denote and/or confer any laudatory, beneficial and/or other quality to the expression with which it is used, whether in terms of design, performance and/or otherwise.

The terms "couple" and "communicate" in any form are intended to mean either a direct connection and/or indirect connection through some interface, device, intermediate component and/or connection, whether optically, electrically, mechanically, chemically, and/or otherwise.

The terms "on" and/or "over" when used in reference to a first component relative to another component, and/or "covering" and/or which "covers" another component, may encompass situations where the first component is direct on (including without limitation, in physical contact with) the other component, as well as cases where one or more intervening components are positioned between the first component and the other component.

Directional terms such as "upward", "downward", "left" and "right" are used to refer to directions in the drawings to which reference is made unless otherwise stated. Similarly, words such as "inward" and "outward" are used to refer to directions toward and away from, respectively, the geometric center of the device, area and/or volume and/or designated parts thereof. Moreover, all dimensions described herein are intended solely to be by way of example of purposes of illustrating certain non-limiting examples and are not intended to limit the scope of the disclosure to any non-limiting examples that may depart from such dimensions as may be specified.

As used herein, the terms "substantially", "substantial", "approximately" and/or "about" are used to denote and account for small variations. When used in conjunction with an event and/or circumstance, such terms can refer to instances in which the event and/or circumstance occurs precisely, as well as instances in which the event and/or circumstance occurs to a close approximation. By way of non-limiting example, when used in conjunction with a numerical value, such terms may refer to a range of variation of less than and/or equal to ±10% of such numerical value, such as less than and/or equal to ±5%, less than and/or equal to ±4%, less than and/or equal to ±3%, less than and/or equal to ±2%, less than and/or equal to 1%, less than and/or equal to ±0.5%, less than and/or equal to 0.1%, and/or less than equal to ±0.05%.

As used herein, the phrase "consisting substantially of" will be understood to include those elements specifically recited and any additional elements that do not materially affect the basic and novel characteristics of the described technology, while the phrase "consisting of" without the use of any modifier, excludes any element not specifically recited.

As will be understood by those having ordinary skill in the relevant art, for any and all purposes, particularly in terms of providing a written description, all ranges disclosed herein also encompass any and all possible sub-ranges and/or combinations of sub-ranges thereof. Any listed range may be easily recognized as sufficiently describing and/or enabling the same range being broken down at least into equal fractions thereof, including without limitation, halves, thirds, quarters, fifths, tenths etc. As a non-limiting example, each range discussed herein may be readily be broken down into a lower third, middle third and/or upper third, etc.

As will also be understood by those having ordinary skill in the relevant art, all language and/or terminology such as "up to", "at least", "greater than", "less than", and the like, may include and/or refer the recited range(s) and may also refer to ranges that may be subsequently broken down into sub-ranges as discussed herein.

As will be understood by those having ordinary skill in the relevant art, a range includes each individual member of the recited range.

General

The purpose of the Abstract is to enable the relevant patent office and/or the public generally, and specifically, persons of ordinary skill in the art who are not familiar with patent and/or legal terms and/or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are considered to be merely illustrative of the scope of the present disclosure.

It should be appreciated that the present disclosure, which is described by the claims and not by the implementation details provided, and which can be modified by varying, omitting, adding and/or replacing and/or in the absence of any element(s) and/or limitation(s) with alternatives and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in one or more of the above-described examples, whether or not described an illustrated as discrete and/or separate, may be combined and/or integrated in another system without departing from the scope of the present disclosure, to create alternative examples comprised of a combination and/or sub-combination of features that may not be explicitly described above, and/or certain features may be omitted, and/or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects and examples of the disclosure, as well as specific examples thereof, are intended to encompass both structural and functional equivalents thereof and to cover and embrace all suitable changes in technology. Additionally, it is intended that such equivalents include both currently-known equivalents as well as equivalents developed in the future, i.e., any elements developed that perform the same function, regardless of structure.

Accordingly, the specification and the examples disclosed therein are to be considered illustrative only, with a true scope of the disclosure being disclosed by the following numbered claims:

What is claimed is:

1. An opto-electronic device comprising:
    a nucleating inhibiting coating (NIC) disposed on a surface of the device in a first portion of a lateral aspect thereof; and
    a conductive coating comprising a conductive coating material and disposed on a surface of the device in a second portion of the lateral aspect thereof;
    wherein:
    the first portion is substantially devoid of a closed coating of the conductive material,
    the NIC comprises a compound comprising a core moiety that is an anthracene moiety, and at least one moiety bonded thereto, and
    at least one of the at least one moiety comprises a fluoroaryl group.

2. The opto-electronic device of claim 1, wherein the fluoroaryl group is a trifluoroaryl group.

3. The opto-electronic device of claim 1, wherein at least one of the at least one moiety comprises at least one additional substituent selected from at least one of: a fluorine atom, a fluoroalkyl group, a fluoroaryl group, a trifluoroaryl group, and a fluoroalkoxy group.

4. The opto-electronic device of claim 1, wherein the compound has a formula selected from a group consisting of Formulae (I), (II), (III), (IV), (V), (VI), (VII), and (VIII):

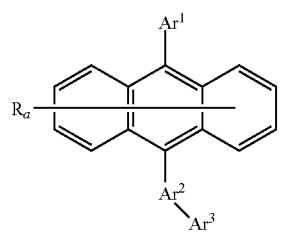

Formula (I)

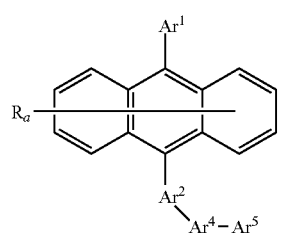

Formula (II)

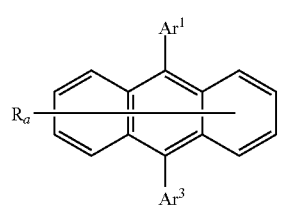

Formula (III)

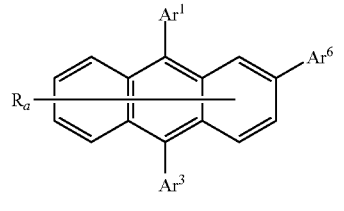

Formula (IV)

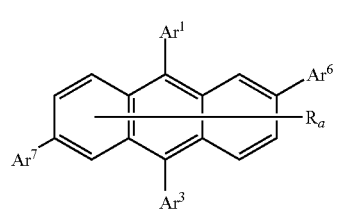

Formula (V)

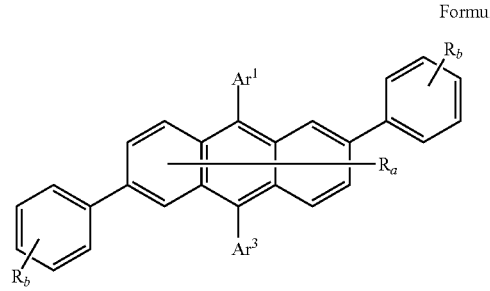

Formula (VI)

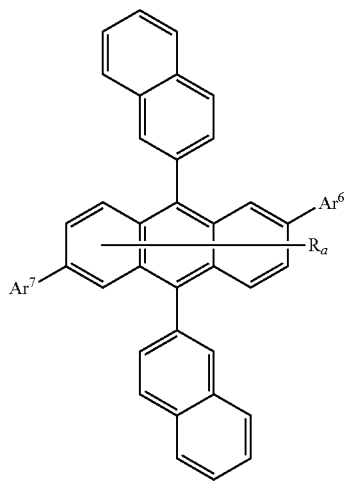

Formula (VII)

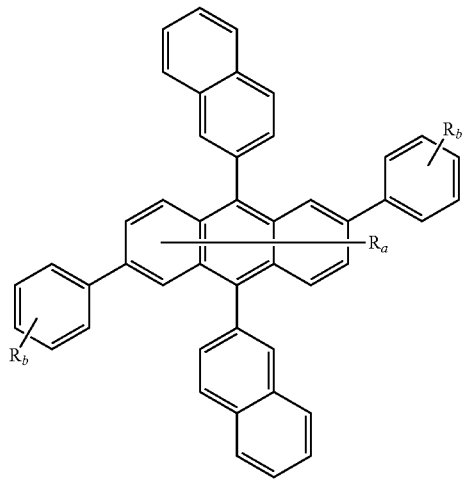

Formula (VIII)

wherein:
$Ar^1$ represents a substituted or unsubstituted aryl group having 6 to 50 carbon atoms; a substituted or unsubstituted arylene group having 6 to 60 carbon atoms; a substituted or unsubstituted heteroaryl group having 4 to 50 carbon atoms; or a substituted or unsubstituted heteroarylene group having 5 to 60 carbon atoms;

$R_a$ represents one or more substituent groups, which are independently: H, D (deutero), F, Cl, alkyl including $C_1$-$C_6$ alkyl, cycloalkyl, silyl, fluoroalkyl, arylalkyl, aryl, heteroaryl, alkoxy, haloalkoxy, fluoroalkoxy, fluoroaryl, and trifluoroaryl;

$R_b$ represents one or more substituent groups, which are independently: H, D (deuteron), F, Cl, alkyl including $C_1$-$C_6$ alkyl, cycloalkyl, silyl, fluoroalkyl, arylalkyl, aryl, haloaryl, heteroaryl, alkoxy, haloalkoxy, fluoroalkoxy, fluoroaryl, and trifluoroaryl;

$Ar^2$ represents a substituted or unsubstituted arylene group having 6 to 50 carbon atoms, or a substituted or unsubstituted heteroarylene group having 4 to 50 carbon atoms;

$Ar^3$ represents a substituted or unsubstituted aryl group having 6 to 50 carbon atoms; a substituted or unsubstituted arylene group having 6 to 60 carbon atoms; a substituted or unsubstituted heteroaryl group having 4 to 50 carbon atoms; or a substituted or unsubstituted heteroarylene group having 5 to 60 carbon atoms;

$Ar^4$ represents a substituted or unsubstituted arylene group having 6 to 50 carbon atoms, or a substituted or unsubstituted heteroarylene group having 4 to 50 carbon atoms;

$Ar^5$ represents a substituted or unsubstituted aryl group having 6 to 50 carbon atoms; a substituted or unsubstituted arylene group having 6 to 60 carbon atoms; a substituted or unsubstituted heteroaryl group having 4 to 50 carbon atoms; or a substituted or unsubstituted heteroarylene group having 5 to 60 carbon atoms;

$Ar^6$ represents a substituted or unsubstituted aryl group having 6 to 50 carbon atoms; a substituted or unsubstituted haloaryl group having 6 to 50 carbon atoms; a substituted or unsubstituted arylene group having 6 to 60 carbon atoms; or a substituted or unsubstituted heteroaryl group having 5 to 60 carbon atoms; and $Ar^7$ represents a substituted or unsubstituted aryl group having 6 to 50 carbon atoms; a substituted or unsubstituted haloaryl group having 6 to 50 carbon atoms; a substituted or unsubstituted arylene group having 6 to 60 carbon atoms; or a substituted or unsubstituted heteroaryl group having 5 to 60 carbon atoms.

5. The opto-electronic device of claim 4, wherein $Ar^1$ is selected from the group consisting of 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl; pyrenyl; pyridine; quinoline; isoquinoline; pyrazine; quinoxaline; arcidine; pyrimidine; quinazoline; pyridazine; cinnoline and phthalzine.

6. The opto-electronic device of claim 4, wherein $R_a$ is selected from the group consisting of H, D, F, Cl, methyl, methoxy, ethyl, t-butyl, fluoromethyl, difluoromethyl, trifluoromethyl, fluoralkoxy, difluoromethoxy, trifluoromethoxy, fluoroethyl, polyfluoroethyl, fluorophenyl, trifluorophenyl, and trifluoromethoxyphenyl.

7. The opto-electronic device of claim 4, wherein $R_b$ is selected from the group consisting of H, D, F, Cl, methyl, methoxy, ethyl, t-butyl, fluoromethyl, difluoromethyl, trfluoromethyl, fluoroalkoxy, diflouromethoxy, trifluoromethoxy, fluoroethyl, polyfluoroethyl, fluorophenyl, trifluorophenyl, and trifluoromethoxyphenyl.

8. The opto-electronic device of claim 4, wherein $Ar^2$ is selected from the group consisting of phenylene; naphthylene; anthracylene; phenanthrylene; benzanthracylene; and pyrenylene.

9. The opto-electronic device of claim 4, wherein $Ar^3$ is selected from the group consisting of 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl; pyrenyl; pyridine; quinoline; isoquinoline; pyrazine; quinoxaline; arcidine; pyrimidine; quinazoline; pyridazine; cinnoline; and phthalzine.

10. The opto-electronic device of claim 4, wherein $Ar^4$ is selected from the group consisting of phenylene; naphthylene; anthracylene; phenanthrylene; benzanthracylene; pyrenylene; and benzimidazole.

11. The opto-electronic device of claim 4, wherein $Ar^5$ is selected from the group consisting of phenyl; 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl; and pyrenyl.

12. The opto-electronic device of claim 4, wherein $Ar^6$ is selected from the group consisting of phenyl, 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl; pyrenyl; 4-fluorophenyl; 3,4,5-trifluorophenyl; and 4-(trifluoromethoxy)phenyl.

13. The opto-electronic device of claim 4, wherein $Ar^7$ is selected from the group consisting of phenyl, 1-naphthyl; 2-naphthyl; 1-phenanthryl; 2-phenanthryl; 10-phenanthryl; 9-phenanthryl; 1-anthracenyl; 2-anthracenyl; 3-anthracenyl; 9-anthracenyl; benzanthracenyl; pyrenyl; 4-fluorophenyl; 3,4,5-trifluorophenyl; and 4-(trifluoromethoxy)phenyl.

14. The opto-electronic device of claim 1, further comprising at least one emissive region, wherein the device comprises a first electrode, a second electrode and a semiconducting layer between the first electrode and the second electrode in the at least one emissive region.

15. The opto-electronic device of claim 14, wherein the first portion comprises the at least one emissive region, and the second electrode extends between the NIC and the semiconducting layer in the first portion.

16. The opto-electronic device of claim 15, wherein the second portion comprises at least a part of a non-emissive region.

17. The opto-electronic device of claim 15, wherein a thickness of the NIC in the at least one emissive region of the first portion is modulated to adjust an optical microcavity effect thereof.

18. The opto-electronic device of claim 15, wherein the conductive coating is electrically coupled to the second electrode.

19. The opto-electronic device of claim 15, wherein the conductive coating coats at least a part of the second electrode in the second portion.

20. The opto-electronic device of claim 15, comprising at least one intermediate coating between the second electrode and the conductive coating along at least a part thereof.

21. The opto-electronic device of claim 20, wherein the intermediate coating comprises a nucleation promoting coating (NPC).

22. The opto-electronic device of claim 15, wherein the second portion comprises at least one additional emissive region.

23. The opto-electronic device of claim 22, wherein at least one of the at least one additional emissive region of the second portion of the device comprises a first electrode, a second electrode and a semiconducting layer between the first electrode and the second electrode, wherein the second electrode comprises the conductive coating.

24. The opto-electronic device of claim 23, wherein a wavelength of light emitted from the at least one additional emissive region of the second portion of the device differs from a wavelength of light emitted from the at least one emissive region of the first portion of the device.

25. The opto-electronic device of claim 14, wherein the second portion comprises the at least one emissive region, and the second electrode extends between the conductive coating and the semiconducting layer in the second portion.

26. The opto-electronic device of claim 25, wherein the first portion comprises at least a part of a non-emissive region.

27. The opto-electronic device of claim 26, wherein the first portion is substantially light-transmissive therethrough.

28. The opto-electronic device of claim 27, wherein the second electrode extends in the first portion and the NIC is disposed on a surface of the second electrode.

29. The opto-electronic device of claim 1, wherein the conductive coating comprises an auxiliary electrode.

30. The opto-electronic device of claim 1, wherein the core moiety further comprises at least one of: a fluorine atom, a fluoroalkyl group, a fluoroaryl group, a trifluoroaryl group, and a fluoroalkoxy group.

* * * * *